(12) United States Patent
Huang et al.

(10) Patent No.: US 11,769,770 B2
(45) Date of Patent: Sep. 26, 2023

(54) METHODS OF FORMING A SEMICONDUCTOR DEVICE HAVING AN AIR SPACER

(71) Applicant: TAIWAN SEMICONDUCTOR MANUFACTURING COMPANY, LTD., Hsinchu (TW)

(72) Inventors: Yu-Lien Huang, Hsinchu County (TW); Che-Ming Hsu, Hsinchu (TW); Ching-Feng Fu, Taichung (TW); Huan-Just Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 133 days.

(21) Appl. No.: 17/313,575

(22) Filed: May 6, 2021

(65) Prior Publication Data

US 2022/0359516 A1 Nov. 10, 2022

(51) Int. Cl.
*H01L 21/8234* (2006.01)
*H01L 29/66* (2006.01)
*H01L 23/522* (2006.01)
*H01L 21/768* (2006.01)
*H01L 27/092* (2006.01)
*H01L 29/06* (2006.01)
*H01L 29/78* (2006.01)
*H01L 27/088* (2006.01)

(52) U.S. Cl.
CPC ...... *H01L 27/0924* (2013.01); *H01L 21/7682* (2013.01); *H01L 21/76834* (2013.01); *H01L 21/823431* (2013.01); *H01L 21/823468* (2013.01); *H01L 21/823475* (2013.01); *H01L 21/823481* (2013.01); *H01L 23/5222* (2013.01); *H01L 27/0886* (2013.01); *H01L 29/0649* (2013.01); *H01L 29/0653* (2013.01); *H01L 29/66795* (2013.01); *H01L 29/7851* (2013.01); *H01L 29/66545* (2013.01); *H01L 29/7848* (2013.01); *H01L 2221/1063* (2013.01)

(58) Field of Classification Search
CPC .............. H01L 21/764; H01L 21/7682; H01L 2221/1042; H01L 29/0649–0653; H01L 23/5222; H01L 21/823475; H01L 21/823871; H01L 29/6681; H01L 21/823481; H01L 21/823878; H01L 21/76224; H01L 21/76229; H01L 21/76232; H01L 21/76834; H01L 2221/1063
See application file for complete search history.

(56) References Cited

U.S. PATENT DOCUMENTS 9,786,553 B1\* 10/2017 Yang ................. H01L 21/76843
2006/0019482 A1\* 1/2006 Su ....................... H01L 23/5222
257/E23.161
(Continued)

*Primary Examiner* — Younes Boulghassoul
(74) *Attorney, Agent, or Firm* — Maschoff Brennan

(57) ABSTRACT

A semiconductor device includes a substrate, a semiconductor fin, a shallow trench isolation (STI) structure, an air spacer, and a gate structure. The semiconductor fin extends upwardly from the substrate. The STI structure laterally surrounds a lower portion of the semiconductor fin. The air spacer is interposed the STI structure and the semiconductor fin. The gate structure extends across the semiconductor fin.

20 Claims, 95 Drawing Sheets

(56) References Cited

U.S. PATENT DOCUMENTS

| | | | |
|---|---|---|---|
| 2008/0182405 A1* | 7/2008 | Liu | H01L 21/76807 438/623 |
| 2015/0179499 A1* | 6/2015 | Yang | H01L 21/76877 257/773 |
| 2017/0047242 A1* | 2/2017 | Sun | H01L 23/5222 |
| 2020/0091345 A1* | 3/2020 | Chiu | H01L 29/7851 |
| 2020/0126843 A1* | 4/2020 | Tsai | H01L 21/76897 |
| 2020/0127109 A1* | 4/2020 | Wang | H01L 21/7682 |
| 2020/0135591 A1* | 4/2020 | Yeong | H01L 21/823821 |
| 2021/0050413 A1* | 2/2021 | Kuo | H01L 21/76885 |
| 2021/0066500 A1* | 3/2021 | Liu | H01L 21/823807 |

* cited by examiner

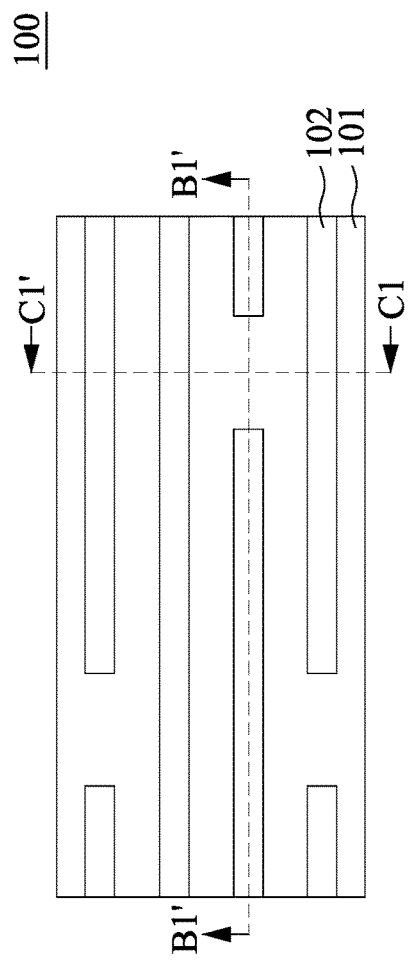
Fig. 2A
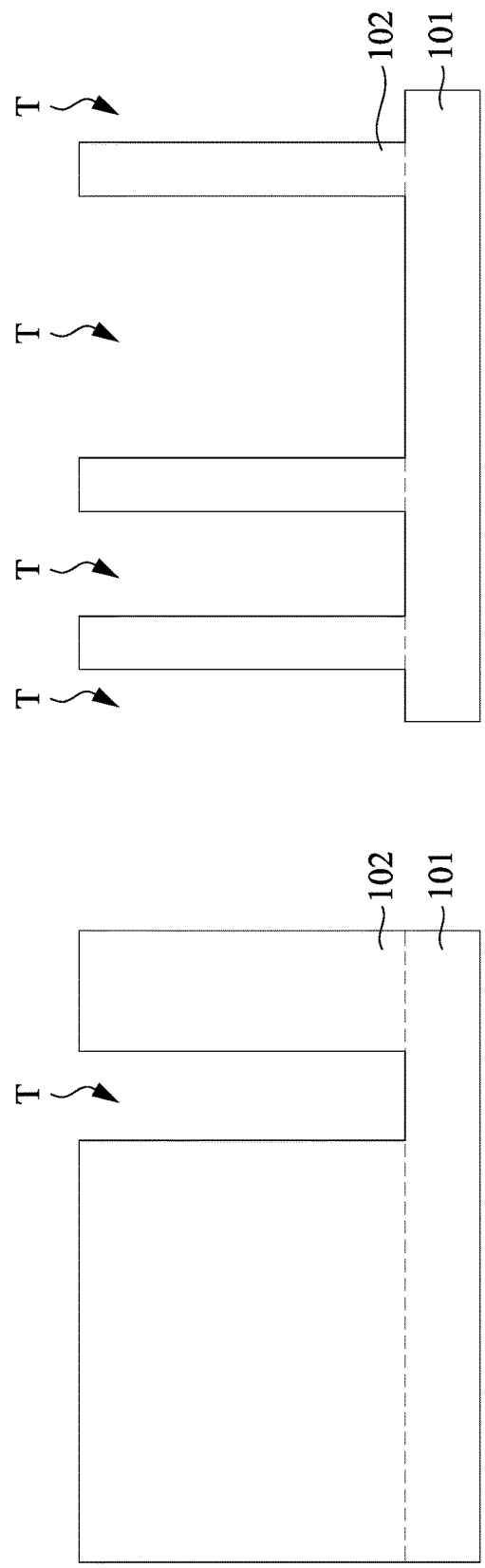
Fig. 2B
Fig. 2C

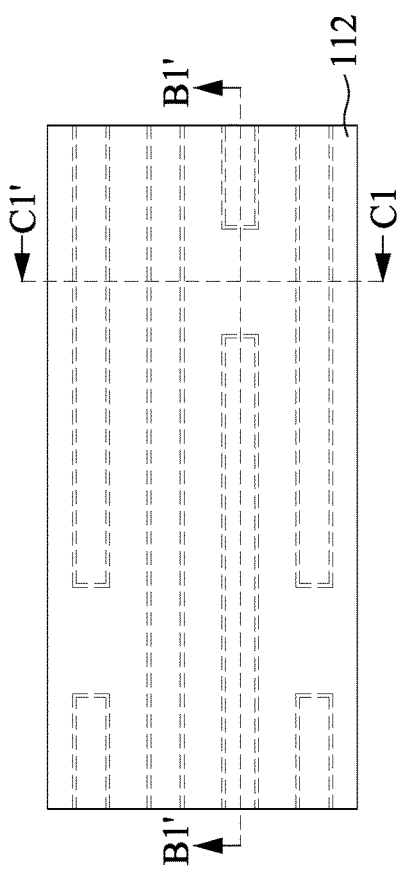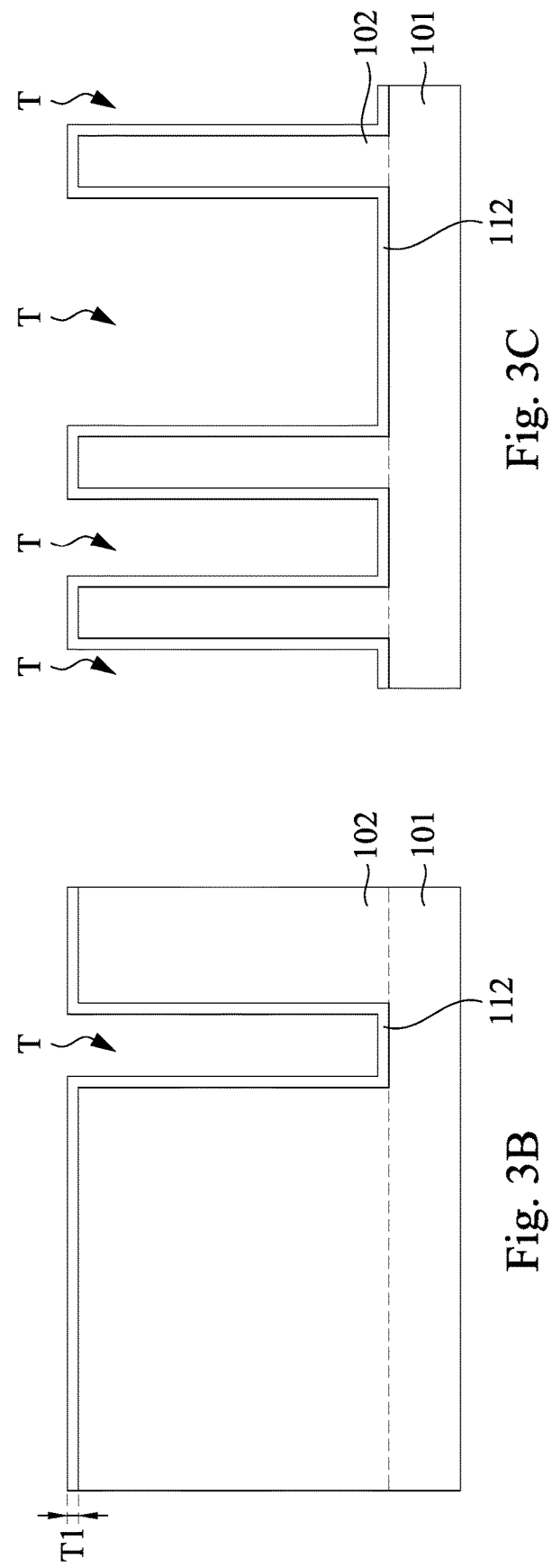

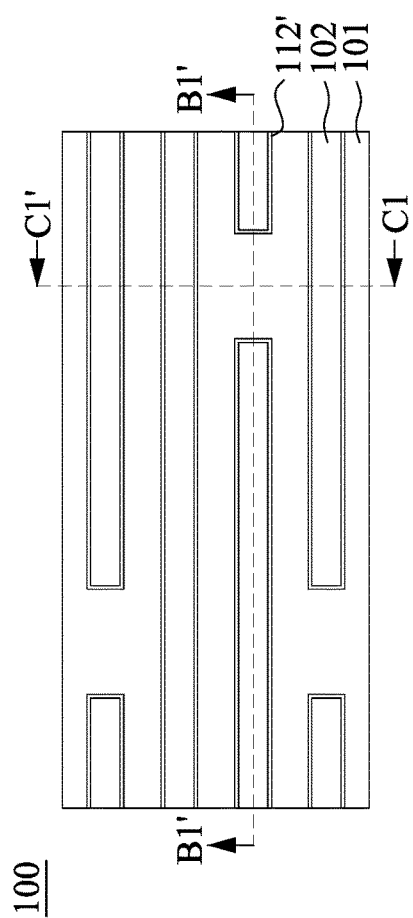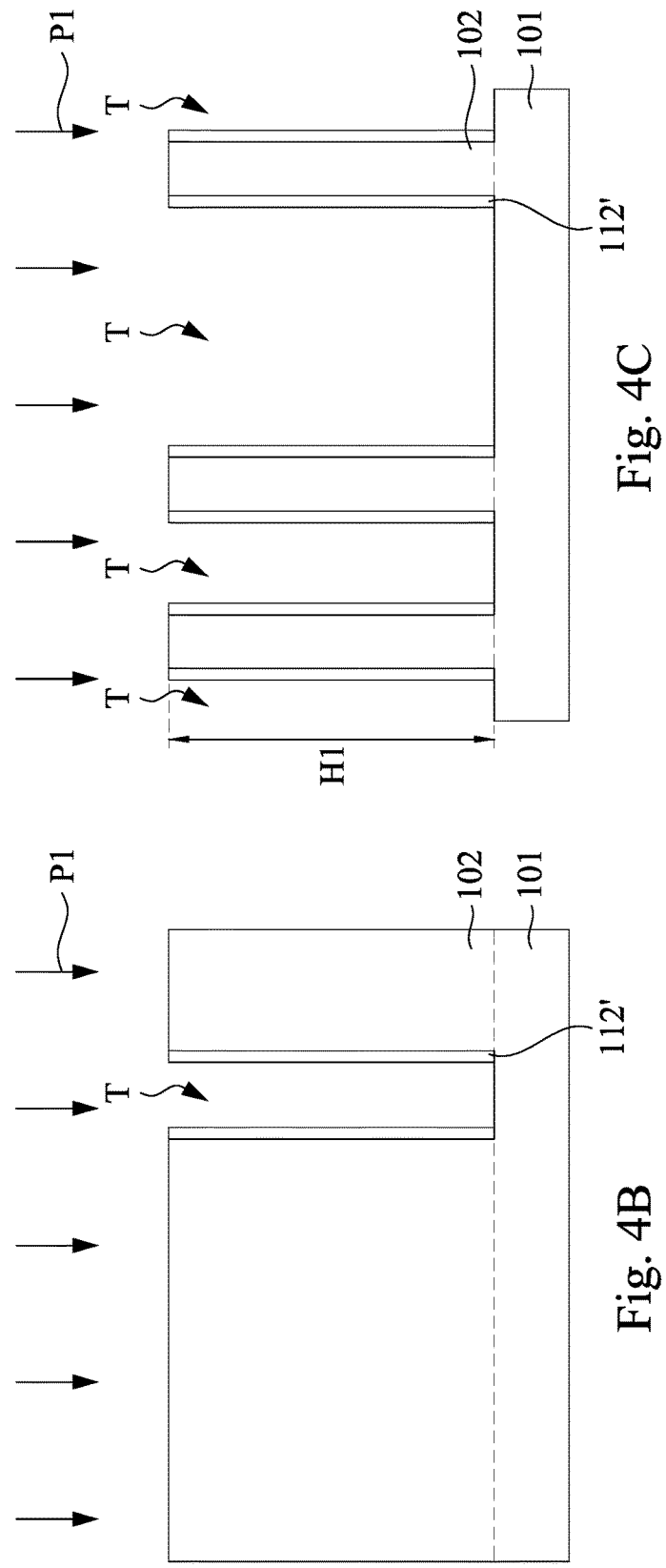

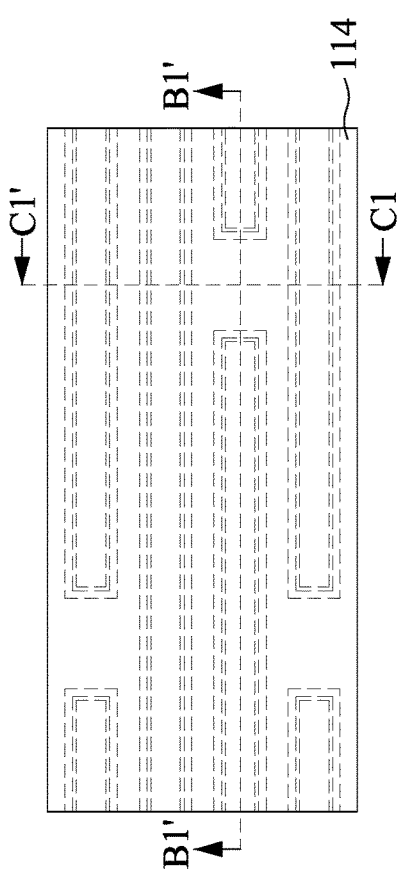
Fig. 5A
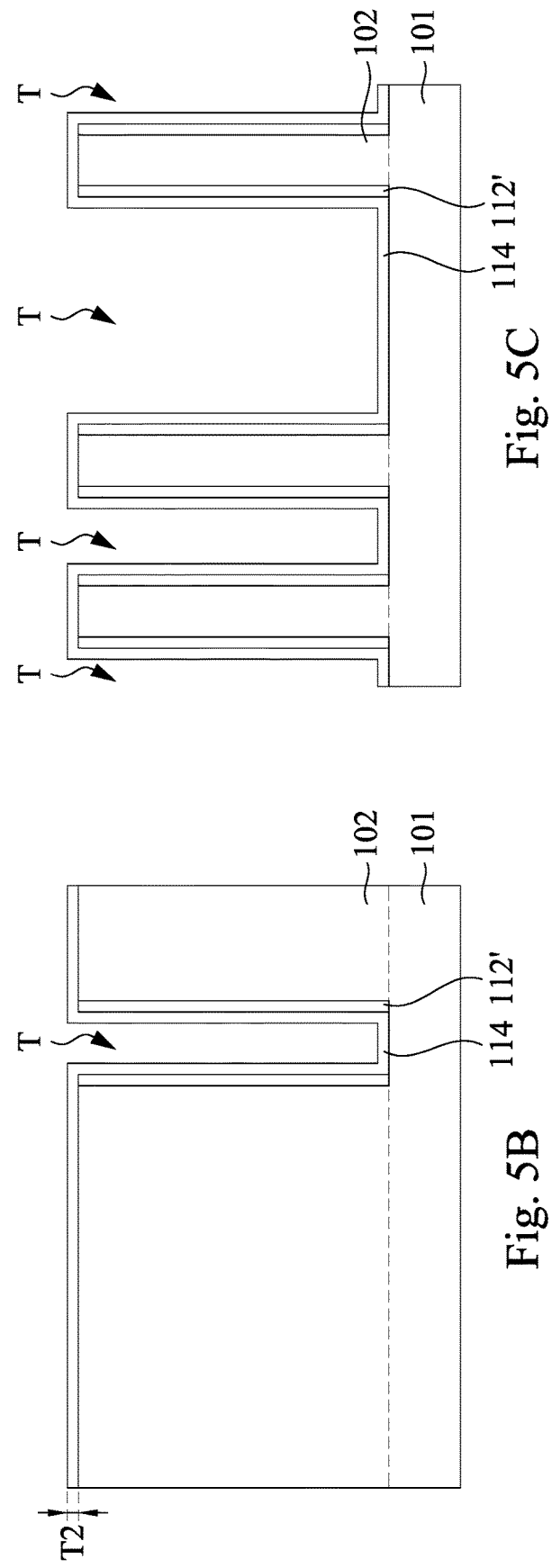
Fig. 5B
Fig. 5C

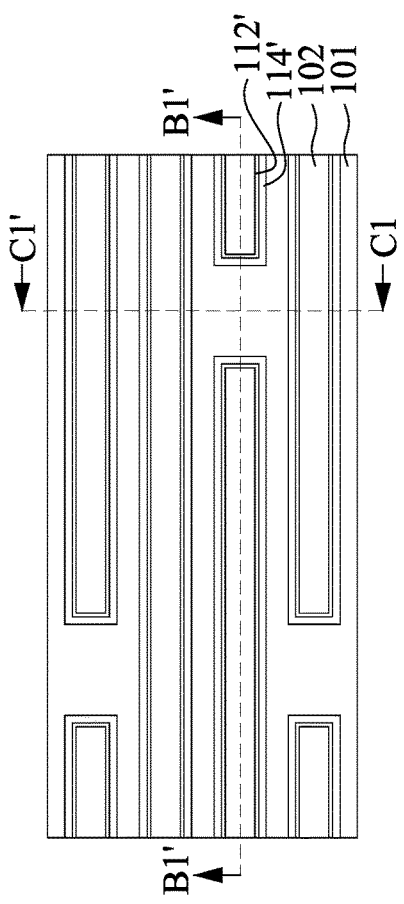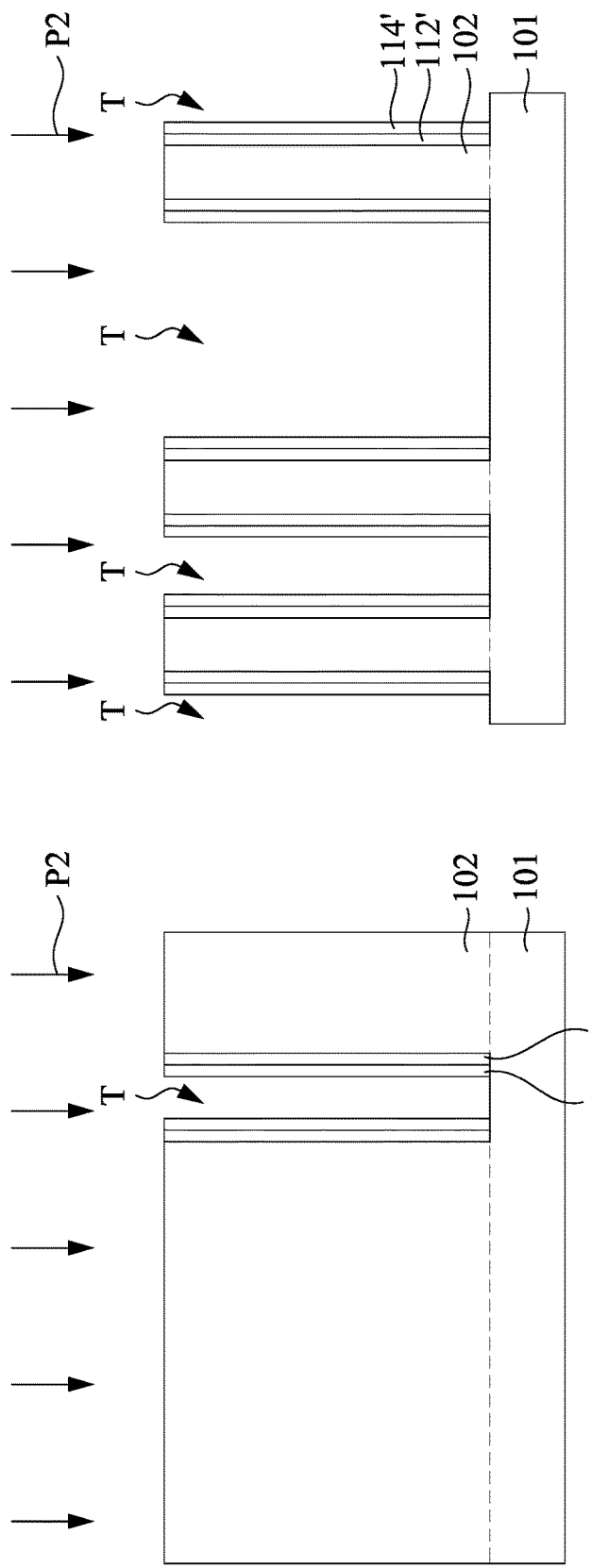

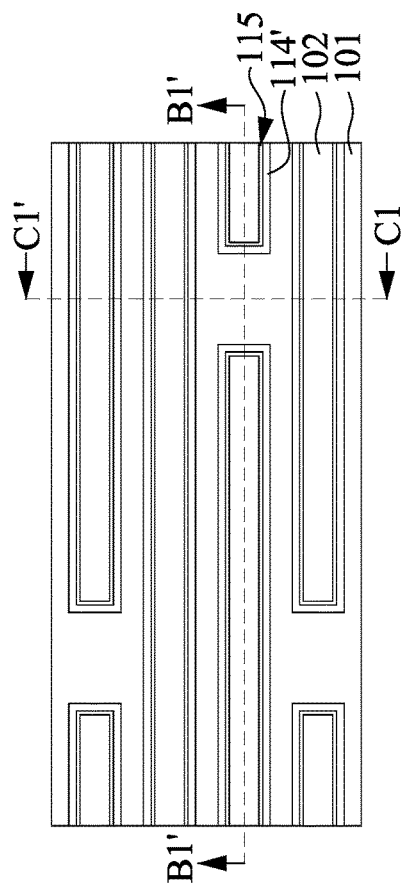
Fig. 7A
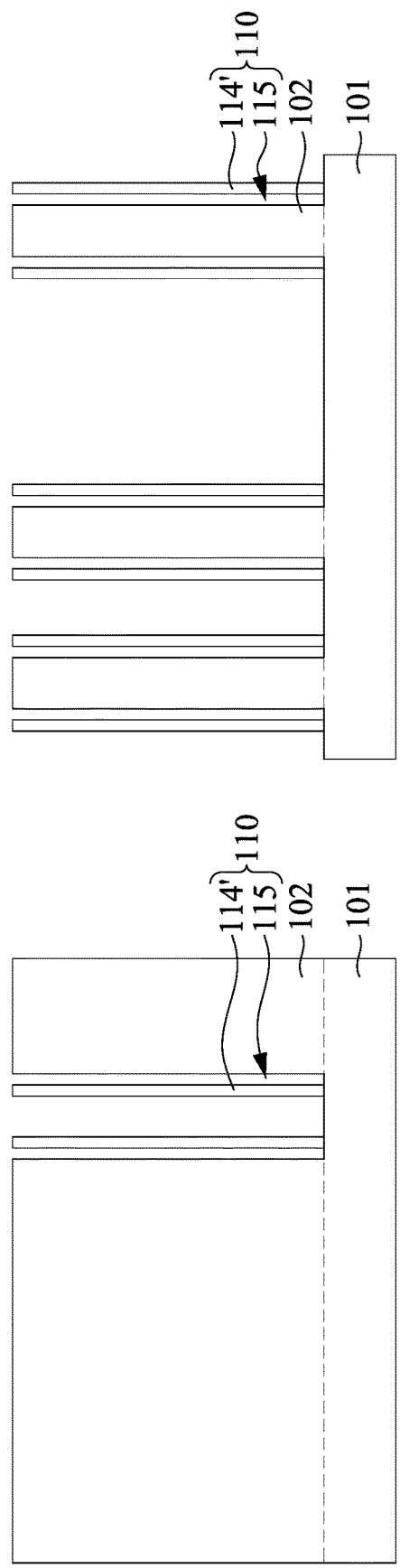
Fig. 7C
Fig. 7B

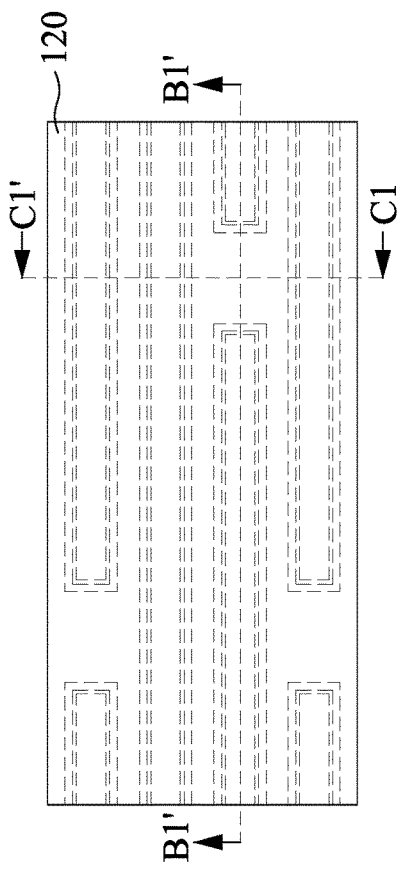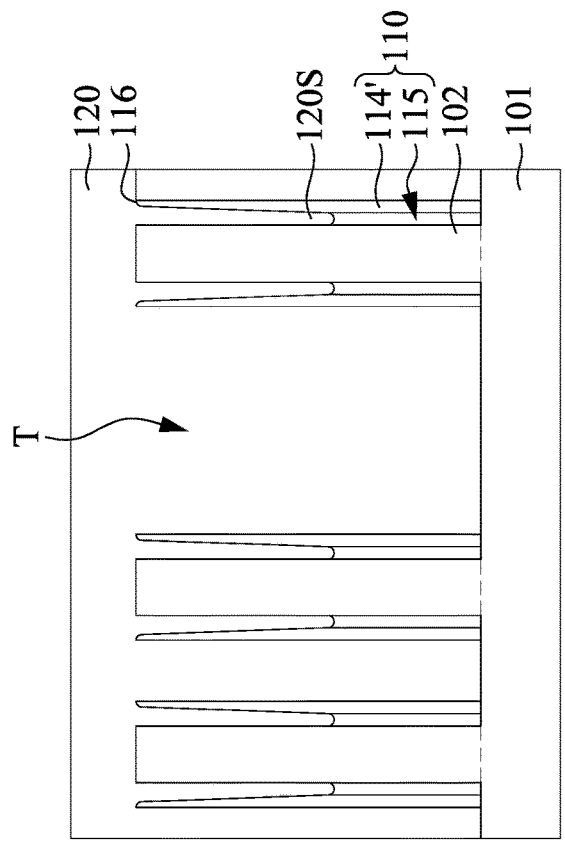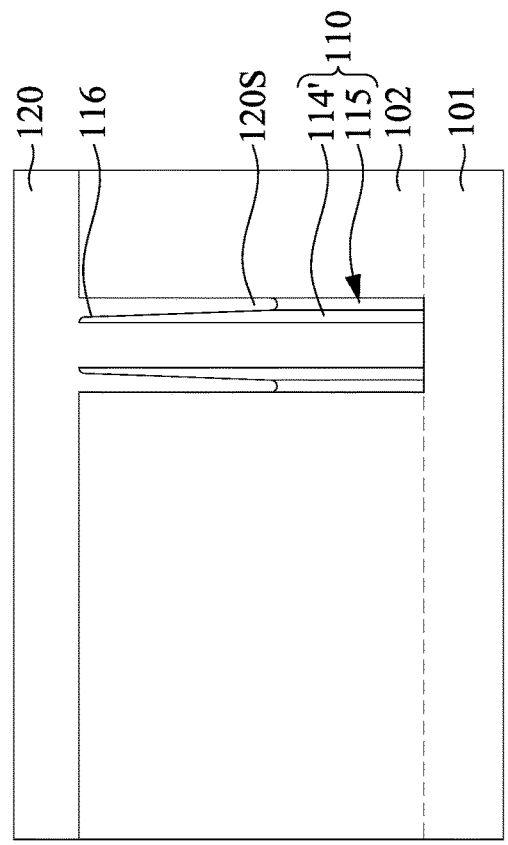
Fig. 9A
Fig. 9B
Fig. 9C

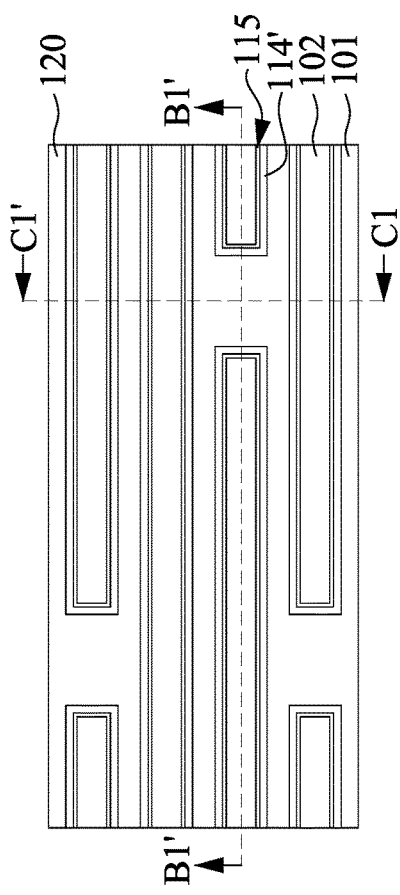
Fig. 10A
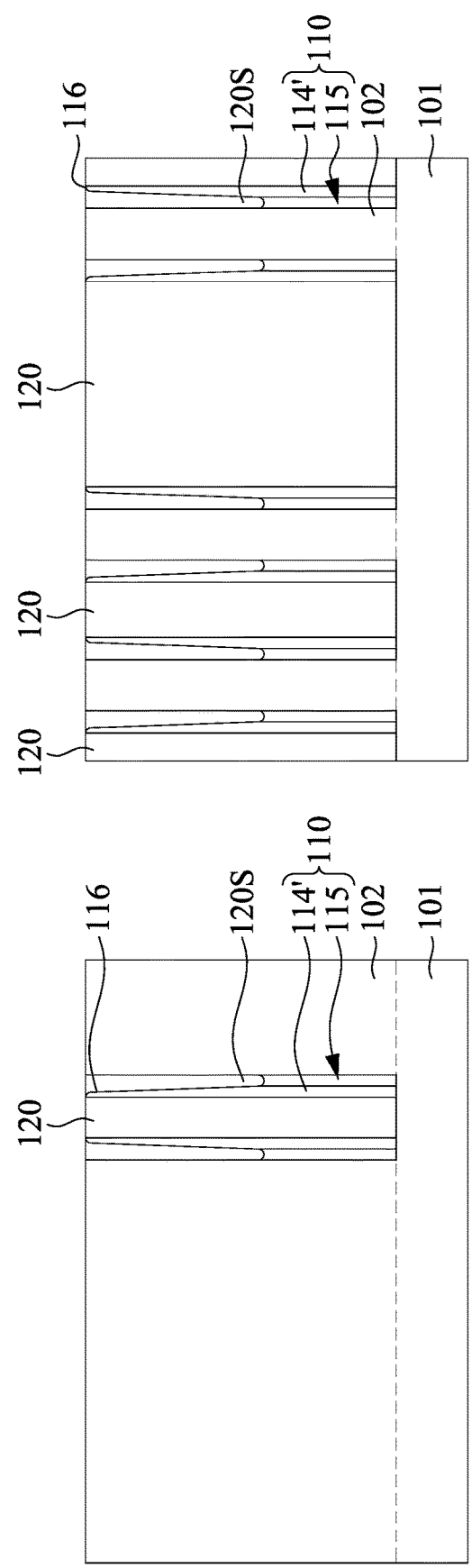
Fig. 10B
Fig. 10C

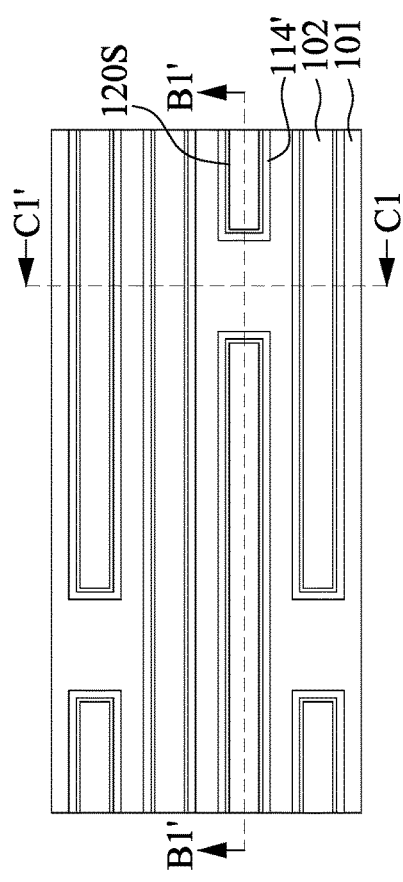
Fig. 11A
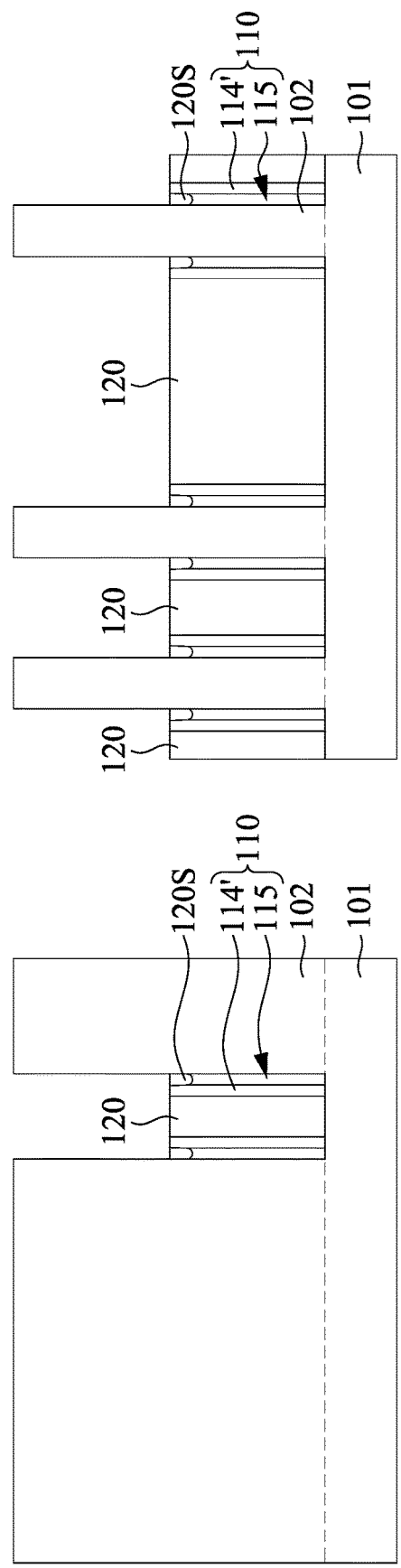
Fig. 11C
Fig. 11B

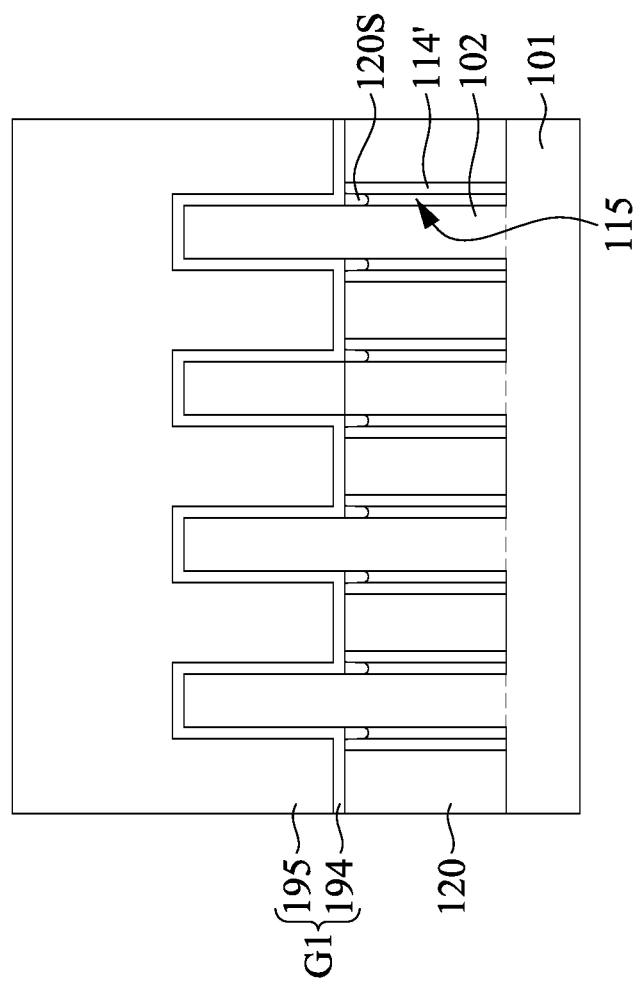

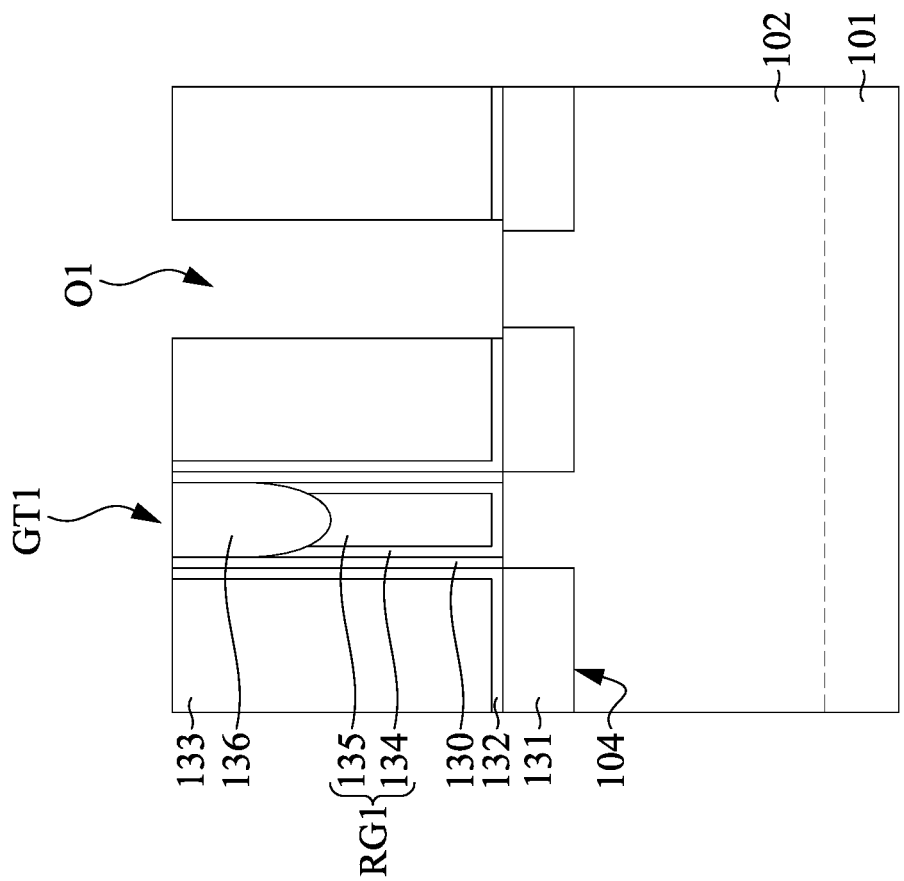
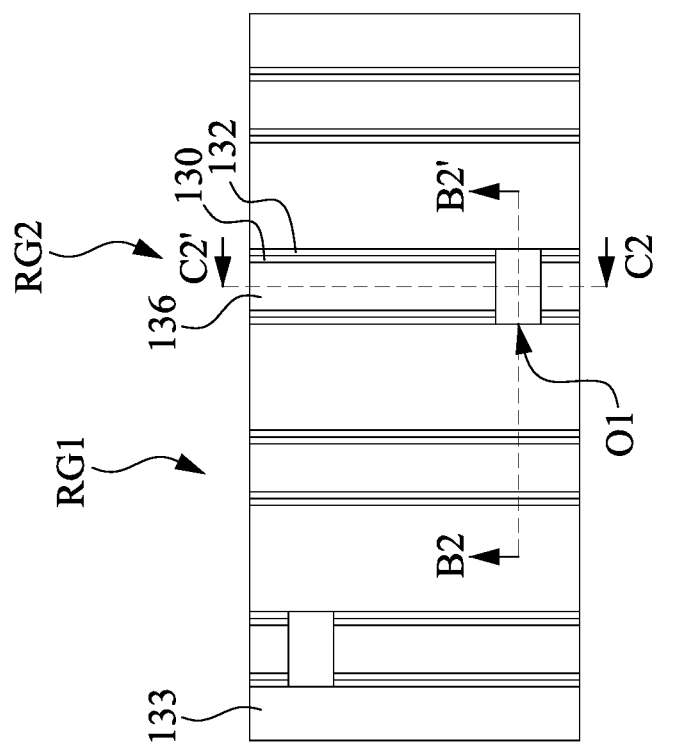
Fig. 14B
Fig. 14A

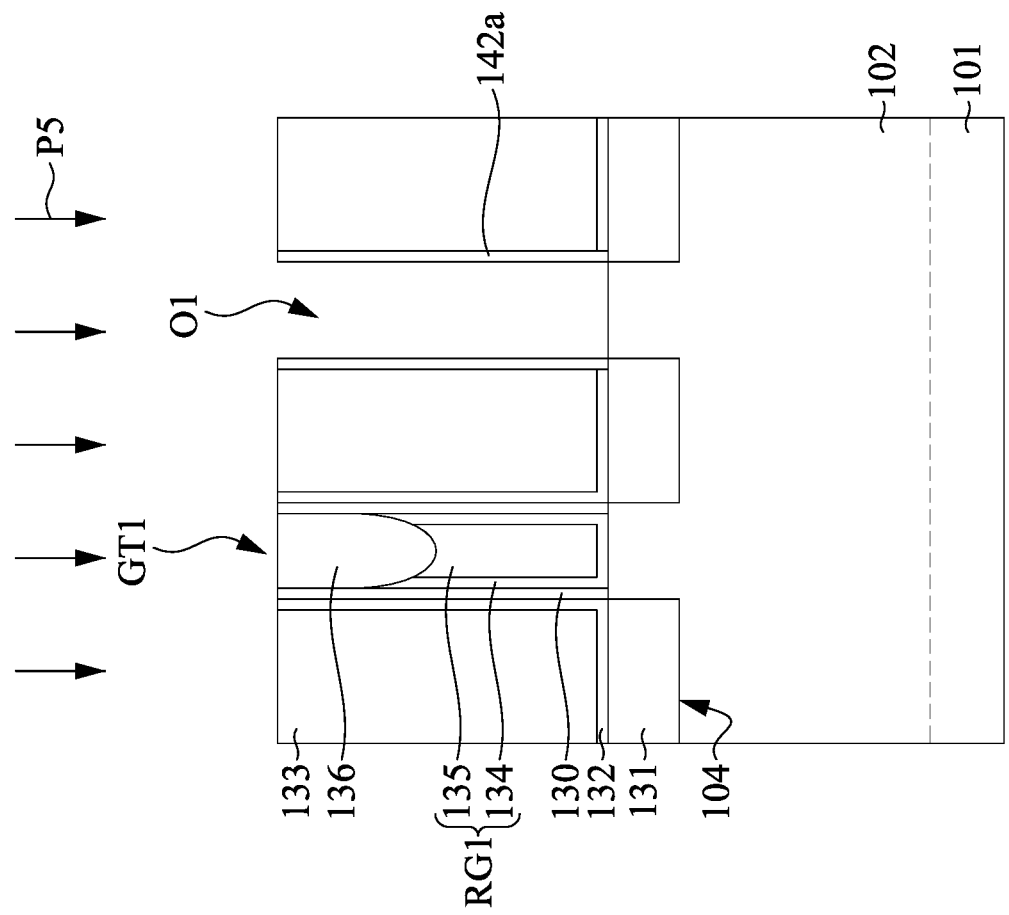
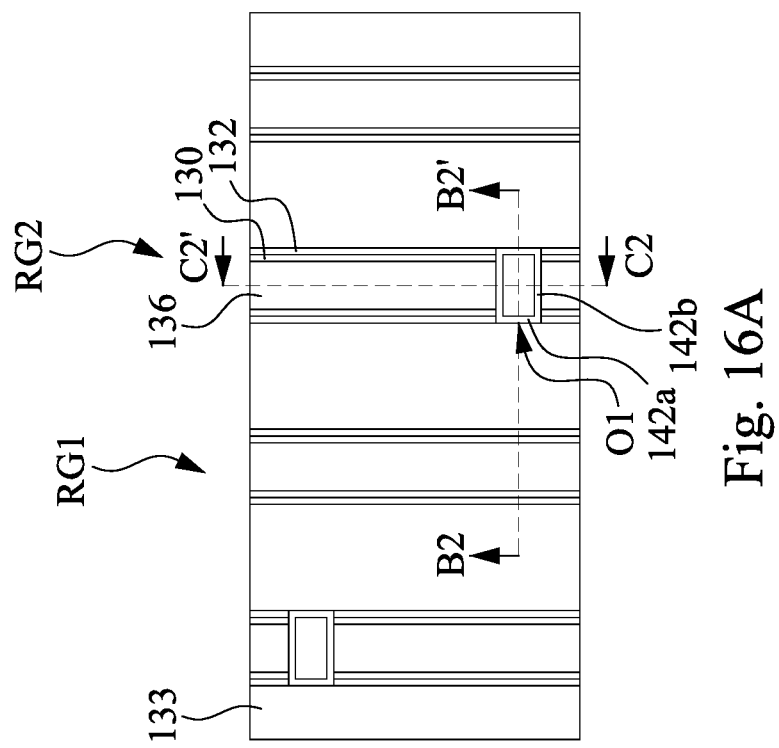

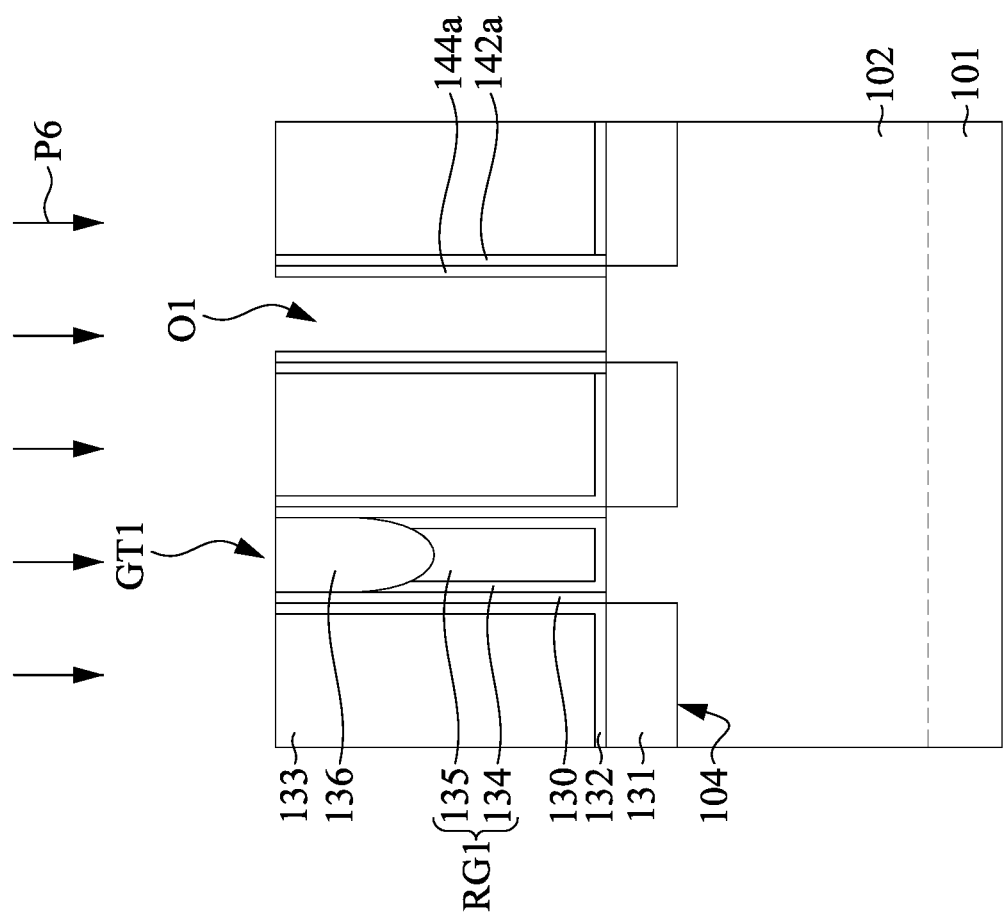
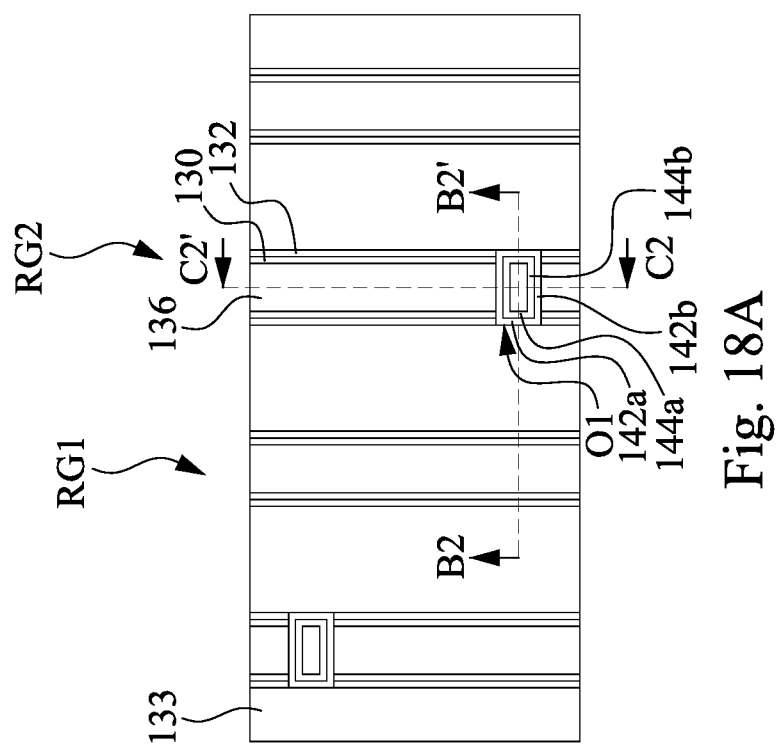
Fig. 18B
Fig. 18A

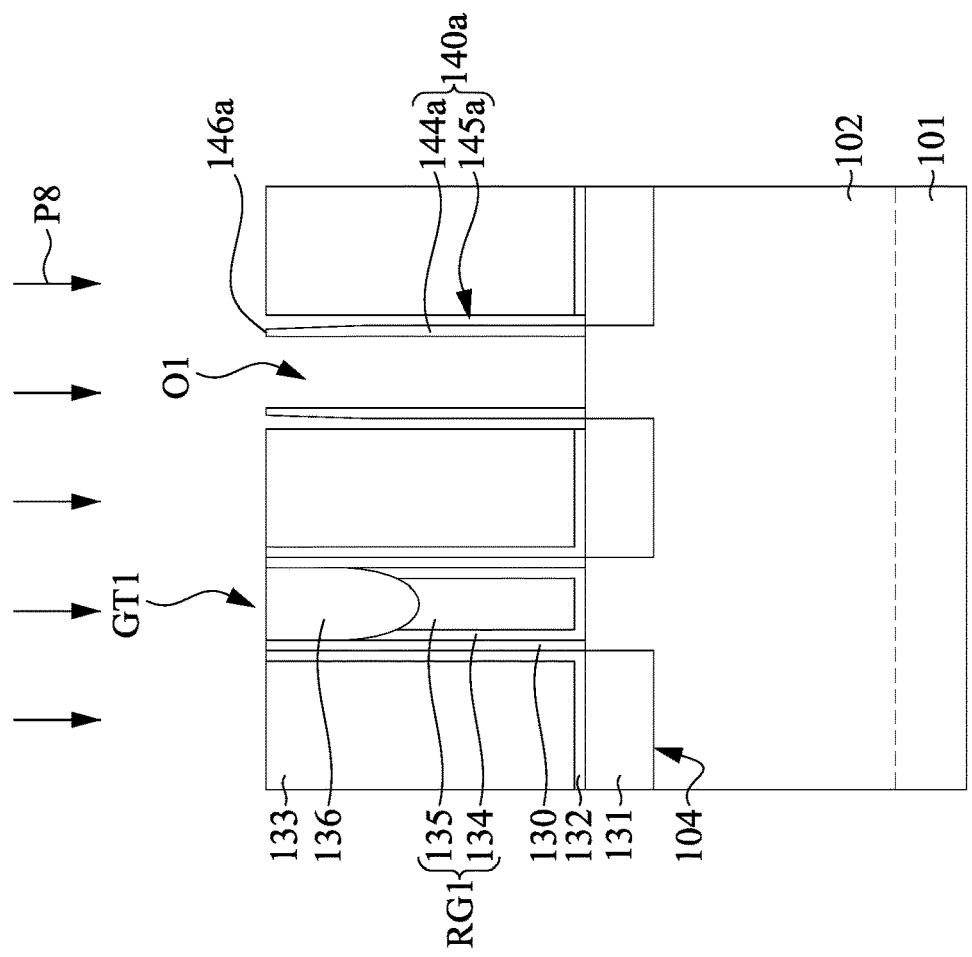
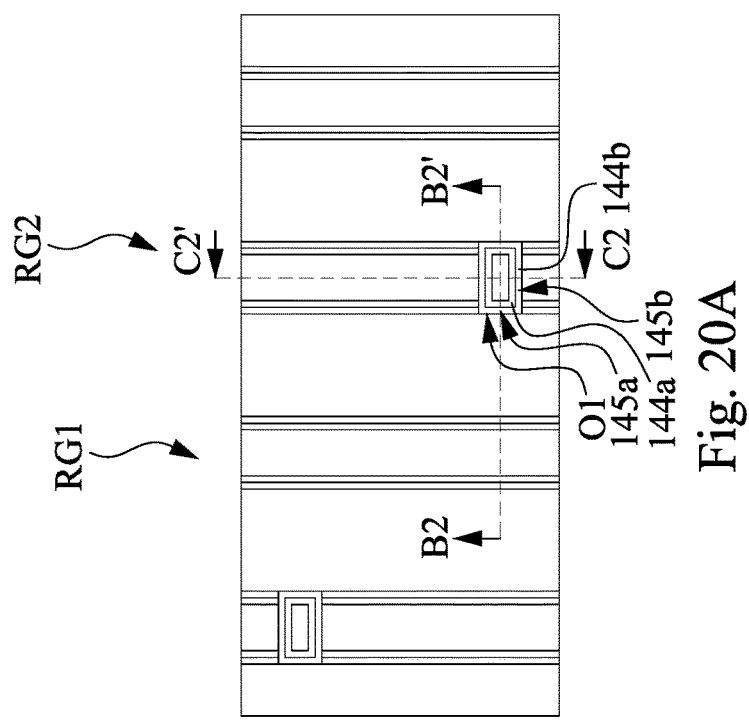
Fig. 20B
Fig. 20A

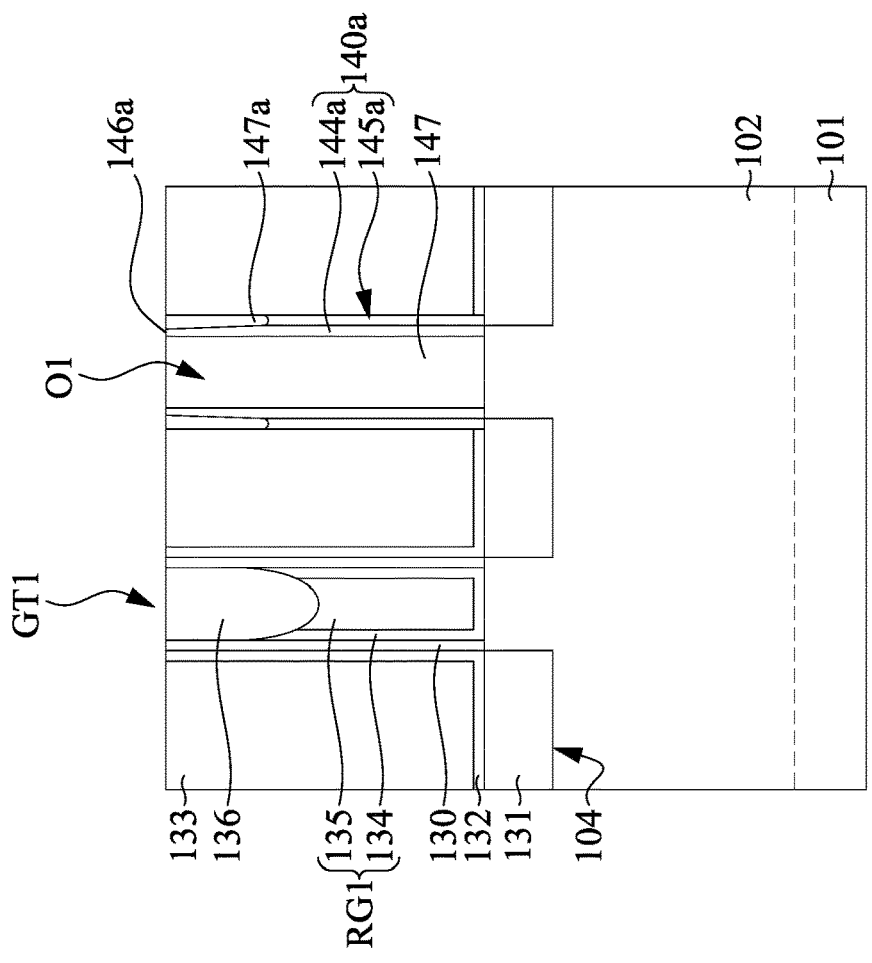
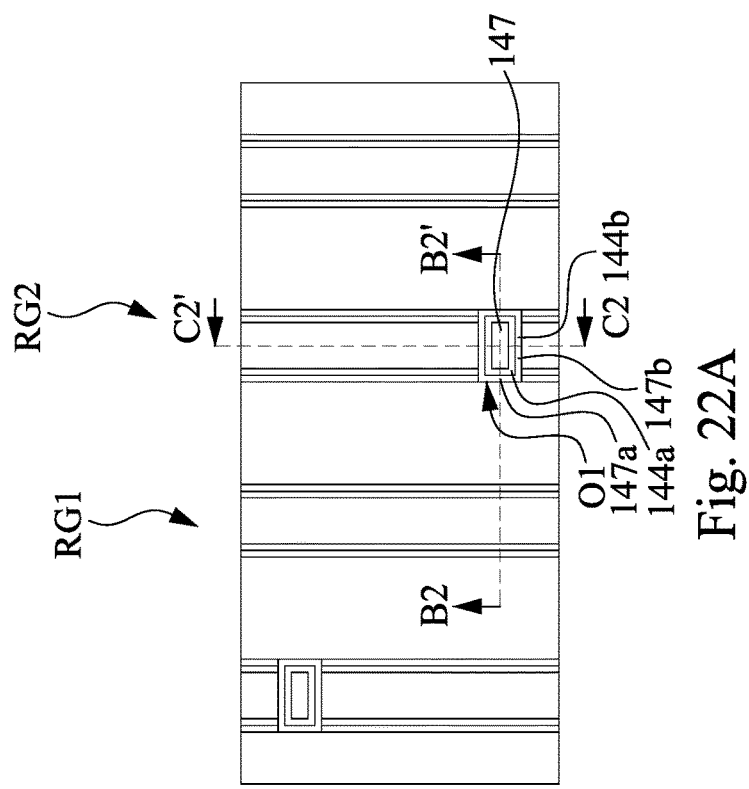
Fig. 22B
Fig. 22A

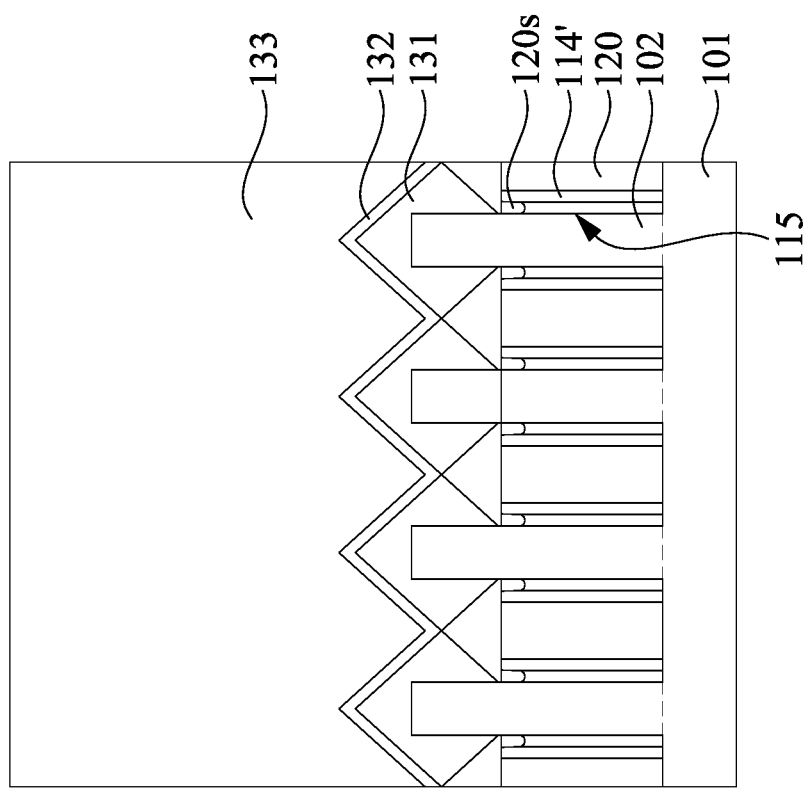

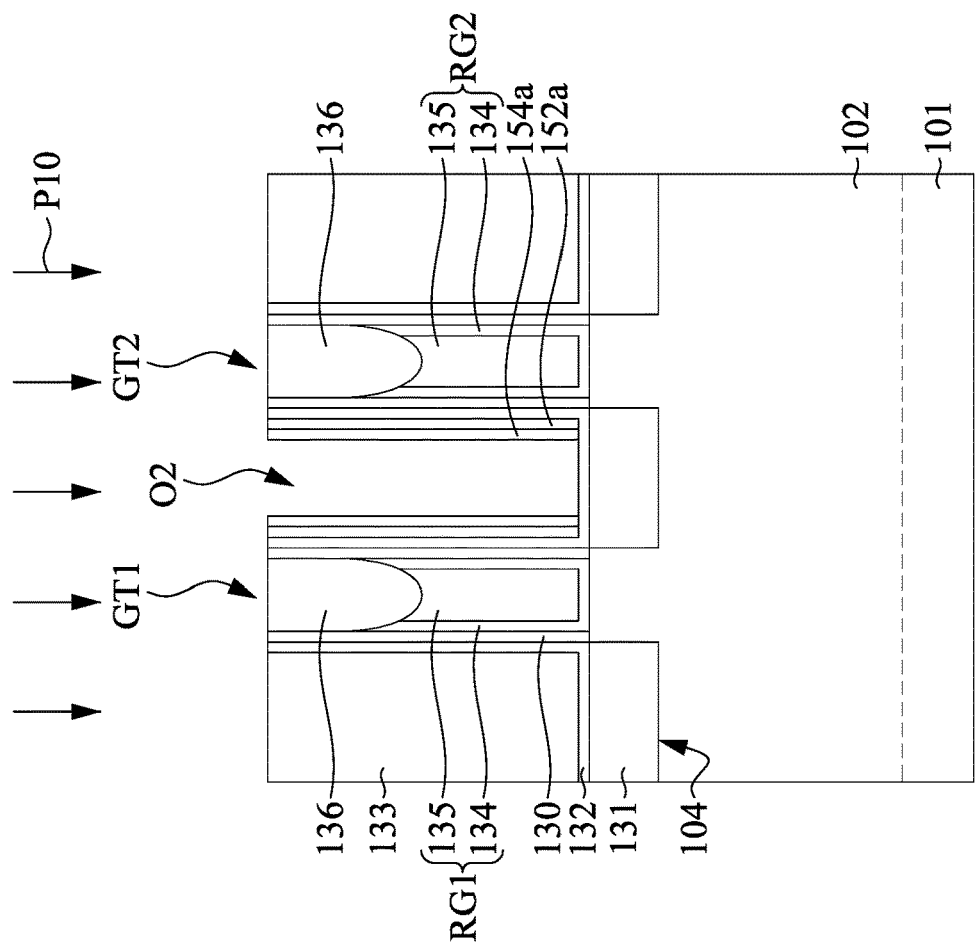
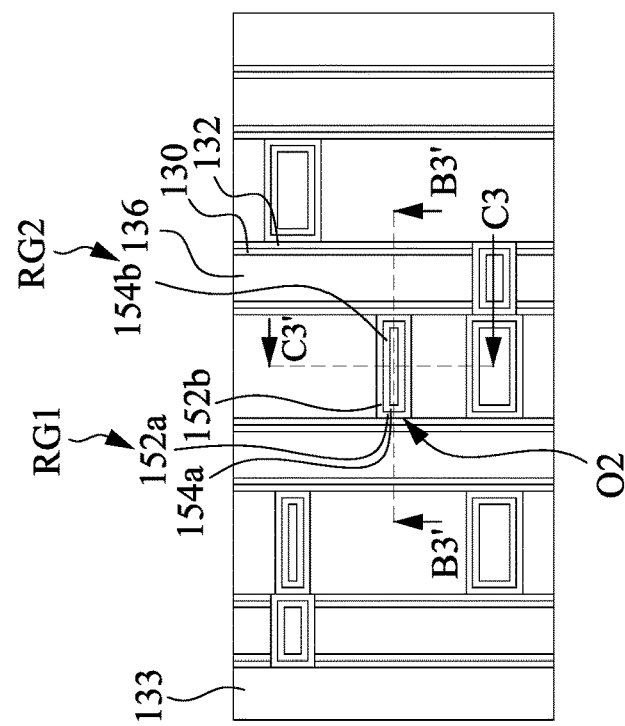
Fig. 28B
Fig. 28A

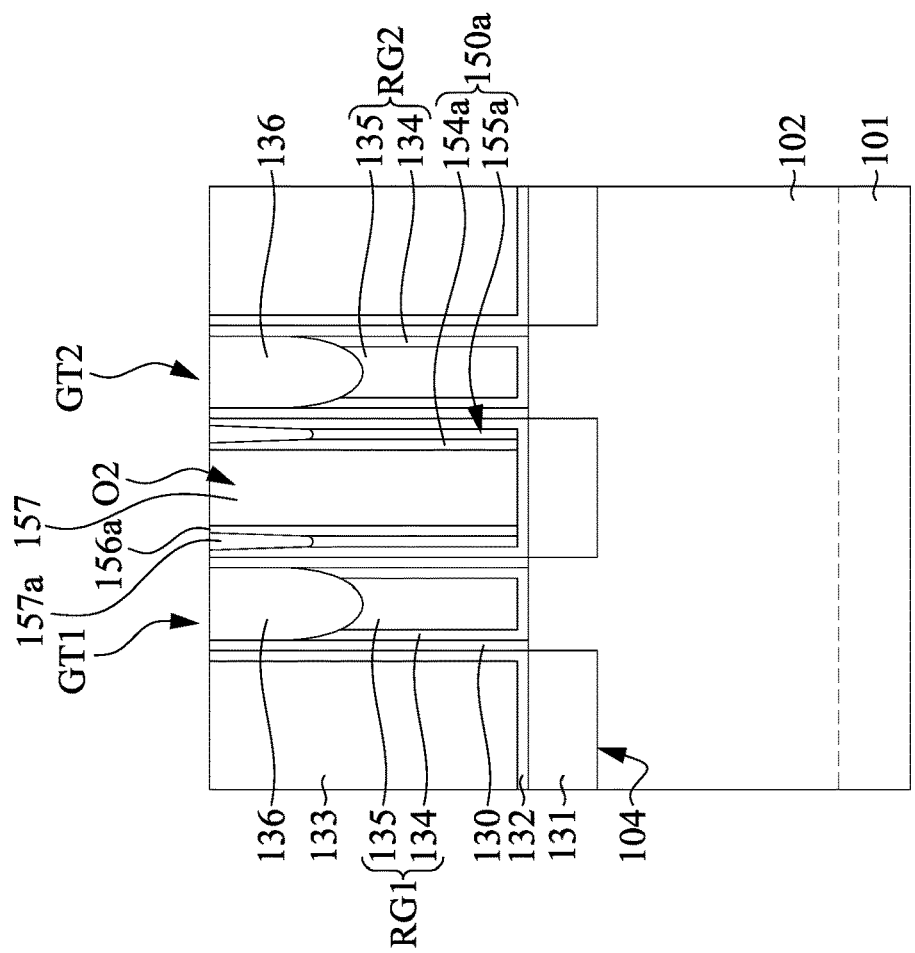
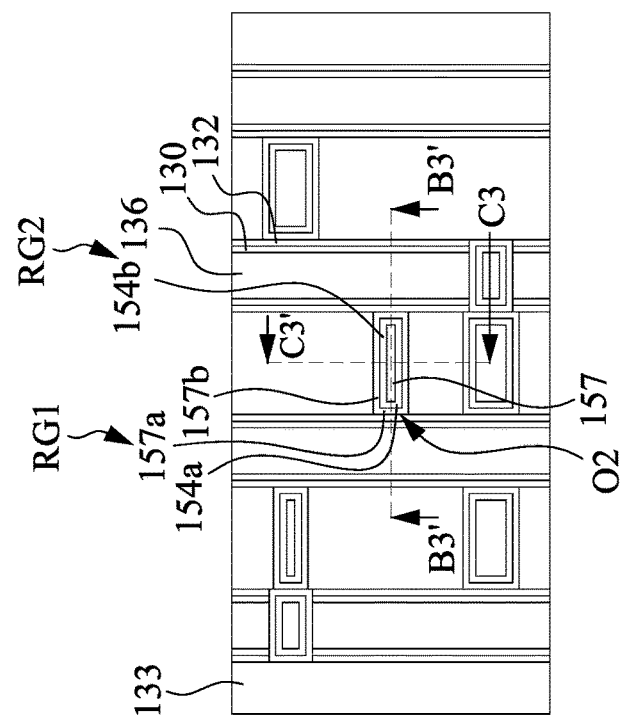
Fig. 32B
Fig. 32A

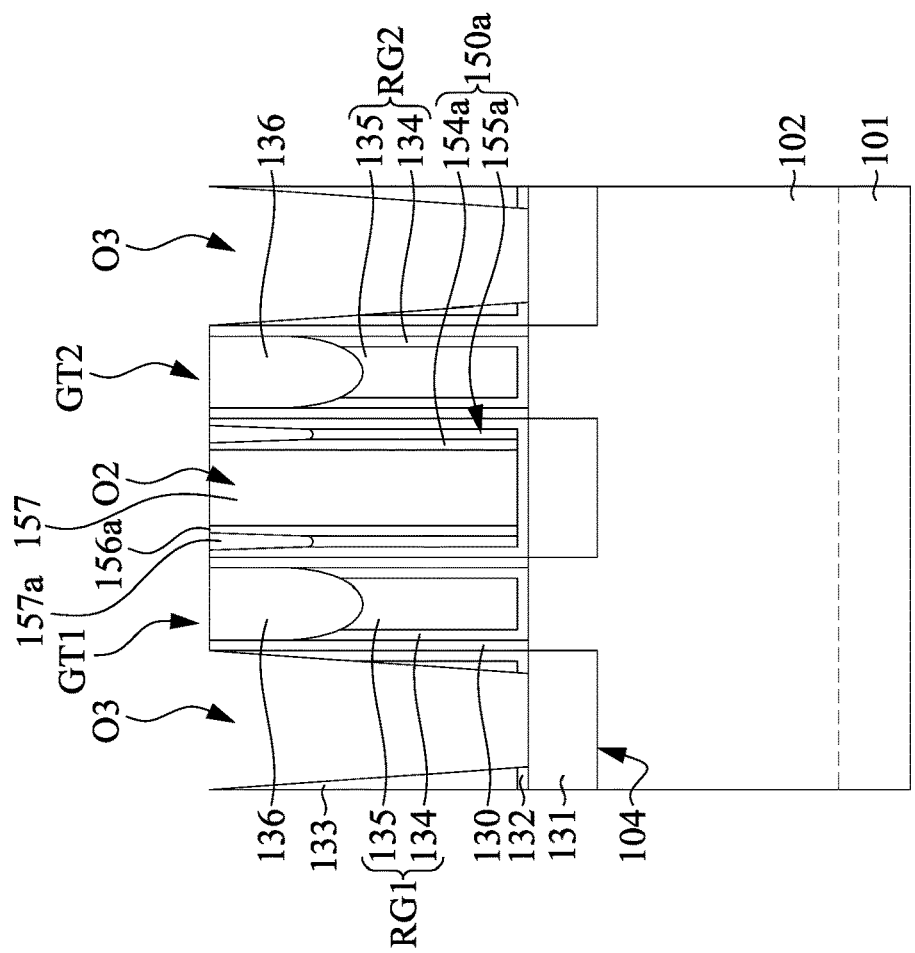
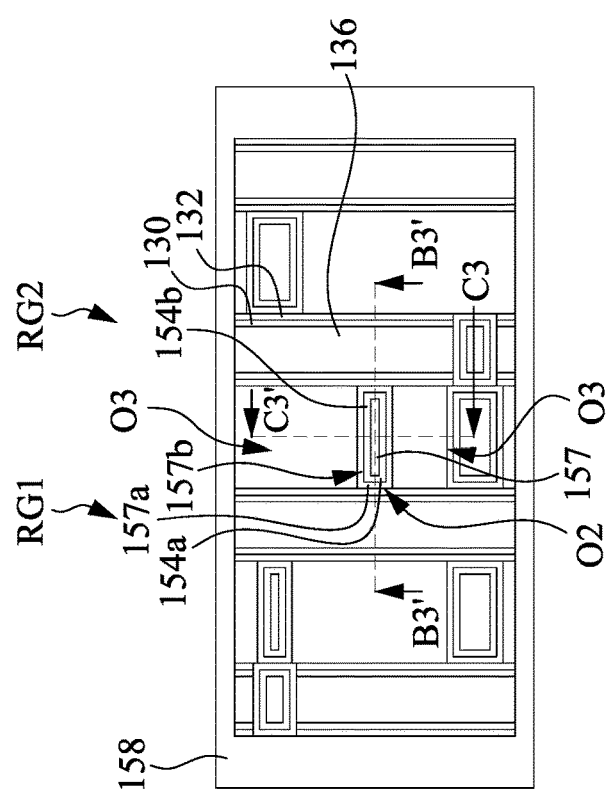
Fig. 34B
Fig. 34A

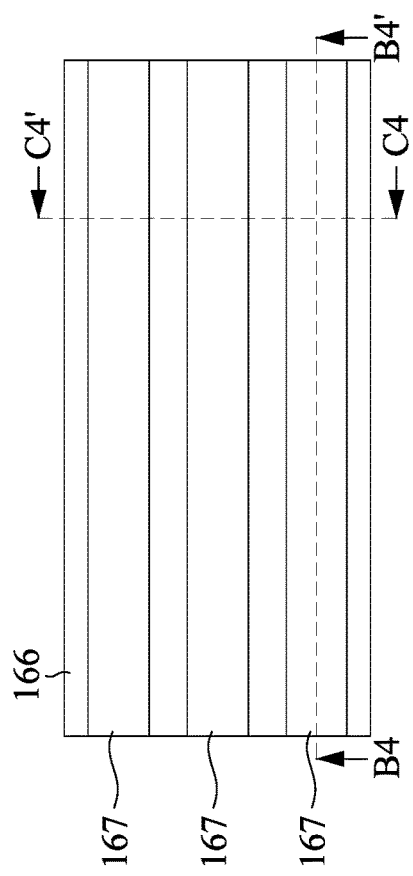
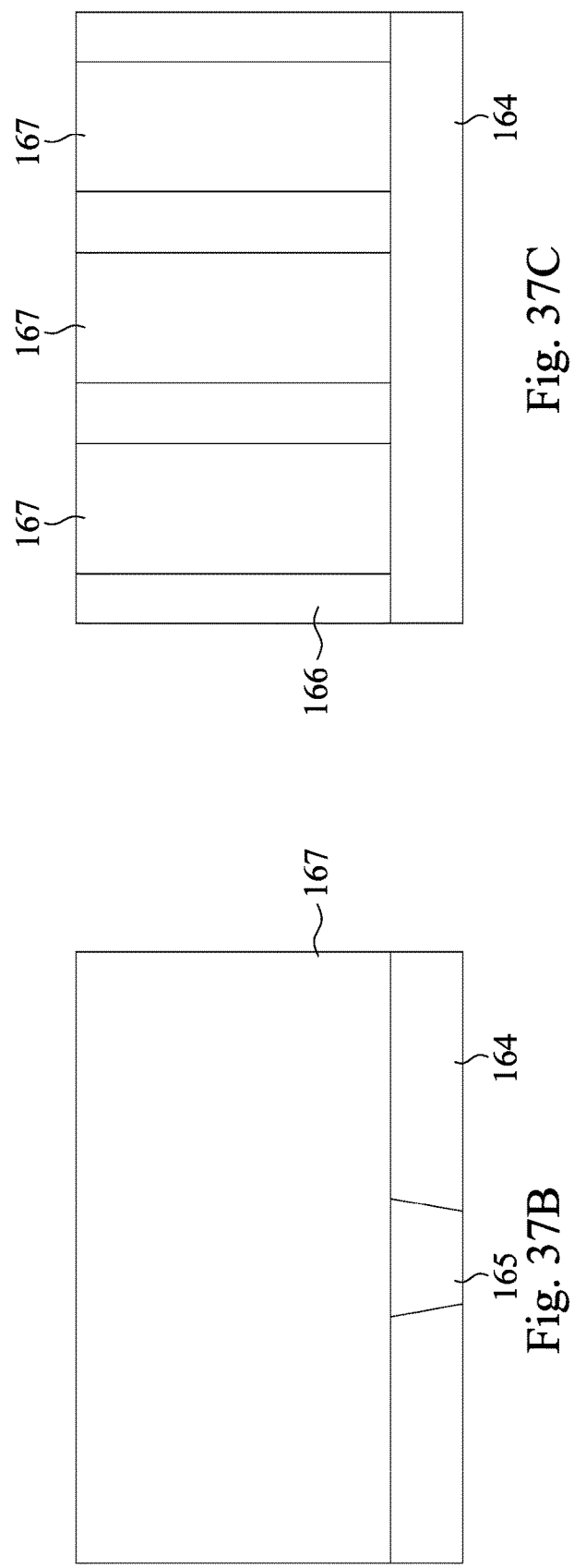
Fig. 37A
Fig. 37B
Fig. 37C

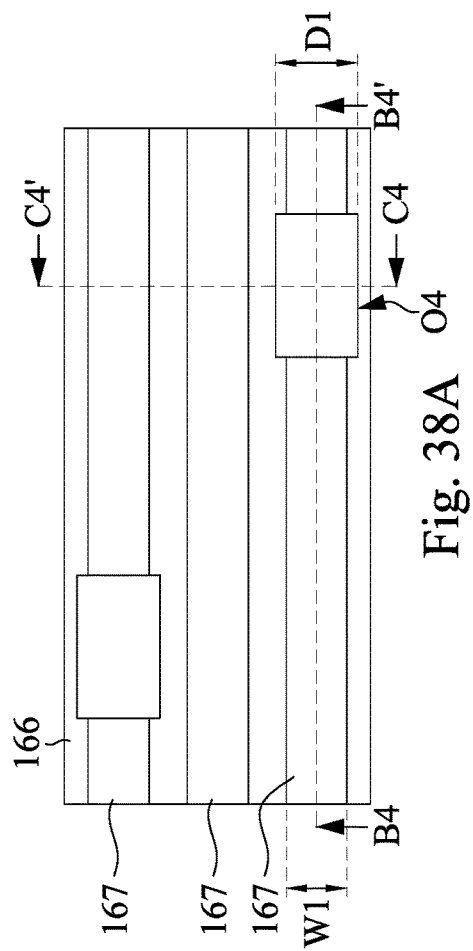
Fig. 38A
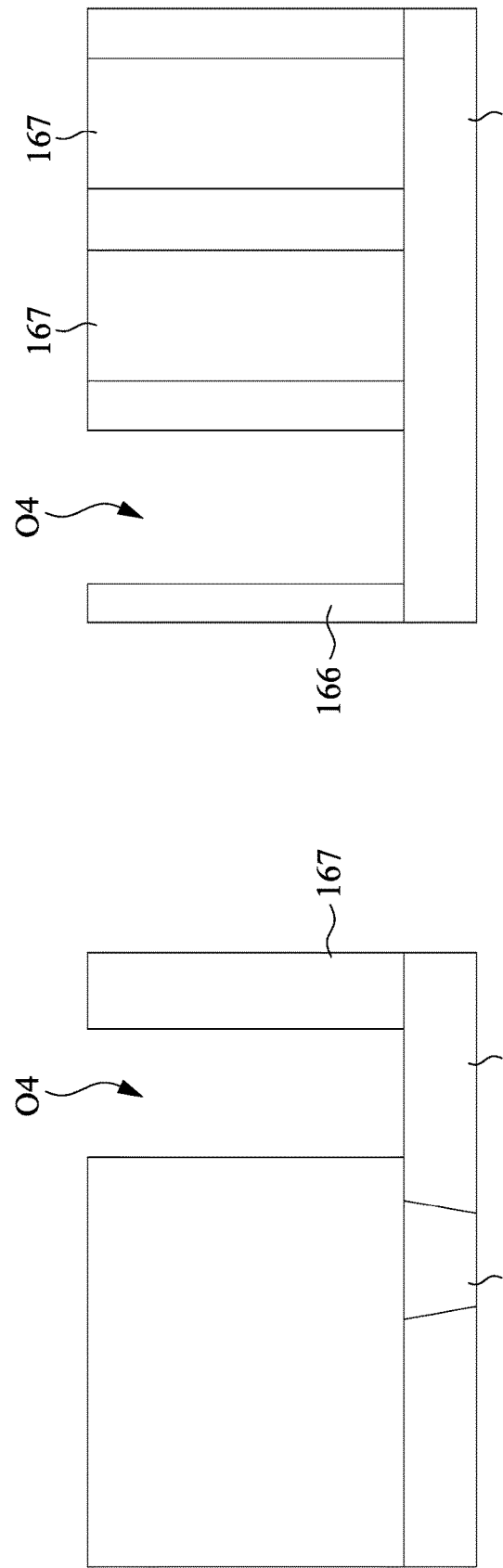
Fig. 38C
Fig. 38B

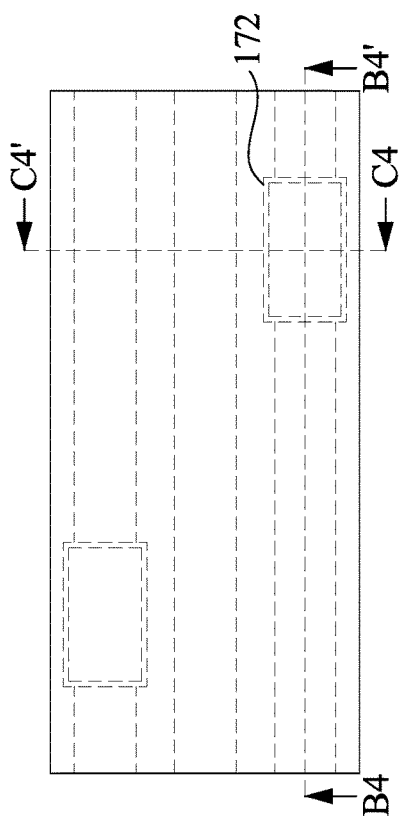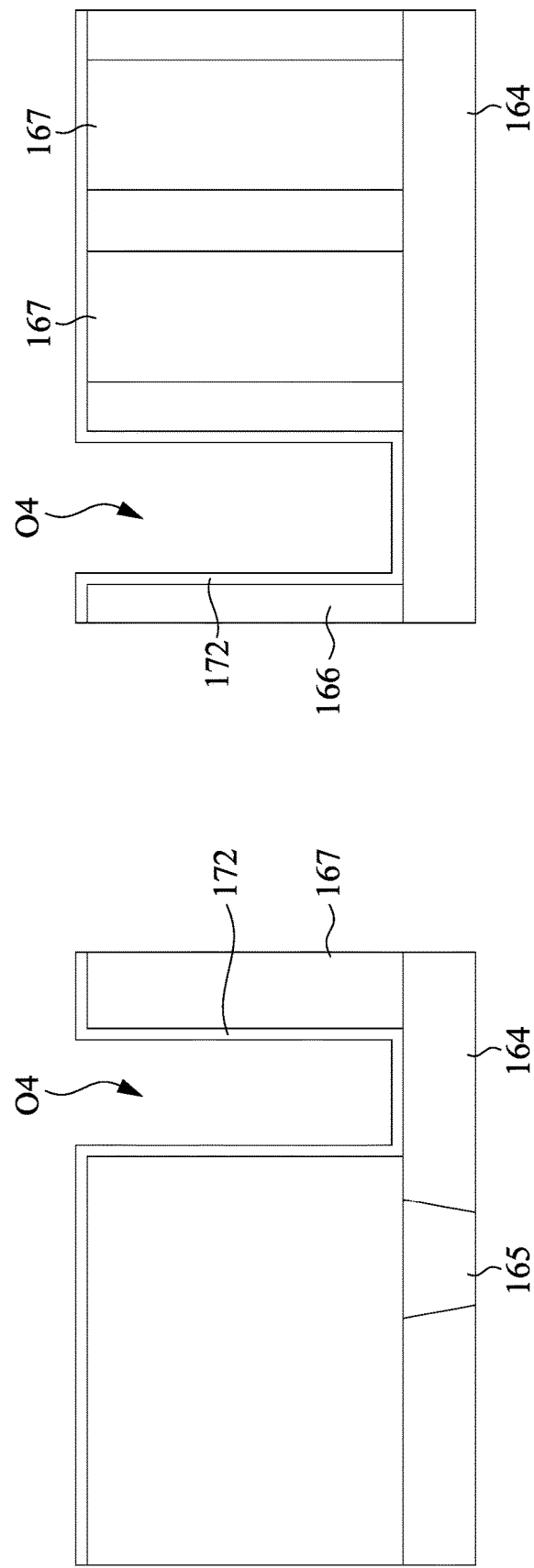
Fig. 39A
Fig. 39B
Fig. 39C

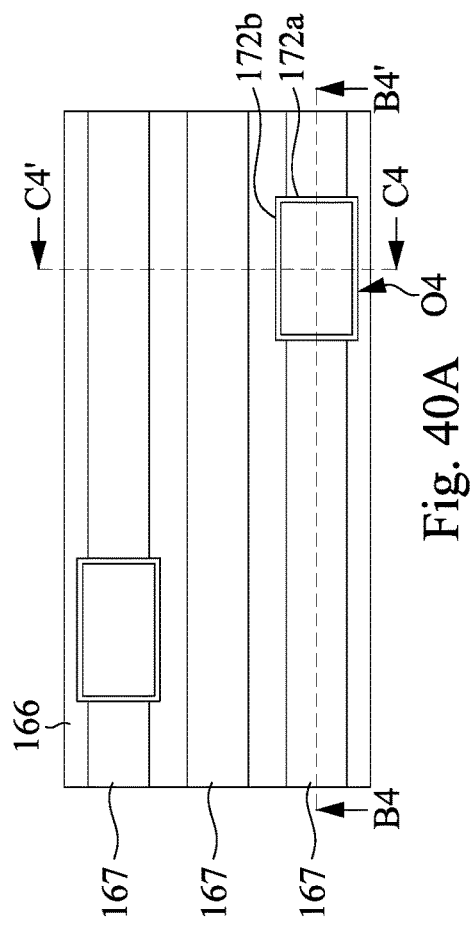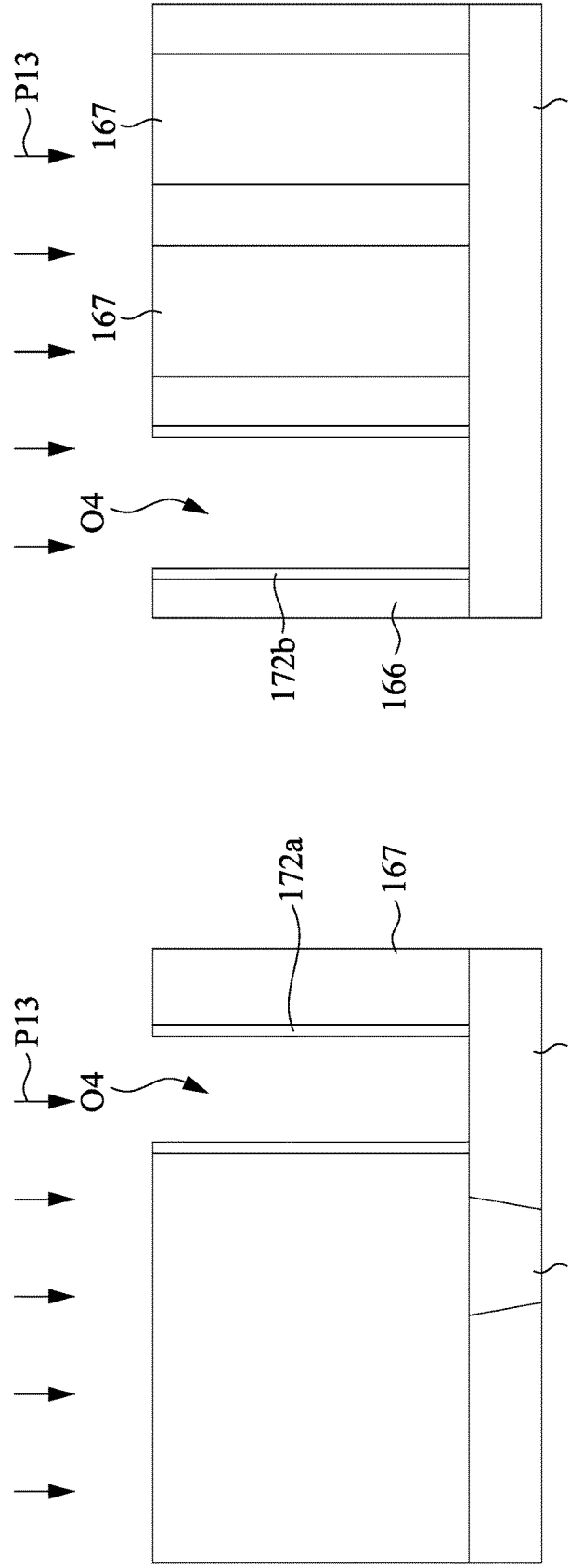

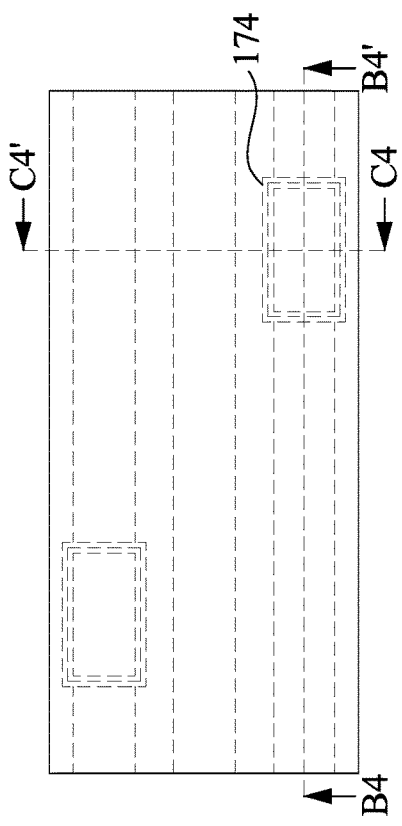
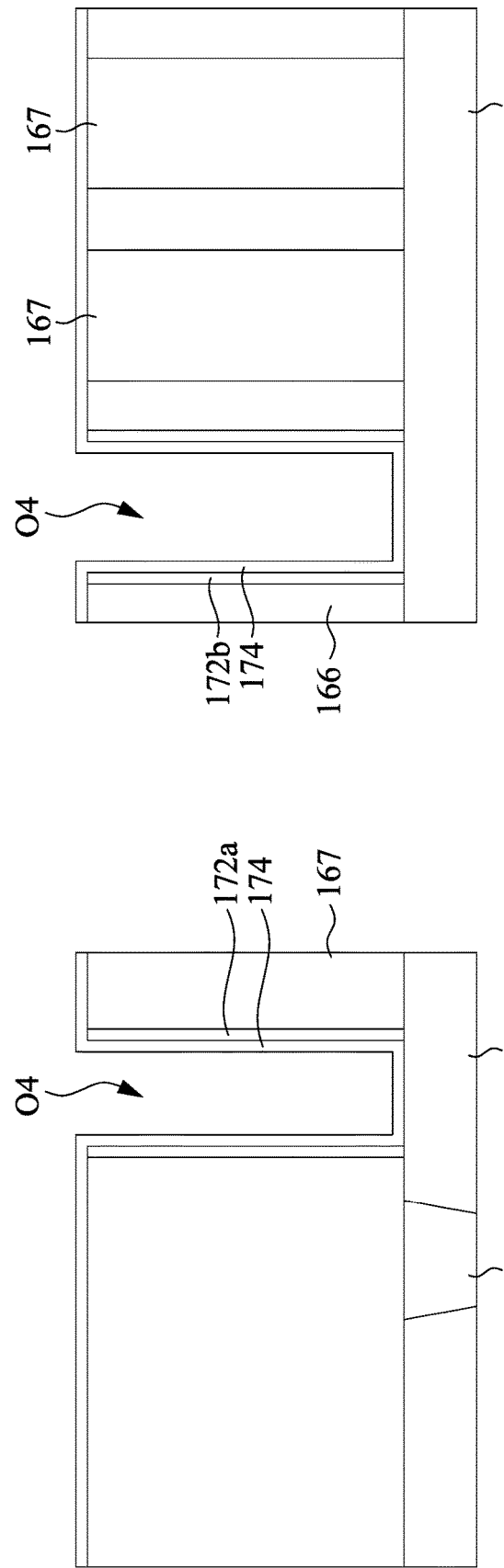
Fig. 41A
Fig. 41B
Fig. 41C

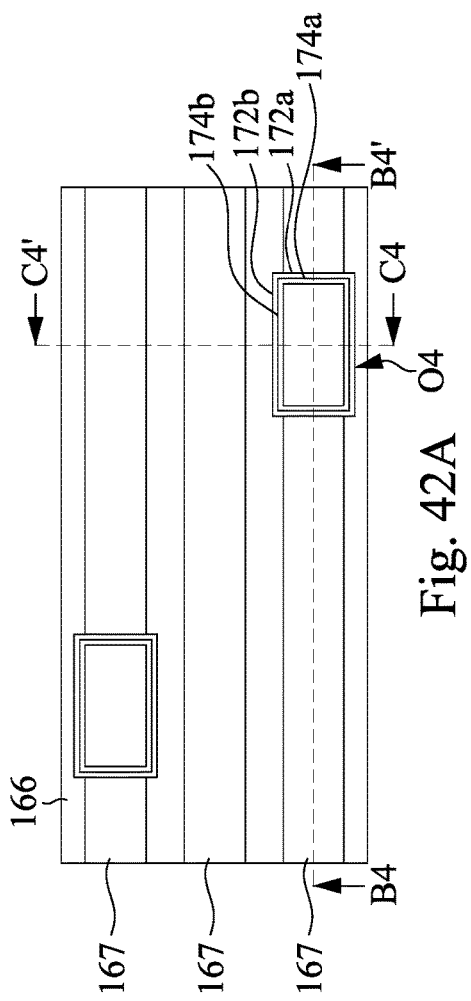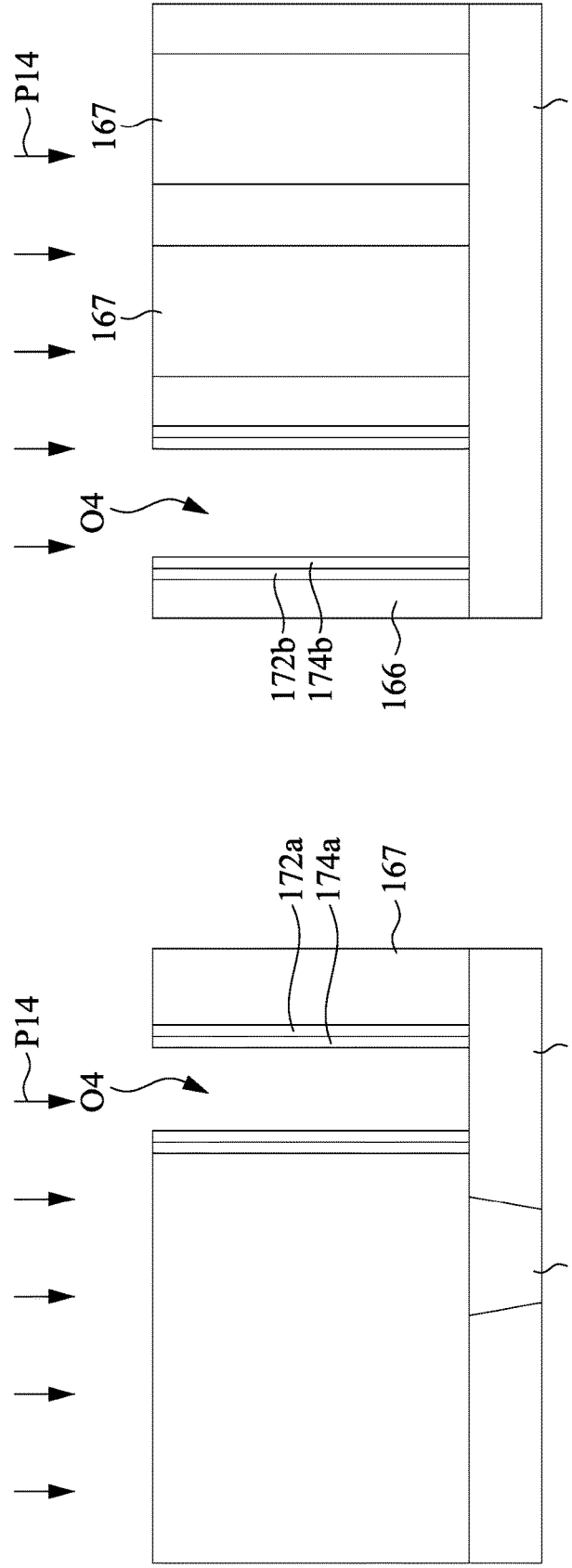
Fig. 42A
Fig. 42B
Fig. 42C

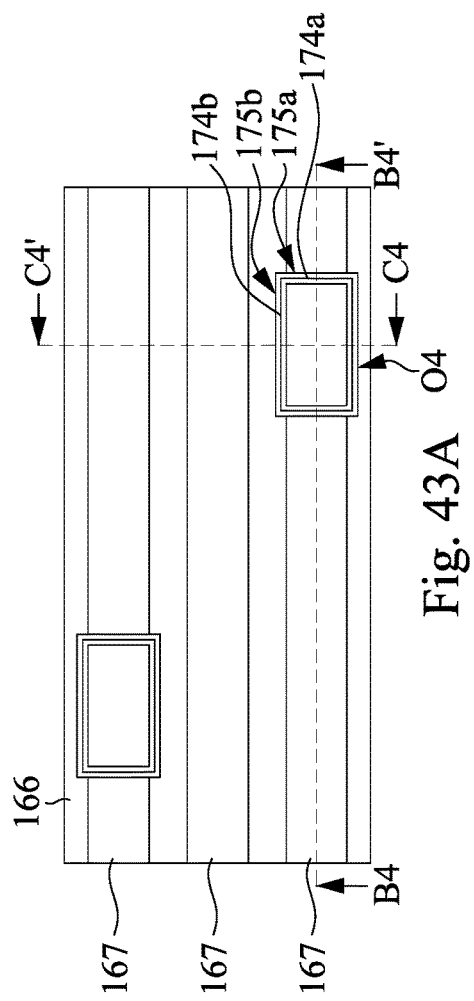
Fig. 43A
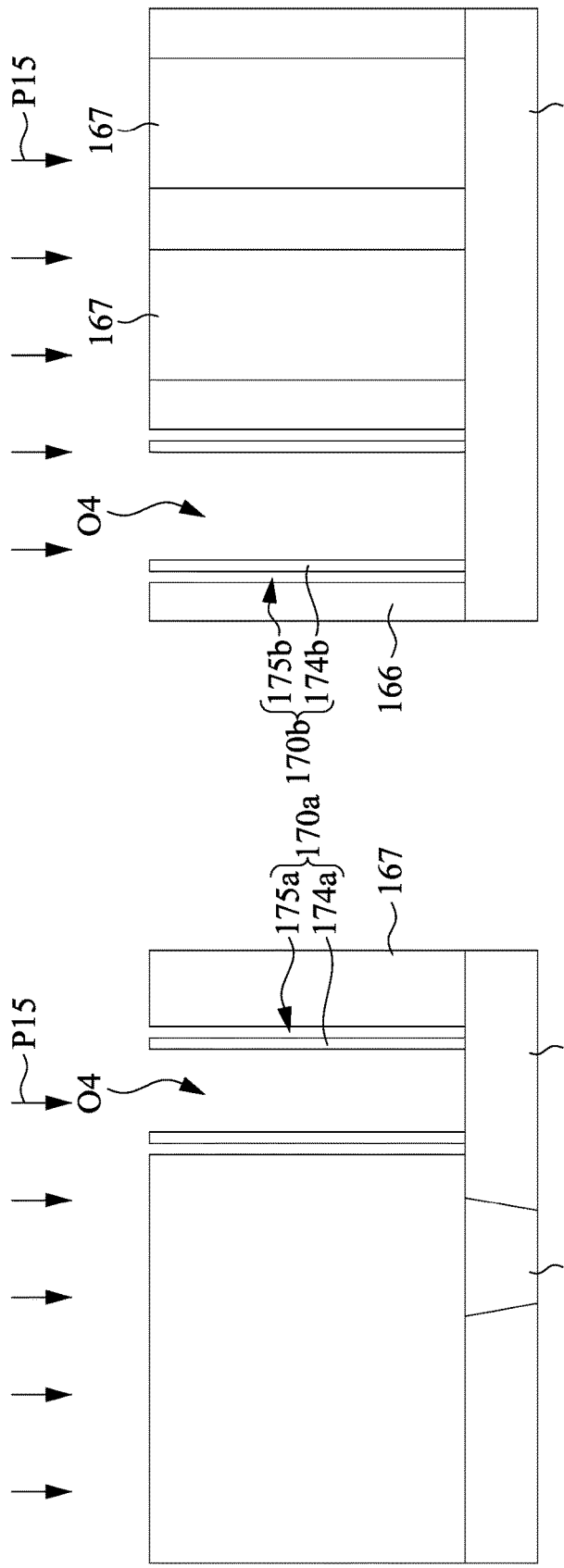
Fig. 43B
Fig. 43C

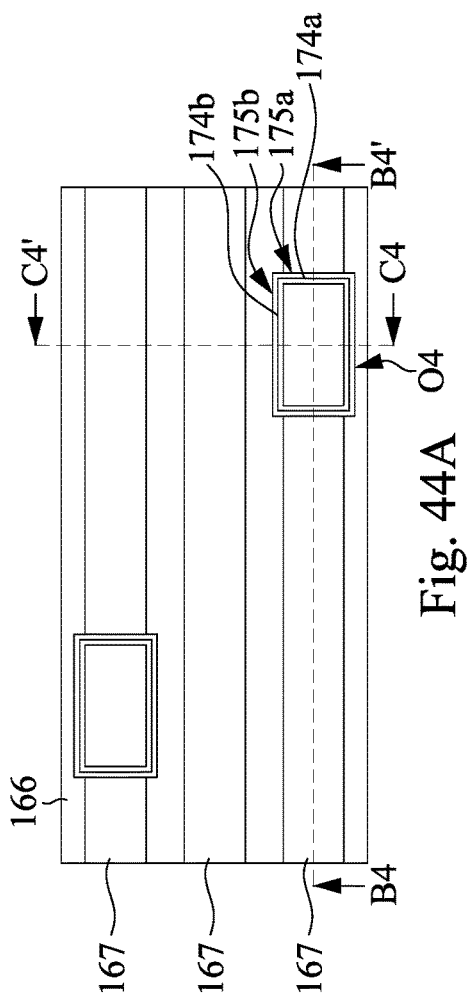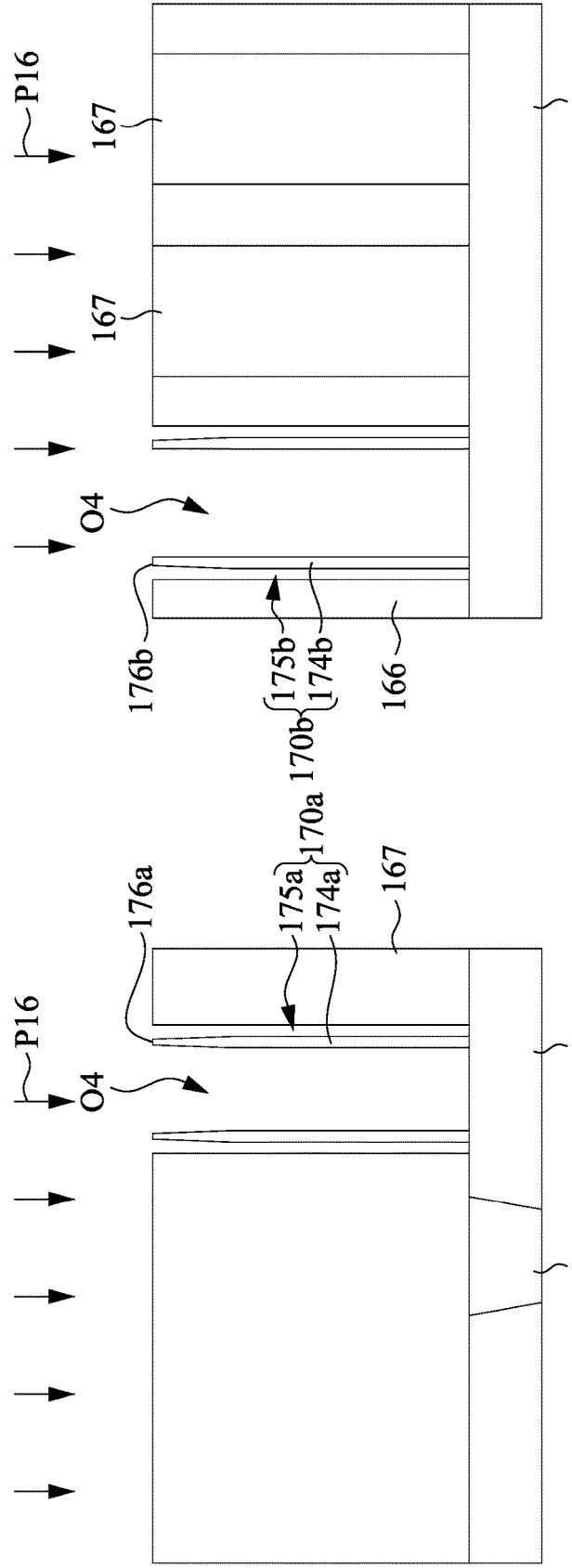
Fig. 44A
Fig. 44B
Fig. 44C

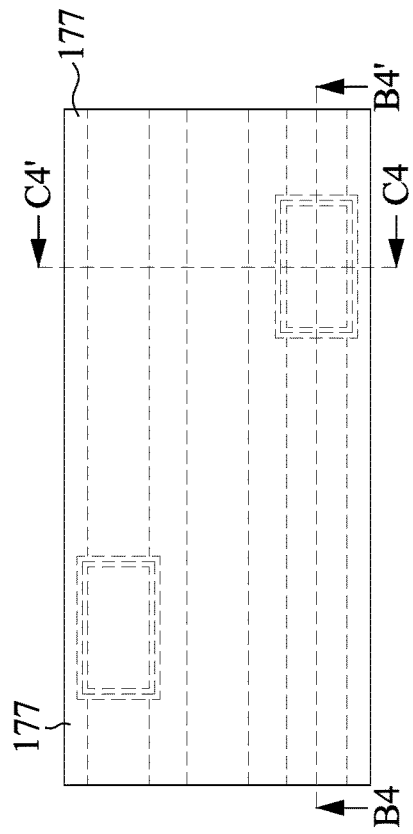
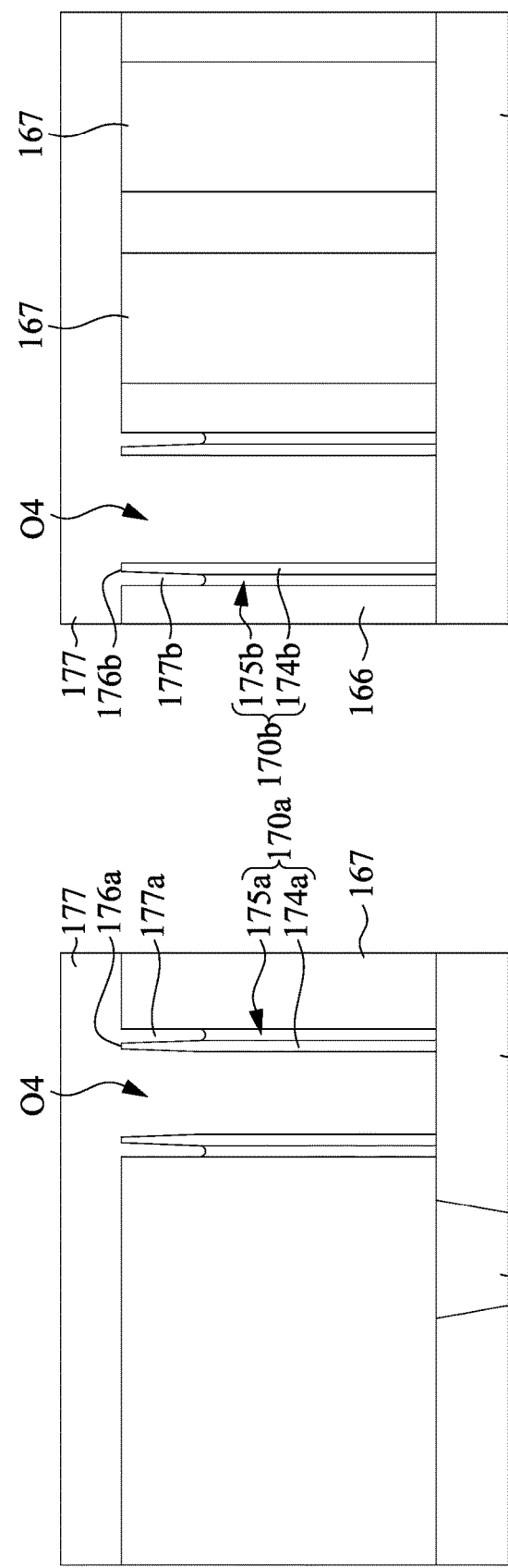
Fig. 45A
Fig. 45B
Fig. 45C

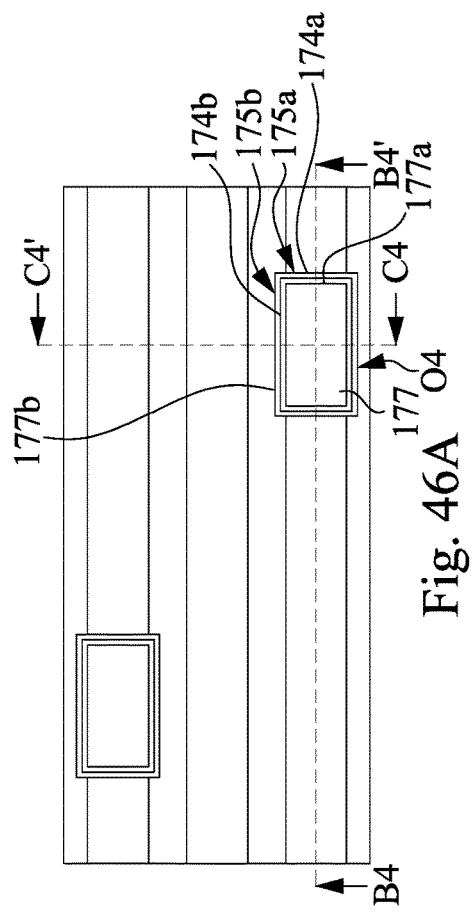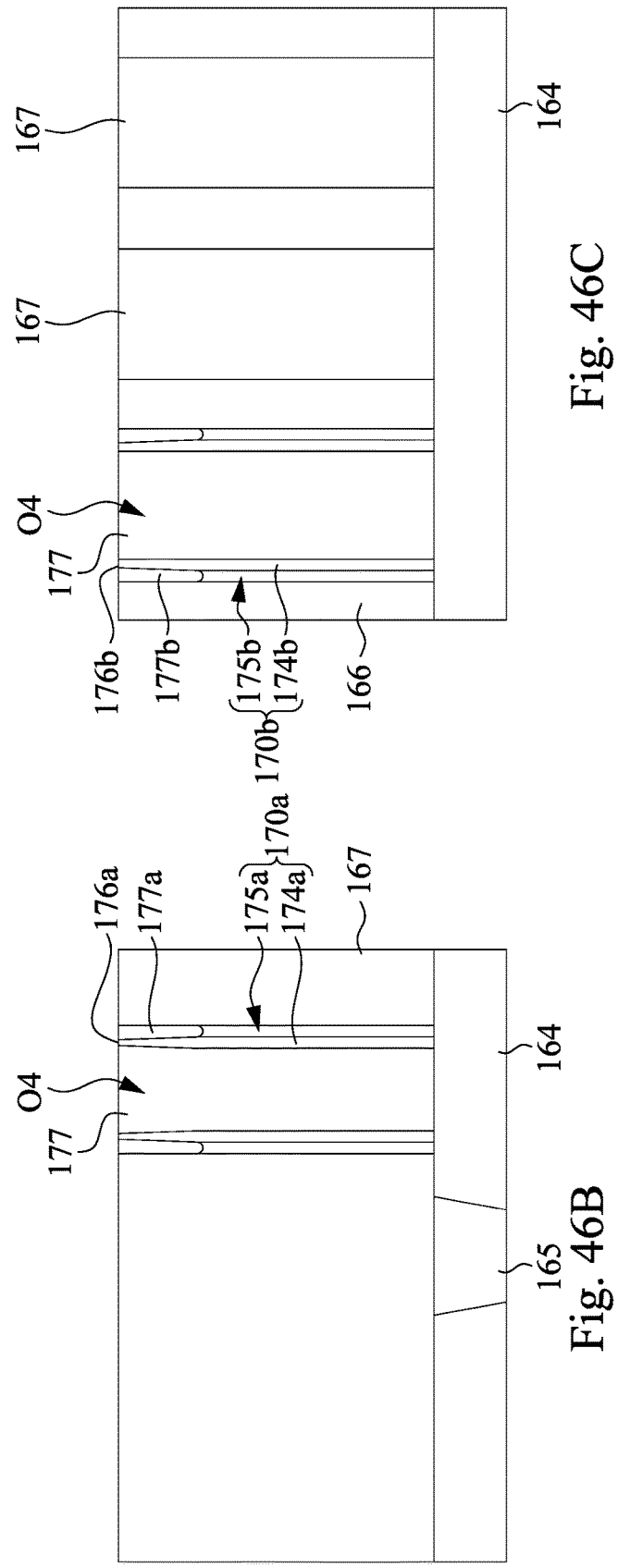

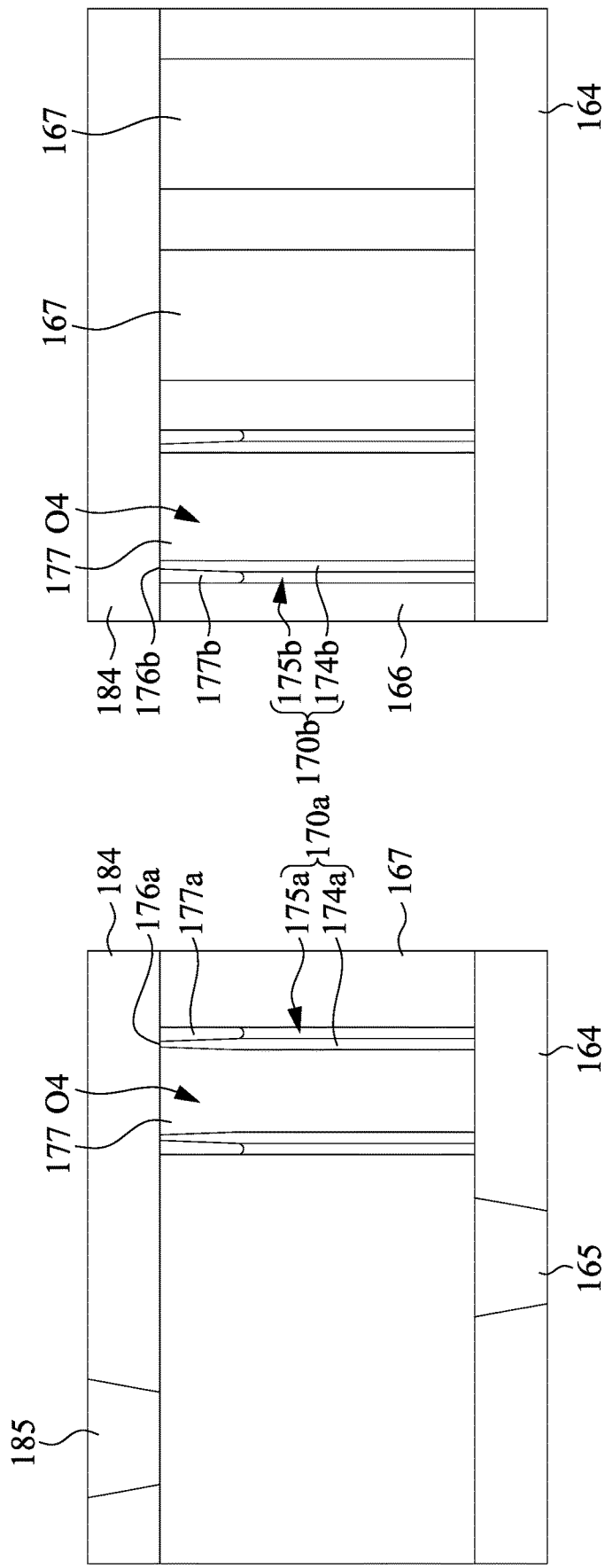

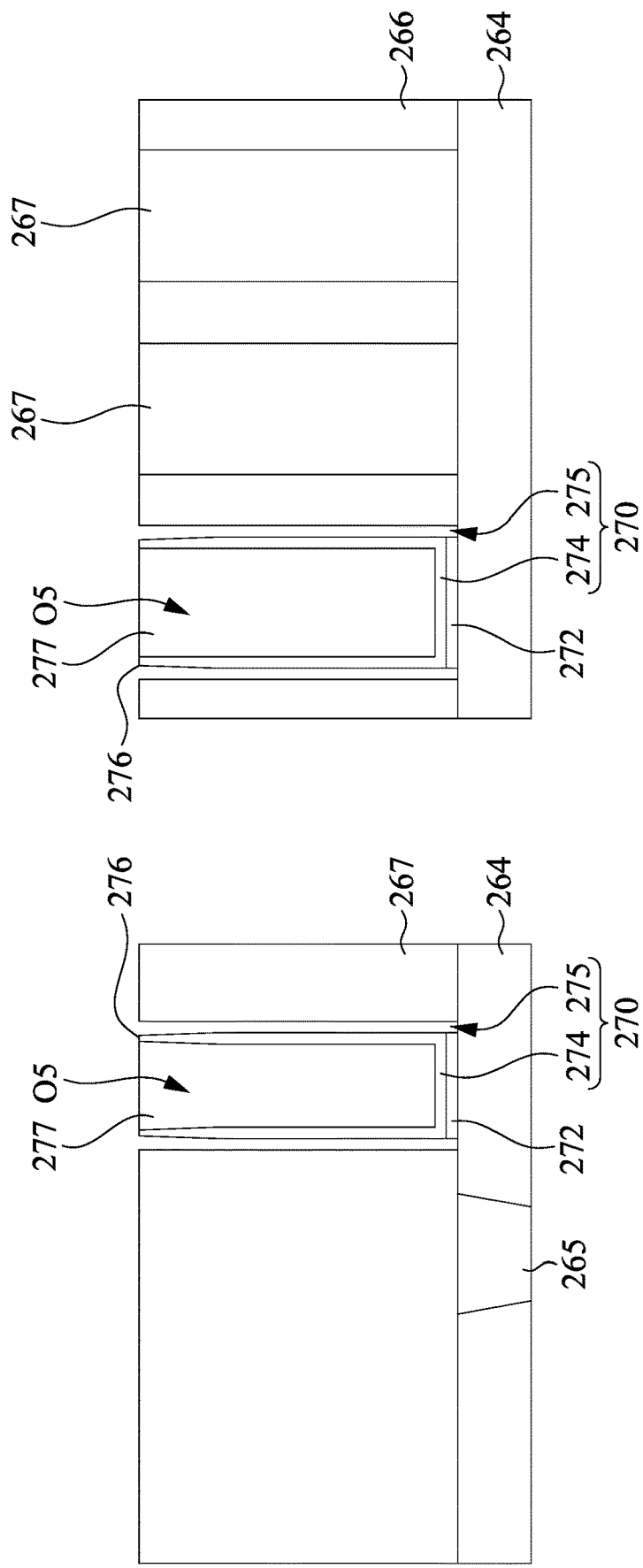

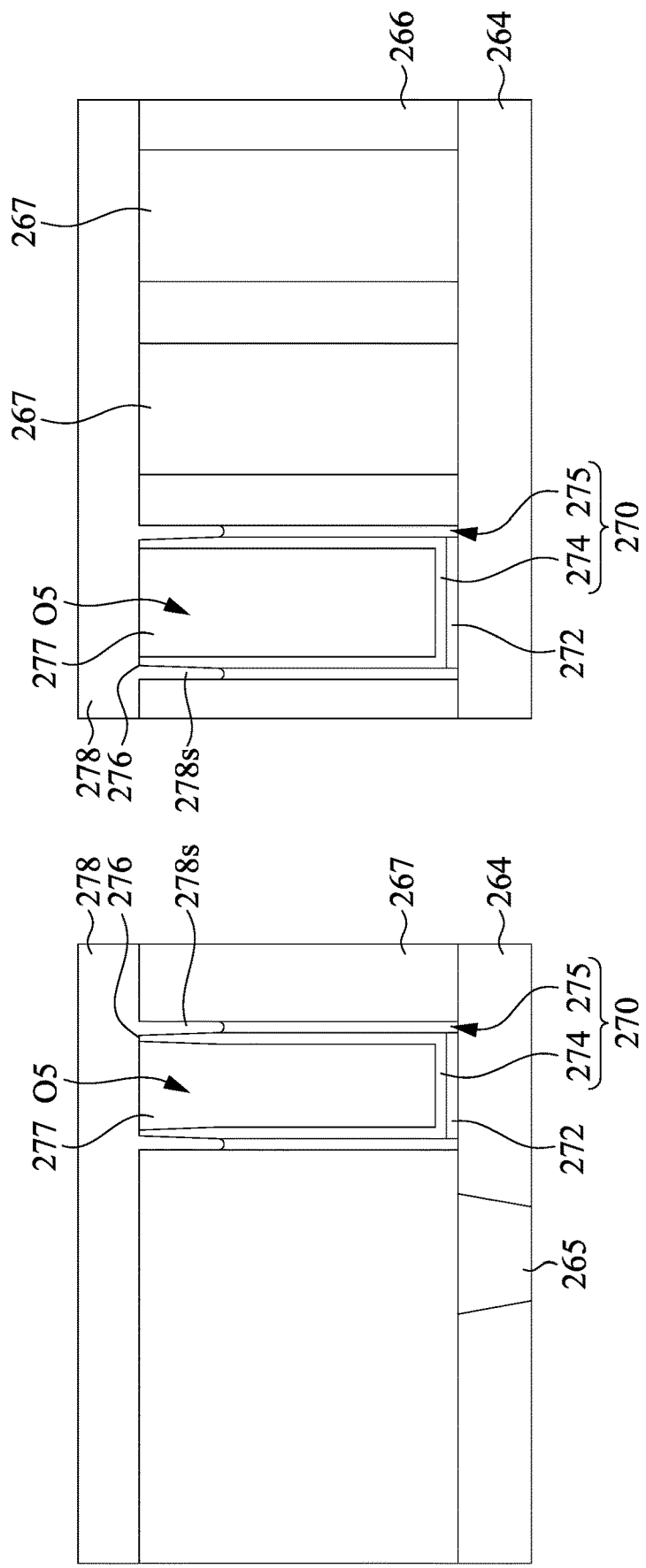

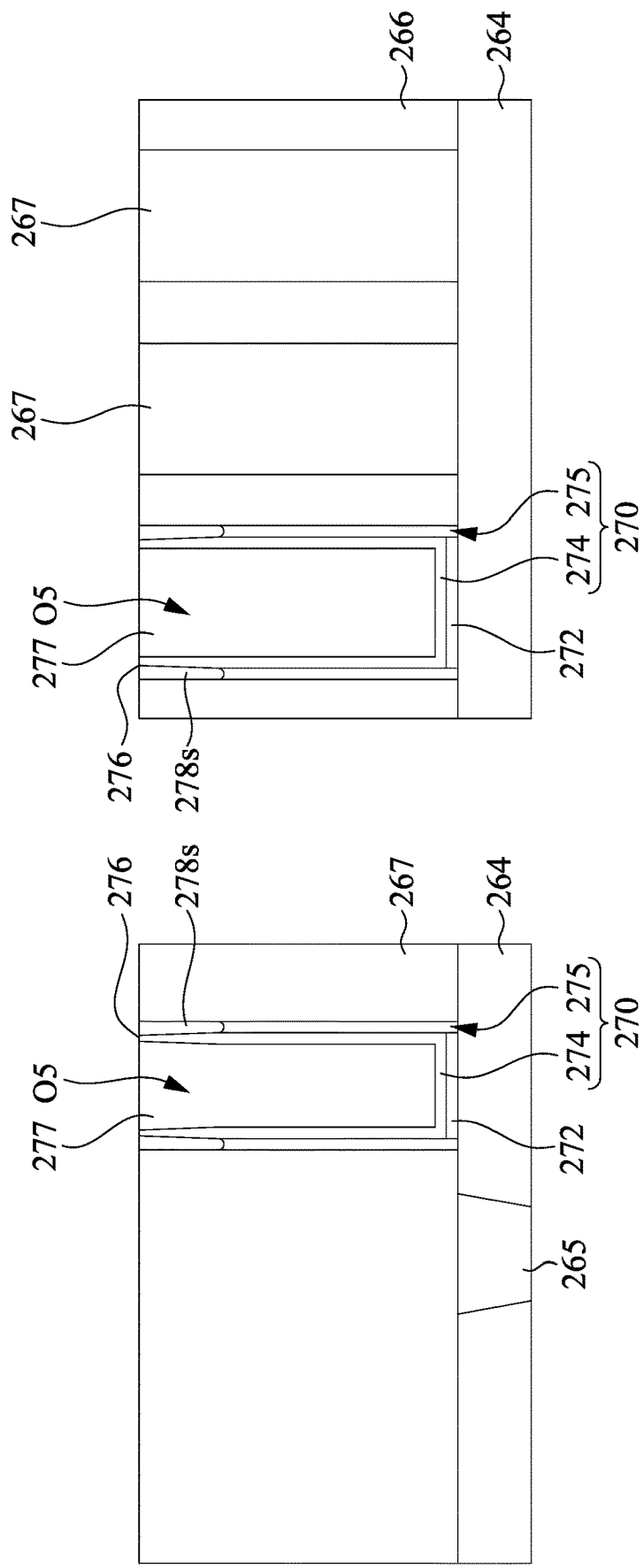

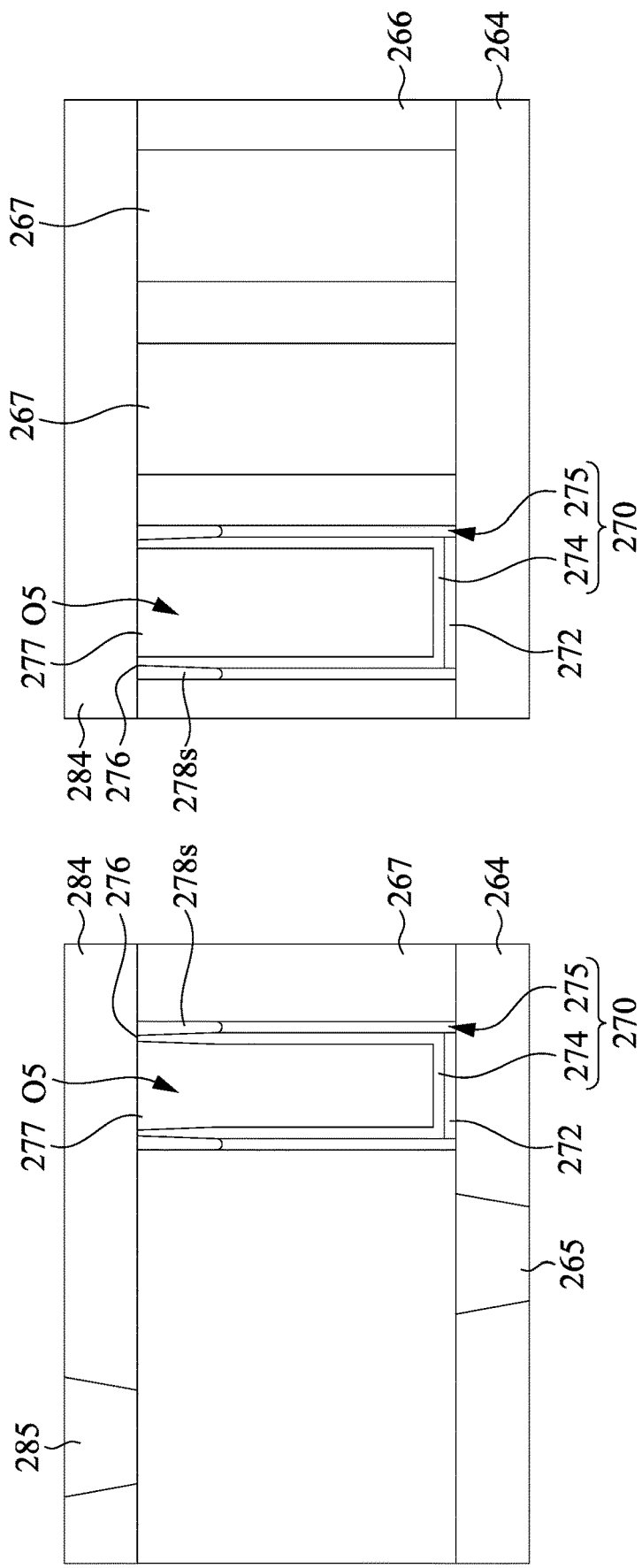

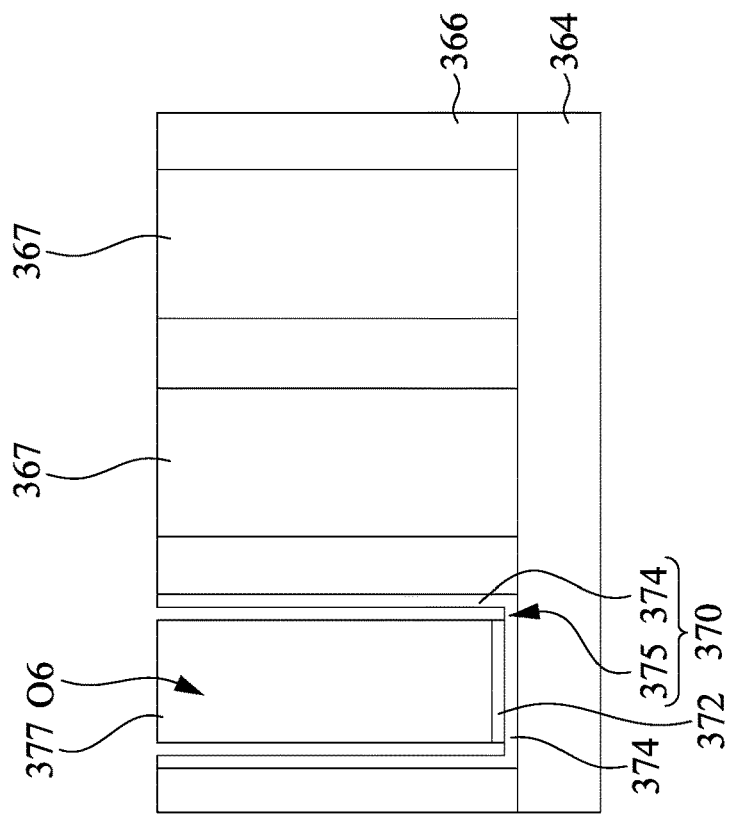
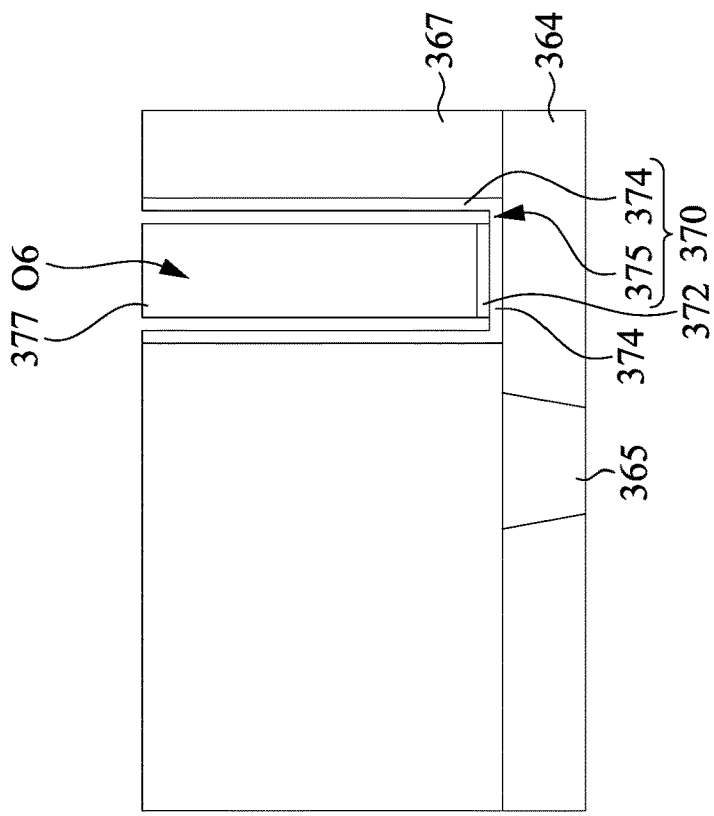
Fig. 57A
Fig. 57B

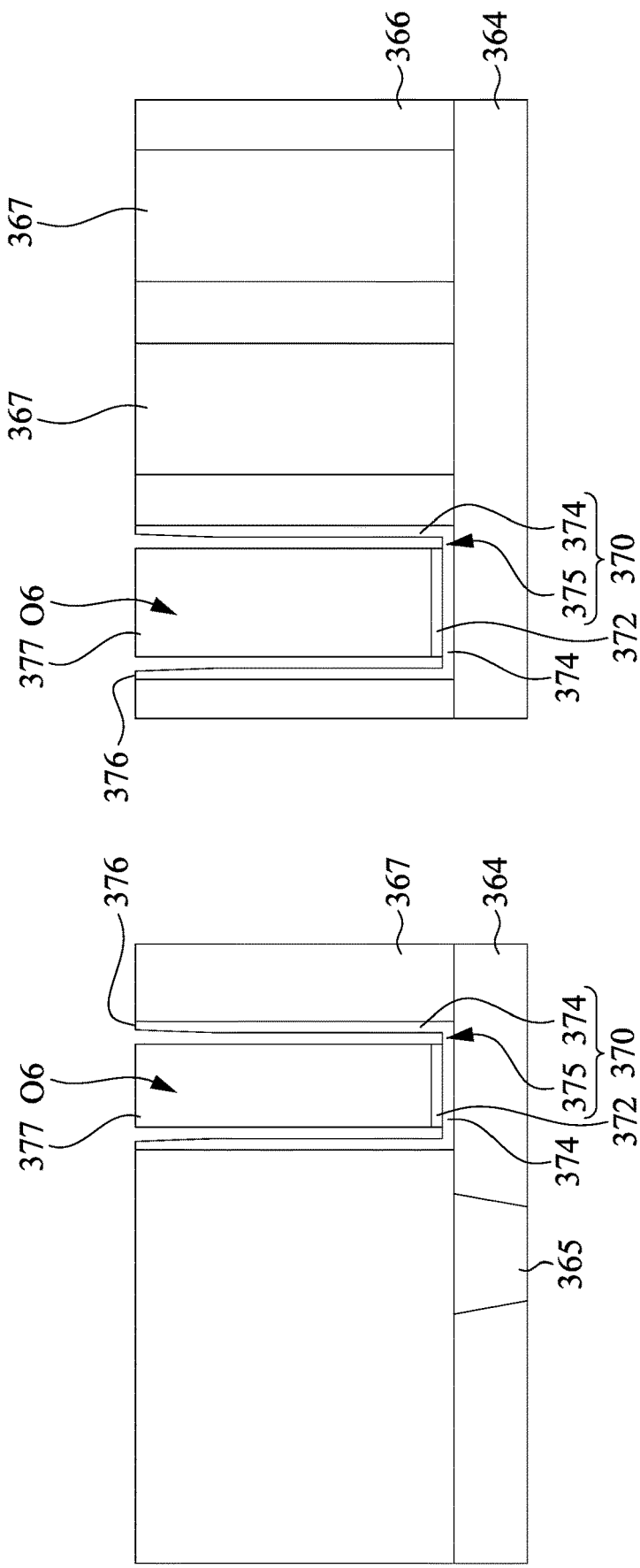

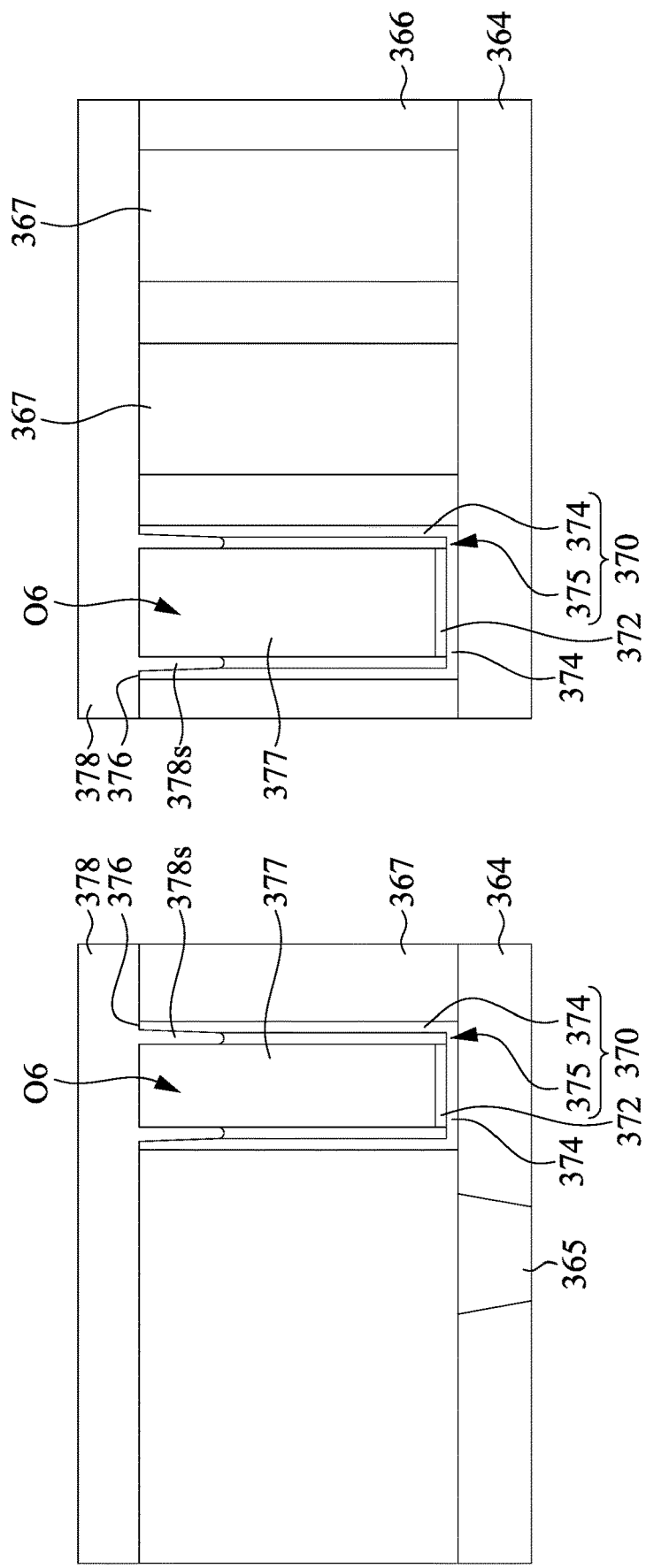

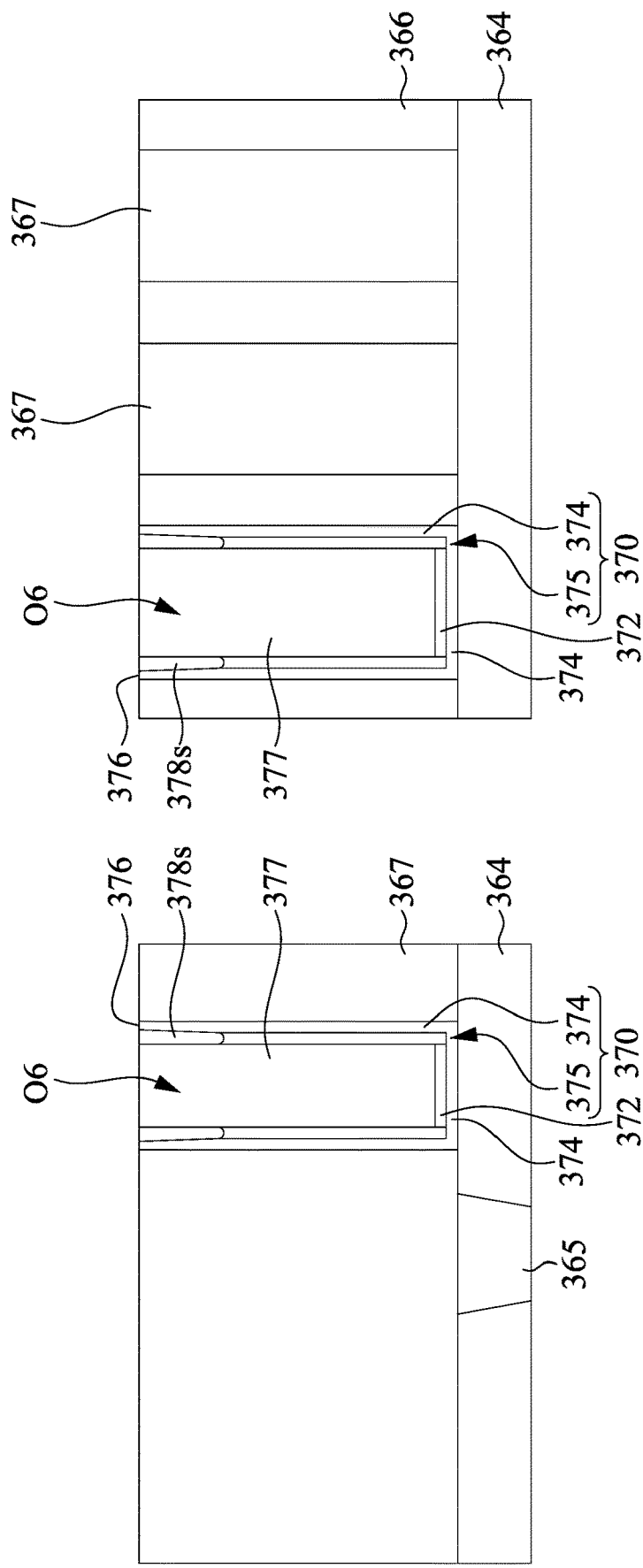

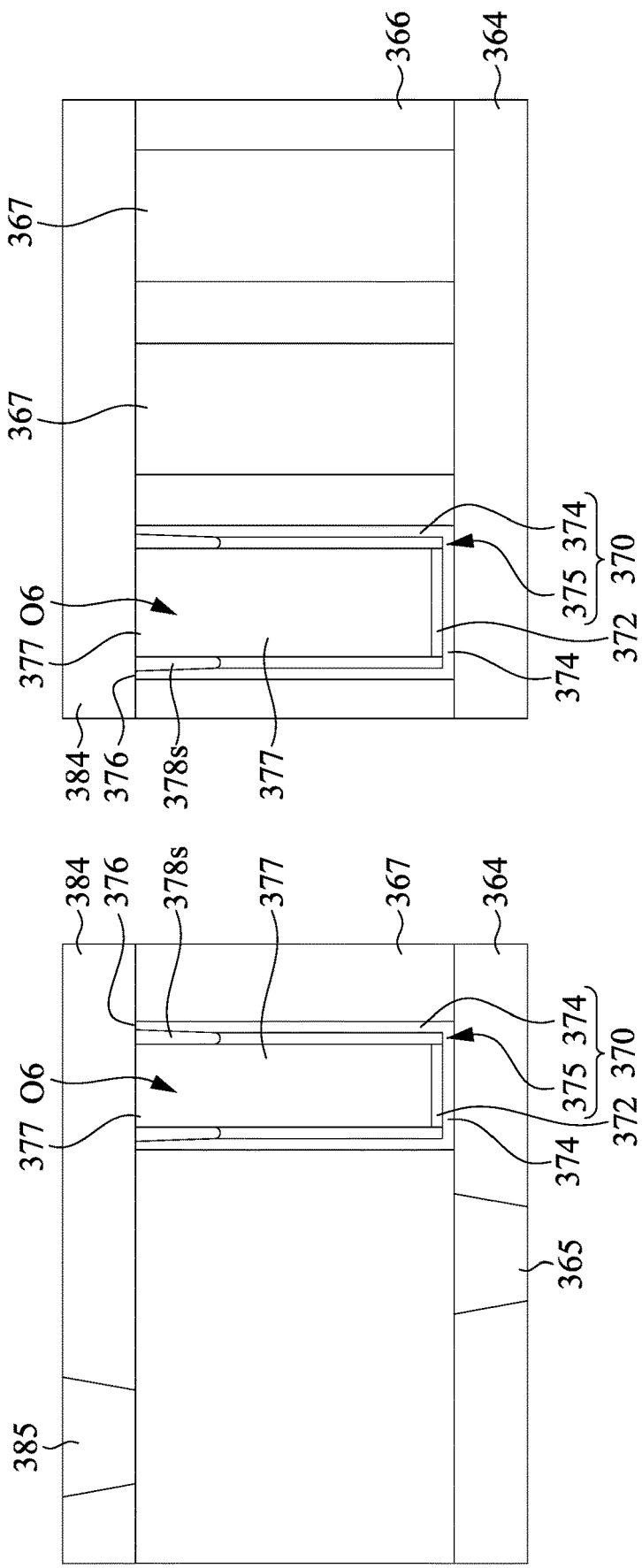

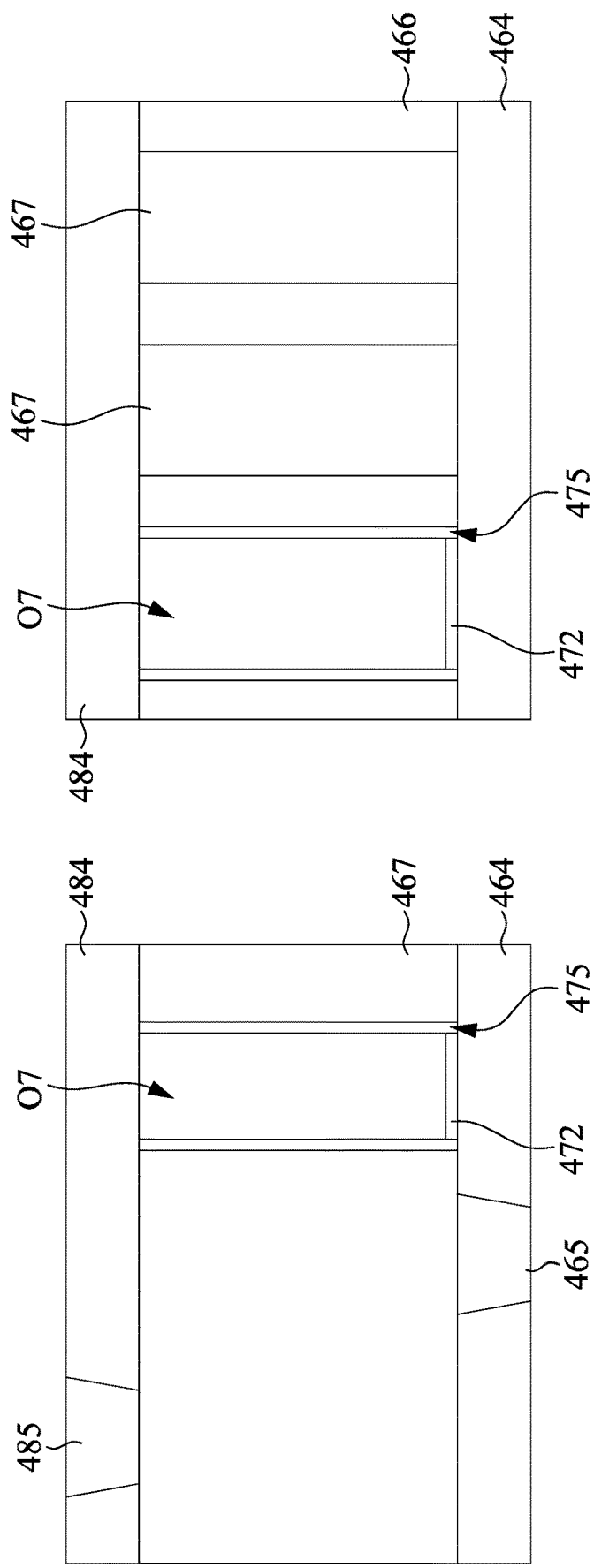

METHODS OF FORMING A SEMICONDUCTOR DEVICE HAVING AN AIR SPACER

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A to 46C, 47A, and 47B illustrate schematic views of intermediate stages in the formation of a semiconductor device in accordance with some embodiments of the present disclosure.

FIGS. 48A to 55B illustrate schematic views of intermediate stages in the formation of a semiconductor device in accordance with some embodiments of the present disclosure.

FIGS. 56A to 61B illustrate schematic views of intermediate stages in the formation of a semiconductor device in accordance with some embodiments of the present disclosure.

FIGS. 62A to 66B illustrate schematic views of intermediate stages in the formation of a semiconductor device in accordance with some embodiments of the present disclosure.

DETAILED DESCRIPTION

Figure 1A:
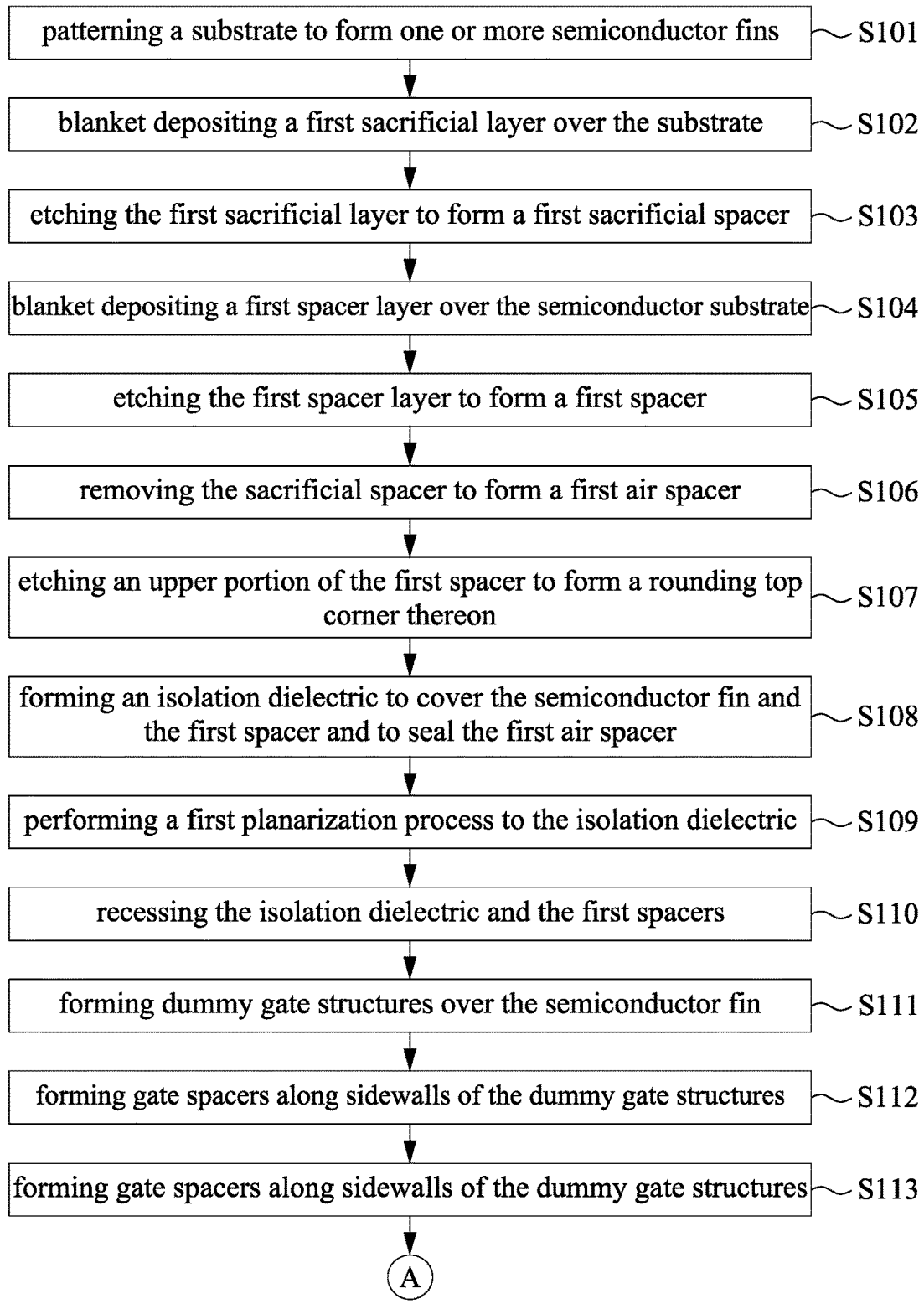
FIGS. 1A to 1D are a method M of manufacturing a semiconductor device in accordance with some embodiments of the present disclosure.
Figure 1B:
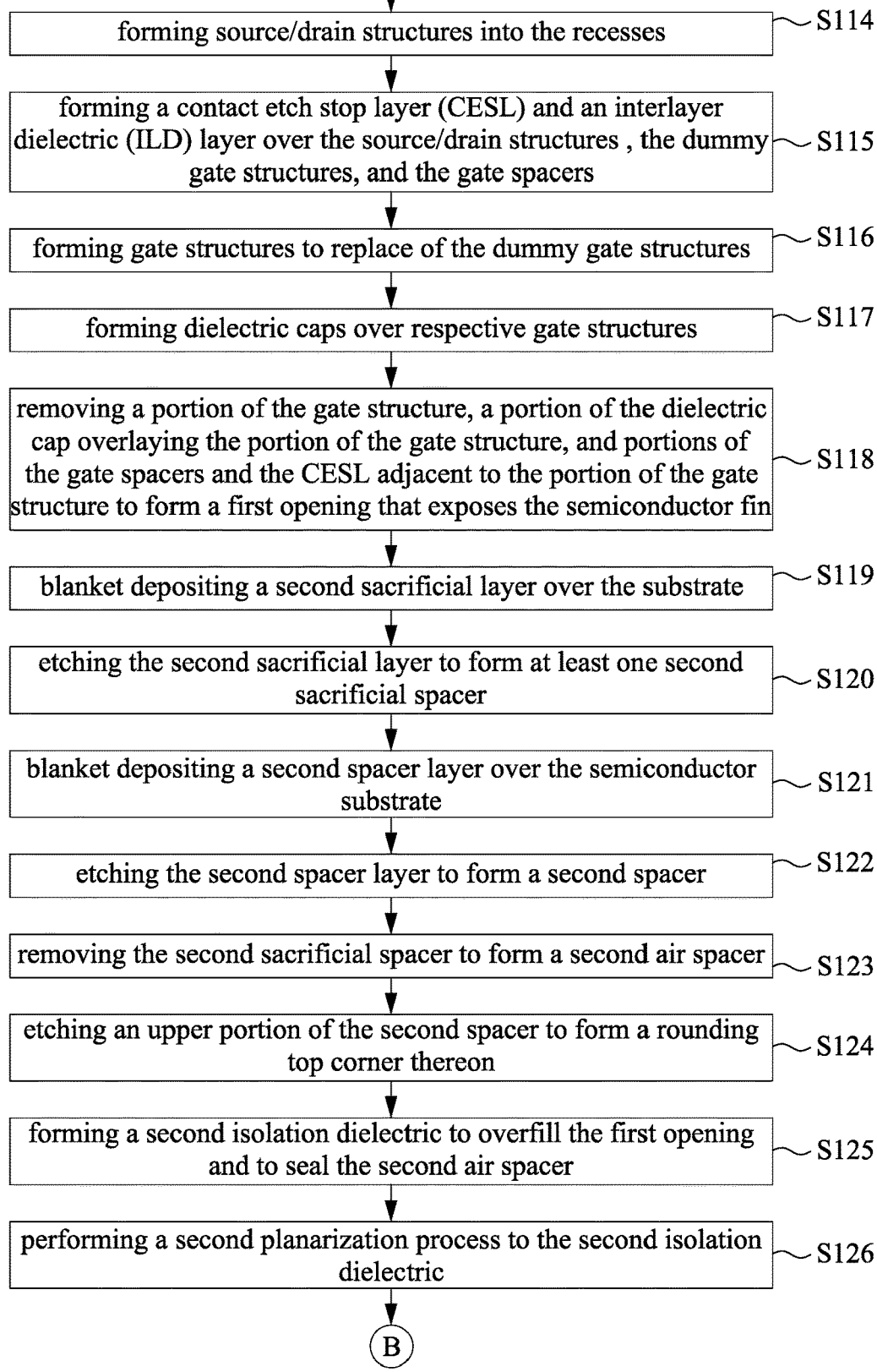
Figure 1C:
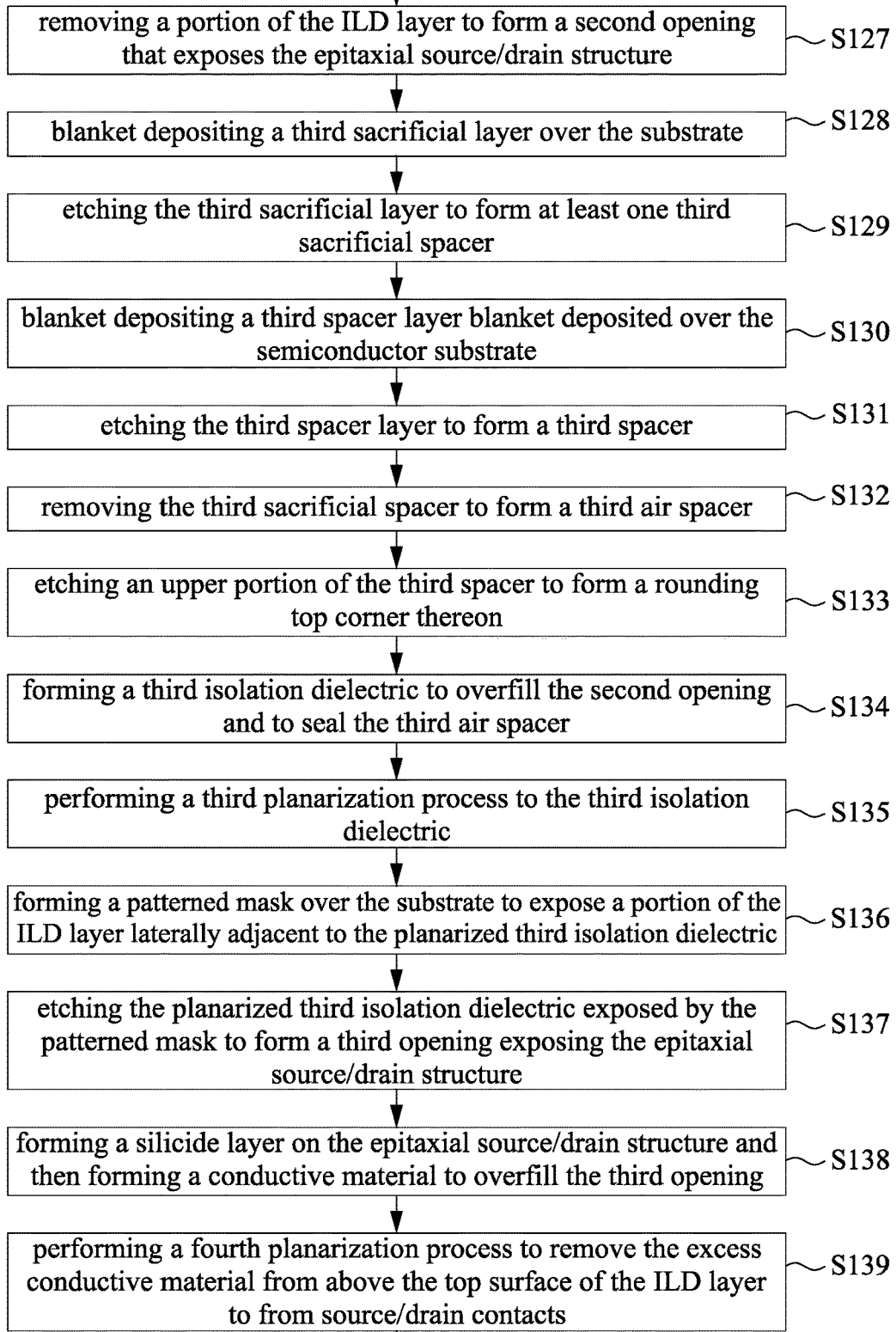
Figure 1D:
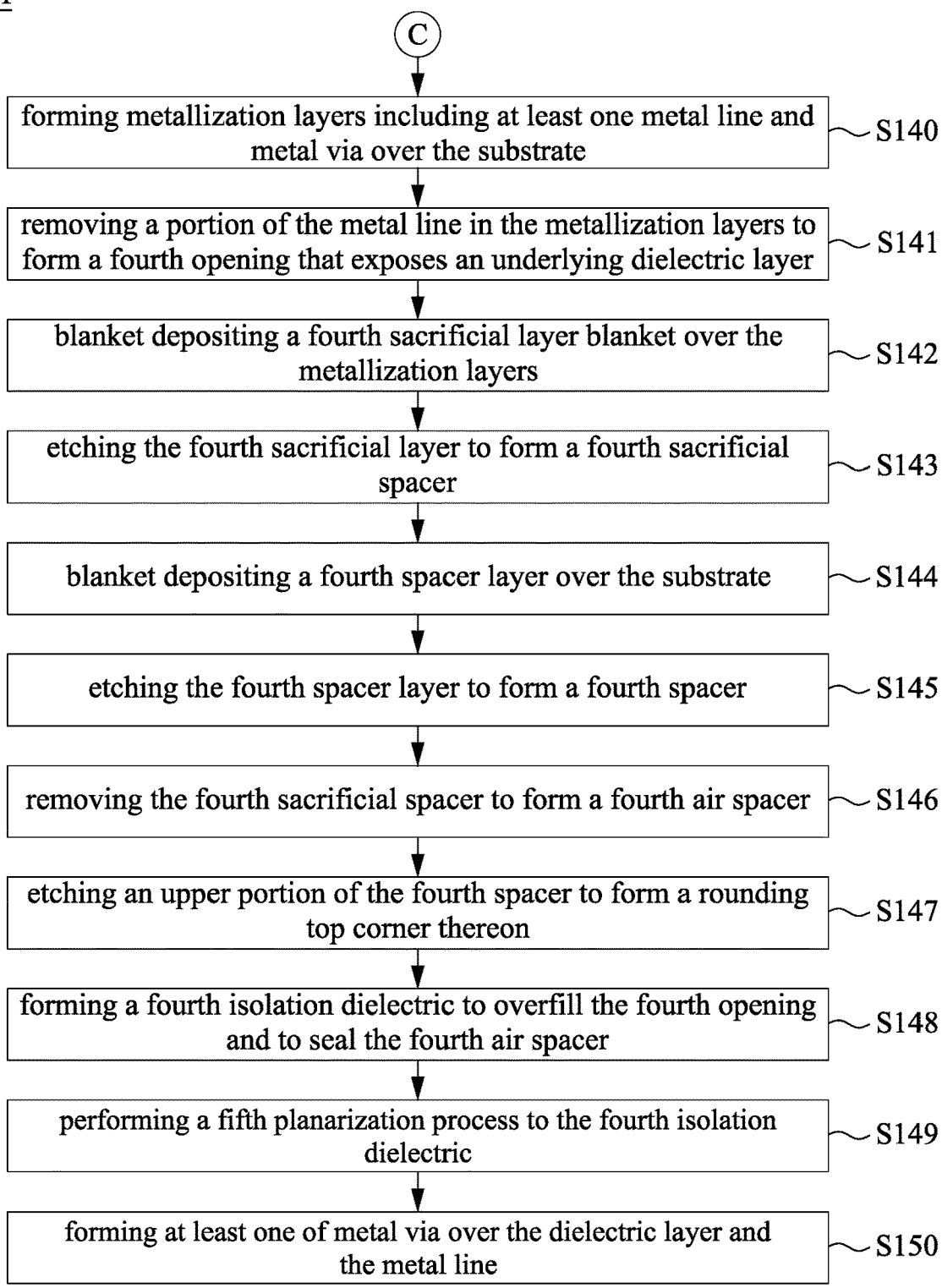

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present disclosure are directed to, but not otherwise limited to, a fin-like field-effect transistor (FinFET) device. The FinFET device, for example, may be a complementary metal-oxide-semiconductor (CMOS) device including a P-type metal-oxide-semiconductor (PMOS) FinFET device and an N-type metal-oxide-semiconductor (NMOS) FinFET device. The following disclosure will continue with one or more FinFET examples to illustrate various embodiments of the present disclosure. It is understood, however, that the application should not be limited to a particular type of device, except as specifically claimed.

The fins may be patterned by any suitable method. For example, the fins may be patterned using one or more photolithography processes, including double-patterning or multi-patterning processes. The double-patterning or the multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

In order to provide electrical insulation as well as structural support for a semiconductor feature (e.g., OD, metal gate, source/drain contact, or metal line in a multi-layer interconnect) of the integrated circuit (IC) structure, a physical spacer may form to surround the semiconductor feature.

However, the physical spacer on the semiconductor structure may provide an additional capacitance to the overall capacitance of the IC structure, because the physical spacer has a large dielectric constant. Therefore, the present disclosure in various embodiments provides an air spacer surrounding the semiconductor feature (e.g., OD, metal gate, source/drain contact, or metal line in a multi-layer interconnect) of the IC structure. An advantage is that the overall capacitance of the IC structure may be reduced to improve the RC delay and further improve the device performance. In greater detail, the air spacer has a dielectric constant equal to 1 ($k_{air}=1$), which is lower than the physical spacer. Thus, the overall capacitance of the IC structure may be reduced by forming the air spacer surrounding the semiconductor feature.

Referring now to FIGS. 1A to 1D, illustrated is an exemplary method M for fabrication of a semiconductor device in accordance with some embodiments, in which the fabrication includes a process of forming air spacers on a semiconductor fin, a gate structure, and/or a metal line. The method M includes a relevant part of the entire manufacturing process. It is understood that additional operations may be provided before, during, and after the operations shown by FIGS. 1A to 1D, and some of the operations described below can be replaced or eliminated for additional embodiments of the method. The order of the operations/processes may be interchangeable. It is noted that FIGS. 1A to 1D has been simplified for a better understanding of the disclosed embodiment. Moreover, the integrated circuit may be configured as a system-on-chip (SoC) device having various PMOS and NMOS transistors that are fabricated to operate at different voltage levels.

FIGS. 2A to 45C, 46B, and 46C illustrate schematic views of intermediate stages in the formation of a semiconductor device 100 in accordance with some embodiments of the present disclosure. FIGS. 2A to 45A are top views. FIGS. 2B to 11B are cross-sectional views obtained from a vertical plane corresponding to line B1-B1' in FIGS. 2A to 11A. FIGS. 2C to 11C are cross-sectional views obtained from a vertical plane corresponding to line C1-C1' in FIGS. 2A to 11A. FIGS. 12B to 21B are cross-sectional views obtained from a vertical plane corresponding to line B2-B2' in FIGS. 12A to 21A. FIGS. 12C to 21C are cross-sectional views obtained from a vertical plane corresponding to line C2-C2' in FIGS. 12A to 21A. FIGS. 22B to 35B are cross-sectional views obtained from a vertical plane corresponding to line B3-B3' in FIGS. 22A to 35A. FIGS. 22C to 35C are cross-sectional views obtained from a vertical plane corresponding to line C3-C3' in FIGS. 22A to 35A. FIGS. 36B to 45B are cross-sectional views obtained from a vertical plane corresponding to line B4-B4' in FIGS. 36A to 45A. FIGS. 36C to 45C are cross-sectional views obtained from a vertical plane corresponding to line C4-C4' in FIGS. 36A to 45A.

This is described in greater detail for an embodiment with reference to FIGS. 2A to 11C, an air spacer is formed to surround an OD region (e.g., semiconductor fin) of the semiconductor device, which in turns allows for reducing the capacitance between adjacent two OD regions. In some embodiments, a shallow trench isolation (STI) structure surrounding the OD region with the air spacer formed thereon can be collectively referred to as an air-inside Cut OD.

The method M begins at block S101 where a substrate is patterned to form one or more semiconductor fins. With reference to FIGS. 2A to 2C, in some embodiments of block S101, a wafer undergoes a series of deposition and photolithography processes, such that a pad layer, a mask layer and a patterned photoresist layer are formed on a substrate 101 of the wafer. In some embodiments, the substrate 101 is a semiconductor substrate, such as a bulk semiconductor, a semiconductor-on-insulator (SOI) substrate, or the like. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, a silicon or glass substrate. Other substrates, such as a multi-layered or gradient substrate may also be used. In some embodiments, the semiconductor material of the substrate 101 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

In some embodiments, the pad layer is a thin film including silicon oxide formed using, for example, a thermal oxidation process. The pad layer may act as an adhesion layer between the substrate 101 and mask layer. The pad layer may also act as an etch stop layer for etching the mask layer. In some embodiments, the mask layer is formed of silicon nitride, for example, using low-pressure chemical vapor deposition (LPCVD) or plasma enhanced chemical vapor deposition (PECVD). The mask layer is used as a hard mask during subsequent photolithography processes. A photoresist layer is formed on the mask layer and is then patterned, forming openings in the photoresist layer, so that regions of the mask layer are exposed.

Subsequently, the mask layer and pad layer are etched through the photoresist layer, exposing underlying substrate 101. The exposed substrate 101 is then etched, forming trenches T. A portion of the substrate 101 between neighboring trenches T can be referred to as a semiconductor fin 102. After etching the substrate 101, the pad layer, the mask layer and the patterned photoresist layer may be removed. Next, a cleaning step may be optionally performed to remove a native oxide of the semiconductor substrate 101. The cleaning may be performed using diluted hydrofluoric (HF) acid, for example.

Returning to FIG. 1A, the method M then proceeds to block S102 where a first sacrificial layer is blanket deposited over the substrate. With reference to FIGS. 3A to 3C, in some embodiments of block S102, the sacrificial layer 112 is blanket deposited over the structure in FIGS. 2A to 2C (i.e., over the substrate 101 and the semiconductor fin 102). In some embodiments, the sacrificial layer 112 may include silicon oxide, silicon nitride, silicon oxynitride, SiCN, $SiC_xO_yN_z$, other suitable materials, or combinations thereof. For example, the sacrificial layer 112 may be a dielectric material such as silicon nitride. In some embodiments, the sacrificial layer 112 includes a material different than the substrate 101. In some embodiments, the sacrificial layer 112 may have a thickness T1 in a range from about 1 nm to about 5 nm, such as about 1, 2, 3, 4, or 5 nm, and other thickness ranges are within the scope of the disclosure. In some embodiments, the sacrificial layer 112 may have a multilayer structure. The sacrificial layer 112 can be formed using a deposition method, such as plasma enhanced chemical vapor deposition (PECVD), low-pressure chemical vapor deposition (LPCVD), Plasma Enhanced Atomic Layer deposition (PEALD), or the like.

Returning to FIG. 1A, the method M then proceeds to block S103 where the first sacrificial layer is etched to form a first sacrificial spacer. With reference to FIGS. 4A to 4C, in some embodiments of block S103, sacrificial spacers 112' are formed on opposite sides of the semiconductor fin 102. In greater detail, an anisotropic etching process P1 (e.g., a reactive-ion etching process, RIE or atomic layer etching (ALE)) is performed to selectively remove the horizontal portions of the sacrificial layer 112. The remaining vertical portions of the sacrificial layer 112 form sacrificial spacers 112'. The sacrificial spacers 112' each vertically extends along the vertical sidewall of the semiconductor fin 102 from a top surface of the substrate 101. The sacrificial spacers 112' have a height H1 measured from the top surface of the semiconductor substrate 101. The height H1 of the sacrificial spacers 112' depend on process conditions of the anisotropic etching process P1 (e.g., etching time duration and/or the like). By way of example but not limiting the present disclosure, the anisotropic etching process P1 may implement an oxygen-containing gas, a fluorine-containing gas (e.g., CF4, SF6, CH2F2, CHF3, and/or C4F6, C4F8), a chlorine-containing gas (e.g., Cl2, CHCl3, CCl4, and/or BCl3), a bromine-containing gas (e.g., HBr and/or $CHBr_3$), a phosphoric-containing gas (e.g., $H_3PO_4$), an iodine-containing gas, other suitable gases and/or plasmas, and/or combinations thereof. In some embodiments, the sacrificial layer 112 (see FIGS. 3A to 3C) is etched using, by way of example but not limiting the present disclosure, phosphoric acid ($H_3PO_4$) when silicon nitride may be used as the nitride sacrificial spacers 112'.

This is described in greater detail with reference to FIGS. 4A to 4C, the anisotropic etching process P1 etches the sacrificial layer 112 (see FIGS. 3A to 3C) at a faster etch rate than it etches the substrate 101. By way of example but not limiting the present disclosure, a ratio of the etch rate of the sacrificial layer 112 to the etch rate of the substrate 101 may be greater than about 10. If the ratio of the etch rate of the sacrificial layer 112 to the etch rate of the substrate 101 is less than about 10, the anisotropic etching process P1 would significantly consume the substrate 101, which in turn adversely affects the semiconductor device.

Returning to FIG. 1A, the method M then proceeds to block S104 where a first spacer layer is blanket deposited over the semiconductor substrate. With reference to FIGS. 5A to 5C, in some embodiments of block S104, a spacer layer 114 is blanket deposited over the structure as shown in FIGS. 4A to 4C (i.e., over the substrate 101, the semiconductor fin 102, and the sacrificial spacer 112'). The spacer layer 114 may include a material different than the sacrificial spacer 112'. In some embodiments, the spacer layer 114 may include silicon oxide, silicon nitride, silicon oxynitride, SiCN, $SiC_xO_yN_z$, other suitable materials, or combinations thereof. For example, the spacer layer 114 may be a dielectric material such as silicon oxide. In some embodiments, the spacer layer 114 may have a multilayer structure. In some embodiments, the spacer layer 114 may have a thickness T2 in a range from about 1 nm to about 5 nm, such as about 1, 2, 3, 4, or 5 nm, and other thickness ranges are within the scope of the disclosure. The spacer layer 114 can be formed using a deposition method, such as plasma enhanced chemical vapor deposition (PECVD), low-pressure chemical vapor deposition (LPCVD), Plasma Enhanced Atomic Layer deposition (PEALD), or the like.

Returning to FIG. 1A, the method M then proceeds to block S105 where the first spacer layer is etched to form a first spacer. With reference to FIGS. 6A to 6C, in some embodiments of block S105, spacers 114' are formed on opposite sides of the semiconductor fin 102. In greater detail, an anisotropic etching process P2 (e.g., a reactive-ion etching process, RIE or atomic layer etching (ALE)) is performed to selectively remove the horizontal portions of the spacer layer 114. The remaining vertical portions of the spacer layer 114 form the spacers 114'. The spacers 114' each vertically extends along the vertical sidewall of the semiconductor fin 102 and the sacrificial spacer 112' from a top surface of the substrate 101. The spacers 114' have a height H2 measured from the top surface of the semiconductor substrate 112. In some embodiments, the height H2 of the spacers 114' may be substantially the same as the height H1 of the sacrificial spacers 112' (see FIGS. 4A to 4C). The height H2 of the spacers 114' depend on process conditions of the anisotropic etching process P2 (e.g., etching time duration and/or the like). By way of example but not limiting the present disclosure, the anisotropic etching process P2 may implement an oxygen-containing gas, a fluorine-containing gas (e.g., CF4, SF6, CH2F2, CHF3, and/or C4F6, C4F8), a chlorine-containing gas (e.g., Cl2, CHCl3, CCl4, and/or BCl3), a bromine-containing gas (e.g., HBr and/or $CHBr_3$), a phosphoric-containing gas (e.g., $H_3PO_4$), an iodine-containing gas, other suitable gases and/or plasmas, and/or combinations thereof. In some embodiments, the spacer layer 114 (see FIGS. 5A to 5C) is etched using, by way of example and not limitation, liquid hydrogen fluoride (HF) or vapor HF in case silicon oxide is used as the oxide spacers 114'.

This is described in greater detail with reference to FIGS. 6A to 6C, the anisotropic etching process P2 etches the spacer layer 114 (see FIGS. 5A to 5C) at a faster etch rate than it etches the substrate 101 and the sacrificial spacers 112'. By way of example but not limiting the present disclosure, a ratio of the etch rate of the spacer layer 114 to the etch rate of the substrate 101 may be greater than about 10 and/or a ratio of the etch rate of the spacer layer 114 to the etch rate of the sacrificial spacers 112' may be greater than about 10. If the ratio of the etch rate of the spacer layer 114 to the etch rate of the substrate 101 is less than about 10, the anisotropic etching process P2 would significantly consume the substrate 101, which in turn adversely affects the semiconductor device. Also, if the ratio of the etch rate of the spacer layer 114 to the etch rate of the sacrificial spacers 112' is less than about 10, the anisotropic etching process P2 would significantly consume the substrate 101, which in turn adversely affects the semiconductor device.

Returning to FIG. 1A, the method M then proceeds to block S106 where the first sacrificial spacer is removed to form a first air spacer. With reference to FIGS. 7A to 7C, in some embodiments of block S106, a selective etching process P3 is performed to selectively remove the sacrificial spacer 112' (see FIGS. 7A to 7C). As a result, an air spacer 115 is formed between the semiconductor fin 102 and the spacer 114'. Stated differently, the semiconductor fin 102 and the spacer 114' are separated by the air spacer 115. After the air spacer 115 is formed, the spacer 114' and the air spacer 115 can be collectively referred to as an insulating structure 110. The insulating structure 110 is formed by removing the sacrificial spacer 112' (see FIGS. 6A to 6C), and thus the shape of the air spacer 115 substantially inherits the shape of the sacrificial spacer 112'. In some embodiments, a portion of the substrate 101 is exposed in the air spacer 115.

As mentioned before, the thickness of the sacrificial spacer 112' (see FIGS. 4A to 4C) is in a range from about 1 nm to about 5 nm. As a result, the air spacer 115 may have a thickness also in a range from about 1 nm to about 5 nm, such as about 1, 2, 3, 4, or 5 nm. If the thickness of the sacrificial spacer 112' is smaller than 1 nm, the sacrificial spacer 112' is too thin such that the etchant is hard to flow into the space between the semiconductor fin 102 and the spacer 114', which in turn affects the formation of the air spacer 115. On the other hand, if the thickness of the sacrificial spacer 112' is greater than 5 nm, the thickness of the air spacer 115 inheriting the thickness of the sacrificial spacer 112' may be too thick, such that the material that will be formed above of the air spacer 115 may easily flow into a lower portion of the air spacer 115, which in turn affects the formation of the air spacer 115. Therefore, during the etching process P3, the sacrificial spacers 112' (see FIGS. 6A to 6C) may be etched away and expose the vertical sidewall of the semiconductor fin 102, which in turn affects the formation of the air spacer 115.

In the present disclosure, the sacrificial layer 112 has large dielectric constant, for example, greater than 1. On the other hand, the insulating structure 110 includes the air spacer 115 that has a dielectric constant equal to 1 ($k_{air}=1$), which is lower than the dielectric constant of the sacrificial layer 112. Thus, the equivalent dielectric constant of the insulating structure 110 may be reduced by forming the air spacer 115. As a result, the overall capacitance of the insulating structure 110 may be reduced, which in turn will reduce the RC delay and further improve the device performance. Moreover, since the air spacer 115 is formed by removing the sacrificial spacer 112', the air spacer 115 may inherit the shape of the sacrificial spacer 112', and thus it is easier to control the size of the air spacer 115 and further control the equivalent capacitance of the insulating structure 110.

In some embodiments, the etching process P3 may be a selective isotropic etching process (e.g., a reactive-ion etching processing in the high pressure or/and lower bias voltage region). By way of example but not limiting the present disclosure, the etching process P3 may implement an oxygen-containing gas, a fluorine-containing gas (e.g., CF4, SF6, CH2F2, CHF3, and/or C4F6, C4F8), a chlorine-containing gas (e.g., Cl2, CHCl3, CCl4, and/or BCl3), a bromine-containing gas (e.g., HBr and/or $CHBr_3$), a phosphoric-containing gas (e.g., $H_3PO_4$), other suitable gases and/or plasmas, and/or combinations thereof. In some embodiments, the sacrificial spacers 112' (see FIGS. 6A to 6C) is etched using, by way of example but not limiting the present disclosure, $NH_4OH$ when silicon is used in the sacrificial spacers 112'. This is described in greater detail with reference to FIGS. 7A to 7C, the etching process P3 etches the sacrificial spacers 112' (see FIGS. 6A to 6C) at a faster etch rate than it etches the substrate 101 and the spacers 114'. By way of example but not limiting the present disclosure, a ratio of the etch rate of the sacrificial spacers 112' to the etch rate of the substrate 101 may be greater than about 10 and/or a ratio of the etch rate of the sacrificial spacers 112' to the etch rate of the spacers 114' may be greater than about 10. If the ratio of the etch rate of the sacrificial spacers 112' to the etch rate of the substrate 101 is less than about 10, the etching process P3 would significantly consume the substrate 101, which in turn adversely affects the semiconductor device. Also, if the ratio of the etch rate of the sacrificial spacers 112' to the etch rate of the spacers 114' is less than about 10, the etching process P3 would significantly consume the substrate 101, which in turn adversely affects the semiconductor device. In some embodiments, the etching process P3 may be an isotropic etching process. In some embodiments, the etching process P3 uses a different etchant than the etching process P2, because the etching process P3 is used to selectively etch material of the inner sacrificial spacers 112' and the etching process P2 is used to selectively etch material of the outer sacrificial spacers 114'.

Figure 8A:
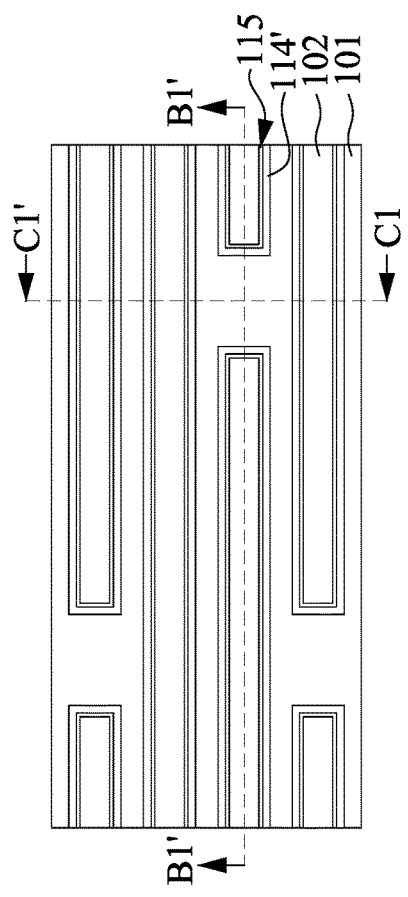
Figure 8C:
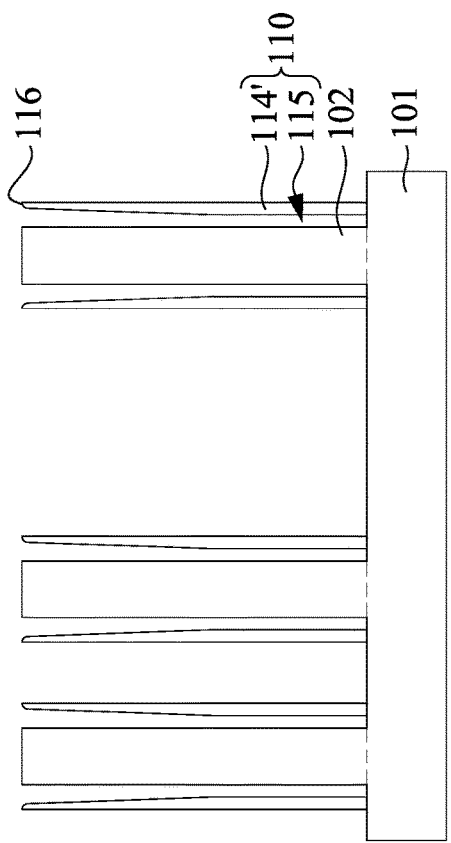
Figure 8B:
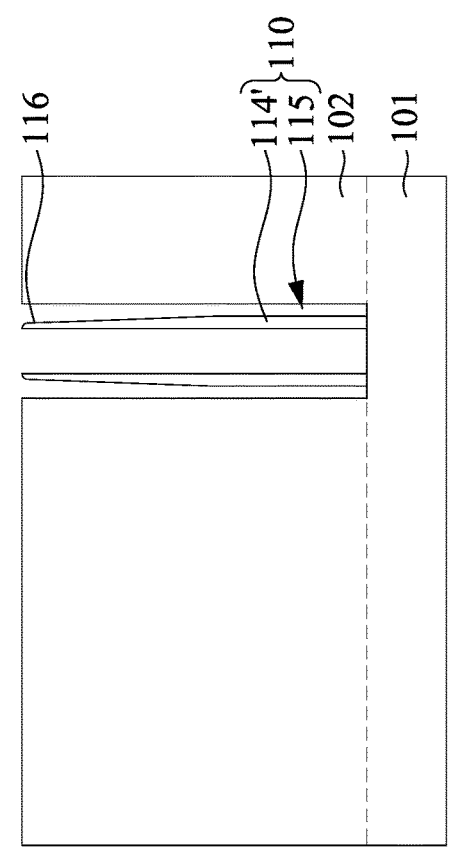

Returning to FIG. 1A, the method M then proceeds to block S107 where an upper portion of the first spacer is etched to form a rounding top corner thereon. With reference to FIGS. 8A to 8C, in some embodiments of block S107, the spacer 114' is etched to form a tapered top end 116 thereon. In some embodiments, the etched spacer 114' may have a rounding top corner thereon. In FIGS. 8A to 8C, an etching process P4 is performed on the spacer 114'. In some embodiments, the etching process P4 is a plasma etching process employing one or more etchants. Plasmas, in general, are partially ionized gas mixtures where a fraction of the atoms or molecules have lost an electron to produce positively charged ions. Electric and magnetic fields can be used to create plasmas and to control their behavior. Plasmas are generated through dissipation of the electrical power supplied to a gas mixture. The power is transferred to electrons and such energetic electrons then undergo collisions with atoms and molecules of the mixture to produce ions, more electrons and radicals by initiating processes such as ionization, excitation and dissociation. Electron impact can ionize an atom or molecule in the plasma or dissociate a molecule producing free radicals. Free radicals may recombine with appropriate gas phase species to reproduce the state they originated from or create other species.

This is described in greater detail with reference to FIGS. 8A to 8C, the non-zero bias plasma etching process is performed to etch the upper portion of the spacer 114' such that a top end of the spacer 114' is tapered. The non-zero bias can drive more plasmas to scale down the spacer 114' compared to zero bias. For example, the non-zero bias plasma etching process begins with ion bombardment to remove compounds of the spacer 114'. Hence, the upper portion of the spacer 114' has a narrower width than a lower portion of the spacer 114'. Stated differently, an upper portion of the air spacer 115 has a wider width than a lower portion of the air spacer 115, such that an isolation dielectric that will be formed later may flow into the upper portion of the air spacer 115. Therefore, an upper end of the air spacer 115 is sealed by the isolation dielectric that will be formed later, and thus the air spacer 115 can be protected during the subsequent process, such that other material would not fill into the air spacer 115.

The profile of the spacer 114' depends on process conditions of the etching process P4 (e.g., etching time duration and/or the like). By way of example but not limiting the present disclosure, the anisotropic etching process P4 may implement an oxygen-containing gas, a fluorine-containing gas (e.g., CF4, SF6, CH2F2, CHF3, and/or C4F6, C4F8), a chlorine-containing gas (e.g., Cl2, CHCl3, CCl4, and/or BCl3), a bromine-containing gas (e.g., HBr and/or $CHBr_3$), a phosphoric-containing gas (e.g., $H_3PO_4$), other suitable gases and/or plasmas, and/or combinations thereof. In some embodiments, the non-zero bias plasma etching process uses a gas mixture of $C_4F_6$ and Ar with a bias in a range from about 50 W to about 1000 W. If the bias power is higher than about 1500 W, the plasma might result in unwanted damage to the semiconductor fin 102. If the bias power is lower than about 30 W, the spacer 114' may not be tapered enough to allow the isolation dielectric that will be formed later to flow into the upper portion of the air spacer 115.

Figure 67:
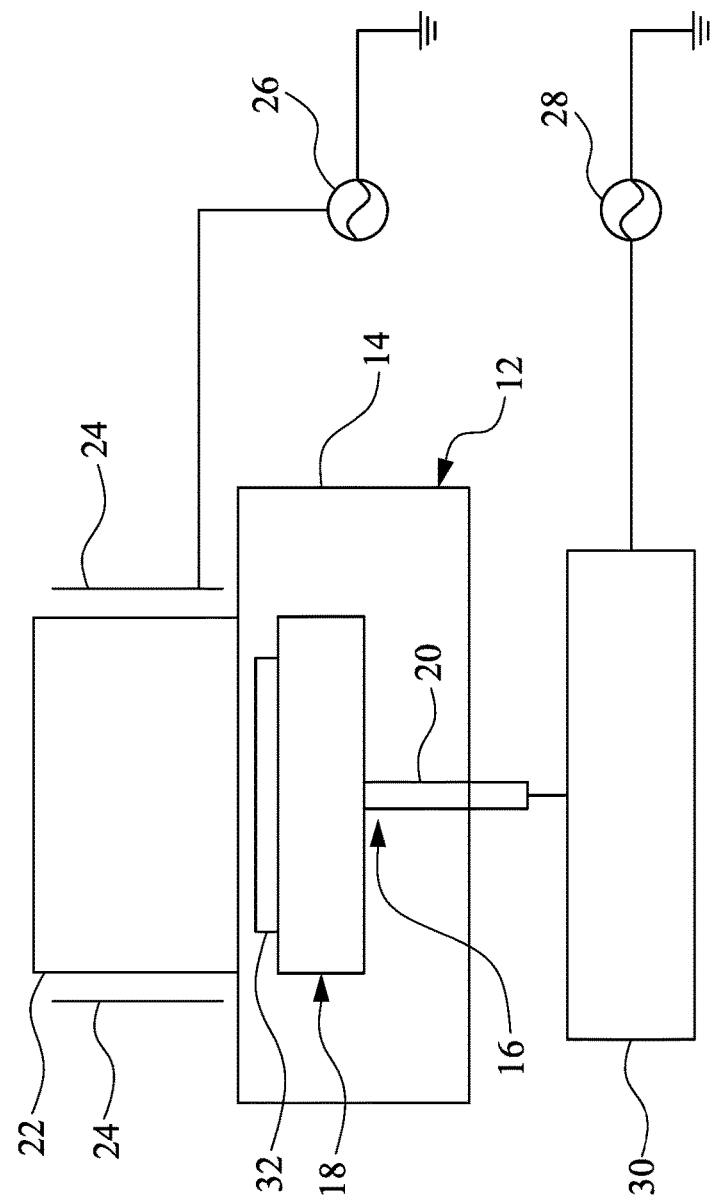
FIG. 67 is a cross-sectional view of a plasma processing apparatus in accordance with some embodiments of the present disclosure.

In greater detail, Referring now to FIG. 67 illustrated is a cross-sectional view of an exemplary plasma processing apparatus 10 in some embodiments of the present disclosure. In some embodiments, the plasma processing apparatus 10 may contain an inductively-coupled plasma (ICP) or Capacitive Coupling Plasma (CCP) as a plasma source and a RF power supply as a bias power source. As shown in FIG. 67, the plasma processing apparatus 10 includes a chamber base 12 having a typically grounded chamber wall 14. The chamber base 12 is closed by a removable lid or a cover 22 and contains a pedestal assembly 18 which can typically be raised and lowered on a shaft 20 by actuation of a pedestal lift assembly 16. An inductively-coupled plasma coil 24 surrounds the lid 22 and is connected to an RF source power supply 26. The pedestal assembly 18 is connected, through an RF match network 30 which matches impedances, to an RF power supply 28. During operation of the plasma processing apparatus 10, the pedestal assembly 18 supports a wafer 32 in the chamber base 12. A plasma-generating source gas, such as argon, is introduced into the plasma processing apparatus 10 by a gas supply (not shown). Volatile reaction products and unreacted plasma species are removed from the plasma processing apparatus 10 by a gas removal mechanism (not shown). Source power such as a high voltage signal, provided by the RF source power supply 26, is applied to the inductively-coupled plasma coil 24 to ignite and sustain a plasma in the plasma processing apparatus 10. Ignition of a plasma in the plasma processing apparatus 10 is accomplished primarily by electrostatic coupling of the inductively-coupled plasma coil 24 with the source gas, due to the large-magnitude voltage applied to the inductively-coupled plasma coil 24 and the resulting electric fields produced in the plasma processing apparatus 10. Once ignited, the plasma is sustained by electromagnetic induction effects associated with time-varying magnetic fields produced by the alternating currents applied to the inductively-coupled plasma coil 24. Through the RF power supply 28, the pedestal assembly 18 is typically electrically biased to provide to the wafer 32 ion energies that are independent of the RF voltage applied to the chamber 10 through the inductively-coupled plasma coil 24 and RF source power supply 26. This facilitates more precise control over the energies of the etchant ions that bombard the surface of the wafer 32. A non-zero bias etching can be provided by the ICP plasma or Capacitive Coupling Plasma (CCP) source 26 with turning on the RF power source 28 during the non-zero bias etching step. On the contrary, a zero bias can be provided by the ICP plasma source 26 without turning on the RF power source 28 during the zero bias etching step. The non-zero bias etching step and the zero bias etching step result in different profile of the etched gate structures, as will be discussed further below. In some embodiments, the plasma processing apparatus 10 may also be an electron cyclotron resonance (ECR) apparatus, but the present disclosure is not limited thereto.

Returning to FIG. 1A, the method M then proceeds to block S108 where a first isolation dielectric is formed to overfill the trench and to seal the first air spacer. With reference to FIGS. 9A to 9C, in some embodiments of block S108, an isolation dielectric 120 is formed to overfill the trenches and cover the semiconductor fin 102. The isolation dielectric 120 in the trenches T can be referred to as a shallow trench isolation (STI) structure. As mentioned before, because the upper portion of the air spacer 115 has a wider width than the lower portion of the air spacer 115, material of the isolation dielectric 120 may flow into the upper portion of the air spacer 115 and seal the air spacer 115. Accordingly, the isolation dielectric 120 includes a seal portion 120S embedded between the spacers 114' and the semiconductor fin 102. Therefore, the upper end of the air spacer 115 is sealed by the seal portion 120S of the isolation dielectric 120, and thus the air spacer 115 can be protected during the subsequent process, such that other material would not fill into the air spacer 115. In some embodiments, the seal portion 120S of the isolation dielectric 120 may be referred to as a dielectric sealer or a dielectric structure.

In some embodiments, the isolation dielectric 120 is made of silicon oxide, silicon nitride, silicon oxynitride, fluoride-doped silicate glass (FSG), or other low-K dielectric materials. In some embodiments, the isolation dielectric 120 may be formed using a high-density-plasma (HDP) chemical vapor deposition (CVD) process, using silane ($SiH_4$) and oxygen ($O_2$) as reacting precursors. In some other embodiments, the isolation dielectric 120 may be formed using a sub-atmospheric CVD (SACVD) process or high aspect-ratio process (HARP), in which process gases may include tetraethylorthosilicate (TEOS) and ozone ($O_3$). In yet other embodiments, the isolation dielectric 120 may be formed using a spin-on-dielectric (SOD) process, such as hydrogen silsesquioxane (HSQ) or methyl silsesquioxane (MSQ). Other processes and materials may be used. In some embodiments, the isolation dielectric 120 can have a multi-layer structure, for example, a thermal oxide liner layer with silicon nitride formed over the liner. Thereafter, a thermal annealing may be optionally performed to the isolation dielectric 120. In some embodiments, the isolation dielectric 120 may be made of a material the same as the spacers 114'. In some embodiments, the isolation dielectric 120 may be made of a material different than the spacers 114'.

Returning to FIG. 1A, the method M then proceeds to block S109 where a first planarization process is performed to the first isolation dielectric. With reference to FIGS. 10A to 10C, in some embodiments of block S109, a planarization process such as chemical mechanical polish (CMP) is performed to remove the excess isolation dielectric 120 over the semiconductor fin 102 such that a top surface of the semiconductor fin 102 is exposed and the air spacer 115 remains covered by the seal portion 120S of the isolation dielectric 120.

Returning to FIG. 1A, the method M then proceeds to block S110 where the isolation dielectric and the first spacers are recessed. With reference to FIGS. 11A to 11C, in some embodiments of block S110, the isolation dielectric 120 and the spacers 114' is recessed and an upper part of the seal portion 120S of the isolation dielectric 120 is removed, for example, through an etching operation, in which diluted HF, SiCoNi (including HF and $NH_3$), dilute HF, or the like, may be used as the etchant. After recessing the isolation dielectric 120 and the spacers 114', a portion of the semiconductor fin 102 is higher than a top surface of the isolation dielectric 120 and the spacers 114' and the air spacer 115 remains covered and thus sealed by the seal portion 120S of the isolation dielectric 120.

Figures 21A, 21B:
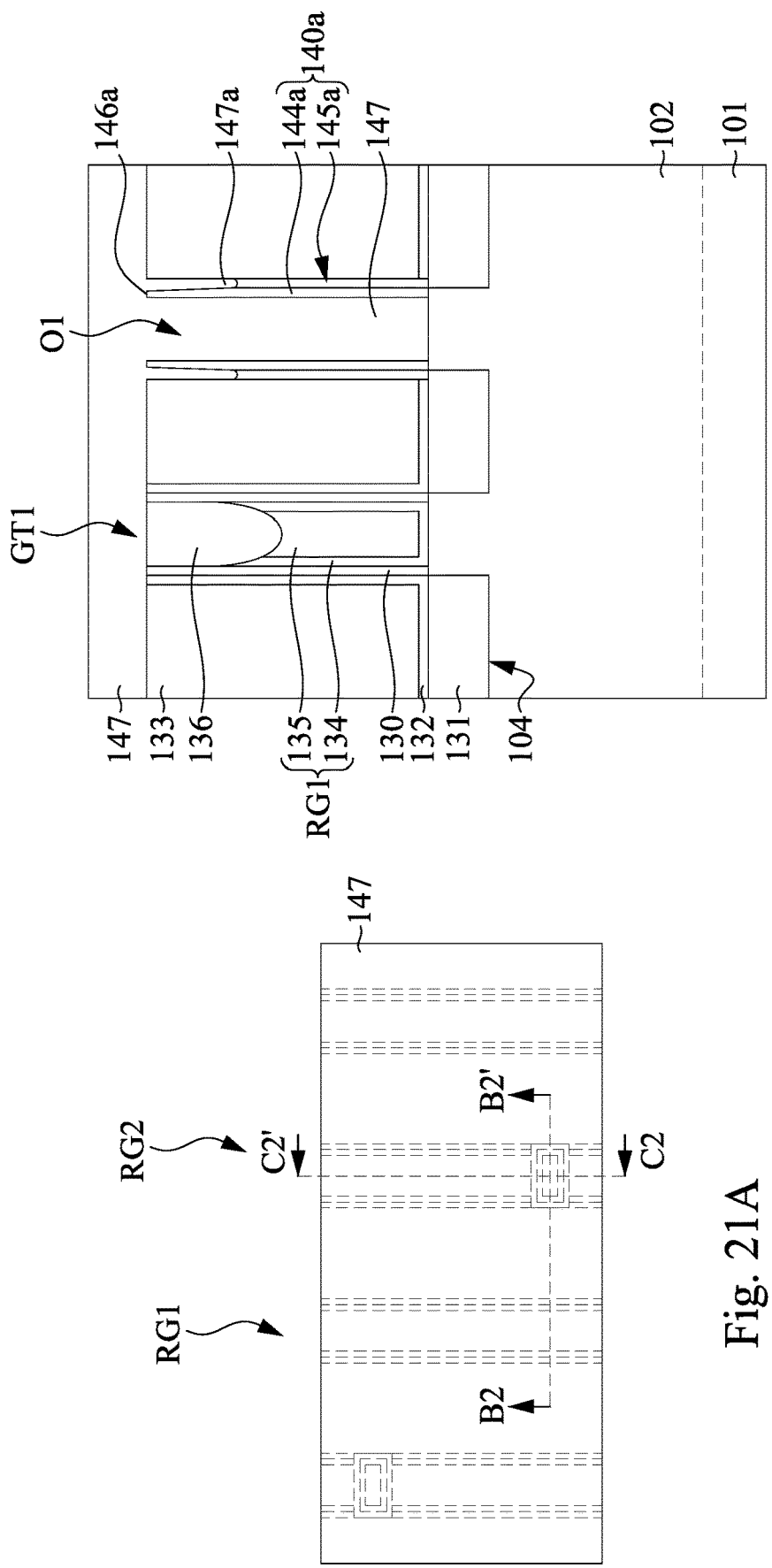
Figure 21C:
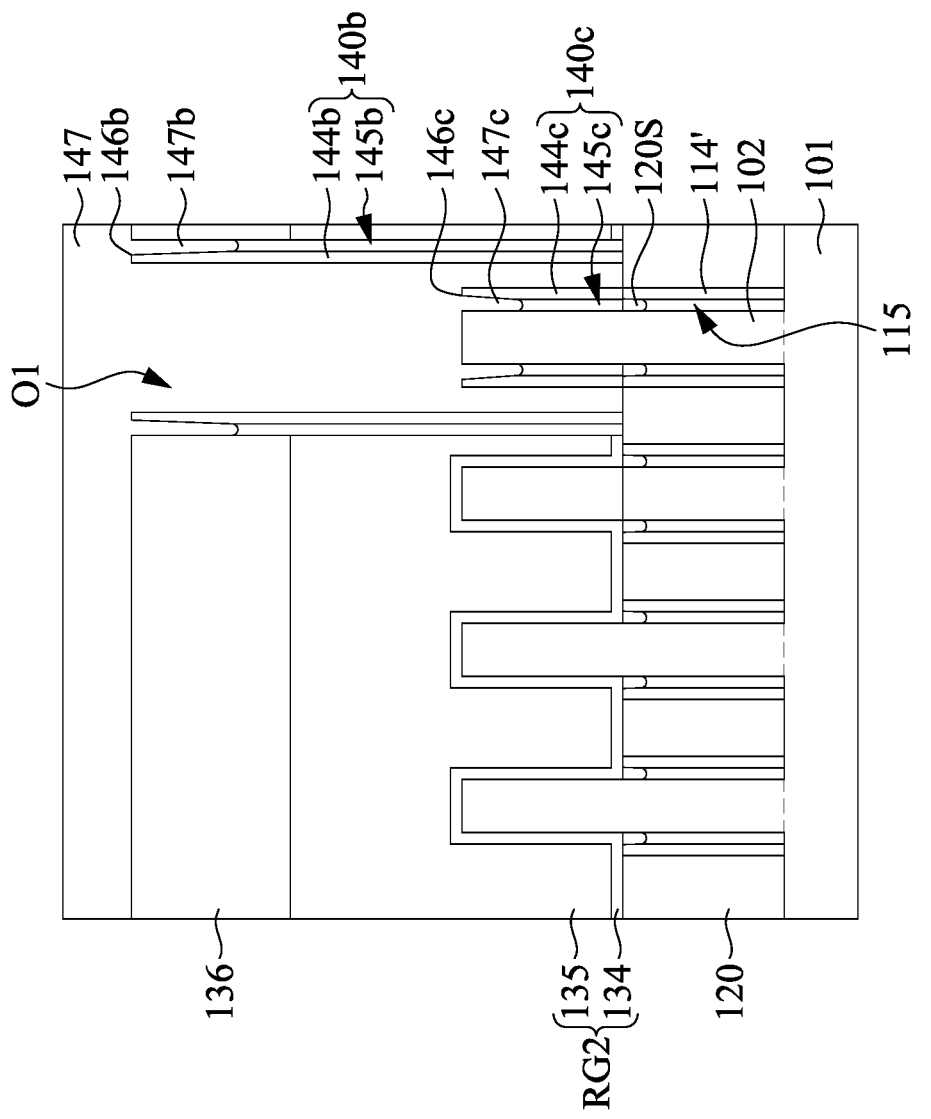
Figure 22C:
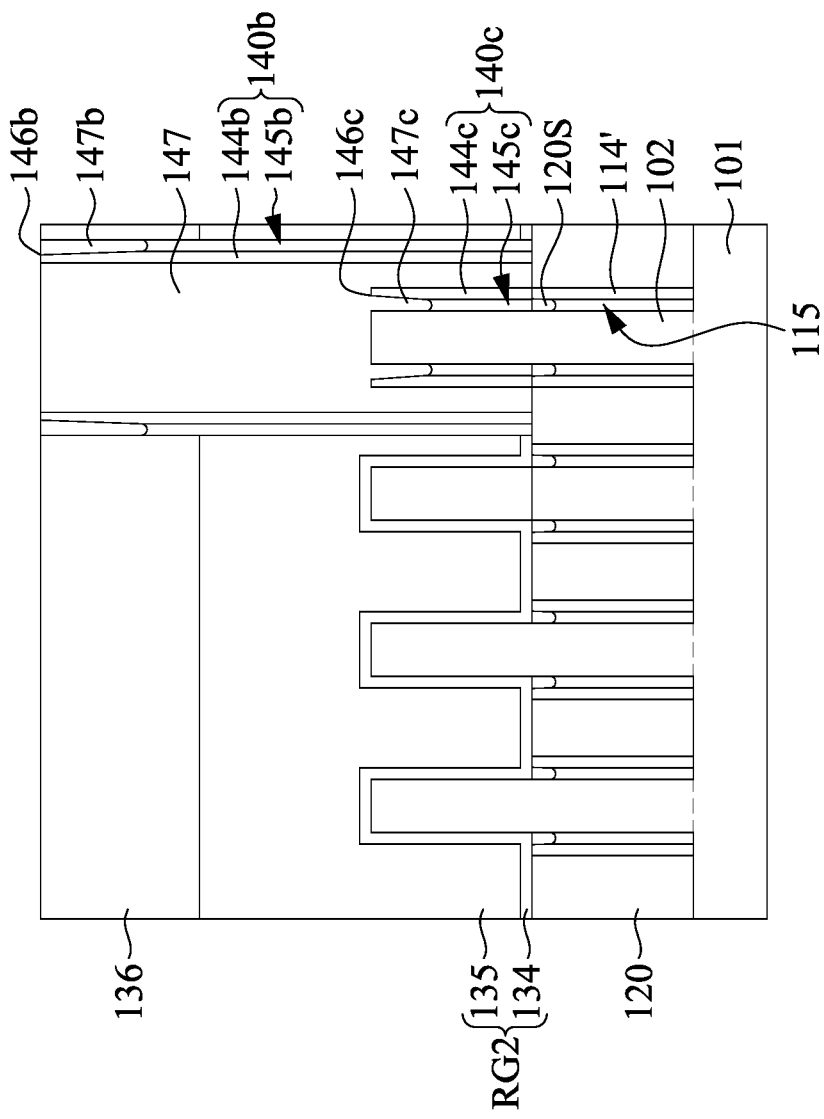
Figure 23B:
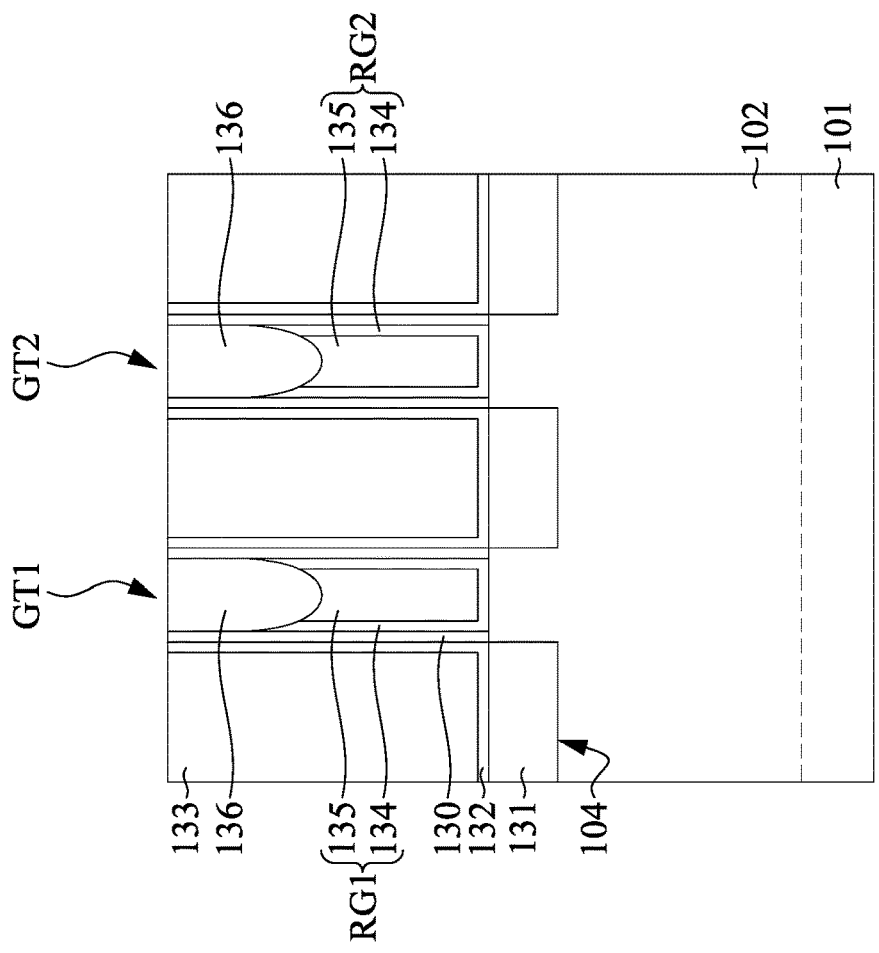
Figure 23A:
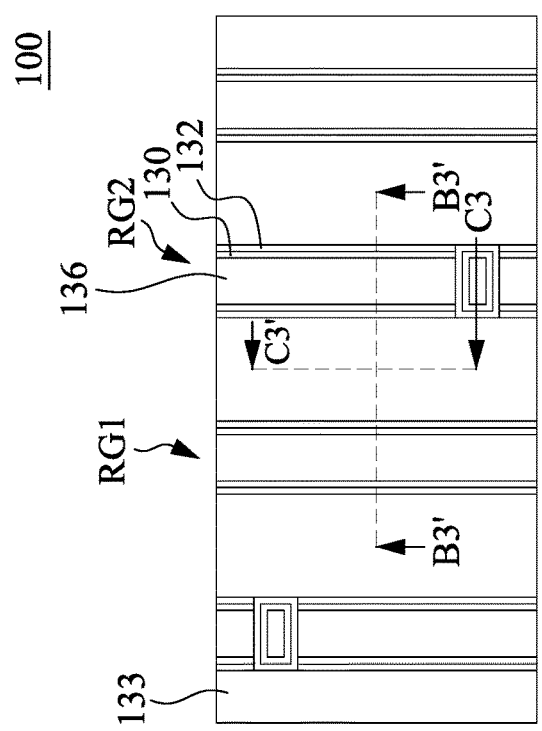
Figure 24B:
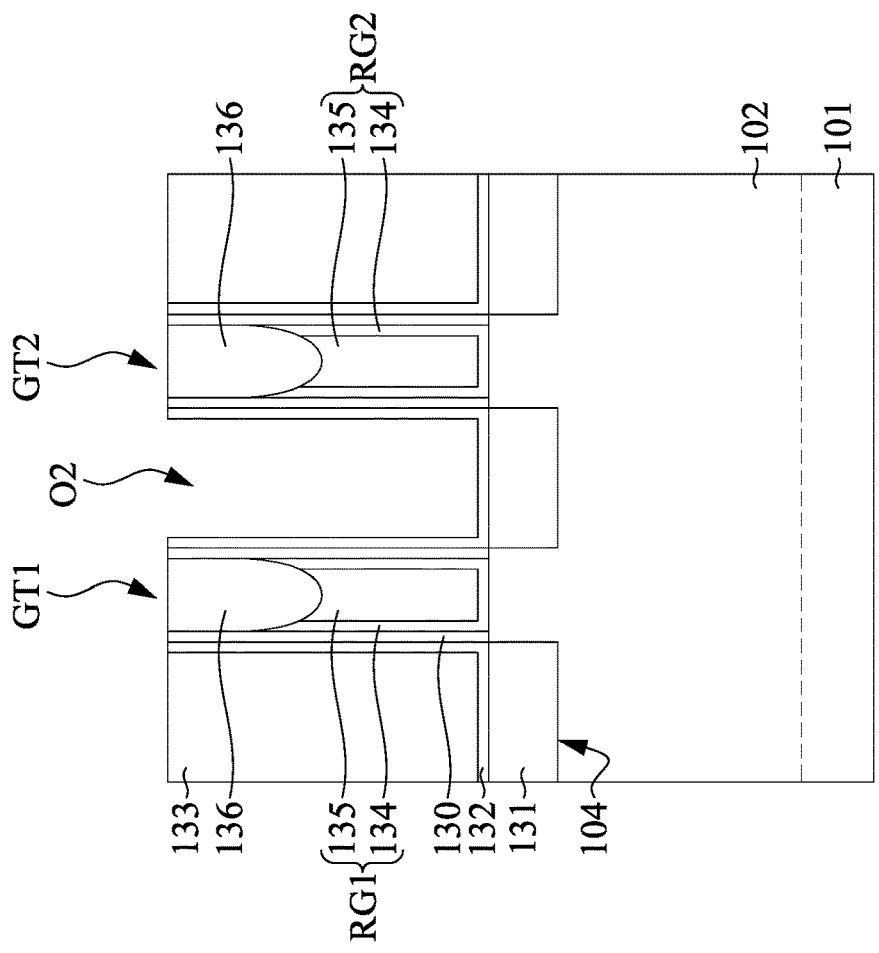
Figure 24A:
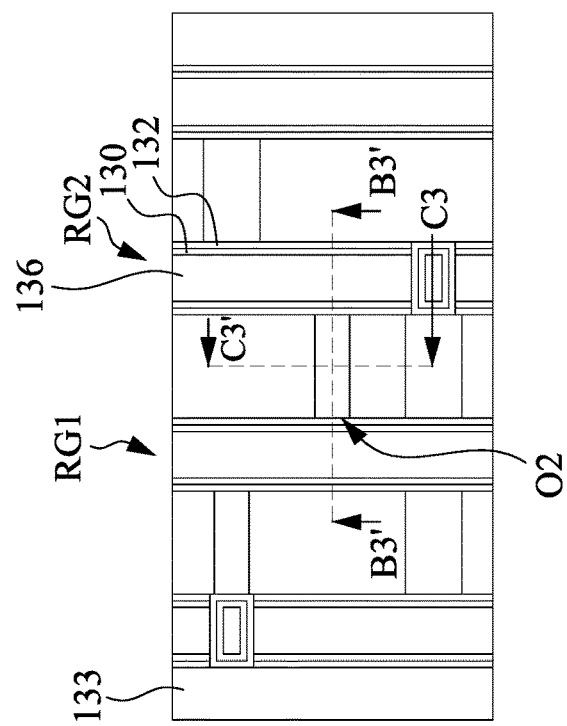
Figure 24C:
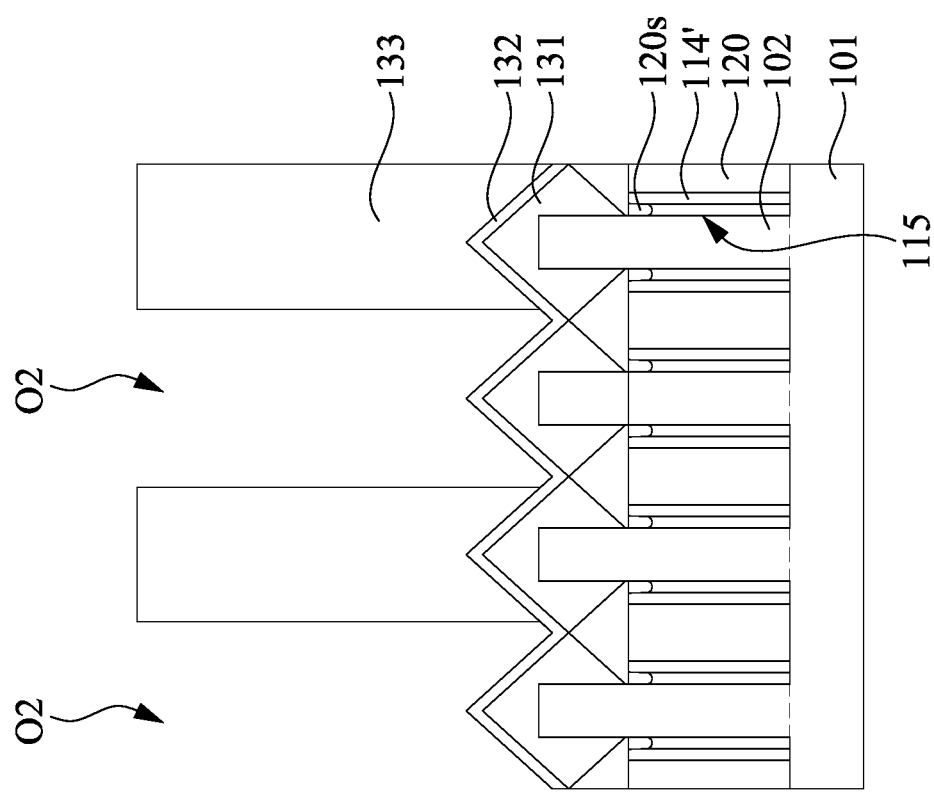

This is described in greater detail for an embodiment with reference to FIGS. 12A to 22C, an isolation dielectric (e.g., an isolation dielectric 147 as shown in FIG. 22A) is interposed between two gate structures of the semiconductor device in order to provide electrical insulation between the two gate structures. An air spacer is formed to surround the isolation dielectric between the two gate structures, which in turns allows for reducing the capacitance between adjacent two gate structures. In some embodiments, the isolation dielectric between the two gate structures with the air spacer formed thereon can be collectively referred to as an air-inside CMG.

Figure 12B:
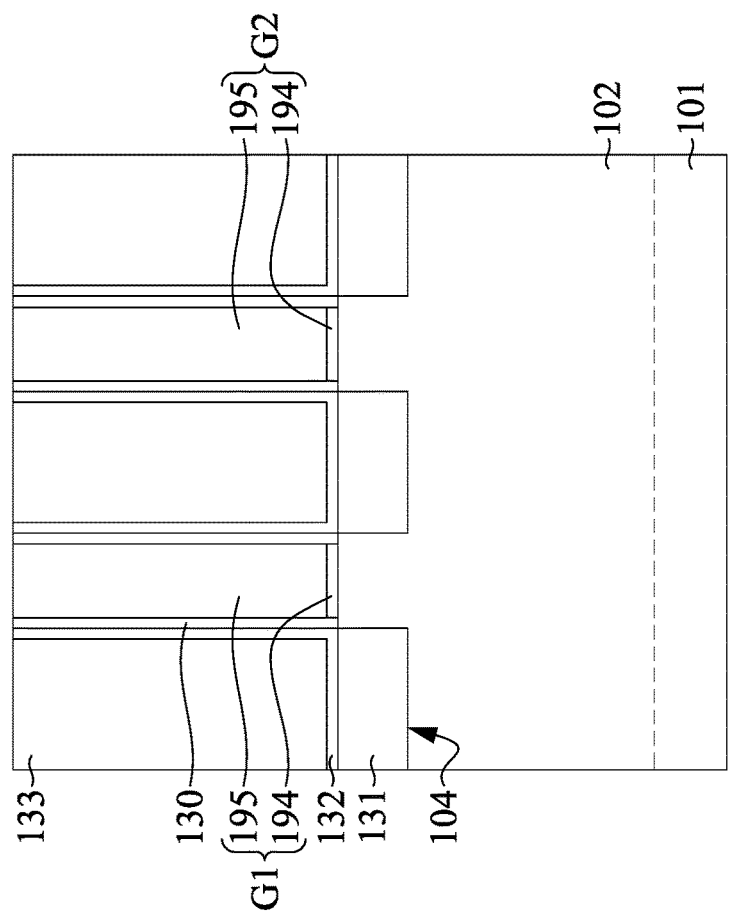
Figure 12A:
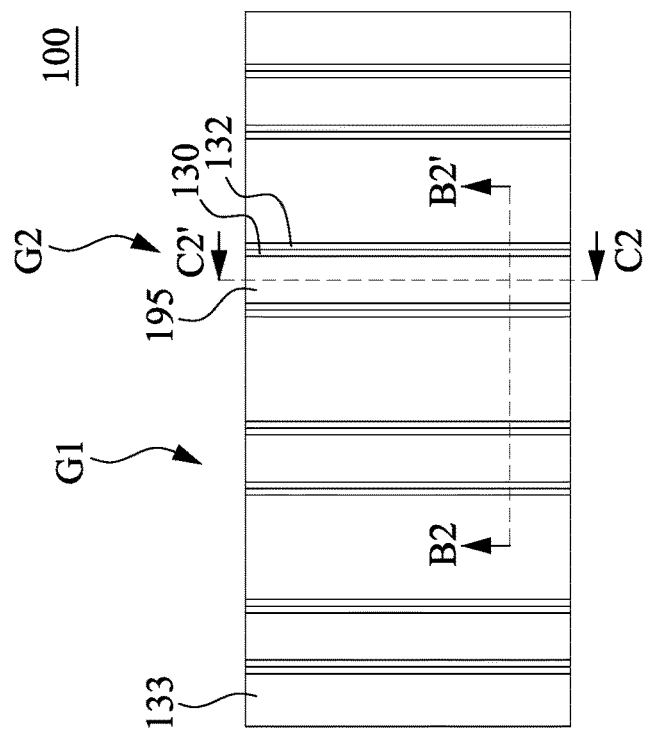

Returning to FIG. 1A, the method M then proceeds to block S111 where dummy gate structures are formed over the semiconductor fin. With reference to FIGS. 12A to 12C, in some embodiments of block S111, dummy gate structures G1 and G2 are over the semiconductor fin 102. In greater detail, a gate dielectric layer 194 is blanket formed over the substrate 101 to cover the semiconductor fin 102 and the isolation dielectric 120, and a dummy gate electrode layer 195 is formed over the gate dielectric layer 194. In some embodiments, the gate dielectric layer 194 is made of high-k dielectric materials, such as metal oxides, transition metal-oxides, or the like. Examples of the high-k dielectric material include, but are not limited to, hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$) alloy, or other applicable dielectric materials. In some embodiments, the gate dielectric layer 194 is an oxide layer. The gate dielectric layer 194 may be formed by a deposition processes, such as chemical vapor deposition (CVD), physical vapor deposition (PVD), atomic layer deposition (ALD), plasma enhanced CVD (PECVD) or other suitable techniques. In some embodiments, the dummy gate electrode layer 195 may include polycrystalline-silicon (poly-Si), poly-crystalline silicon-germanium (poly-SiGe), metallic nitrides, metallic silicides, metallic oxides, or metals. In some embodiments, the dummy gate electrode layer 195 includes a metal-containing material such as TiN, TaN, TaC, Co, Ru, Al, combinations thereof, or multi-layers thereof. The dummy gate electrode layer 195 may be deposited by CVD, physical vapor deposition (PVD), sputter deposition, or other techniques suitable for depositing conductive materials.

Subsequently, a mask layer (not shown) is formed over the dummy gate electrode layer 195 and then patterned to form separated mask portions. The patterned mask layer may be formed by a series of operations including deposition, photolithography patterning, and etching processes. The photolithography patterning processes may include photoresist coating (e.g., spin-on coating), soft baking, mask aligning, exposure, post-exposure baking, developing the photoresist, rinsing, drying (e.g., hard baking), and/or other applicable processes. Subsequently, one or more etching processes are performed to form dummy gate structures G1 and G2 wrapping around the semiconductor fin 102 using the patterned mask as an etching mask, and the patterned mask layer is removed after the etching. The etching processes may include dry etching, wet etching, and/or other etching methods (e.g., reactive ion etching). The dummy gate structure G1 and G2 each includes a gate dielectric layer 194 and a dummy gate electrode layer 195 over the gate dielectric layer 194. The dummy gate structures G1 and G2 have substantially parallel longitudinal axes that are substantially perpendicular to a longitudinal axis of the semiconductor fin 102. The dummy gate structures G1 and G2 will be replaced with replacement gate structure RG1 and RG2 (see FIGS. 13A to 13C) using a "gate-last" or replacement-gate process.

Returning to FIG. 1A, the method M then proceeds to block S112 where gate spacers are formed along sidewalls of the dummy gate structures. With reference to FIGS. 12A to 12C, in some embodiments of block S112, gate spacers 130 are formed along sidewalls of the dummy gate structures G1 and G2. In some embodiments, the gate spacers 130 may include silicon oxide, silicon nitride, silicon oxynitride, silicon carbide, silicon carbonitride, silicon oxycarbonitride, silicon oxycarbide, porous dielectric materials, hydrogen doped silicon oxycarbide (SiOC:H), low-k dielectric materials, or other suitable dielectric materials. The gate spacers 130 may include a single layer or multilayer structure made of different dielectric materials. The method of forming the gate spacers 130 includes blanket forming a dielectric layer on the dummy gate structures G1 and G2 and the substrate 101 using, for example, CVD, PVD or ALD, and then performing an etching process such as anisotropic etching to remove horizontal portions of the dielectric layer. The remaining portions of the dielectric layer on sidewalls of the dummy gate structures G1 and G2 can serve as the gate spacers 130. In some embodiments, the gate spacers 130 may be used to offset subsequently formed doped regions, such as source/drain regions. The gate spacers 130 may further be used for designing or modifying the source/drain region profile.

Returning to FIG. 1A, the method M then proceeds to block S113 where source/drain recesses are formed into the fin. With reference to FIGS. 12A to 12C, in some embodiments of block S113, portions of the semiconductor fin 102 not covered by the dummy gate structures G1 and G2 and the gate spacers 130 are recessed to form recesses 104. Formation of the recesses 104 may include a dry etching process, a wet etching process, or combination dry and wet etching processes. This etching process may include reactive ion etch (RIE) using the dummy gate structures G1 and G2 and gate spacers 130 as masks, or by any other suitable removal process. After the etching process, a pre-cleaning process may be performed to clean the recesses 104 with hydrofluoric acid (HF) or other suitable solution in some embodiments.

Returning to FIG. 1A, the method M then proceeds to block S114 where source/drain structures are formed into the recesses. With reference to FIGS. 12A to 12C, in some embodiments of block S114, epitaxial source/drain structures 131 are respectively formed in the recesses 104. The epitaxial source/drain structures 131 may be formed using one or more epitaxy or epitaxial (epi) processes, such that Si features, SiGe features, silicon phosphate (SiP) features, silicon carbide (SiC) features and/or other suitable features can be formed in a crystalline state on the semiconductor fins 102. In some embodiments, lattice constants of the epitaxial source/drain structures 131 are different from that of the semiconductor fin 102, so that the channel region between the epitaxial source/drain structures 131 can be strained or stressed by the epitaxial source/drain structures 131 to improve carrier mobility of the semiconductor device and enhance the device performance.

In some embodiments, the epitaxy process includes CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor fin 102 (e.g., silicon, silicon germanium, silicon phosphate, or the like). The epitaxial source/drain structures 131 may be in-situ doped. The doping species include p-type dopants, such as boron or $BF_2$; n-type dopants, such as phosphorus or arsenic; and/or other suitable dopants including combinations thereof. If the epitaxial source/drain structures 131 are not in-situ doped, an implantation process is performed to dope the epitaxial source/drain structures 131. One or more annealing processes may be performed to activate the epitaxial source/drain structures 131. The annealing processes include rapid thermal annealing (RTA) and/or laser annealing processes.

Returning to FIG. 1A, the method M then proceeds to block S115 where a contact etch stop layer (CESL) and an interlayer dielectric (ILD) layer is formed over the source/drain structures, the dummy gate structures, and the gate spacers. With reference to FIGS. 12A to 12C, in some embodiments of block S115, a CESL 132 is formed over the source/drain structures 131, the dummy gate structures G1 and G2 and the gate spacers 130, and an ILD layer 133 is formed over the CESL 132, followed by performing a CMP process to remove excessive material of the ILD layer 133 and CESL 132 to expose the dummy gate structures G1 and G2. The CMP process may planarize a top surface of the ILD layer 133 with top surfaces of the dummy gate structures G1 and G2 and the gate spacers 130. In some embodiments, the ILD layer 133 includes silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD layer 133 may be formed using, for example, CVD, ALD, spin-on-glass (SOG) or other suitable techniques. In some embodiments, the CESL 132 includes silicon nitride, silicon oxynitride or other suitable materials. The CESL 132 can be formed using, for example, plasma enhanced CVD, low pressure CVD, ALD or other suitable techniques.

Figure 13B:
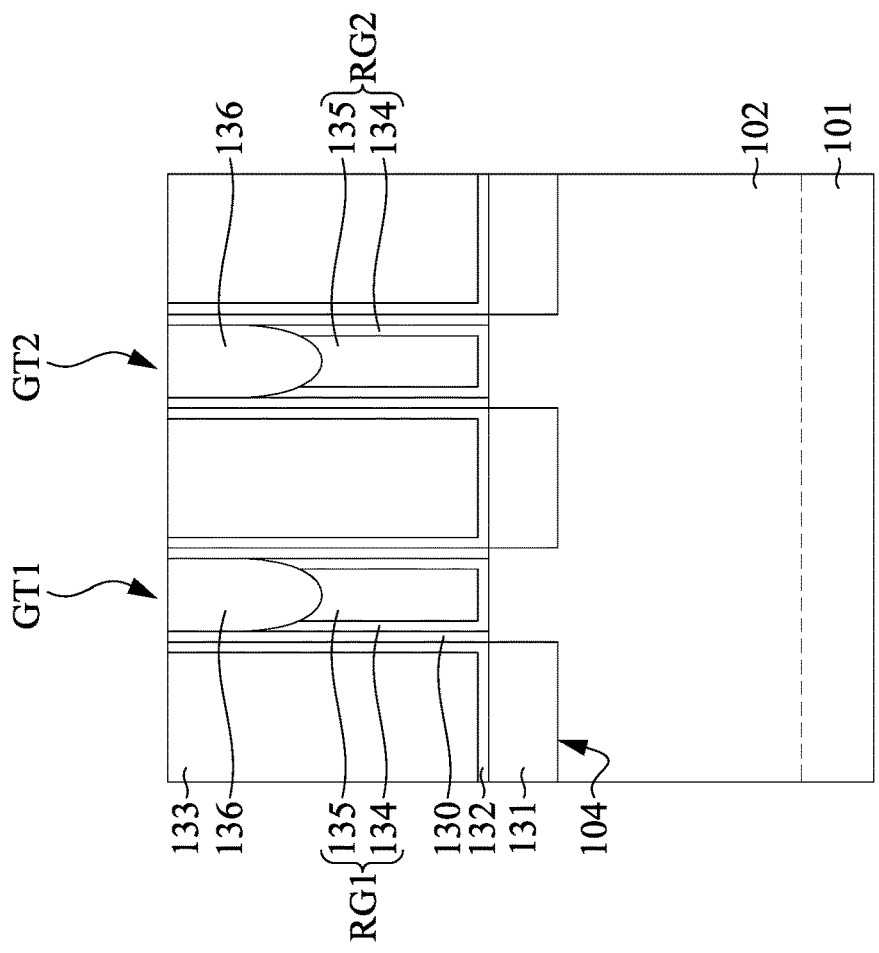
Figure 13A:
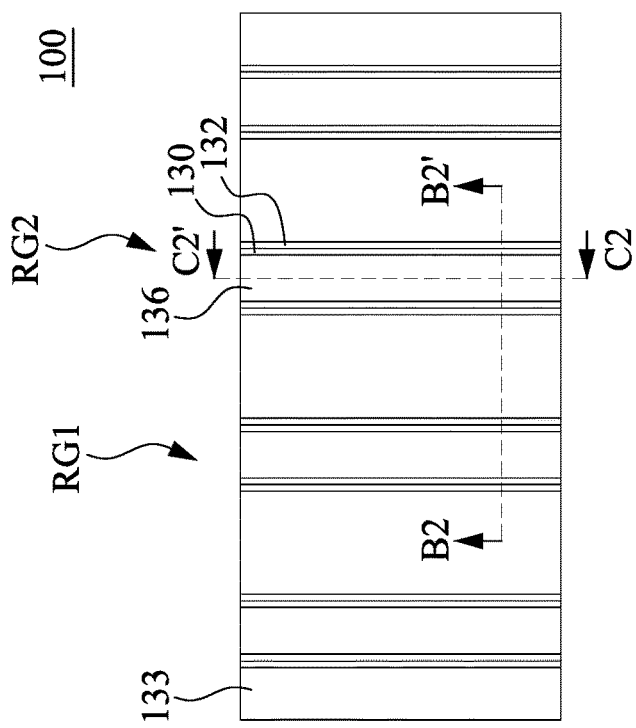
Figure 13C:
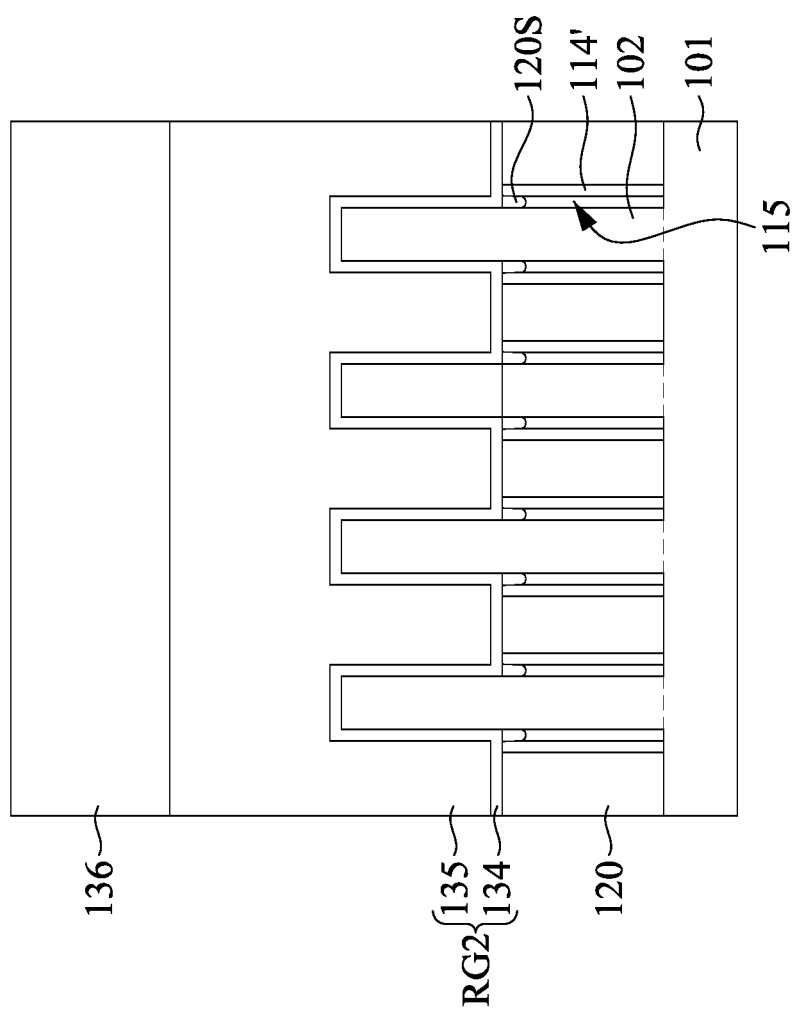

Returning to FIG. 1A, the method M then proceeds to block S116 where gate structures are formed to replace of the dummy gate structures. With reference to FIGS. 13A to 13C, in some embodiments of block S116, the dummy gate structures G1 and G2 shown in FIGS. 12A to 12C are removed to form gate trenches GT1 and GT2 with the gate spacers 130 as their sidewalls. Widths of the gate trenches GT1 and GT2 are associated with the corresponding dummy gate structures G1 and G2 as shown in FIGS. 12A to 12C. In some embodiments, the dummy gate structures G1 and G2 are removed by performing a first etching process and performing a second etching process after the first etching process. In some embodiments, the dummy gate electrode layer 194 is mainly removed by the first etching process, and the gate dielectric layer 195 is mainly removed by the second etching process that employs a different etchant than that used in the first etching process. In some embodiments, the dummy gate electrode layer 195 is removed, while the gate dielectric layers 194 remain in the gate trenches GT1 and GT2. Subsequently, replacement gate structures RG1 and RG2 are respectively formed in the gate trenches GT1 and GT2. An exemplary method of forming these replacement gate structures RG1 and RG2 may include blanket forming a gate dielectric layer over the substrate 101, forming one or more work function metal layers over the blanket gate dielectric layer, forming a fill metal layer over the one or more work function metal layers, and performing a CMP process to remove excessive materials of the fill metal layer, the one or more work function metal layers and the gate dielectric layer outside the gate trenches GT1 and GT2. As a result of this method, the replacement gate structures RG1 and RG2 each include a gate dielectric layer 134 and a metal gate electrode 135 wrapped around by the gate dielectric layer 134.

In some embodiments, the gate dielectric layer 134 may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. In some embodiments, the gate dielectric layer 134 may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof. In alternative embodiments, the gate dielectric layer 134 may have a multilayer structure such as one layer of silicon oxide (e.g., interfacial layer) and another layer of high-k material. In some embodiments, the gate dielectric layer 134 is made of the same material because they are formed from the same dielectric layer blanket deposited over the substrate 101.

The metal gate electrode 135 includes suitable work function metals to provide suitable work functions. In some embodiments, the metal gate electrode 135 may include one or more n-type work function metals (N-metal) for forming an n-type transistor on the substrate 101. The n-type work function metals may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. In alternative embodiments, the metal gate electrode 135 may include one or more p-type work function metals (P-metal) for forming a p-type transistor on the substrate 101. The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials. At least two of the metal gate electrodes 135 are made of different work function metals so as to achieve suitable work functions in some embodiments. In some embodiments, an entirety of the metal gate electrode 135 is a work function metal.

Subsequently, the non-zero bias plasma etching step is performed to thin down the gate structures RG1 and RG2, because the non-zero bias can drive more plasmas to scale down gate structures RG1 and RG2 compared to zero bias. In some embodiments, the non-zero bias plasma etching step uses a gas mixture of $Cl_2$, $O_2$, $BCl_3$, and Ar with a bias in a range from about 25V to about 1200V. Due to the nature of plasmas driven by non-zero bias, the non-zero bias etching step exhibits slower etch rate at the regions close to the gate spacers 130 (e.g., peripheral regions of the gate structures RG1 and RG2) than that at regions farther away from the gate spacers 130 (e.g., middle regions or central regions of the gate structures RG1 and RG2). The etch rate difference leads to curved top surfaces of the resulting gate structures RG1 and RG2. This is described in greater detail with reference to FIGS. 13A to 13C, during the non-zero bias plasma etching step, the etching rate of the metal gate electrode adjacent to the gate spacer (e.g., peripheral regions of the metal gate electrode 135) is less than that away from the gate spacer 130 (e.g., central regions of the metal gate electrode 135). In addition, during the non-zero bias plasma etching step, the etching rate of gate dielectric layer 134 is less than on the metal gate electrode 135. In other words, in the non-zero bias plasma etching step, a removed amount of the metal gate electrode 135 adjacent to the gate spacer 130 is less than a removed amount of the metal gate electrode 135 away from the gate spacer 130. A removed amount of the gate dielectric layer 134 is less than a removed amount of the metal gate electrode 135 adjacent to the gate spacer 130 for the process period of the non-zero bias plasma etching step. Hence, after the non-zero bias plasma etching step, a topmost portion of the remained gate dielectric layer 134 is higher than a topmost portion of the remained metal gate electrode 135. The remained metal gate electrode 135 is recessed toward the substrate 101 and results in a concave profile.

Returning to FIG. 1A, the method M then proceeds to block S117 where dielectric caps are formed over respective gate structures. With reference to FIGS. 13A to 13C, in some embodiments of block S117, dielectric caps 136 are formed over respective gate structures RG1 and RG2 using, for example, a deposition process to deposit a dielectric material over the substrate 101, followed by a CMP process to remove excess dielectric material outside the gate trenches. In some embodiments, the dielectric caps 136 include silicon nitride or other suitable dielectric material. The dielectric caps 136 have different etch selectivity than the spacers 130, the contact etch stop layer 132, and/or the ILD layer 133, so as to selective etch back the dielectric caps 136. By way of example, if the dielectric cap 136 is SiN, the spacers 130, the contact etch stop layer 132, and/or the ILD layer 133 are dielectric materials different from SiN. The dielectric caps 136 can be used to define self-aligned contact region and thus referred to as SAC structures or a SAC layer.

Figure 14C:
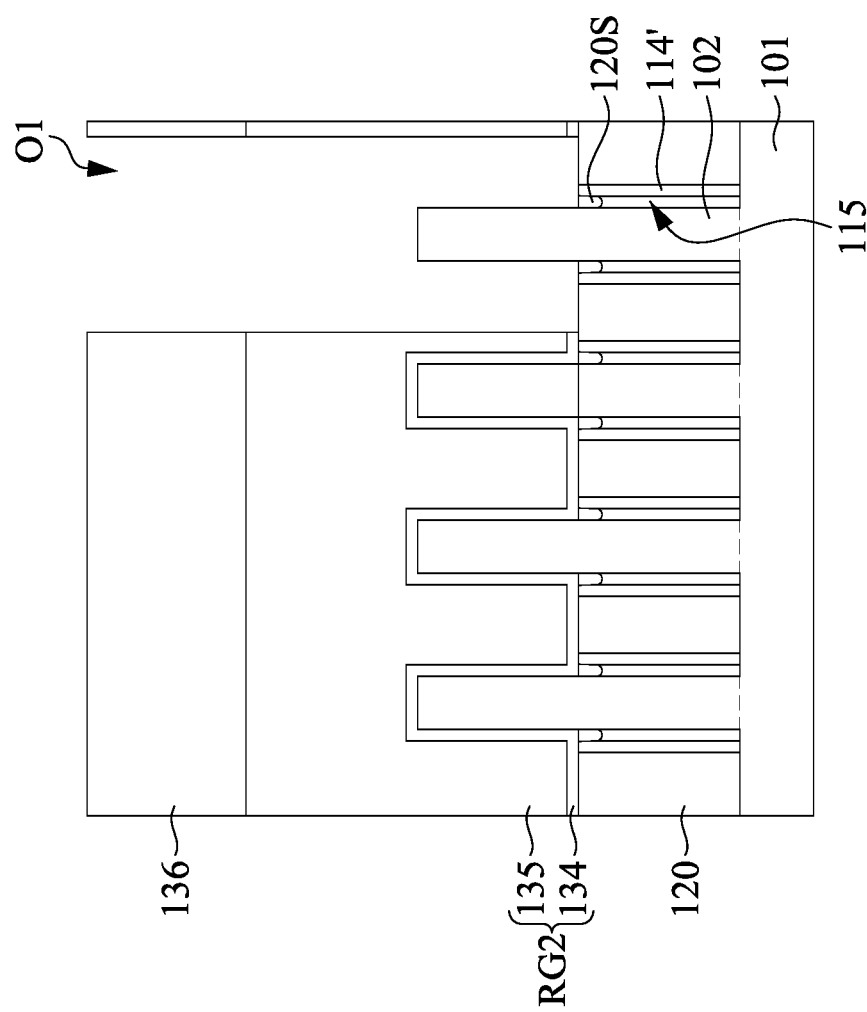

Returning to FIG. 1A, the method M then proceeds to block S118 where a portion of the gate structure, a portion of the dielectric cap overlaying the portion of the gate structure, and portions of the gate spacers and the CESL adjacent to the portion of the gate structure are removed to form a first opening that exposes the semiconductor fin. With reference to FIGS. 14A to 14C, in some embodiments of block S118, a patterned mask (not shown) is formed over the gate structures RG1 and RG2, the gate spacers 130, the CESL 132, and the ILD layer 133. One or more etching processes are performed using the patterned mask as an etching mask. In some embodiments, for example, one or more etching processes are performed to remove portions of the gate structure RG2, the dielectric caps 136 overlaying the gate structure RG2, and the gate spacers 130 and the CESL 132 adjacent to the gate structure RG2, such that an opening O1 is formed extending through the gate structure RG2 and exposes the semiconductor fin 102. Stated differently, the remainders of the gate structure RG2 are spaced apart from each other by the opening O1.

Figures 15A, 15B:
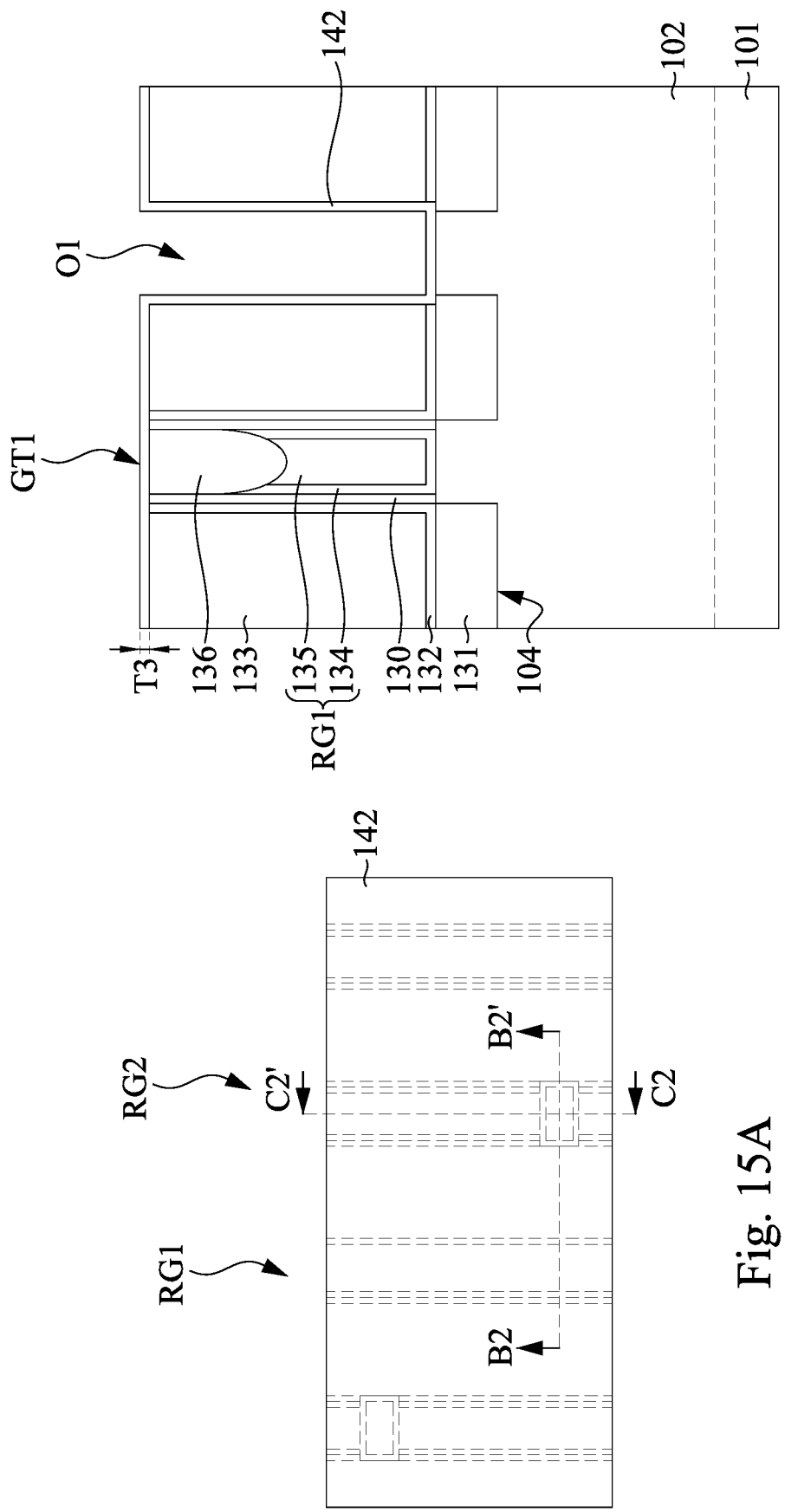
Figure 15C:
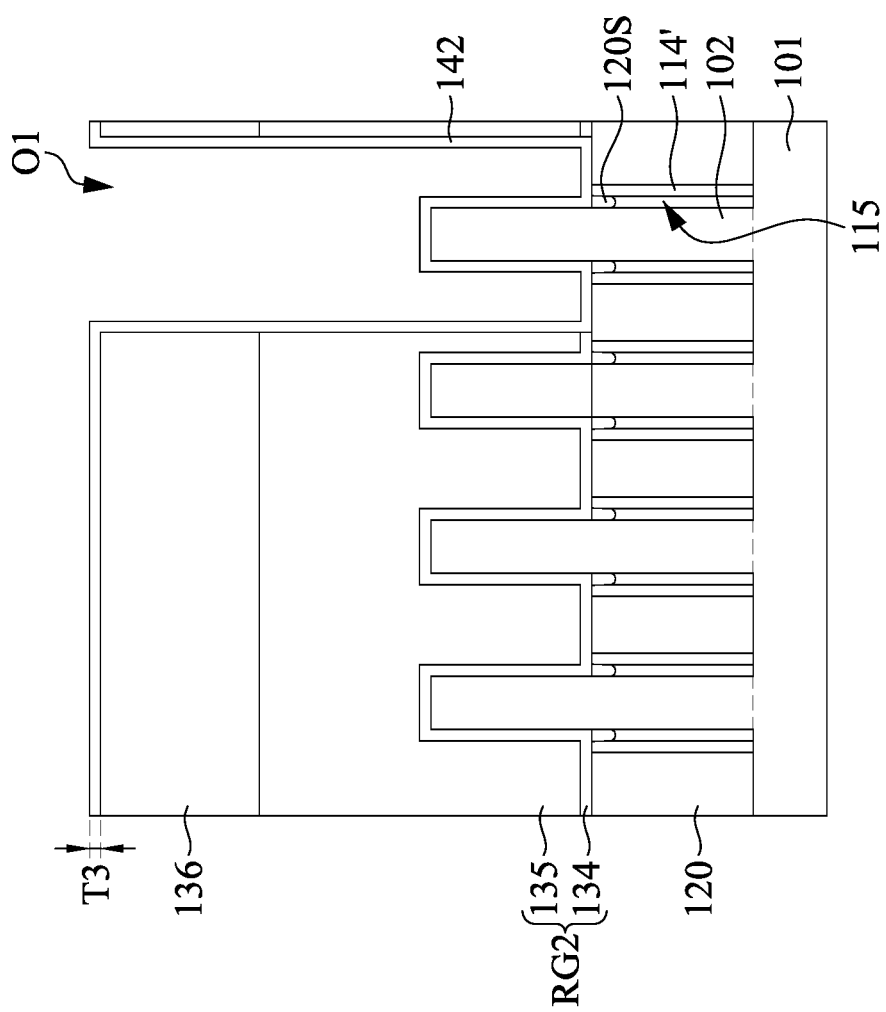

Returning to FIG. 1B, the method M then proceeds to block S119 where a second sacrificial layer is blanket deposited over the substrate. With reference to FIGS. 15A to 15C, in some embodiments of block S119, the sacrificial layer 142 is blanket deposited over the structure in FIGS. 14A to 14C (i.e., over the gate structures RG1 and RG2, the gate spacers 130, the CESL 132, and the ILD layer 133, the isolation dielectric 120, the spacers 114', and the semiconductor fin 102 in the opening O1). In some embodiments, the sacrificial layer 142 may include silicon oxide, silicon nitride, silicon oxynitride, SiCN, $SiC_xO_yN_z$, other suitable materials, or combinations thereof. For example, the sacrificial layer 142 may be a dielectric material such as silicon nitride. In some embodiments, the sacrificial layer 142 includes a material different than the semiconductor fin 102, the ILD layer 133 (see FIG. 15B), the isolation dielectric 120 (see FIG. 15B), and/or the dielectric cap 136 (see FIG. 15C). In some embodiments, the sacrificial layer 142 may have a thickness T3 in a range from about 1 nm to about 5 nm, such as about 1, 2, 3, 4, or 5 nm, and other thickness ranges are within the scope of the disclosure. In some embodiments, the sacrificial layer 142 may have a multilayer structure. The sacrificial layer 142 can be formed using a deposition method, such as plasma enhanced chemical vapor deposition (PECVD), low-pressure chemical vapor deposition (LPCVD), sub-atmospheric chemical vapor deposition (SACVD), or the like.

Figure 16C:
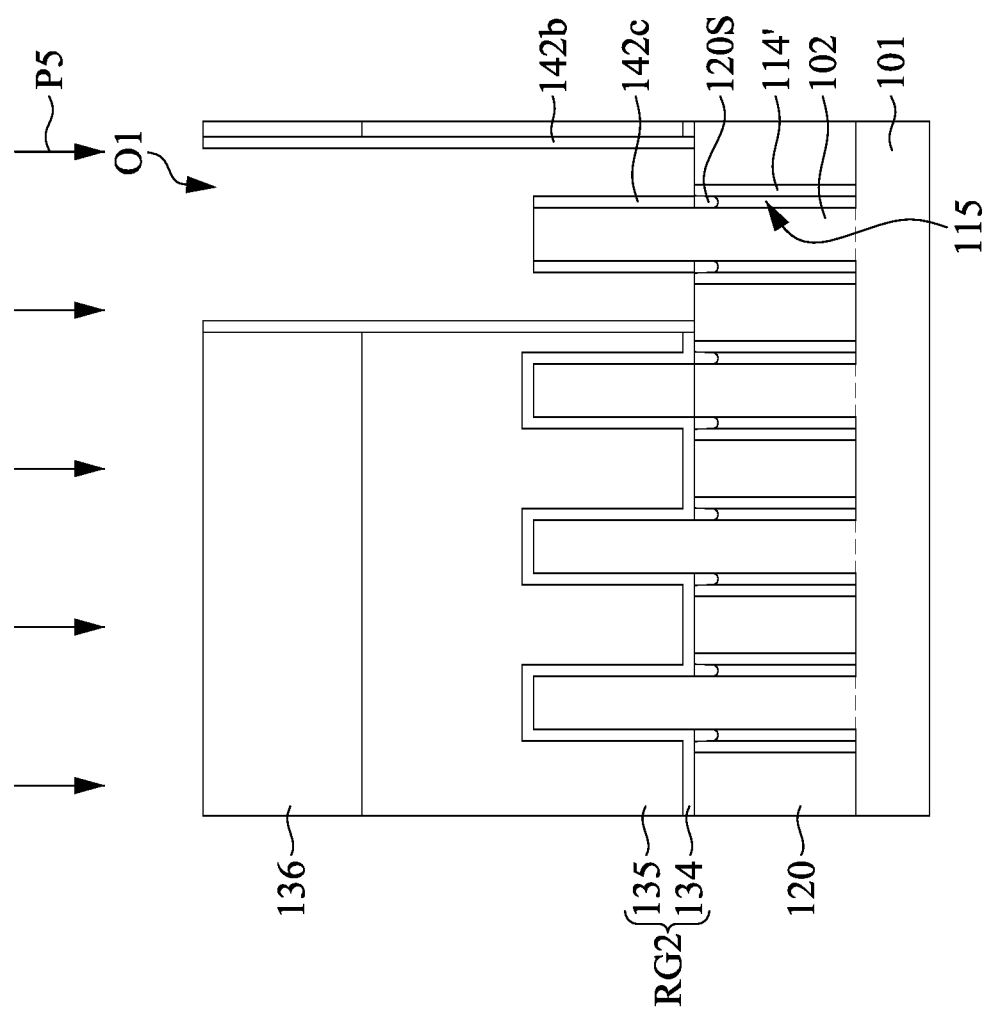

Returning to FIG. 1B, the method M then proceeds to block S120 where the second sacrificial layer is etched to form at least one second sacrificial spacer. With reference to FIGS. 16A to 16C, in some embodiments of block S120, the sacrificial layer 142 is etched to form sacrificial spacers 142a formed on opposite sidewalls of the ILD layer 133 in the opening O1 (see FIG. 16B), sacrificial spacers 142b formed on opposite sidewalls of the gate structure RG2 in the opening O1 (see FIG. 15C), and sacrificial spacers 142c formed the opposite sides of the semiconductor fin 102 in the opening O1 (see FIG. 16C). In greater detail, an anisotropic etching process P5 (e.g., a reactive-ion etching process, RIE or atomic layer etching (ALE)) is performed to selectively remove the horizontal portions of the sacrificial layer 142. The remaining vertical portions of the sacrificial layer 142 form sacrificial spacers 142a, 142b, and 142C. The sacrificial spacers 142a each vertically extends along sidewalls of the opening O1 of the gate structure RG2 from the top surface of the semiconductor fin 102. The sacrificial spacers 142b each vertically extends along sidewalls of the opening O1 of the ILD layer 133 from the top surface of the isolation dielectric 120. The sacrificial spacers 142c each vertically extends along the sidewalls of the semiconductor fin 102 in the opening O1 of the ILD layer 133 from the top surface of the isolation dielectric 120. By way of example but not limiting the present disclosure, the anisotropic etching process P5 may implement an oxygen-containing gas, a fluorine-containing gas (e.g., $CF_4$, $SF_6$, $CH_2F_2$, $CHF_3$, and/or $C_4F_6$, $C_4F_8$), a chlorine-containing gas (e.g., $Cl_2$, $CHC_3$, $CCl_4$, and/or $BCl_3$), a bromine-containing gas (e.g., HBr and/or $CHBr_3$), a phosphoric-containing gas (e.g., $H_3PO_4$), an iodine-containing gas, other suitable gases and/or plasmas, and/or combinations thereof. In some embodiments, the sacrificial layer 142 (see FIGS. 15A to 15C) is etched using, by way of example but not limiting the present disclosure.

This is described in greater detail with reference to FIGS. 16A to 16C, the anisotropic etching process P5 etches the sacrificial layer 142 (see FIGS. 15A to 15C) at a faster etch rate than it etches the ILD layer 133 (see FIG. 16B), the isolation dielectric 120 (see FIG. 16B), and/or the dielectric cap 136 (see FIG. 16C). By way of example but not limiting the present disclosure, a ratio of the etch rate of the sacrificial layer 142 to the etch rate of the ILD layer 133 may be greater than about 10, a ratio of the etch rate of the sacrificial layer 142 to the etch rate of the isolation dielectric 120 may be greater than about 10, and/or a ratio of the etch rate of the sacrificial layer 142 to the etch rate of the dielectric cap 136 may be greater than about 10. If the ratio of the etch rate of the sacrificial layer 142 to the etch rate of the ILD layer 133, the isolation dielectric 120, and/or the dielectric cap 136 is less than about 10, the anisotropic etching process P5 would significantly consume the ILD layer 133, the isolation dielectric 120, and/or the dielectric cap 136, which in turn adversely affects the semiconductor device.

Figures 17A, 17B:
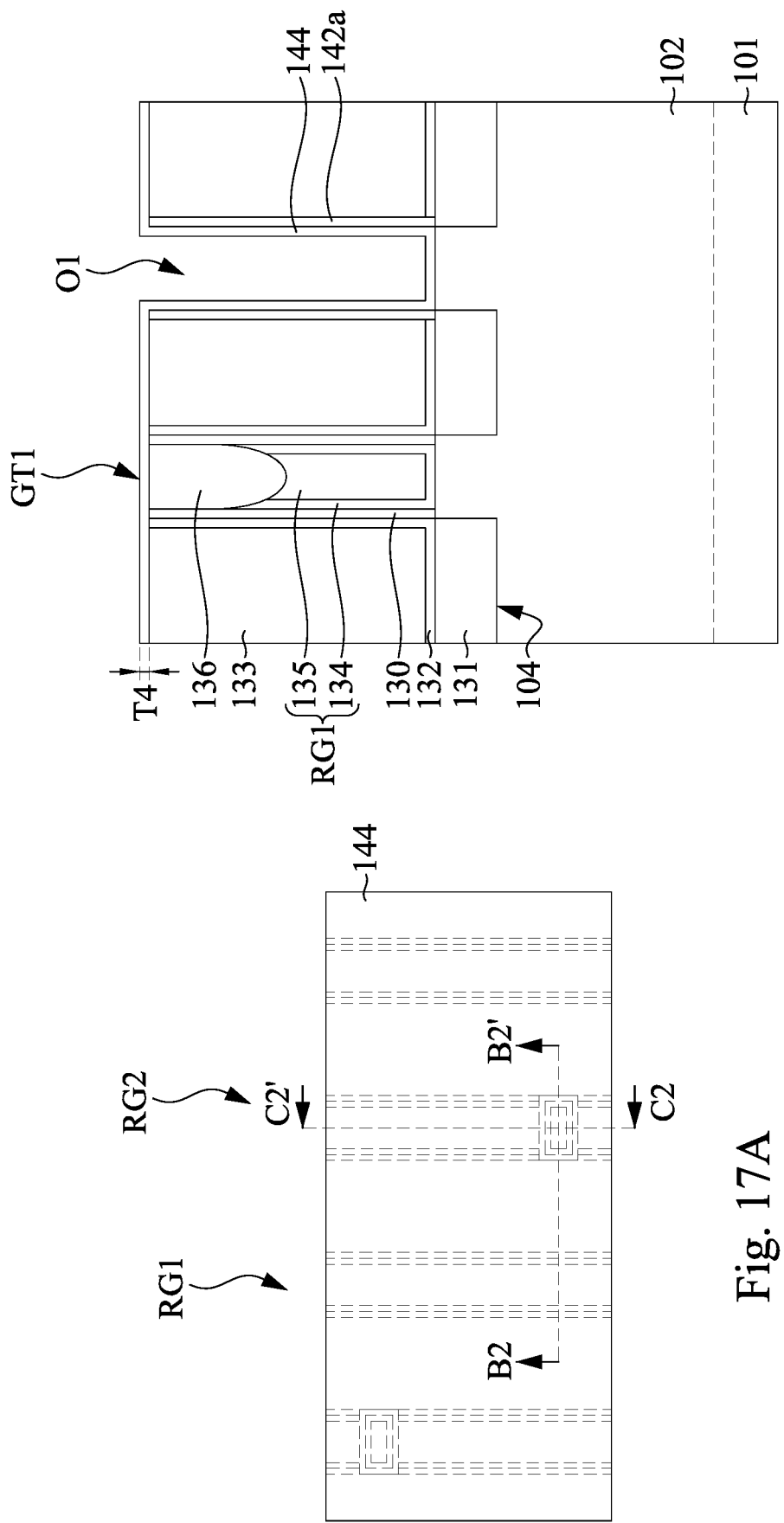
Figure 17C:
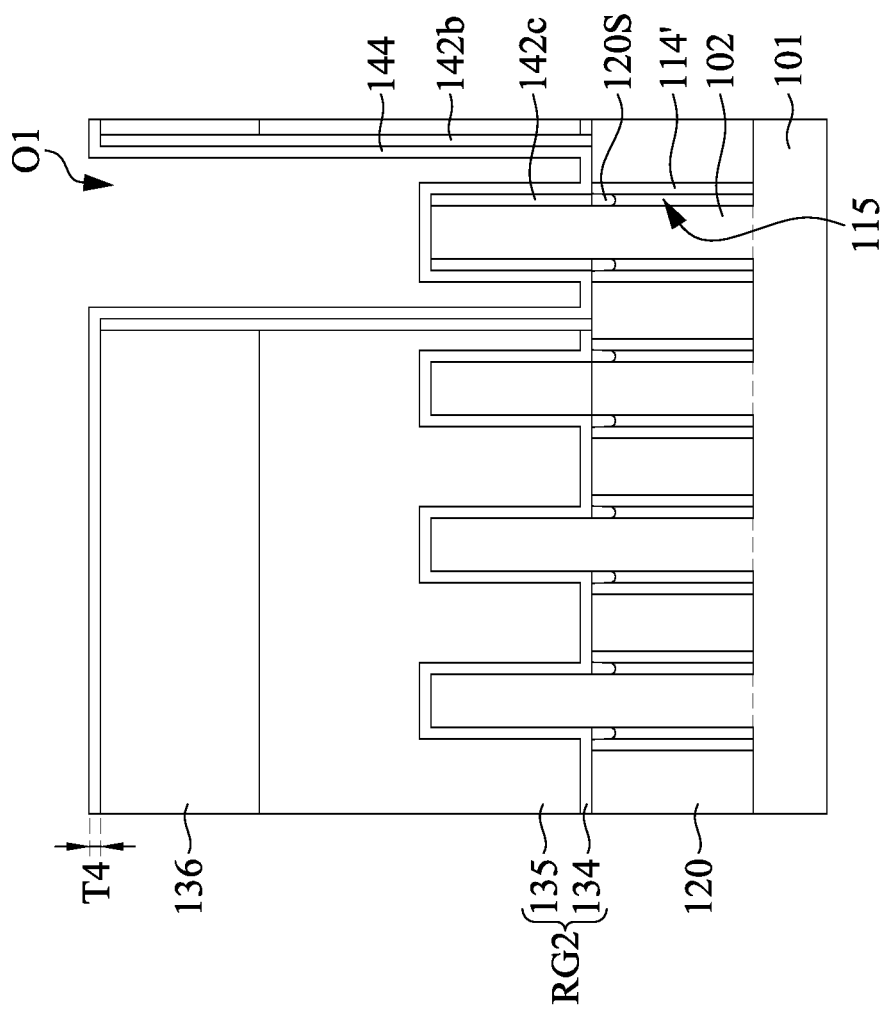

Returning to FIG. 1B, the method M then proceeds to block S121 where a second spacer layer is blanket deposited over the semiconductor substrate. With reference to FIGS. 17A to 17C, in some embodiments of block S121, a spacer layer 144 is blanket deposited over the structure as shown in FIGS. 16A to 16C (i.e., over the gate structures RG1 and RG2, the gate spacers 130, the CESL 132, and the ILD layer 133, the isolation dielectric 120, the spacers 114', and the sacrificial spacers 142a and 142b). In some embodiments, the spacer layer 144 may include silicon oxide, silicon nitride, silicon oxynitride, SiCN, $SiC_xO_yN_z$, other suitable materials, or combinations thereof. For example, the spacer layer 144 may be a dielectric material such as silicon oxide. In some embodiments, the spacer layer 144 may include a material different than the sacrificial spacers 142a, 142b, and 142c. In some embodiments, the spacer layer 144 may have a multilayer structure. In some embodiments, the spacer layer 144 may have a thickness T4 in a range from about 1 nm to about 5 nm, such as about 1, 2, 3, 4, or 5 nm, and other thickness ranges are within the scope of the disclosure. The spacer layer 144 can be formed using a deposition method, such as plasma enhanced chemical vapor deposition (PECVD), low-pressure chemical vapor deposition (LPCVD), Plasma. Enhanced Atomic Layer deposition (PEALD), or the like.

Figure 18C:
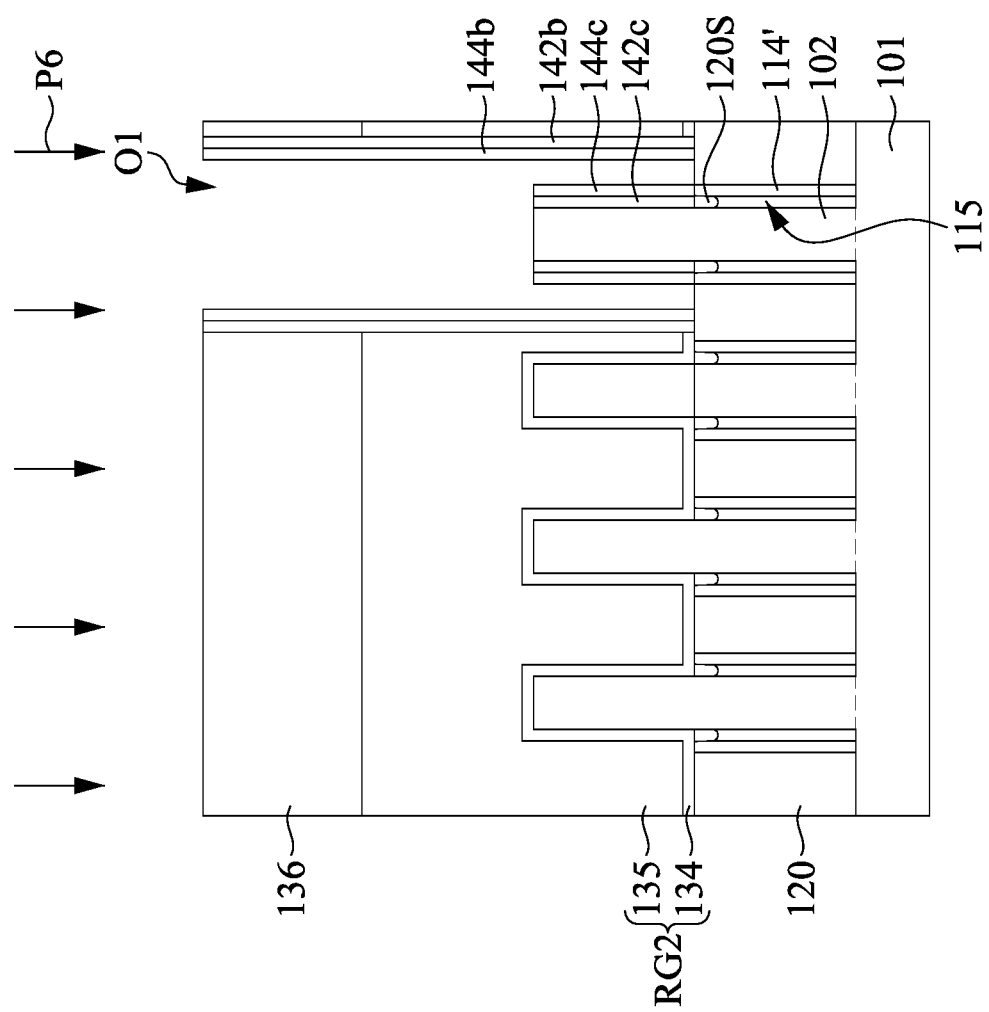

Returning to FIG. 1B, the method M then proceeds to block S122 where the second spacer layer is etched to form a second spacer. With reference to FIGS. 18A to 18C, in some embodiments of block S122, the spacer layer 144 is etched to form spacers 144a formed on opposite sidewalls of the ILD layer 133 (see FIG. 18B) in the opening O1, spacers 144b formed on opposite sidewalls of the gate structure RG2 (see FIG. 18C) in the opening O1, and spacers 144c formed the opposite sides of the semiconductor fin 102 in the opening O1. In greater detail, an anisotropic etching process P6 (e.g., a reactive-ion etching process, RIE or atomic layer etching (ALE)) is performed to selectively remove the horizontal portions of the spacer layer 144. The remaining vertical portions of the spacer layer 144 form the spacers 144a, 144b, and 144c. The spacer 144a vertically extends along a side surface of the sacrificial spacer 142a from the top surface of the semiconductor fin 102. The spacer 144b vertically extends along a side surface of the sacrificial spacer 142b from the top surface of the isolation dielectric 120. The spacer 144c vertically extends along a side surface of the sacrificial spacer 142c from the top surface of the isolation dielectric 120. By way of example but not limiting the present disclosure, the anisotropic etching process P6 may implement an oxygen-containing gas, a fluorine-containing gas (e.g., CF4, SF6, CH2F2, CHF3, and/or C4F6, C4F8), a chlorine-containing gas (e.g., Cl2, $CHCl_3$, $CCl_4$, and/or $BCl_3$), a bromine-containing gas (e.g., HBr and/or $CHBr_3$), a phosphoric-containing gas (e.g., $H_3PO_4$), an iodine-containing gas, other suitable gases and/or plasmas, and/or combinations thereof. In some embodiments, the spacer layer 144 (see FIGS. 17A to 17C) is etched using, by way of example and not limitation.

This is described in greater detail with reference to FIGS. 18A to 18C, the anisotropic etching process P6 etches the spacer layer 144 (see FIGS. 17A to 17C) at a faster etch rate than it etches the ILD layer 133 (see FIG. 18B), the sacrificial spacer 142a (see FIG. 18B), the isolation dielectric 120 (see FIG. 18C), the sacrificial spacers 142b and 142c (see FIG. 18C), and/or the dielectric cap 136 (see FIG. 18C). By way of example but not limiting the present disclosure, a ratio of the etch rate of the spacer layer 144 to the etch rate of the ILD layer 133 may be greater than about 10, a ratio of the etch rate of the spacer layer 144 to the etch rate of the isolation dielectric 120 may be greater than about 10, a ratio of the etch rate of the spacer layer 144 to the etch rate of the sacrificial spacers 142a, 142b, and 142c may be greater than about 10, and/or a ratio of the etch rate of the spacer layer 144 to the etch rate of the dielectric cap 136 may be greater than about 10. If the ratio of the etch rate of the sacrificial layer 142 to the etch rate of the ILD layer 133, the isolation dielectric 120, the dielectric cap 136, and/or the sacrificial spacers 142a, 142b, and 142c is less than about 10, the anisotropic etching process P6 would significantly consume the ILD layer 133, the isolation dielectric 120, the dielectric cap 136, and/or the sacrificial spacers 142a, 142b, and 142c, which in turn adversely affects the semiconductor device.

Figure 19B:
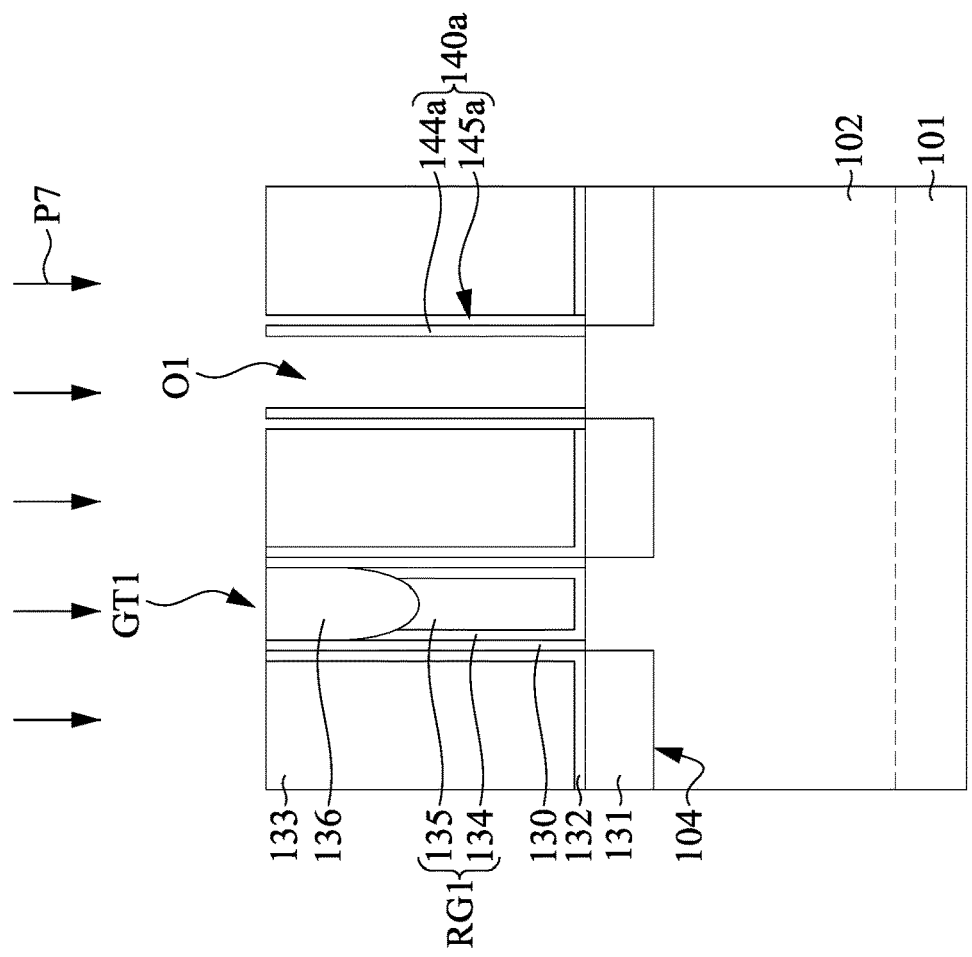
Figure 19A:
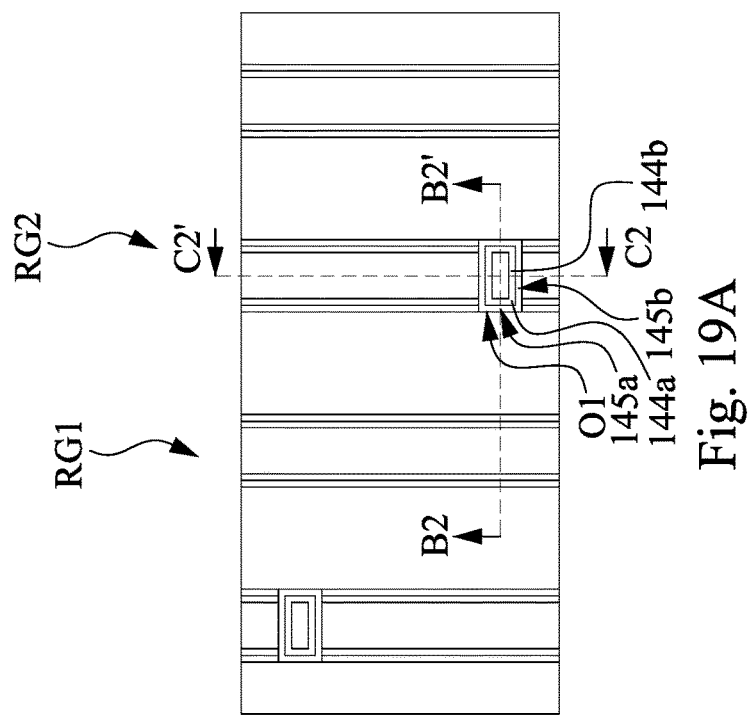
Figure 19C:
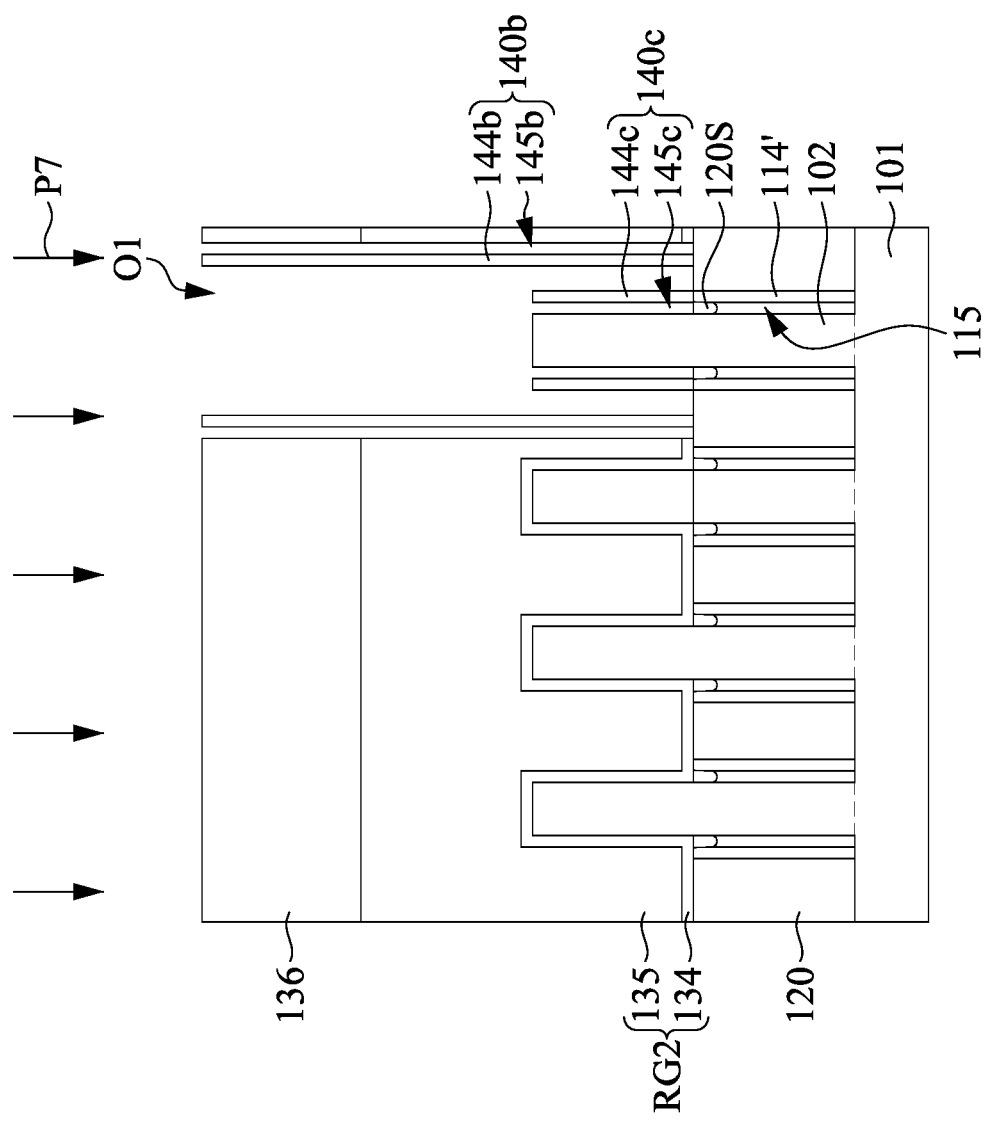

Returning to FIG. 1B, the method M then proceeds to block S123 where the second sacrificial spacer is removed to form a second air spacer. With reference to FIGS. 19A to 19C, in some embodiments of block S123, a selective etching process P7 is performed to selectively remove the sacrificial spacer 142a, 142b, and 142c (see FIGS. 18A to 18C). As a result, an air spacer 145a is formed between the ILD layer 133 and the spacer 144a. An air spacer 145b is formed between the replacement gate structure GR2 and the spacer 144b. An air spacer 145c is formed between an upper portion of the semiconductor fin 102 and the spacer 144c. Stated differently, the ILD layer 133 and the spacer 144a are separated by the air spacer 145a. The replacement gate structure GR2 and the spacer 144b are separated by the air spacer 145b. The semiconductor fin 102 and the spacer 144c are separated by the air spacer 145c. After the air spacers 145a, 145b, and 145c are formed, the spacer 144a and the air spacer 145a can be collectively referred to as an insulating structure 140a, the spacer 144b and the air spacer 145b can be collectively referred to as an insulating structure 140b, and the spacer 144c and the air spacer 145c can be collectively referred to as an insulating structure 140c. The insulating structures 140a, 140b, and 140c are formed by removing the sacrificial spacers 144a, 144b, and 144c (see FIGS. 18A to 18C), and thus the shape of the air spacers 145a, 145b, and 145c substantially inherit the shapes of the sacrificial spacers 144a, 144b, and 144c. In some embodiments, portions of the isolation dielectric 120 and the semiconductor fin 102 are exposed in the air spacers 145a, 145b, and 145c.

As mentioned before, thicknesses of the sacrificial spacers 144a, 144b, and 144c (see FIGS. 18A to 18C) are in a range from about 1 nm to about 5 nm. As a result, the air spacers 145a, 145b, and 145c may have thicknesses also in a range from about 1 nm to about 5 nm, such as about 1, 2, 3, 4, or 5 nm. If the thicknesses of the sacrificial spacers 144a, 144b, and 144c are smaller than 1 nm, the sacrificial spacers 144a, 144b, and 144c are too thin such that the etchant is hard to flow into the space between the ILD layer 133 and the spacer 144a, hard to flow into the space between the gate structure GR2 and the spacer 144b, and hard to flow into the space between the semiconductor fin 102 and the spacer 144c, which in turn affects the formation of the air spacers 145a, 145b, and 145c. On the other hand, if thicknesses of the sacrificial spacers 144a, 144b, and 144c are greater than 5 nm, the thicknesses of the air spacers 145a, 145b, and 145c inheriting the thicknesses of the sacrificial spacers 144a, 144b, and 144c may be too thick, such that the material that will be formed above of the air spacers 145a, 145b, and 145c may easily flow into lower portions of the air spacers 145a, 145b, and 145c, which in turn affects the formation of the air spacers 145a, 145b, and 145c. Therefore, during the etching process P7, the sacrificial spacers 142a, 142b, and 142c (see FIGS. 18A to 18C) may be etched away and expose the vertical sidewalls of the semiconductor fin 102, the replacement gate structure GR2, and the ILD layer 133, which in turn affects the formation of the air spacers 145a, 145b, and 145c.

In the present disclosure, the sacrificial layer 142 has large dielectric constant, for example, greater than 1. On the other hand, the insulating structures 140a, 140b, and 140c include the air spacers 145a, 145b, and 145c that have a dielectric constant equal to 1 ($k_{air}=1$), which is lower than the dielectric constant of the sacrificial layer 142. Thus, the equivalent dielectric constant of the insulating structures 140a, 140b, and 140c may be reduced by forming the air spacers 145a, 145b, and 145c. As a result, the overall capacitance of the insulating structures 140a, 140b, and 140c may be reduced, which in turn will reduce the RC delay and further improve the device performance. Moreover, since the air spacers 145a, 145b, and 145c are formed by removing the sacrificial spacers 142a, 142b, and 142C, the air spacers 145a, 145b, and 145c may inherit the shape of the sacrificial spacers 142a, 142b, and 142C, and thus it is easier to control the size of the air spacers 145a, 145b, and 145c and further control the equivalent capacitance of the insulating structures 140a, 140b, and 140c.

In some embodiments, the etching process P7 may be a selective isotropic etching process (e.g., a reactive-ion etching process, RIE or atomic layer etching (ALE)). By way of example but not limiting the present disclosure, the etching process P7 may implement an oxygen-containing gas, a fluorine-containing gas (e.g., CF4, SF6, CH2F2, CHF3, and/or C4F6, C4F8), a chlorine-containing gas (e.g., Cl2, CHCl3, CCl4, and/or BCl3), a bromine-containing gas (e.g., HBr and/or CHBr$_3$), a phosphoric-containing gas (e.g., H$_3$PO$_4$), an iodine-containing gas, other suitable gases and/or plasmas, and/or combinations thereof. In some embodiments, the sacrificial spacers 142a, 142b, and 142c (see FIGS. 18A to 18C) is etched using, by way of example but not limiting the present disclosure, NH$_4$OH when silicon is used in the nitride sacrificial spacers 142a, 142b, and 142c. This is described in greater detail with reference to FIGS. 19A to 19C, the etching process P7 etches the sacrificial spacers 142a, 142b, and 142c (see FIGS. 18A to 18C) at a faster etch rate than it etches the semiconductor fin 102, the ILD layer 133 (see FIG. 18B), the spacers 144a (see FIG. 18B), the spacers 144b and 144c (see FIG. 18C), the isolation dielectric 120 (see FIG. 18C), and the gate structure RG2 (see FIG. 18C). By way of example but not limiting the present disclosure, a ratio of the etch rate of the sacrificial spacers 142a, 142b, and 142c to the etch rate of the semiconductor fin 102, the ILD layer 133, the spacers 144a, 144b and 144c, the isolation dielectric 120, and/or the gate structure RG2 may be greater than about 10. If the ratio of the etch rate of the sacrificial spacers 142a, 142b, and 142c to the etch rate of the semiconductor fin 102, the ILD layer 133, the spacers 144a, 144b and 144c, the isolation dielectric 120, and/or the gate structure RG2 is less than about 10, the etching process P7 would significantly consume the semiconductor fin 102, the ILD layer 133, the spacers 144a, 144b and 144c, the isolation dielectric 120, and/or the gate structure RG2, which in turn adversely affects the semiconductor device. In some embodiments, the etching process P7 may be an isotropic etching process. In some embodiments, the etching process P7 uses a different etchant than the previous etching process P6.

Figure 20C:
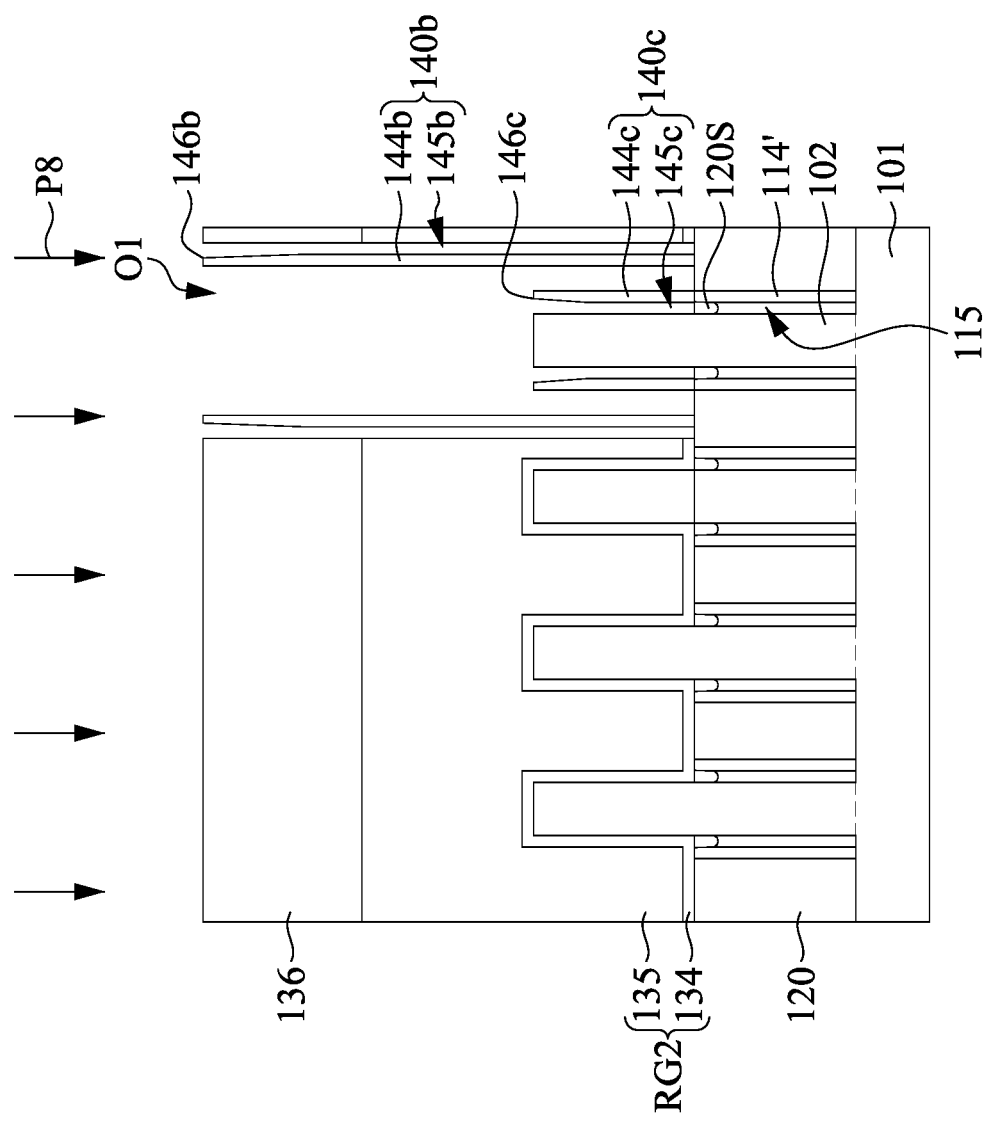

Returning to FIG. 1B, the method M then proceeds to block S124 where an upper portion of the second spacer is etched to form a rounding top corner thereon. With reference to FIGS. 20A to 20C, in some embodiments of block S124, an upper portion of the spacer 144a is etched to form a tapered top end 146a thereon, an upper portion of the spacer 144b is etched to form a tapered top end 146b thereon, and an upper portion of the spacer 144c is etched to form a tapered top end 146c thereon. In some embodiments, an etching process P8 is performed on the spacers 144a, 144b, and 144c. In some embodiments, the etching process P8 is a plasma etching process employing one or more etchants.

This is described in greater detail with reference to FIGS. 20A to 20C, the non-zero bias plasma etching process is performed to etch the upper portions of the spacers 144a, 144b, and 144c such that the top ends of the spacers 144a, 144b, and 144c are tapered. The non-zero bias can drive more plasmas to scale down the spacers 144a, 144b, and 144c compared to zero bias. For example, the non-zero bias plasma etching process begins with ion bombardment to remove compounds of the spacers 144a, 144b, and 144c. Hence, the upper portion of the spacers 144a, 144b, and 144c have narrower widths than lower portions of the spacers 144a, 144b, and 144c. Stated differently, upper portions of the air spacers 145a, 145b, and 145c have wider widths than lower portions of the air spacers 145a, 145b, and 145c, such that an isolation dielectric that will be formed later may flow into the upper portions of the air spacers 145a, 145b, and 145c. Therefore, upper ends of the air spacers 145a, 145b, and 145c are blocked by the isolation dielectric that will be formed later, and thus the air spacers 145a, 145b, and 145c can be protected during the subsequent process, such that other material would not fill into the air spacers 145a, 145b, and 145c.

The profile of the spacers 144a, 144b, and 144c depend on process conditions of the etching process P8 (e.g., etching time duration and/or the like). By way of example but not limiting the present disclosure, the anisotropic etching process P8 may implement an oxygen-containing gas, a fluorine-containing gas (e.g., $CF_4$, $SF_6$, $CH_2F_2$, $CHF_3$, and/or $C_4F_6$, $C_4F_8$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, a phosphoric-containing gas (e.g., $H_3PO_4$), other suitable gases and/or plasmas, and/or combinations thereof. In some embodiments, the non-zero bias plasma etching process uses a gas mixture of $C_4F_6$, and Ar with a bias in a range from about 50 W to about 1000 W. If the bias power is higher than about 1500 W, the plasma might result in unwanted damage to the ILD layer 133 (see FIG. 20B), the gate structure RG2 (see FIG. 20C), and the dielectric cap 136 (see FIG. 20C). If the bias power is lower than about 30 W, the spacers 144a, 144b, and 144c may not be tapered enough to allow the isolation dielectric that will be formed later to flow into the upper portion of the air spacers 145a, 145b, and 145c.

Returning to FIG. 1B, the method M then proceeds to block S125 where a second isolation dielectric is formed to overfill the first opening and to seal the second air spacer. With reference to FIGS. 21A to 21C, in some embodiments of block S125, an isolation dielectric 147 is formed to overfill the opening O1 and cover the semiconductor fin 102 in the opening O1. As mentioned before, because the upper portions of the air spacers 145a, 145b, and 145c have wider widths than the lower portions of the air spacers 145a, 145b, and 145c, material of the isolation dielectric 147 may flow into the upper portions of the air spacers 145a, 145b, and 145c and seal the air spacers 145a, 145b, and 145c. Accordingly, the isolation dielectric 147 includes a seal portion 147a (see FIG. 21B) embedded between the spacers 144a and the ILD layer 133, a seal portion 147b (see FIG. 21C) embedded between the spacers 144b and the gate structure RG2, and a seal portion 147c (see FIG. 21C) embedded between the spacers 144c and the semiconductor fin 102. Therefore, the upper end of the air spacers 145a, 145b, and 145c are blocked by the seal portions 147a, 147b, and 147c of the isolation dielectric 147, and thus the air spacers 145a, 145b, and 145c can be protected during the subsequent process, such that other material would not fill into the air spacers 145a, 145b, and 145c.

In some embodiments, the isolation dielectric 147 is made of silicon oxide, silicon nitride, silicon oxynitride, fluoride-doped silicate glass (FSG), or other low-K dielectric materials. In some embodiments, the isolation dielectric 147 may be formed using a high-density-plasma (HDP) chemical vapor deposition (CVD) process, using silane ($SiH_4$) and oxygen ($O_2$) as reacting precursors. In some other embodiments, the isolation dielectric 147 may be formed using a sub-atmospheric CVD (SACVD) process or high aspect-ratio process (HARP), in which process gases may include tetraethylorthosilicate (TEOS) and ozone ($O_3$). In yet other embodiments, the isolation dielectric 147 may be formed using a spin-on-dielectric (SOD) process, such as hydrogen silsesquioxane (HSQ) or methyl silsesquioxane (MSQ). Other processes and materials may be used. In some embodiments, the isolation dielectric 147 can have a multi-layer structure, for example, a thermal oxide liner layer with silicon nitride formed over the liner. Thereafter, a thermal annealing may be optionally performed to the isolation dielectric 147. In some embodiments, the isolation dielectric 147 may be made of a material the same as the spacers 144a, 144b, and 144c. In some embodiments, the isolation dielectric 147 may be made of a material different than the spacers 144a, 144b, and 144c.

Returning to FIG. 1B, the method M then proceeds to block S126 where a second planarization process is performed to the second isolation dielectric. With reference to FIGS. 22A to 22C, in some embodiments of block S126, a planarization process such as chemical mechanical polish (CMP) is performed to remove the excess isolation dielectric 147 over the ILD layer 133 and the gate trenches GT1 and GT2 such that top surfaces of the ILD layer 133 and the gate trenches GT1 and GT2 are exposed and the air spacers 145a, 145b, and 145c remain covered by the seal portions 147a, 147b, and 147c of the isolation dielectric 147.

Figures 35A, 35B:
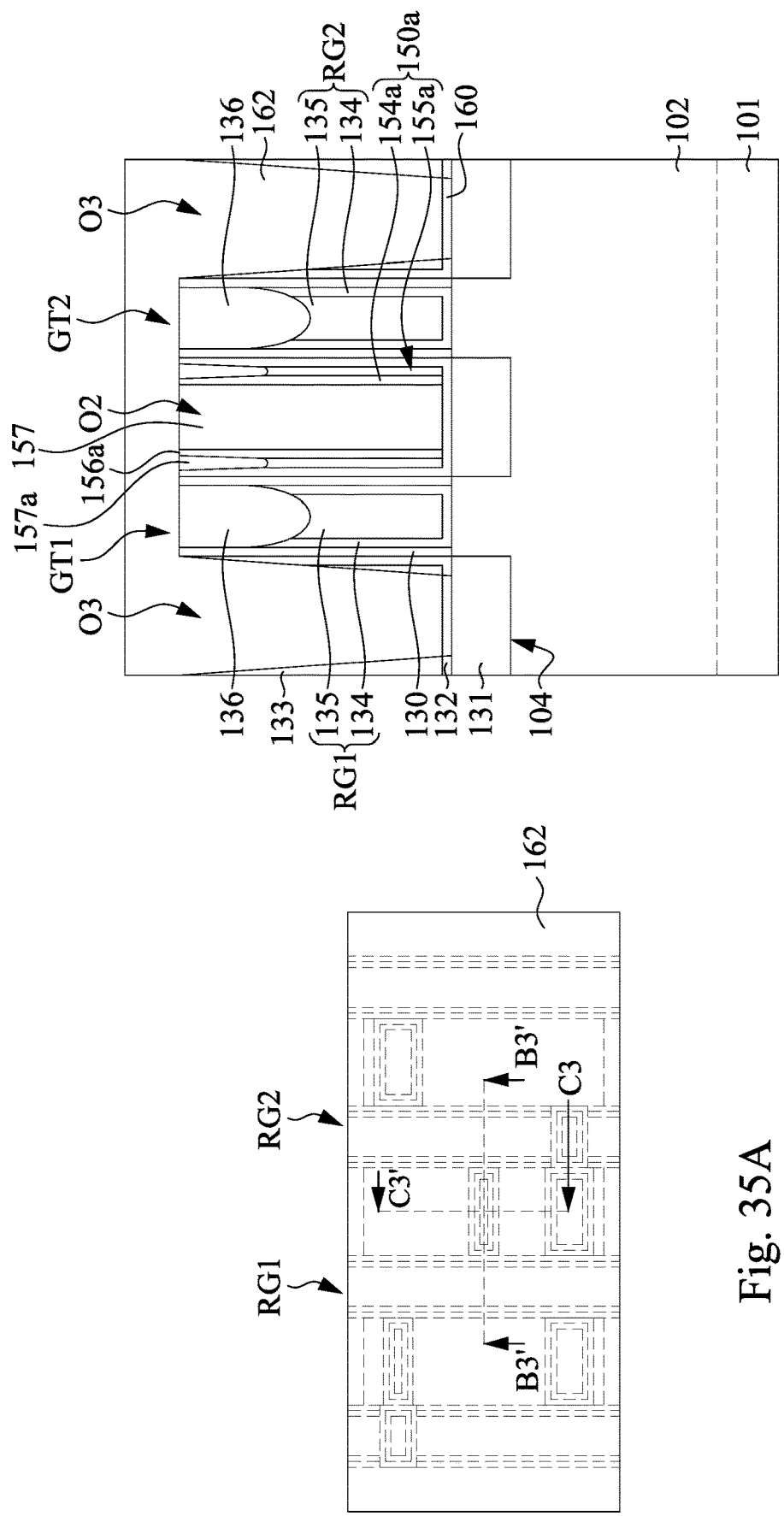
Figure 35C:
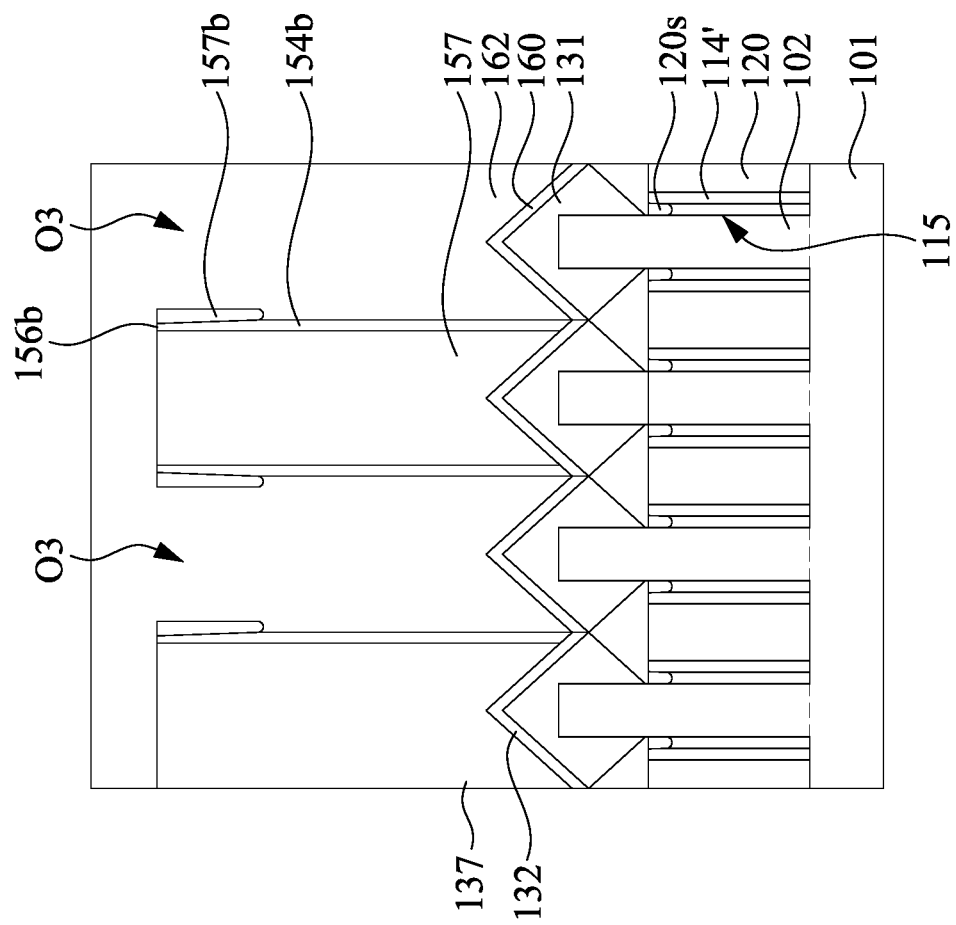
Figure 36B:
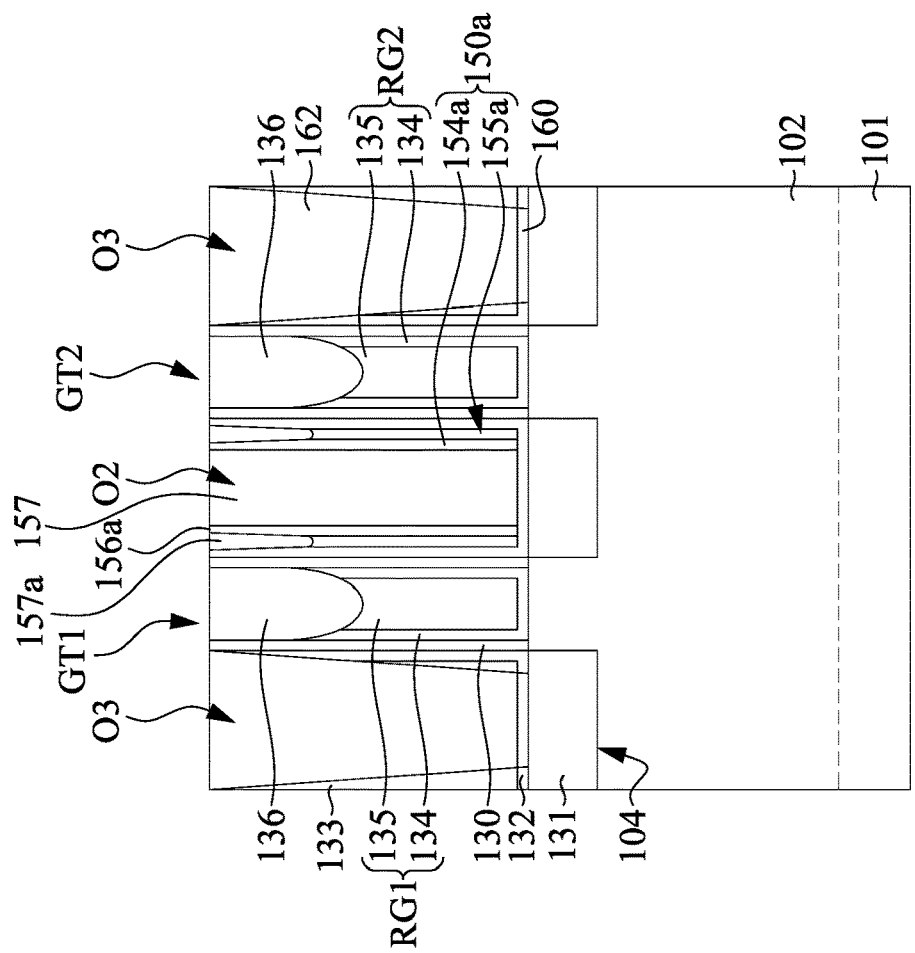
Figure 36A:
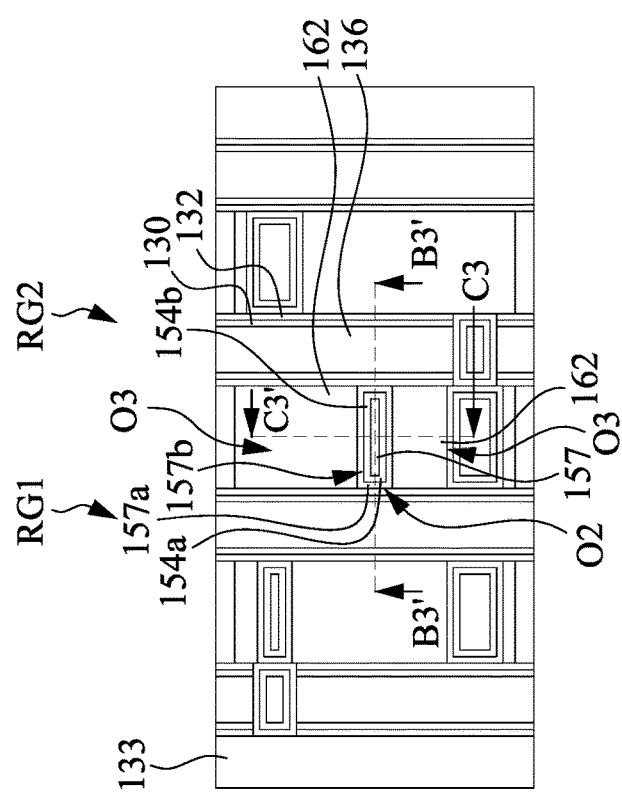

This is described in greater detail for an embodiment with reference to FIGS. 23A to 36C, an isolation dielectric (e.g., an isolation dielectric 157 as shown in FIG. 36A) is interposed between two source/drain contacts of the semiconductor device in order to provide electrical insulation between the two source/drain contacts. An air spacer is formed to surround the isolation dielectric between the two source/drain contacts, which in turns allows for reducing the capacitance between adjacent two source/drain contacts. In some embodiments, the isolation dielectric between the two source/drain contacts with the air spacer formed thereon can be collectively referred to as an air-inside CMD.

Returning to FIG. 1B, the method M then proceeds to block S127 where a portion of the ILD layer is removed to form a second opening that exposes the epitaxial source/drain structure. With reference to FIGS. 23A to 24C, in some embodiments of block S127, a patterned mask (not shown) is formed over the gate structures RG1 and RG2, the gate spacers 130, the CESL 132, and the ILD layer 133. One or more etching processes are performed using the patterned mask as an etching mask. In some embodiments, for example, one or more etching processes are performed to remove portions of the ILD layer 133 overlaying the epitaxial source/drain structure 131, such that openings O2 are formed extending through the ILD layer 133 and expose corresponding ones of the epitaxial source/drain structures 131. Stated differently, the remainders of the ILD layer 133 are spaced apart from each other by the opening O2.

Figures 25A, 25B:
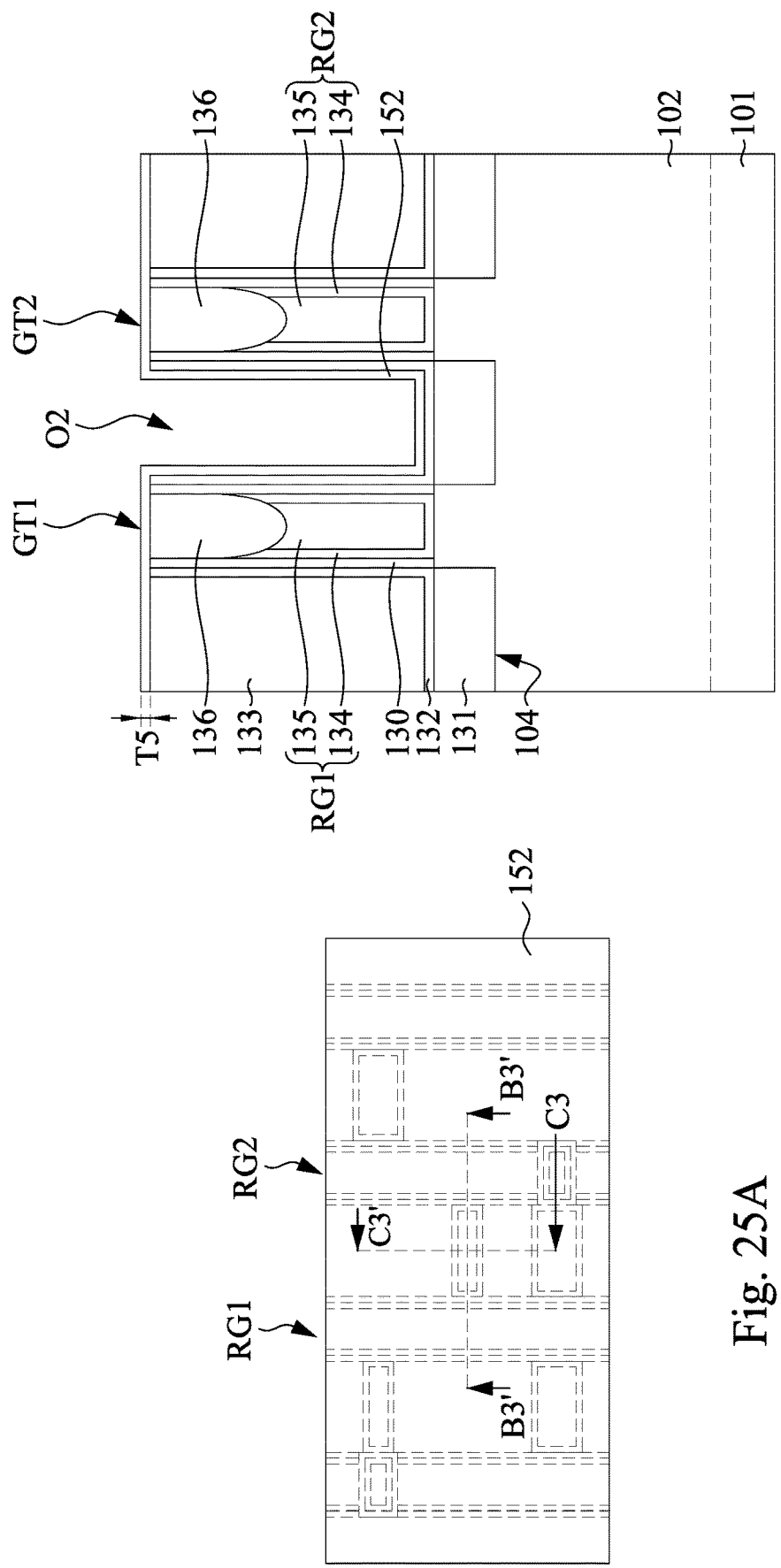
Figure 25C:
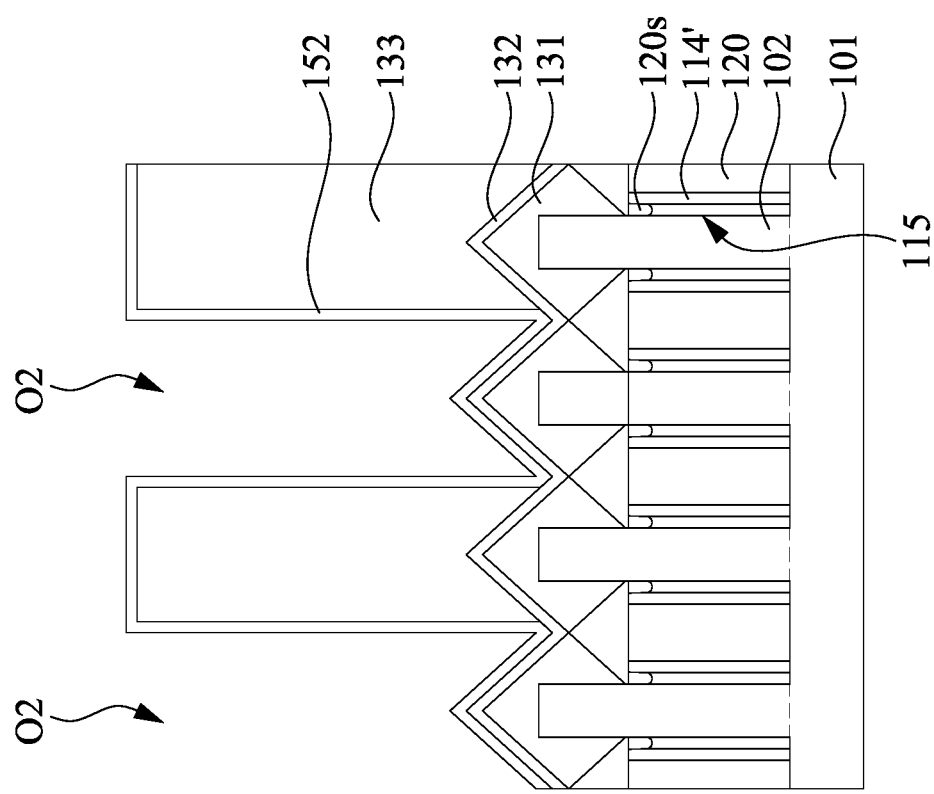

Returning to FIG. 1B, the method M then proceeds to block S128 where a third sacrificial layer is blanket deposited over the substrate. With reference to FIGS. 25A to 25C, in some embodiments of block S128, the sacrificial layer 152 is blanket deposited over the structure in FIGS. 24A to 24C (i.e., over the gate structures RG1 and RG2, the gate spacers 130, the CESL 132, and the ILD layer 133, and the epitaxial source/drain structure 131 in the opening O2). In some embodiments, the sacrificial layer 152 may include silicon oxide, silicon nitride, silicon oxynitride, SiCN, $SiC_xO_yN_z$, other suitable materials, or combinations thereof. For example, the sacrificial layer 152 may be a dielectric material such as silicon nitride. In some embodiments, the sacrificial layer 152 includes a material different than the ILD layer 133, the dielectric cap 136 (see FIG. 25B), and/or the CESL 132 (see FIG. 25C). In some embodiments, the sacrificial layer 152 may have a thickness T5 in a range from about 1 nm to about 5 nm, such as about 1, 2, 3, 4, or 5 nm, and other thickness ranges are within the scope of the disclosure. In some embodiments, the sacrificial layer 152 may have a multilayer structure. The sacrificial layer 152 can be formed using a deposition method, such as plasma enhanced chemical vapor deposition (PECVD), low-pressure chemical vapor deposition (LPCVD), sub-atmospheric chemical vapor deposition (SACVD), or the like.

Figure 26B:
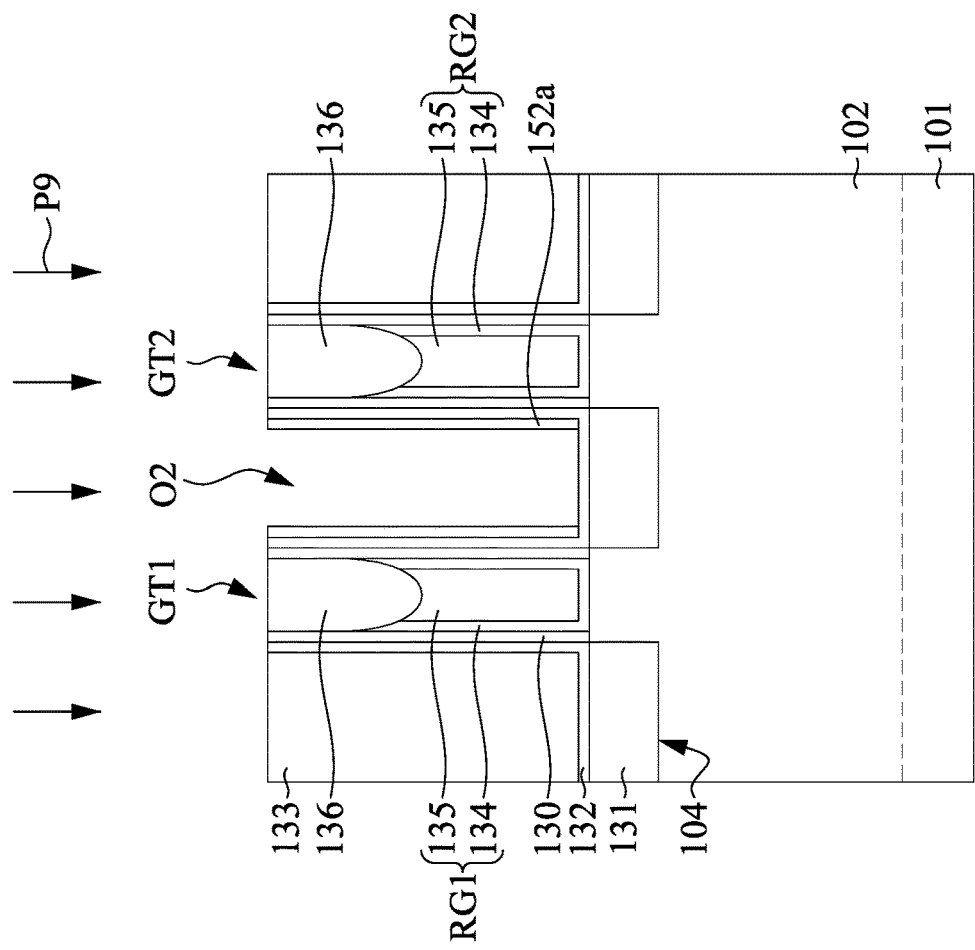
Figure 26A:
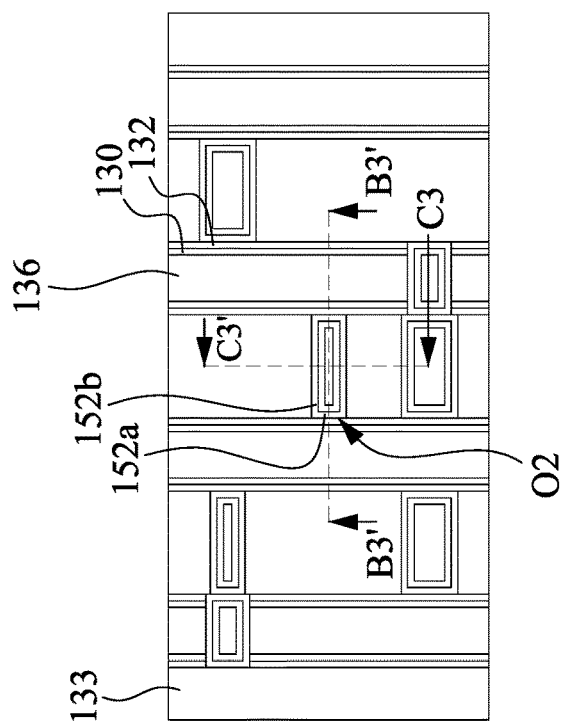
Figure 26C:
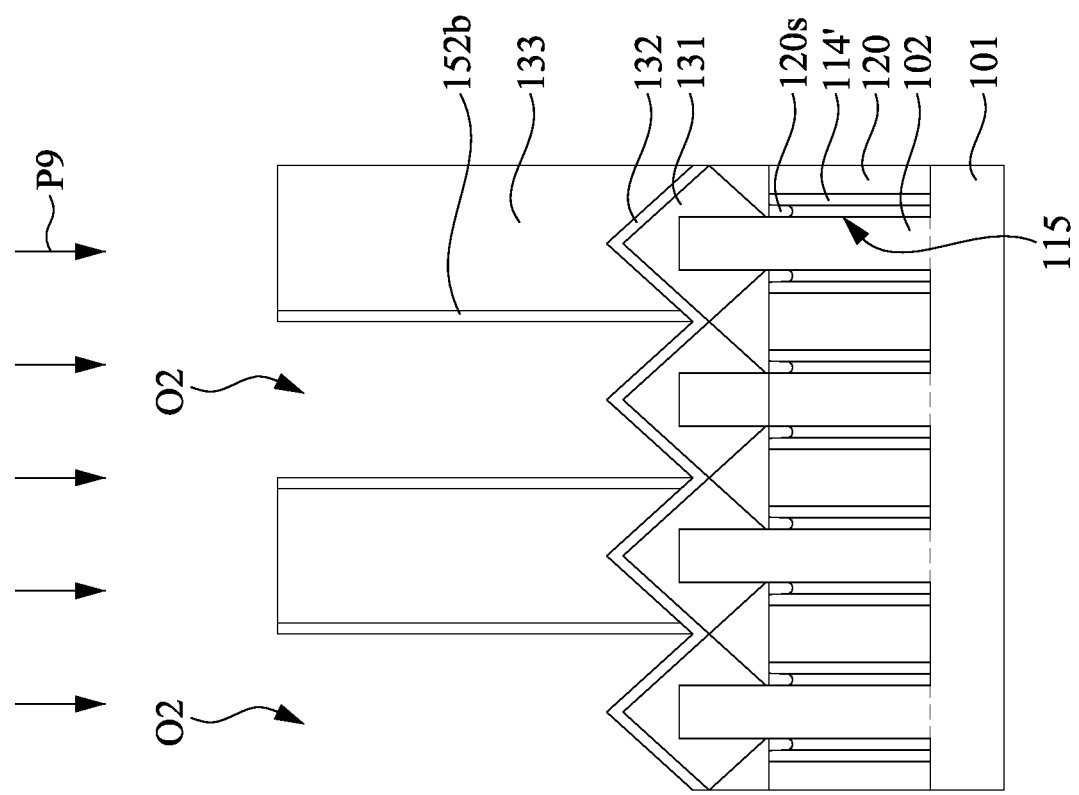

Returning to FIG. 1B, the method M then proceeds to block S129 where the third sacrificial layer is etched to form at least one third sacrificial spacer. With reference to FIGS. 26A to 26C, in some embodiments of block S129, the sacrificial layer 152 is etched to form sacrificial spacers 152a formed on a sidewall of the gate structure RG1 and a sidewall of the gate structure RG2 (see FIG. 26B) in the opening O2 and sacrificial spacers 152b formed on opposite sidewalls of the ILD layer 133 (see FIG. 26C) in the opening O2. In greater detail, an anisotropic etching process P9 (e.g., a reactive-ion etching process, RIE or atomic layer etching (ALE)) is performed to selectively remove the horizontal portions of the sacrificial layer 152. The remaining vertical portions of the sacrificial layer 152 form sacrificial spacers 152a and 152b. The sacrificial spacers 152a each vertically extends along sidewalls of the opening O2 of the gate structures RG1 and RG2. The sacrificial spacers 152b each vertically extends along sidewalls of the opening O2 of the ILD layer 133 from the top surface of the CESL 132. By way of example but not limiting the present disclosure, the anisotropic etching process P9 may implement an oxygen-containing gas, a fluorine-containing gas (e.g., $CF_4$, $SF_6$, $CH_2F_2$, $CHF_3$, and/or $C_4F_6$, $C_4F_8$), a chlorine-containing gas (e.g., $Cl_2$, $CHCl_3$, $CCl_4$, and/or $BCl_3$), a bromine-containing gas (e.g., HBr and/or $CHBr_3$), a phosphoric-containing gas (e.g., $H_3PO_4$), an iodine-containing gas, other suitable gases and/or plasmas, and/or combinations thereof. In some embodiments, the sacrificial layer 152 (see FIGS. 25A to 25C) is etched using, by way of example but not limiting the present disclosure, $NH_4OH$ when silicon is used in the nitride sacrificial spacers 152a and 152b.

This is described in greater detail with reference to FIGS. 26A to 26C, the anisotropic etching process P9 etches the sacrificial layer 152 (see FIGS. 25A to 25C) at a faster etch rate than it etches the ILD layer 133, the gate spacers 130, the CESL 132, and/or the dielectric cap 136 (see FIG. 26B). By way of example but not limiting the present disclosure, a ratio of the etch rate of the sacrificial layer 152 to the etch rate of the ILD layer 133, the gate spacers 130, the CESL 132, and/or the dielectric cap 136 may be greater than about 10. If the ratio of the etch rate of the sacrificial layer 152 to the etch rate of the ILD layer 133, the gate spacers 130, the CESL 132, and/or the dielectric cap 136 is less than about 10, the anisotropic etching process P9 would significantly consume the ILD layer 133, the gate spacers 130, the CESL 132, and/or the dielectric cap 136, which in turn adversely affects the semiconductor device.

Figures 27A, 27B:
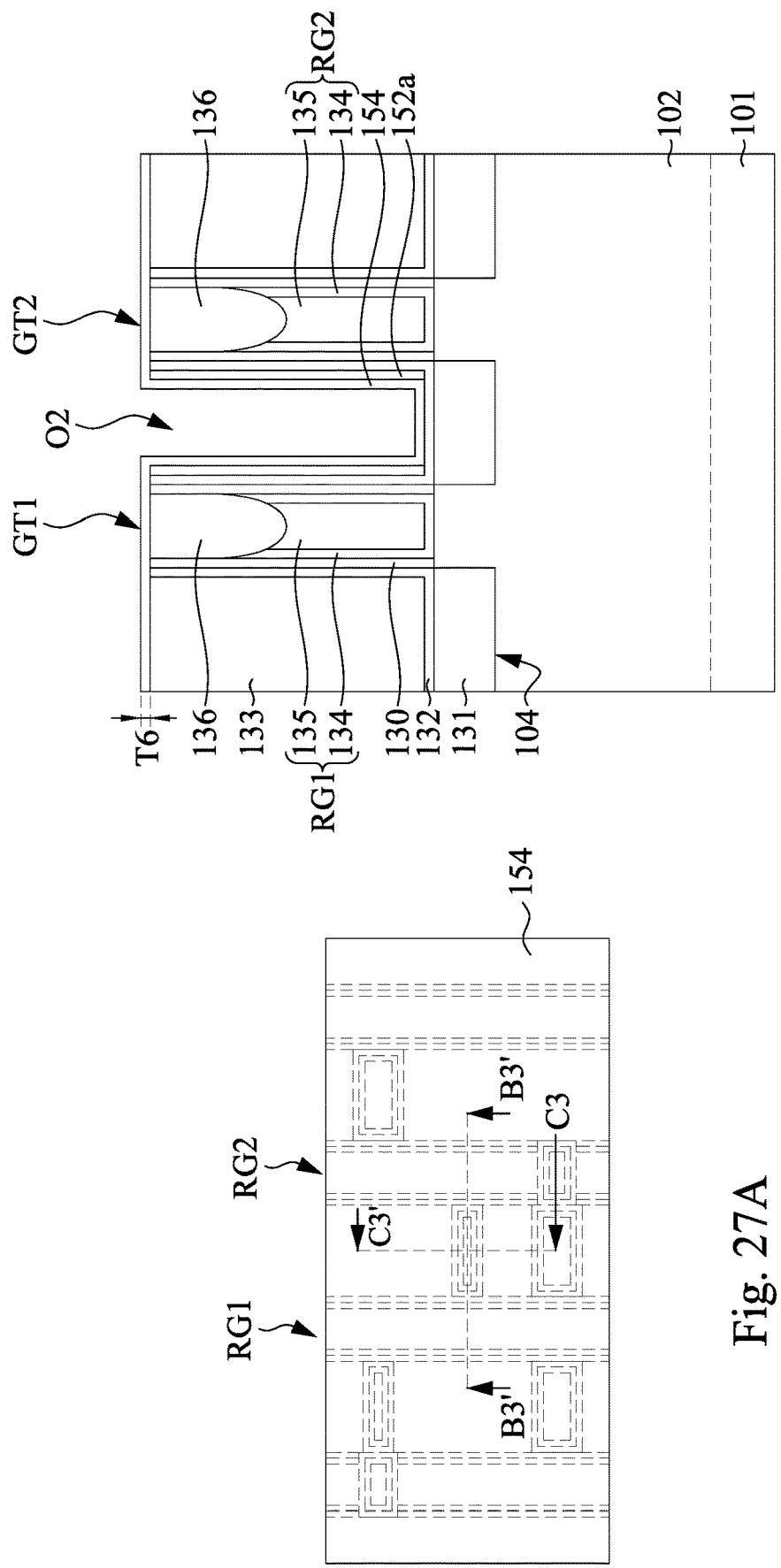
Figure 27C:
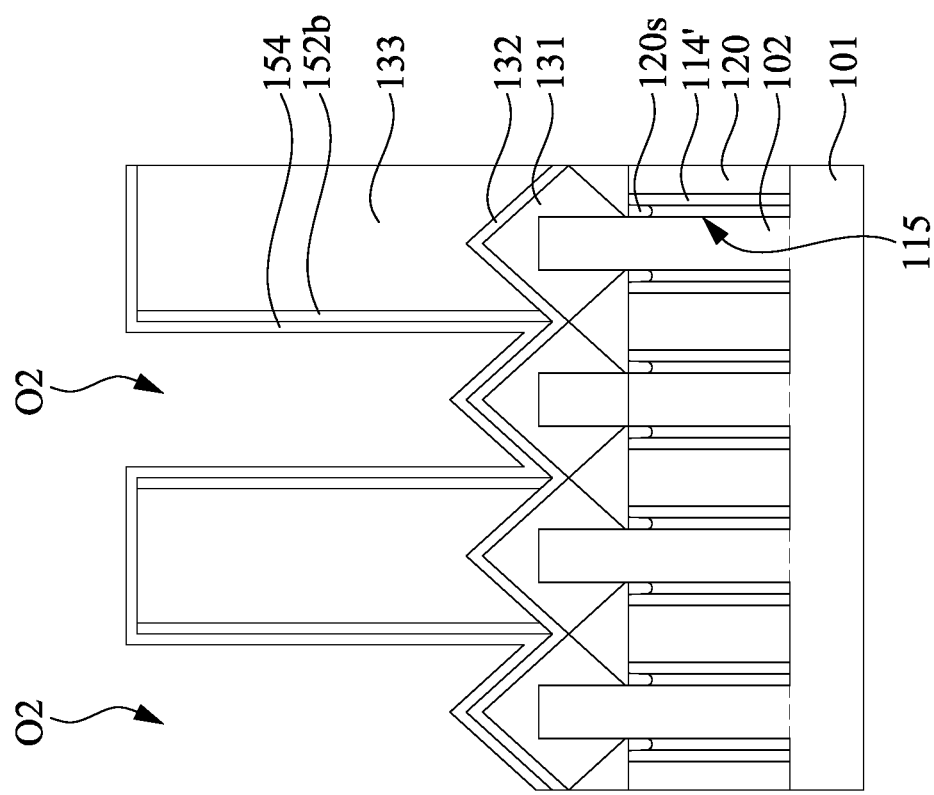

Returning to FIG. 1B, the method M then proceeds to block S130 where a third spacer layer is blanket deposited over the semiconductor substrate. With reference to FIGS. 27A to 27C, in some embodiments of block S130, a spacer layer 154 is blanket deposited over the structure as shown in FIGS. 26A to 26C (i.e., i.e., over the gate structures RG1 and RG2, the gate spacers 130, the CESL 132, and the ILD layer 133, the epitaxial source/drain structure 131, and the sacrificial spacers 152a and 152b). In some embodiments, the spacer layer 154 may include silicon oxide, silicon nitride, silicon oxynitride, SiCN, $SiC_xO_yN_z$, other suitable materials, or combinations thereof. For example, the spacer layer 154 may be a dielectric material such as silicon oxide. In some embodiments, the spacer layer 154 may include a material different than the sacrificial spacers 152a and 152b. In some embodiments, the spacer layer 154 may have a multilayer structure. In some embodiments, the spacer layer 154 may have a thickness T6 in a range from about 1 nm to about 5 nm, such as about 1, 2, 3, 4, or 5 nm, and other thickness ranges are within the scope of the disclosure. The spacer layer 154 can be formed using a deposition method, such as plasma enhanced chemical vapor deposition (PECVD), low-pressure chemical vapor deposition (LPCVD), sub-atmospheric chemical vapor deposition (SACVD), or the like.

Figure 28C:
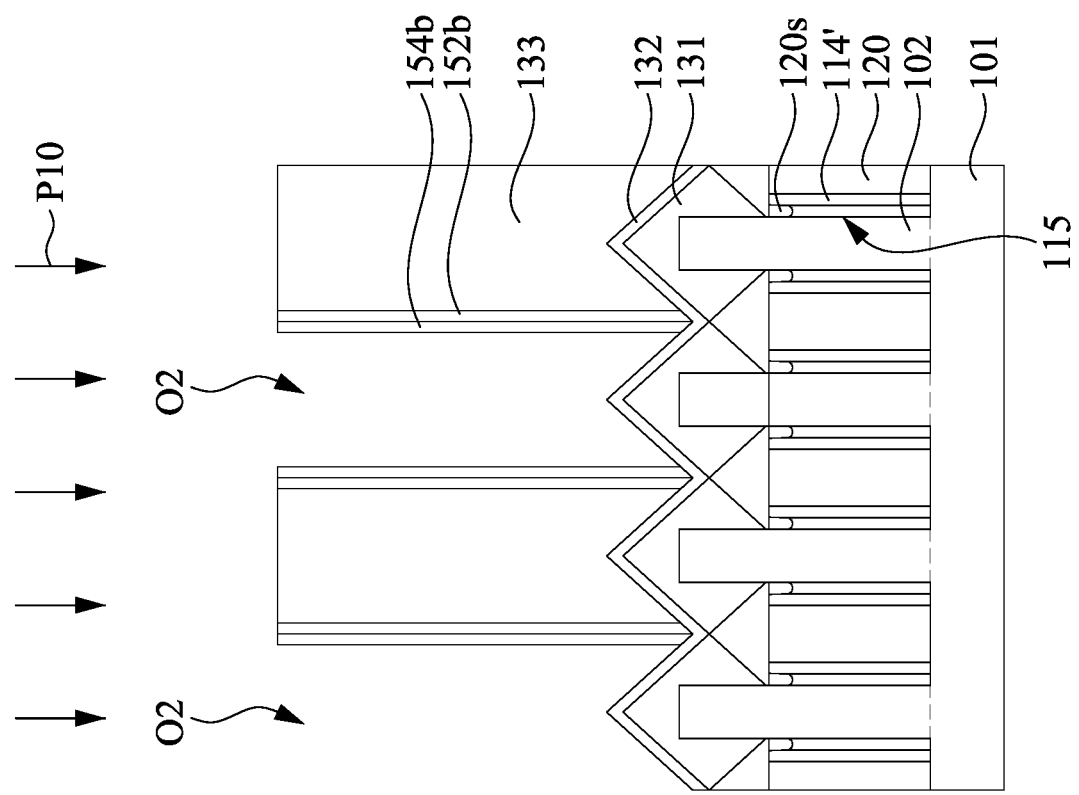

Returning to FIG. 1C, the method M then proceeds to block S131 where the third spacer layer is etched to form a third spacer. With reference to FIGS. 28A to 28C, in some embodiments of block S131, the spacer layer 154 is etched to form spacers 154a formed on a sidewall of the gate structure RG1 and a sidewall of the gate structure RG2 (see FIG. 28B) in the opening O2 and spacers 154b formed on opposite sidewalls of the ILD layer 133 (see FIG. 28C) in the opening O2. In greater detail, an anisotropic etching process P10 (e.g., a reactive-ion etching process, RIE or atomic layer etching (ALE)) is performed to selectively remove the horizontal portions of the spacer layer 154. The remaining vertical portions of the spacer layer 154 form the spacers 154a and 154c. The spacers 154a each vertically extends along sidewalls of the opening O2 of the gate structures RG1 and RG2. The spacers 154b each vertically extends along sidewalls of the opening O2 of the ILD layer 133 from the top surface of the CESL 132. By way of example but not limiting the present disclosure, the anisotropic etching process P10 may implement an oxygen-containing gas, a fluorine-containing gas (e.g., $CF_4$, $SF_6$, $CH_2F_2$, $CHF_3$, and/or $C_4F_6$, $C_4F_8$), a chlorine-containing gas (e.g., $Cl_2$, $CHCl_3$, $CCl_4$, and/or $BCl_3$), a bromine-containing gas (e.g., HBr and/or $CHBr_3$), a phosphoric-containing gas (e.g., $H_3PO_4$), an iodine-containing gas, other suitable gases and/or plasmas, and/or combinations thereof.

This is described in greater detail with reference to FIGS. 28A to 28C, the anisotropic etching process P10 etches the spacer layer 154 (see FIGS. 27A to 27C) at a faster etch rate than it etches the ILD layer 133, the gate spacers 130, the CESL 132, and/or the dielectric cap 136 (see FIG. 28B). By way of example but not limiting the present disclosure, a ratio of the etch rate of the spacer layer 154 to the etch rate of the ILD layer 133, the gate spacers 130, the CESL 132, and/or the dielectric cap 136 (see FIG. 28B) may be greater than about 10. If the ratio of the etch rate of the spacer layer 154 to the etch rate of the ILD layer 133, the gate spacers 130, the CESL 132, and/or the dielectric cap 136 (see FIG. 28B) is less than about 10, the anisotropic etching process P10 would significantly consume the ILD layer 133, the gate spacers 130, the CESL 132, and/or the dielectric cap 136 (see FIG. 28B), which in turn adversely affects the semiconductor device.

Figure 29B:
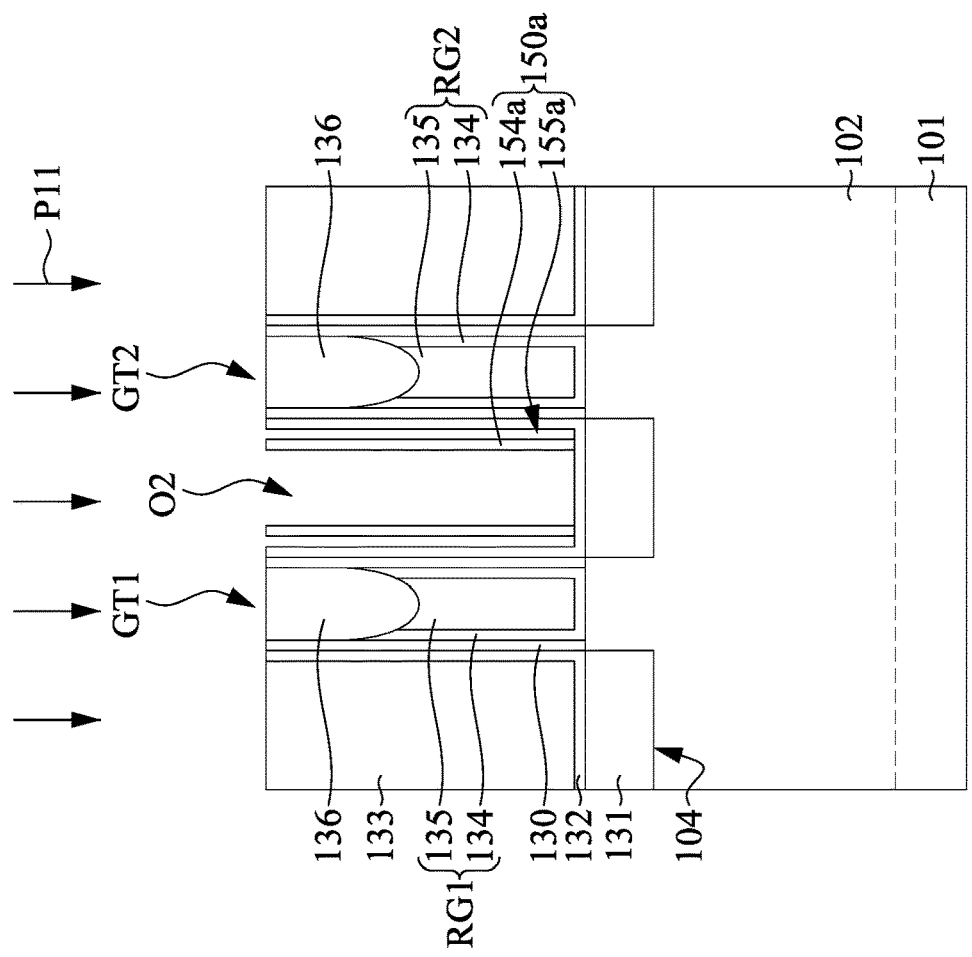
Figure 29A:
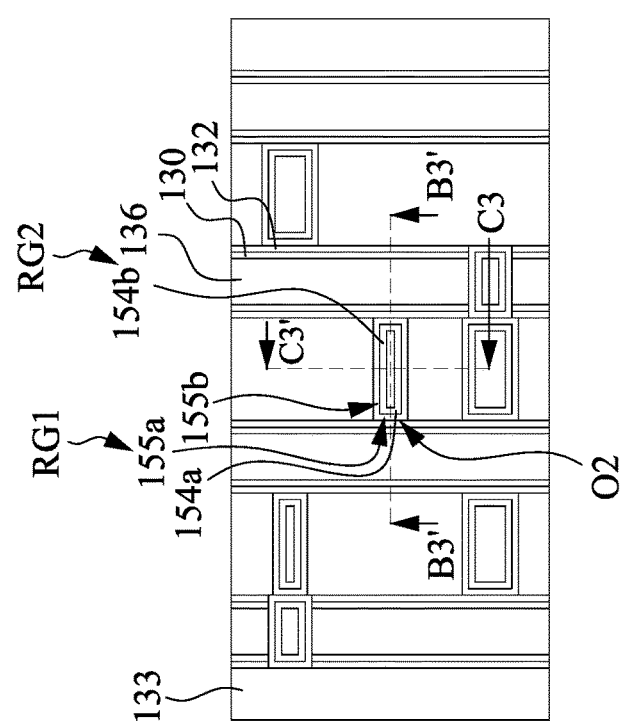
Figure 29C:
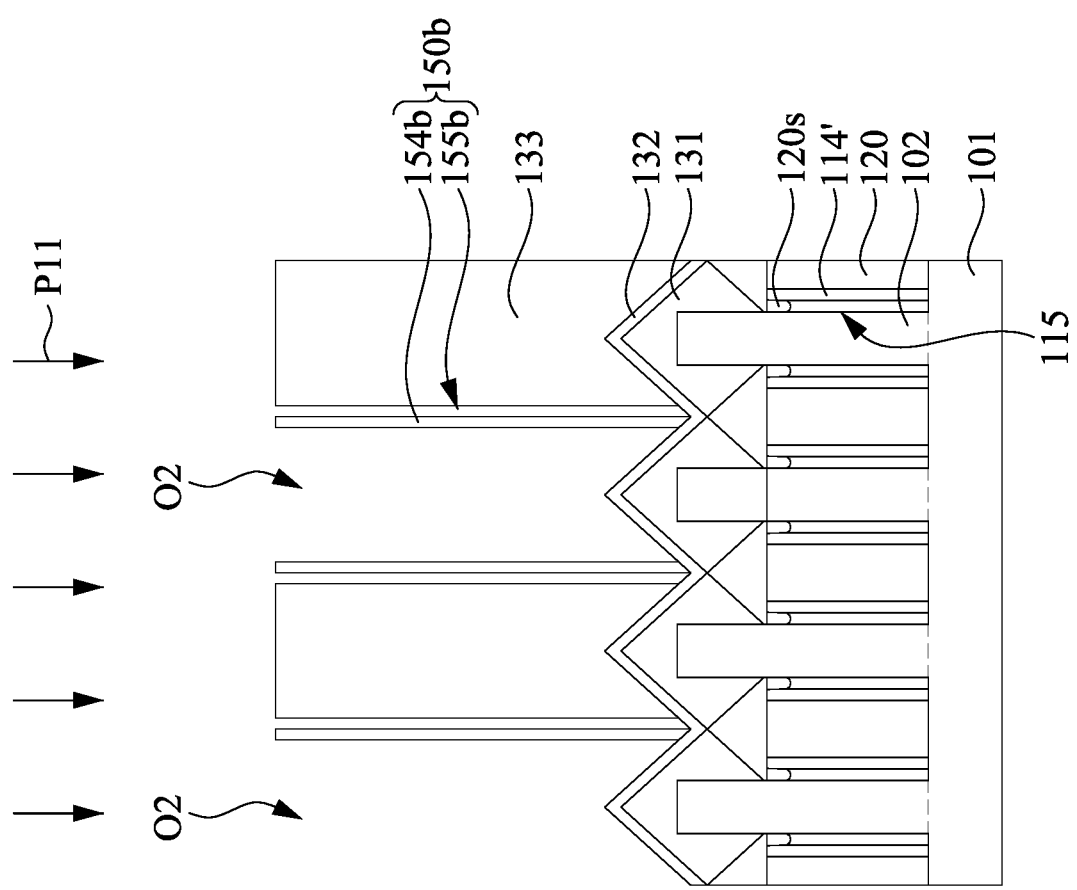

Returning to FIG. 1C, the method M then proceeds to block S132 where the third sacrificial spacer is removed to form a third air spacer. With reference to FIGS. 29A to 29C, in some embodiments of block S132, a selective etching process P11 is performed to selectively remove the sacrificial spacer 152a and 152b (see FIGS. 28A to 28C). As a result, an air spacer 155a is formed between the gate structures RG1 and RG2 and the spacer 154a. An air spacer 155b is formed between the ILD layer 133 and the spacer 154b. Stated differently, the gate structures RG1 and RG2 and the spacers 154a are separated by the air spacer 155a. The ILD layer 133 and the spacer 154b are separated by the air spacer 155b. After the air spacers 155a and 155b are formed, the spacer 154a and the air spacer 155a can be collectively referred to as an insulating structure 150a and the spacer 154b and the air spacer 155b can be collectively referred to as an insulating structure 150b. The insulating structures 150a and 150b are formed by removing the sacrificial spacers 154a and 154b (see FIGS. 28A to 28C), and thus the shape of the air spacers 155a and 155b substantially inherit the shapes of the sacrificial spacers 154a and 154b. In some embodiments, portions of the CESL 132 are exposed in the air spacers 155a and 155b.

As mentioned before, thicknesses of the sacrificial spacers 154a and 154b (see FIGS. 28A to 28C) are in a range from about 1 nm to about 5 nm. As a result, the air spacers 155a and 155b may have thicknesses also in a range from about 1 nm to about 5 nm, such as about 1, 2, 3, 4, or 5 nm. If the thickness of the sacrificial spacers 154a and 154b are smaller than 1 nm, the sacrificial spacers 154a and 154b are too thin such that the etchant is hard to flow into the spaces between the gate structures RG1 and RG2 and the spacers 154a and hard to flow into the space between the ILD layer 133 and the spacer 154b, which in turn affects the formation of the air spacers 155a and 155b. On the other hand, if thicknesses of the sacrificial spacers 154a and 154b are greater than 5 nm, the thicknesses of the air spacers 155a and 155b inheriting the thicknesses of the sacrificial spacers 154a and 154b may be too thick, such that the material that will be formed above of the air spacers 155a and 155b may easily flow into lower portions of the air spacers 155a and 155b, which in turn affects the formation of the air spacers 155a and 155b. Therefore, during the etching process P11, the sacrificial spacers 152a and 152b (see FIGS. 28A to 28C) may be etched away and expose the vertical sidewalls of the CESL 132 and the ILD layer 133, which in turn affects the formation of the air spacers 155a and 155b.

In the present disclosure, the sacrificial layer 152 has large dielectric constant, for example, greater than 1. On the other hand, the insulating structures 150a and 150b include the air spacers 155a and 155b that have a dielectric constant equal to 1 ($k_{air}=1$), which is lower than the dielectric constant of the sacrificial layer 152. Thus, the equivalent dielectric constant of the insulating structures 150a and 150b may be reduced by forming the air spacers 155a and 155b. As a result, the overall capacitance of the insulating structures 150a and 150b may be reduced, which in turn will reduce the RC delay and further improve the device performance. Moreover, since the air spacers 155a and 155b are formed by removing the sacrificial spacers 152a and 152b, the air spacers 145a and 145b may inherit the shape of the sacrificial spacers 152a and 152b, and thus it is easier to control the size of the air spacers 155a and 155b and further control the equivalent capacitance of the insulating structures 150a and 150b.

In some embodiments, the etching process P11 may be a selective anisotropic etching process (e.g., a reactive-ion etching process, RIE or atomic layer etching (ALE)). By way of example but not limiting the present disclosure, the etching process P11 may implement an oxygen-containing gas, a fluorine-containing gas (e.g., $CF_4$, $SF_6$, $CH_2F_2$, $CHF_3$, and/or $C_4F_6$, $C_4F_8$), a chlorine-containing gas (e.g., $Cl_2$, $CHCl_3$, $CCl_4$, and/or $BCl_3$), a bromine-containing gas (e.g., HBr and/or $CHBr_3$), a phosphoric-containing gas (e.g., $H_3PO_4$), an iodine-containing gas, other suitable gases and/or plasmas, and/or combinations thereof. In some embodiments, the sacrificial spacers 152a and 152b (see FIGS. 28A to 28C) is etched using, by way of example but not limiting the present disclosure, $NH_4OH$ when silicon is used in the nitride sacrificial spacers 152a and 152b. This is described in greater detail with reference to FIGS. 29A to 29C, the etching process P11 etches the sacrificial spacers 152a and 152b (see FIGS. 28A to 28C) at a faster etch rate than it etches the CESL 132, the spacers 154a (see FIG. 29B), the ILD layer 133 (see FIG. 29C), and the spacers 154b (see FIG. 29C). By way of example but not limiting the present disclosure, a ratio of the etch rate of the sacrificial spacers 152a and 152b to the etch rate of the CESL 132, the spacers 154a and 154b, and/or the ILD layer 133 may be greater than about 10. If the ratio of the etch rate of the sacrificial spacers 152a and 152b to the etch rate of the CESL 132, the spacers 154a and 154b, and/or the ILD layer 133 is less than about 10, the etching process P11 would significantly consume the CESL 132, the spacers 154a and 154b, and/or the ILD layer 133, which in turn adversely affects the semiconductor device. In some embodiments, the etching process P11 may be an isotropic etching process. In some embodiments, the etching process P11 uses a different etchant than the previous etching process P10.

Figure 30B:
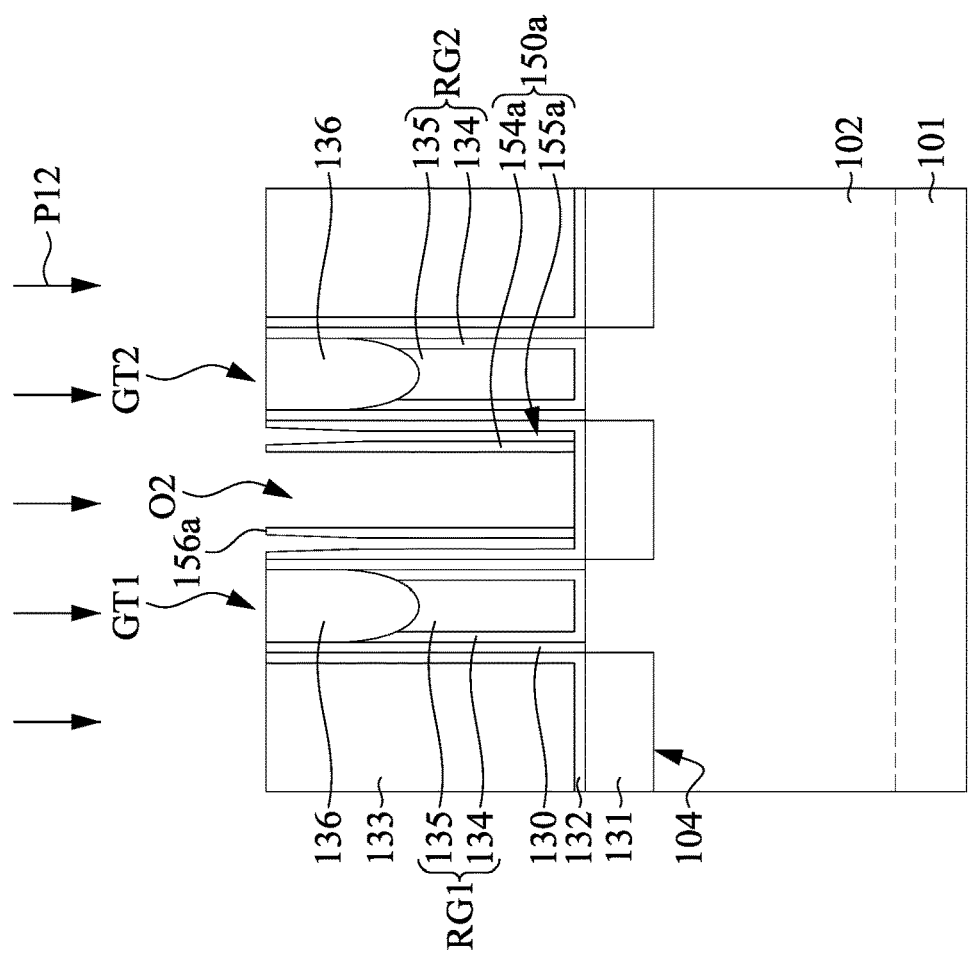
Figure 30A:
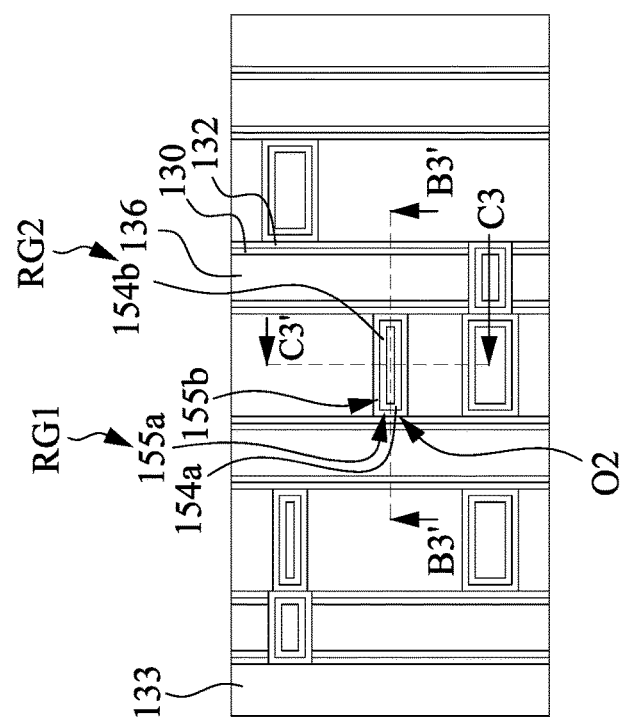
Figure 30C:
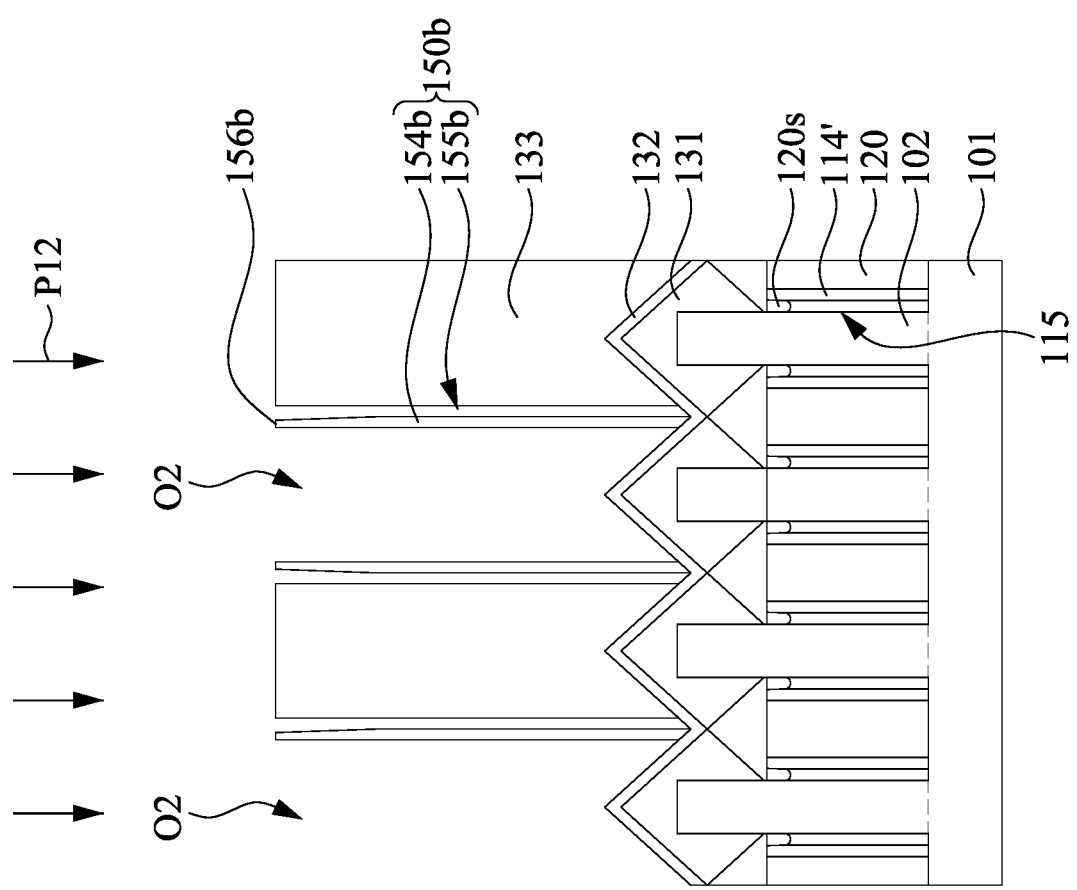

Returning to FIG. 1C, the method M then proceeds to block S133 where an upper portion of the third spacer is etched to form a rounding top corner thereon. With reference to FIGS. 30A to 30C, in some embodiments of block S133, an upper portion of the spacer 154a is etched to form a tapered top end 156a thereon and an upper portion of the spacer 154b is etched to form a tapered top end 156b thereon. In some embodiments, an etching process P12 is performed on the spacers 154a and 154b. In some embodiments, the etching process P12 is a plasma etching process employing one or more etchants.

This is described in greater detail with reference to FIGS. 30A to 30C, the non-zero bias plasma etching process is performed to etch the upper portions of the spacers 154a and 154b such that the top ends of the spacers 154a and 154b are tapered. The non-zero bias can drive more plasmas to scale down the spacers 154a and 154b compared to zero bias. For example, the non-zero bias plasma etching process begins with ion bombardment to remove compounds of the spacers 154a and 154b. Hence, the upper portion of the spacers 154a and 154b have narrower widths than lower portions of the spacers 154a and 154b. Stated differently, upper portions of the air spacers 155a and 155b have wider widths than lower portions of the air spacers 155a and 155b, such that an isolation dielectric that will be formed later may flow into the upper portions of the air spacers 155a and 155b. Therefore, upper ends of the air spacers 155a and 155b are blocked by the isolation dielectric that will be formed later, and thus the air spacers 155a and 155b can be protected during the subsequent process, such that other material would not fill into the air spacers 155a and 155b.

The profile of the spacers 154a and 154b depend on process conditions of the etching process P12 (e.g., etching time duration and/or the like). By way of example but not limiting the present disclosure, the anisotropic etching process P12 may implement an oxygen-containing gas, a fluorine-containing gas (e.g., $CF_4$, $SF_6$, $CH_2F_2$, $CHF_3$, and/or $C_4F_6$, $C_4F_8$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, a phosphoric-containing gas (e.g., $H_3PO_4$), other suitable gases and/or plasmas, and/or combinations thereof. In some embodiments, the non-zero bias plasma etching process uses a gas mixture of $C_4F_6$ and Ar with a bias in a range from about 50 W to about 1000 W. If the bias power is higher than about 1500 W, the plasma might result in unwanted damage to the CESL 132 and the ILD layer 133 (see FIG. 30C). If the bias power is lower than about 30 W, the spacers 154a and 154b may not be tapered enough to allow the isolation dielectric that will be formed later to flow into the upper portion of the air spacers 155a and 155b.

Figures 31A, 31B:
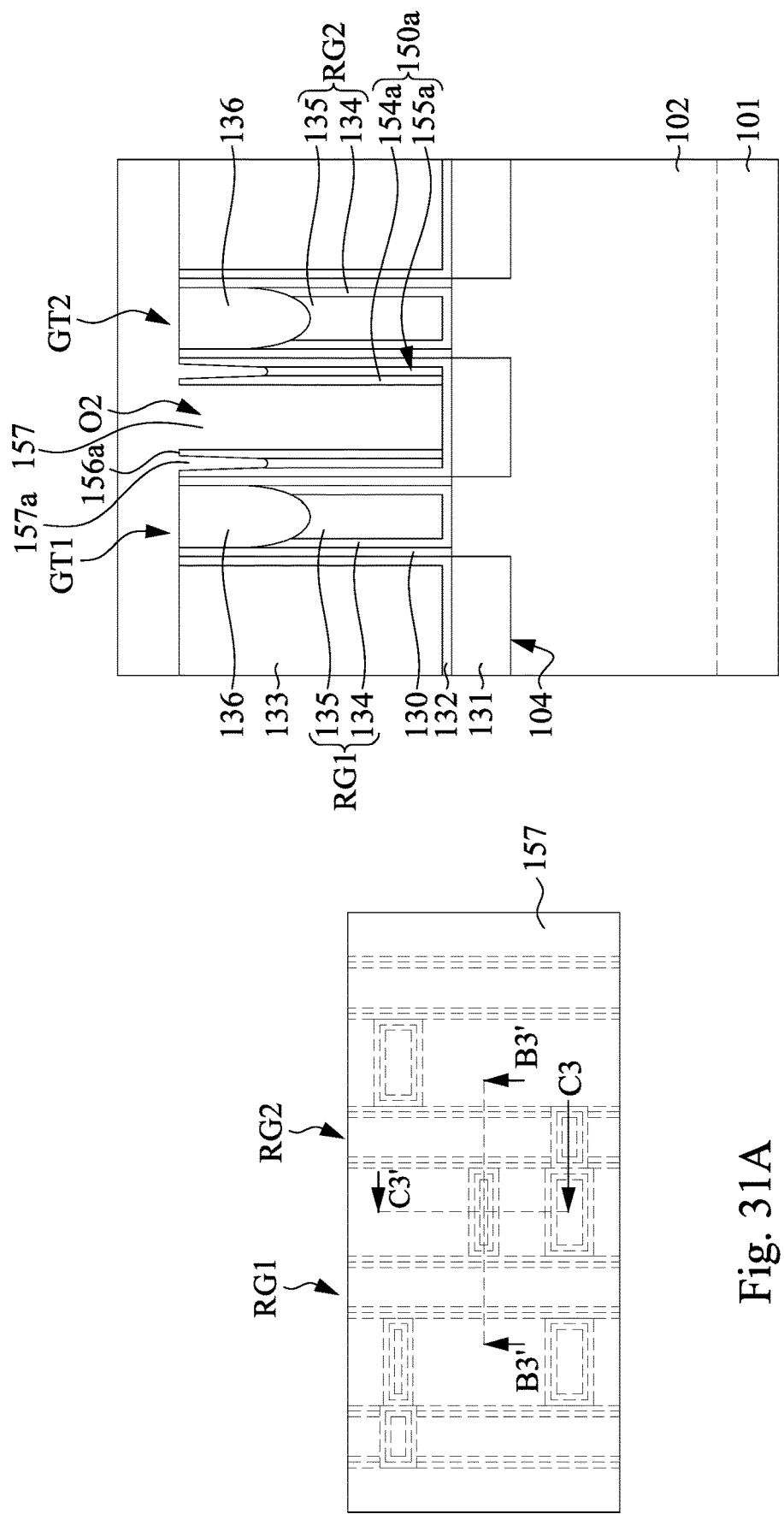
Figure 31C:
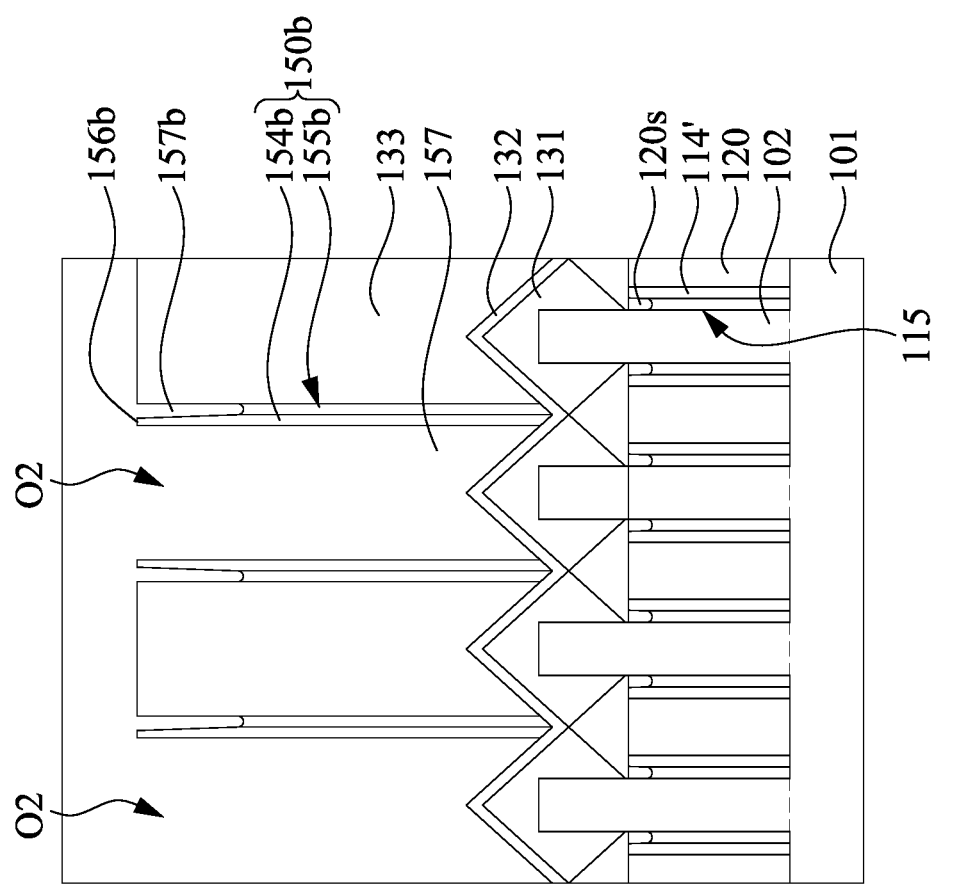

Returning to FIG. 1C, the method M then proceeds to block S134 where a third isolation dielectric is formed to overfill the second opening and to seal the third air spacer. With reference to FIGS. 31A to 31C, in some embodiments of block S134, an isolation dielectric 157 is formed to overfill the opening O2 and cover the epitaxial source/drain structure 131 in the opening O2. As mentioned before, because the upper portions of the air spacers 155a and 155b have wider widths than the lower portions of the air spacers 155a and 155b, material of the isolation dielectric 157 may flow into the upper portions of the air spacers 155a and 155b and seal the air spacers 155a and 155b. Accordingly, the isolation dielectric 157 includes a seal portion 157a (see FIG. 31B) embedded between the spacers 154a and the gate structures RG1 and RG2 and a seal portion 157b (see FIG. 31C) embedded between the spacers 154b and the ILD layer 133. Therefore, the upper end of the air spacers 155a and 155b are blocked by the seal portions 157a and 157b of the isolation dielectric 157, and thus the air spacers 155a and 155b can be protected during the subsequent process, such that other material would not fill into the air spacers 155a and 155b.

In some embodiments, the isolation dielectric 157 is made of silicon oxide, silicon nitride, silicon oxynitride, fluoride-doped silicate glass (FSG), or other low-K dielectric materials. In some embodiments, the isolation dielectric 157 may be formed using a high-density-plasma (HDP) chemical vapor deposition (CVD) process, using silane ($SiH_4$) and oxygen ($O_2$) as reacting precursors. In some other embodiments, the isolation dielectric 157 may be formed using a sub-atmospheric CVD (SACVD) process or high aspect-ratio process (HARP), in which process gases may include tetraethylorthosilicate (TEOS) and ozone ($O_3$). In yet other embodiments, the isolation dielectric 157 may be formed using a spin-on-dielectric (SOD) process, such as hydrogen silsesquioxane (HSQ) or methyl silsesquioxane (MSQ). Other processes and materials may be used. In some embodiments, the isolation dielectric 157 can have a multi-layer structure, for example, a thermal oxide liner layer with silicon nitride formed over the liner. Thereafter, a thermal annealing may be optionally performed to the isolation dielectric 157. In some embodiments, the isolation dielectric 157 may be made of a material the same as the spacers 154a and 154b. In some embodiments, the isolation dielectric 147 may be made of a material different than the spacers 154a and 154b.

Figure 32C:
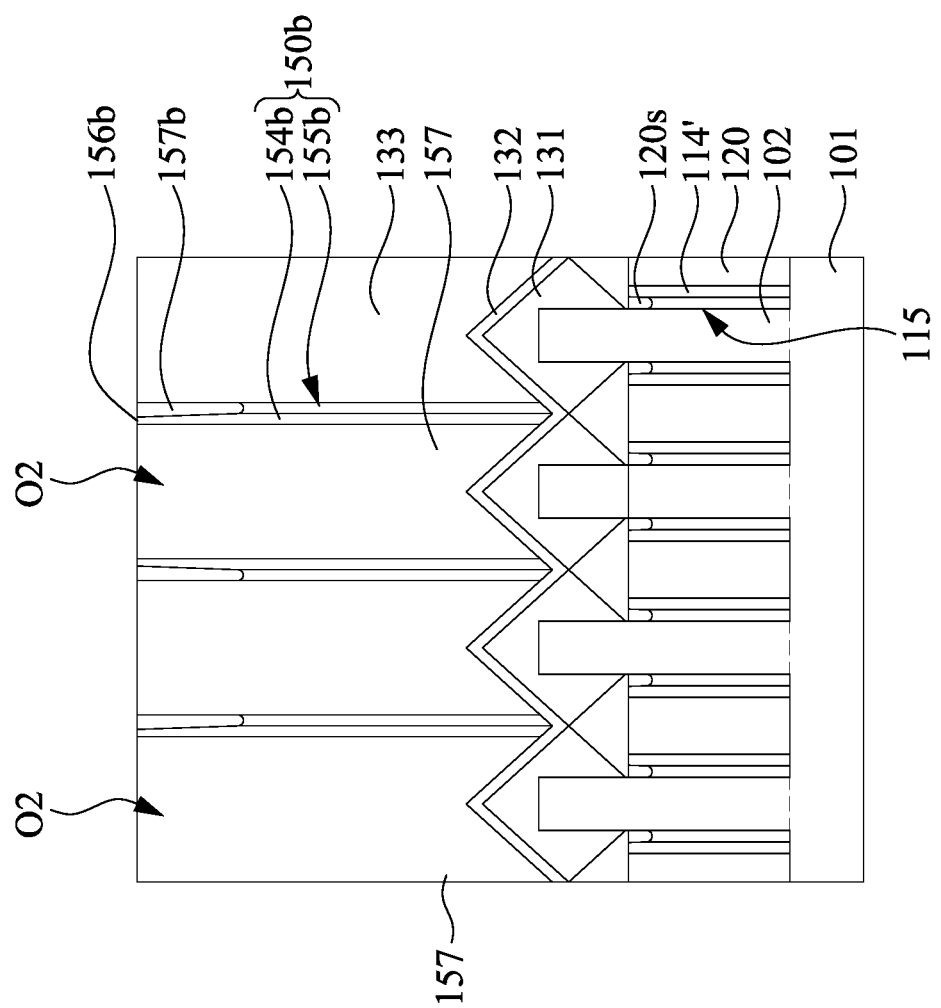

Returning to FIG. 1C, the method M then proceeds to block S135 where a third planarization process is performed to the third isolation dielectric. With reference to FIGS. 32A to 32C, in some embodiments of block S135, a planarization process such as chemical mechanical polish (CMP) is performed to remove the excess isolation dielectric 157 over the ILD layer 133 and the gate trenches GT1 and GT2 such that top surfaces of the ILD layer 133 and the gate trenches GT1 and GT2 are exposed and the air spacers 155a and 155b remain covered by the seal portions 157a and 157b of the isolation dielectric 157.

Figure 33B:
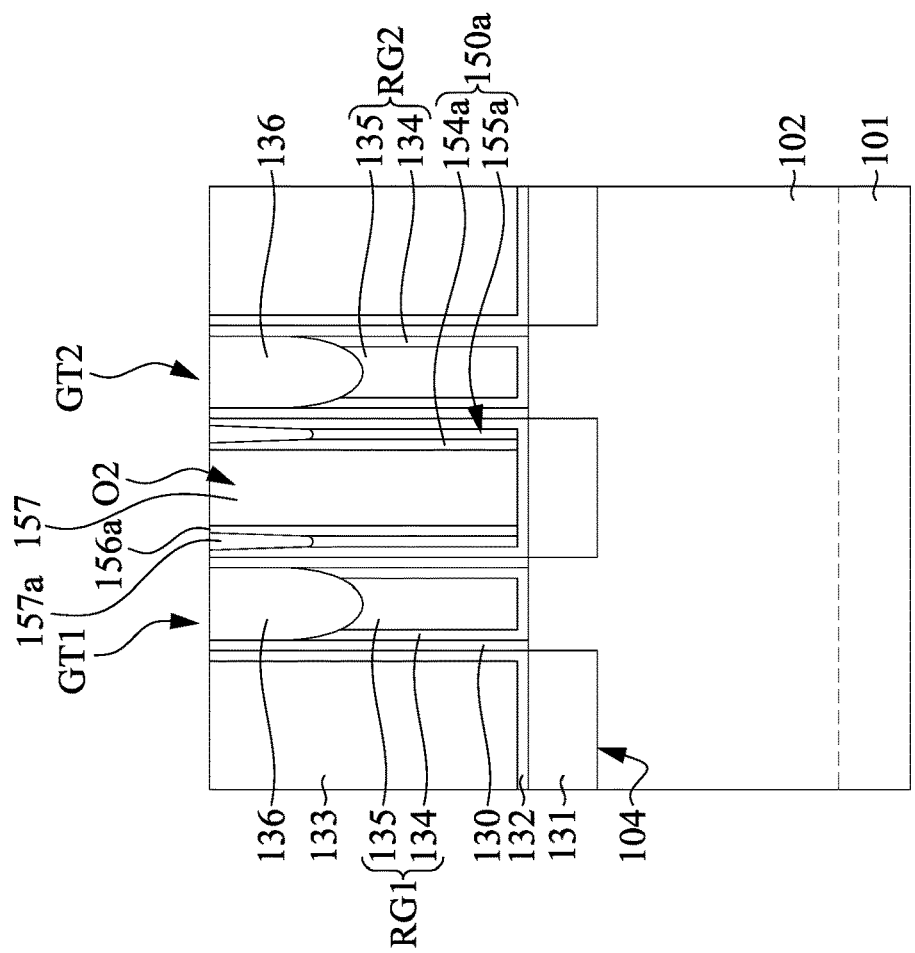
Figure 33A:
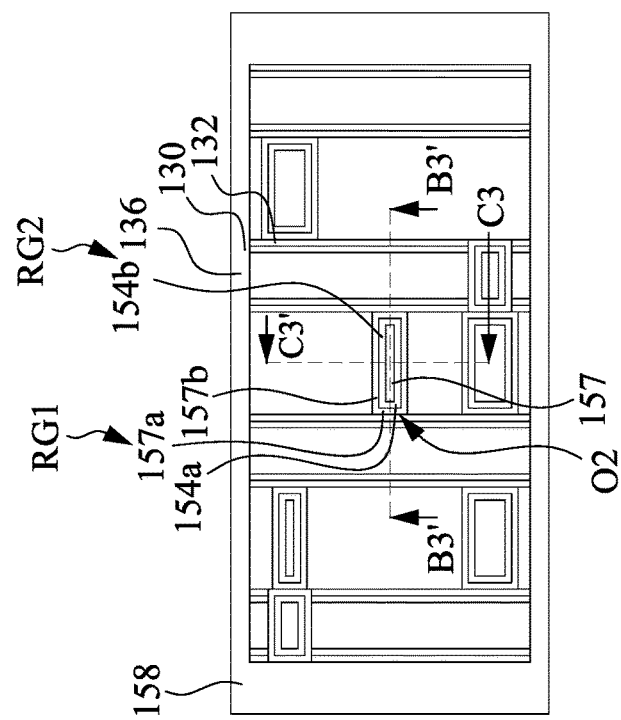
Figure 33C:
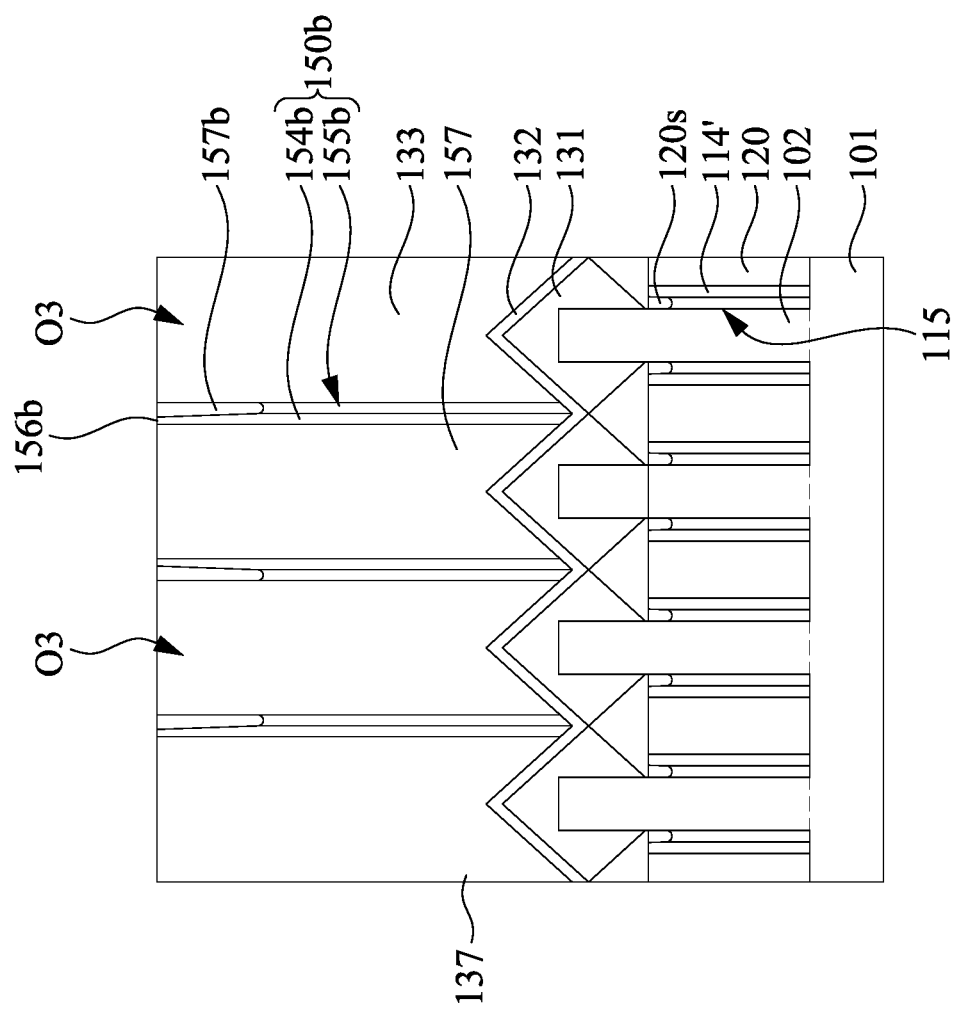

Returning to FIG. 1C, the method M then proceeds to block S136 where a patterned mask is formed over the substrate to expose a portion of the ILD layer laterally adjacent to the planarized third isolation dielectric. With reference to FIGS. 33A to 33C, in some embodiments of block S136, a patterned mask 158 is formed over the substrate 101 to expose a portion of the ILD layer 131 adjacent to the planarized isolation dielectric 157. The mask layer 158 may be formed by a series of operations including deposition, photolithography patterning, and etching processes. The photolithography patterning processes may include photoresist coating (e.g., spin-on coating), soft baking, mask aligning, exposure, post-exposure baking, developing the photoresist, rinsing, drying (e.g., hard baking), and/or other applicable processes. The etching processes may include dry etching, wet etching, and/or other etching methods (e.g., reactive ion etching).

Figure 34C:
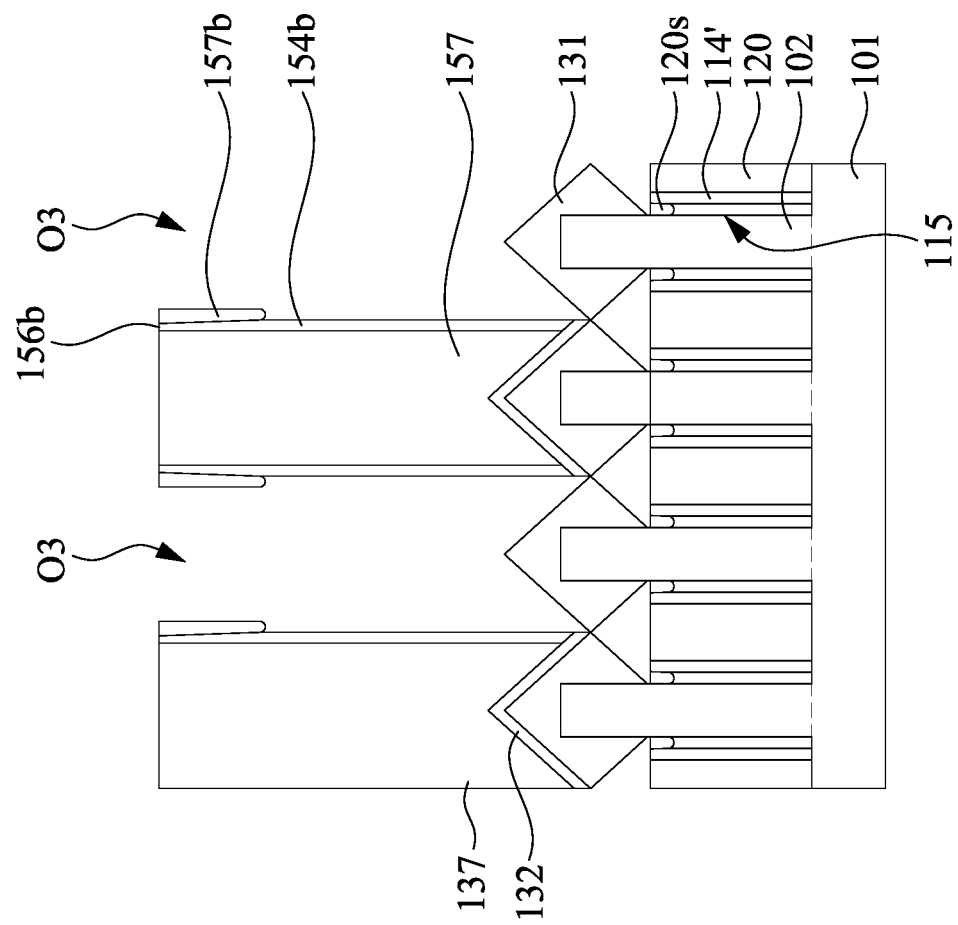

Returning to FIG. 1C, the method M then proceeds to block S137 where the planarized third isolation dielectric exposed by the patterned mask is etched to form a third opening exposing the epitaxial source/drain structure. With reference to FIGS. 34A to 34C, in some embodiments of block S137, the planarized isolation dielectric 133 exposed by the patterned mask 158 is etched to form source/drain contact openings O3 exposing corresponding epitaxial source/drain structures 131. One or more etching processes are performed using the patterned mask 158 as an etching mask. The etching processes may include dry etching, wet etching, and/or other etching methods (e.g., reactive ion etching). After etching the planarized isolation dielectric 133, the patterned mask 158 may be removed.

Returning to FIG. 1C, the method M then proceeds to block S138 where a silicide layer is formed on the epitaxial source/drain structure and then a conductive material is formed to overfill the third opening. With reference to FIGS. 35A to 35C, in some embodiments of block S138, a silicide layer 160 is formed on the epitaxial source/drain structure 131. In some embodiments, the silicide layer 160 may include metal silicide, such as $CoSi_2$, $TiSi_2$, $WSi_2$, $NiSi_2$, $MoSi_2$, $TaSi_2$, PtSi, or the like. Subsequently, a conductive material 162 are deposited to overfill the source/drain contact opening O3 in the ILD layer 133 by using any acceptable deposition technique (e.g., CVD, ALD, PEALD, PECVD, PVD, ECP, electroless plating, or the like, or any combination thereof). In some embodiments, the conductive material 162 may include tungsten (W), aluminum (Al), copper (Cu), Cobalt (Co), other suitable conductive material, or combinations thereof.

Figure 36C:
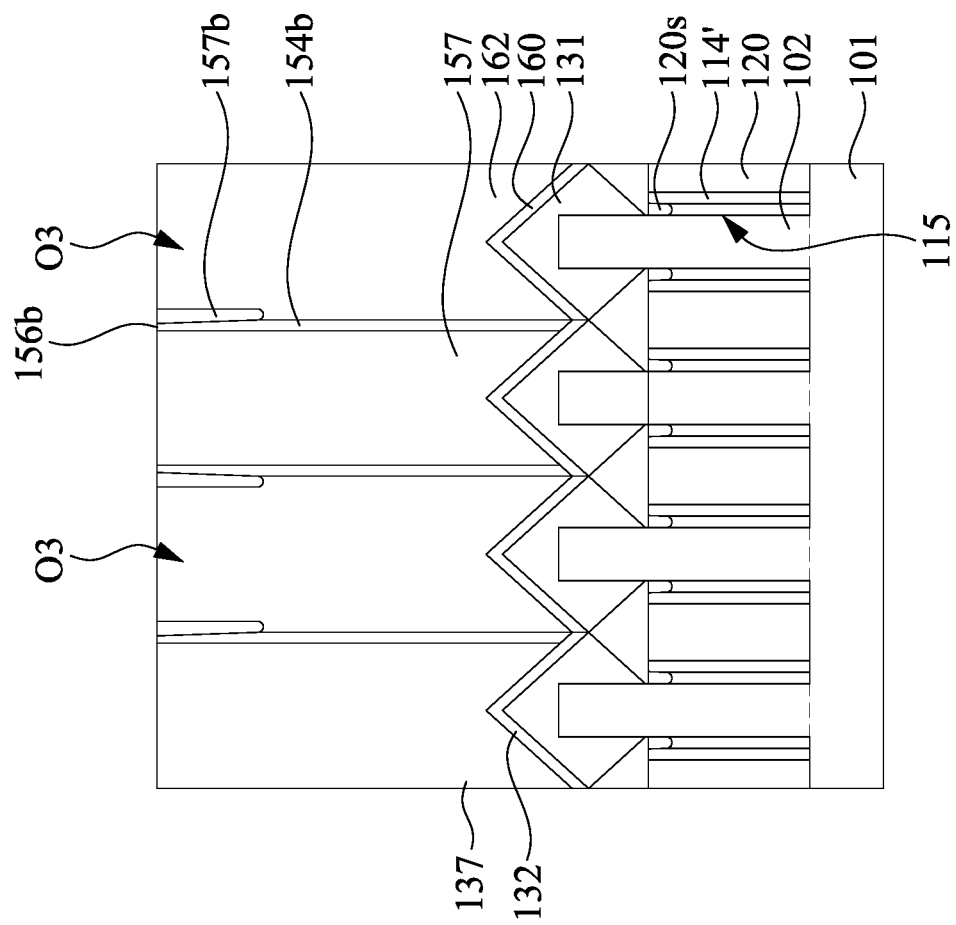

Returning to FIG. 1C, the method M then proceeds to block S139 where a fourth planarization process is performed to remove the excess conductive material from above the top surface of the ILD layer to from source/drain contacts. With reference to FIGS. 36A to 36C, in some embodiments of block S139, a planarization process (e.g., CMP) is performed to remove excess conductive material 162 from above the top surface of the ILD layer 133 to from a source/drain contact 162a.

This is described in greater detail for an embodiment with reference to FIGS. 37A to 47B, an isolation dielectric (e.g., an isolation dielectric 177 as shown in FIGS. 47A and 47B) is interposed between two metal lines of a multi-layer interconnect in an IC structure in order to provide electrical insulation between the two metal lines. An air spacer is formed to surround the isolation dielectric between the two metal lines, which in turns allows for reducing the capacitance between adjacent two metal lines. In some embodiments, the isolation dielectric between the two metal lines with the air spacer formed thereon can be collectively referred to as an air-inside cut metal.

Returning to FIG. 1C, the method M then proceeds to block S140 where a metallization layers including at least one metal line and metal via are formed over the substrate. With reference to FIGS. 37A to 37C, in some embodiments of block S140, metallization layers are formed over the structure as shown in FIGS. 36A to 36C. The metallization layers may be fabricated using a plurality of metal lines and corresponding metal vias. The metallization layers are formed over transistors as illustrated in FIGS. 36A-36C and electrically connected to underlying transistors by using, e.g., the source/drain contact 162a shown in FIGS. 36A-36C. Also included in semiconductor device is an inter-metal dielectric structure to provide electrical insulation as well as structural support for the metallization layers of the integrated circuit during many fabrication process steps. The inter-metal dielectric structure may be fabricated a plurality of dielectric layers (which may also be referred to as an inter-metal dielectric (ILD) layer).

In FIGS. 37A to 37C, the dielectric layers 164 and 166 of the inter-metal dielectric structure are formed over the structure as shown in FIGS. 36A to 36C. The dielectric layer 166 is formed over the dielectric layer 164. In some embodiments, the dielectric layers 164 and/or 166 may include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), porous SiLK, or porous silicon oxide ($SiO_2$). In some embodiments, the dielectric layers 164 and/or 166 may include SiCN, SiCO, $SiO_2$, SiN, SiC and AlON, combinations thereof, or other suitable materials. In some embodiments, a dielectric constant (k) of the dielectric layers 164 and/or 166 is less than about 2.5. In some embodiments, the dielectric layer 164 has a material the same as the dielectric layer 166. In some embodiments, the dielectric layer 164 has a material different than the dielectric layer 166.

In FIGS. 37A to 37C, the metal via 165 (see FIG. 37B) is embedded in the dielectric layer 164 and the metal lines 167 (see FIGS. 37A and 37C) are embedded in the dielectric layer 166 and extending parallel with each other. As shown in FIG. 37B, the metal line 167 is electrically connected to the metal via 165. In some embodiments, the metal via 165 and/or metal line 167 may include copper, Pt, Ru, aluminum, tantalum, tungsten, tantalum nitride (TaN), titanium, titanium nitride (TiN), combinations thereof, or other suitable materials. In some embodiments, top surfaces of the metal lines 167 are substantially level with a top surface of the dielectric layer 164.

Returning to FIG. 1C, the method M then proceeds to block S141 where a portion of the metal line in the metallization layers is removed to form a fourth opening that exposes an underlying dielectric layer. With reference to FIGS. 38A to 38C, in some embodiments of block S141, a patterned mask (not shown) is formed over the dielectric layer 164 and the metal lines 167. One or more etching processes are performed using the patterned mask as an etching mask. In some embodiments, for example, one or more etching processes are performed to remove a portion of the metal line 167 is removed to form an opening O4 (may be also referred to as a trench) that exposes the underlying dielectric layer 164, such that the opening O4 is formed between remainders of the metal line 167 and exposes the underlying dielectric layer 164. Stated differently, the remainders of the metal line 167 are spaced apart from each other by the opening O4. In FIG. 38A, the opening O4 has a dimension D1 substantially perpendicular to a lengthwise direction of the metal line 167 and greater than a width W1 of the metal line 167. In some embodiments, the dimension D1 of the opening O4 is substantially the same as the width W1 of the metal line 167.

Returning to FIG. 1C, the method M then proceeds to block S142 where a fourth sacrificial layer is blanket deposited over the metallization layers. With reference to FIGS. 39A to 39C, in some embodiments of block S142, a sacrificial layer 172 is blanket deposited over the structure in FIGS. 38A to 38C (i.e., over the dielectric layer 164 and the metal lines 167). In some embodiments, the sacrificial layer 172 may include silicon oxide, silicon nitride, silicon oxynitride, SiCN, $SiC_xO_yN_z$, other suitable materials, or combinations thereof. For example, the sacrificial layer 172 may be a dielectric material such as silicon nitride. In some embodiments, the sacrificial layer 172 includes a material different than the dielectric layer 164. In some embodiments, the sacrificial layer 172 may have a thickness T7 in a range from about 1 nm to about 5 nm, such as about 1, 2, 3, 4, or 5 nm, and other thickness ranges are within the scope of the disclosure. In some embodiments, the sacrificial layer 172 may have a multilayer structure. The sacrificial layer 172 can be formed using a deposition method, such as plasma enhanced chemical vapor deposition (PECVD), low-pressure chemical vapor deposition (LPCVD), Plasma Enhanced Atomic Layer deposition (PEALD), or the like.

Returning to FIG. 1D, the method M then proceeds to block S143 where the fourth sacrificial layer is etched to form a fourth sacrificial spacer. With reference to FIGS. 40A to 40C, in some embodiments of block S143, sacrificial spacers 172a are formed on opposite sidewalls of the metal line 167 in the opening O4 (see FIG. 40B) and sacrificial spacers 172b are formed on opposite sidewalls of the ILD layer 146 in the opening O4 (see FIG. 40C). In greater detail, an anisotropic etching process P13 (e.g., a reactive-ion etching process, RIE or atomic layer etching (ALE)) is performed to selectively remove the horizontal portions of the sacrificial layer 172. The remaining vertical portions of the sacrificial layer 172 form sacrificial spacers 172a and 172b. The sacrificial spacers 172a each vertically extends along the vertical sidewall of the dielectric layer 166 in the opening O4 from a top surface of the dielectric layer 164. The sacrificial spacers 172b each vertically extends along the vertical sidewall of the metal line 167 in the opening O4 from the top surface of the dielectric layer 164.

By way of example but not limiting the present disclosure, the anisotropic etching process P13 may implement an oxygen-containing gas, a fluorine-containing gas (e.g., $CF_4$, $SF_6$, $CH_2F_2$, $CHF_3$, and/or $C_4F_6$, $C_4F_8$), a chlorine-containing gas (e.g., $Cl_2$, $CHCl_3$, $CCl_4$, and/or $BCl_3$), a bromine-containing gas (e.g., HBr and/or $CHBr_3$), a phosphoric-containing gas (e.g., $H_3PO_4$), an iodine-containing gas, other suitable gases and/or plasmas, and/or combinations thereof. In some embodiments, the sacrificial layer 172 (see FIGS. 39A to 39C) is etched using, by way of example but not limiting the present disclosure, phosphoric acid ($H_3PO_4$) when silicon nitride is used as the nitride sacrificial spacers 172a and 172b. This is described in greater detail with reference to FIGS. 40A to 40C, the anisotropic etching process P13 etches the sacrificial layer 172 (see FIGS. 39A to 39C) at a faster etch rate than it etches the dielectric layer 164 and the metal lines 167. By way of example but not limiting the present disclosure, a ratio of the etch rate of the sacrificial layer 172 to the etch rate of the dielectric layer 164 and/or the metal lines 167 may be greater than about 10. If the ratio of the etch rate of the sacrificial layer 112 to the etch rate of the dielectric layer 164 and/or the metal lines 167 is less than about 10, the anisotropic etching process P13 would significantly consume the dielectric layer 164 and/or the metal lines 167, which in turn adversely affects the semiconductor device.

Returning to FIG. 1D, the method M then proceeds to block S144 where a fourth spacer layer is blanket deposited over the substrate. With reference to FIGS. 41A to 41C, in some embodiments of block S144, a spacer layer 174 is blanket deposited over the structure as shown in FIGS. 40A to 40C (i.e., over the dielectric layer 164, the metal lines 167, and the sacrificial spacers 172a and 172b). The spacer layer 174 may include a material different than the sacrificial spacers sacrificial spacers 172a and 172b. In some embodiments, the spacer layer 174 may include silicon oxide, silicon nitride, silicon oxynitride, SiCN, $SiC_xO_yN_z$, other suitable materials, or combinations thereof. For example, the spacer layer 174 may be a dielectric material such as silicon oxide. In some embodiments, the spacer layer 174 may have a multilayer structure. In some embodiments, the spacer layer 174 may have a thickness T8 in a range from about 1 nm to about 5 nm, such as about 1, 2, 3, 4, or 5 nm, and other thickness ranges are within the scope of the disclosure. The spacer layer 174 can be formed using a deposition method, such as plasma enhanced chemical vapor deposition (PECVD), low-pressure chemical vapor deposition (LPCVD), Plasma Enhanced Atomic Layer deposition (PEALD), or the like.

Returning to FIG. 1D, the method M then proceeds to block S145 where the fourth spacer layer is etched to form a fourth spacer. With reference to FIGS. 42A to 42C, in some embodiments of block S145, spacers 174a are formed on opposite sidewalls of the metal line 167 in the opening O4 (see FIG. 42B) and spacers 174b are formed on opposite sidewalls of the ILD layer 146 in the opening O4 (see FIG. 42C). In greater detail, an anisotropic etching process P14 (e.g., a reactive-ion etching process, RIE or atomic layer etching (ALE)) is performed to selectively remove the horizontal portions of the spacer layer 174. The remaining vertical portions of the spacer layer 174 form the spacers 174a and 174b. The spacers 174a each vertically extends along the vertical sidewall of the opening O4 of the metal line 167 from the top surface of the dielectric layer 164. The spacers 174b each vertically extends along the vertical sidewall of the opening O4 of the dielectric layer 166 from the top surface of the dielectric layer 164. By way of example but not limiting the present disclosure, the anisotropic etching process P14 may implement an oxygen-containing gas, a fluorine-containing gas (e.g., $CF_4$, $SF_6$, $CH_2F_2$, $CHF_3$, and/or $C_4F_6$, $C_4F_8$), a chlorine-containing gas (e.g., Cl$_2$, CHCl$_3$, CCl$_4$, and/or BCl$_3$), a bromine-containing gas (e.g., HBr and/or CHBr$_3$), a phosphoric-containing gas (e.g., H$_3$PO$_4$), an iodine-containing gas, other suitable gases and/or plasmas, and/or combinations thereof. In some embodiments, the spacer layer 174 (see FIGS. 41A to 41C) is etched using, by way of example and not limitation.

This is described in greater detail with reference to FIGS. 42A to 42C, the anisotropic etching process P14 etches the spacer layer 174 (see FIGS. 41A to 41C) at a faster etch rate than it etches the dielectric layer 164, the metal lines 167, and the sacrificial spacers 172a and 172b. By way of example but not limiting the present disclosure, a ratio of the etch rate of the spacer layer 174 to the etch rate of the dielectric layer 164, the metal lines 167, and/or the sacrificial spacers 172a and 172b may be greater than about 10. If the ratio of the etch rate of the spacer layer 174 to the etch rate of the dielectric layer 164, the metal lines 167, and/or the sacrificial spacers 172a and 172b is less than about 10, the anisotropic etching process P14 would significantly consume the dielectric layer 164, the metal lines 167, and/or the sacrificial spacers 172a and 172b, which in turn adversely affects the semiconductor device.

Returning to FIG. 1D, the method M then proceeds to block S146 where the fourth sacrificial spacer is removed to form a fourth air spacer. With reference to FIGS. 43A to 43C, in some embodiments of block S146, a selective etching process P15 is performed to selectively remove the sacrificial spacers 172a and 172b (see FIGS. 42A to 42C). As a result, an air spacer 175a is formed between the metal line 167 and the spacer 174a. An air spacer 175b is formed between the dielectric layer 166 and the spacer 174b. Stated differently, the metal line 167 and the spacer 174a are separated by the air spacer 175a. The dielectric layer 166 and the spacer 174b are separated by the air spacer 175b. After the air spacers 175a and 175b are formed, the spacer 174a and the air spacer 175a can be collectively referred to as an insulating structure 170a. The spacers 174b and the air spacer 175b can be collectively referred to as an insulating structure 170b. The insulating structures 170a and 170b are formed by removing the spacers 172a and 172b (see FIGS. 42A to 42C), and thus the shape of the air spacers 175a and 175b substantially inherit the shapes of the sacrificial spacers 172a and 172b. In some embodiments, portions of the dielectric layer 164 are exposed in the air spacers 175a and 175b.

As mentioned before, the thicknesses of the sacrificial spacers 172a and 172b (see FIGS. 40A to 40C) are in a range from about 1 nm to about 5 nm. As a result, the air spacers 175a and 175b may have a thickness also in a range from about 1 nm to about 5 nm, such as about 1, 2, 3, 4, or 5 nm. If the thickness of the sacrificial spacers 172a and 172b is smaller than 1 nm, the sacrificial spacers 172a and 172b is too thin such that the etchant is hard to flow into the space between the metal line 167, the dielectric layer 166, and the spacers 174a and 174b, which in turn affects the formation of the air spacers 175a and 175b. On the other hand, if the thickness of the sacrificial spacers 172a and 172b is greater than 5 nm, the thickness of the air spacers 175a and 175b inheriting the thicknesses of the sacrificial spacers 172a and 172b may be too thick, such that the material that will be formed above of the air spacers 175a and 175b may easily flow into lower portions of the air spacers 175a and 175b, which in turn affects the formation of the air spacers 175a and 175b. Therefore, during the etching process P15, the sacrificial spacers 172a and 172b (see FIGS. 42A to 42C) may be etched away and expose the vertical sidewalls of the metal line 167 and the dielectric layer 166, which in turn affects the formation of the air spacers 175a and 175b.

In the present disclosure, the sacrificial layer 172 has large dielectric constant, for example, greater than 1. On the other hand, the insulating structure 110 includes the air spacers 175a and 175b that have a dielectric constant equal to 1 ($k_{air}$=1), which is lower than the dielectric constant of the sacrificial layer 172. Thus, the equivalent dielectric constant of the insulating structure 170a and 170b may be reduced by forming the air spacers 175a and 175b. As a result, the overall capacitance of the insulating structures 170a and 170b may be reduced, which in turn will reduce the RC delay and further improve the device performance. Moreover, since the air spacers 175a and 175b are formed by removing the sacrificial spacers 172a and 172b, the air spacers 175a and 175b may inherit the shape of the sacrificial spacers 172a and 172b, and thus it is easier to control the size of the air spacers 175a and 175b and further control the equivalent capacitance of the insulating structures 170a and 170b.

In some embodiments, the etching process P15 may be an isotropic etching process (e.g., a reactive-ion etching process, RIE or atomic layer etching (ALE)). By way of example but not limiting the present disclosure, the etching process P15 may implement an oxygen-containing gas, a fluorine-containing gas (e.g., CF$_4$, SF$_6$, CH$_2$F$_2$, CHF$_3$, and/or C$_4$F$_6$, C$_4$F$_8$), a chlorine-containing gas (e.g., Cl$_2$, CHCl$_3$, CCl$_4$, and/or BCl$_3$), a bromine-containing gas (e.g., HBr and/or CHBr$_3$), a phosphoric-containing gas (e.g., H$_3$PO$_4$), an iodine-containing gas, other suitable gases and/or plasmas, and/or combinations thereof. In some embodiments, the sacrificial spacers 172a and 172b (see FIGS. 42A to 42C) is etched using, by way of example but not limiting the present disclosure, NH$_4$OH when silicon is used in the nitride sacrificial spacers 172a and 172b. This is described in greater detail with reference to FIGS. 43A to 43C, the etching process P15 etches the sacrificial spacers 172a and 172b (see FIGS. 42A to 42C) at a faster etch rate than it etches the dielectric layer 164, the metal lines 167, and/or the spacers 174a and 174b. By way of example but not limiting the present disclosure, a ratio of the etch rate of the sacrificial spacers 172a and 172b to the etch rate of the dielectric layer 164, the metal lines 167, and/or the spacers 174a and 174b may be greater than about 10. If the ratio of the etch rate of the sacrificial spacers 172a and 172b to the etch rate of the dielectric layer 164, the metal lines 167, and/or the spacers 174a and 174b is less than about 10, the etching process P15 would significantly consume the dielectric layer 164, the metal lines 167, and/or the spacers 174a and 174b, which in turn adversely affects the semiconductor device. In some embodiments, the etching process P15 may be an isotropic etching process. In some embodiments, the etching process P15 uses a different etchant than the previous etching process P14.

Returning to FIG. 1D, the method M then proceeds to block S147 where an upper portion of the fourth spacer is etched to form a rounding top corner thereon. With reference to FIGS. 44A to 44C, in some embodiments of block S147, upper portions of the spacers 174a and 174b are etched to form tapered top ends 176a and 176b thereon. In some embodiments, an etching process P16 is performed on the spacers 174a and 174b. In some embodiments, the etching process P16 is a plasma etching process employing one or more etchants.

This is described in greater detail with reference to FIGS. 44A to 44C, the non-zero bias plasma etching process is performed to etch the upper portion of the spacers 174a and 174*b* such that top ends of the spacers 174*a* and 174*b* are tapered. The non-zero bias can drive more plasmas to scale down the spacers 174*a* and 174*b* compared to zero bias. For example, the non-zero bias plasma etching process begins with ion bombardment to remove compounds of the spacers 174*a* and 174*b*. Hence, the upper portions of the spacers 174*a* and 174*b* have narrower widths than lower portions of the spacers 174*a* and 174*b*. Stated differently, upper portions of the air spacers 175*a* and 175*b* have wider widths than lower portions of the air spacers 175*a* and 175*b*, such that an isolation dielectric that will be formed later may flow into the upper portions of the air spacers 175*a* and 175*b*. Therefore, upper ends of the air spacers 175*a* and 175*b* are blocked by the isolation dielectric that will be formed later, and thus the air spacers 175*a* and 175*b* can be protected during the subsequent process, such that other material would not fill into the air spacers 175*a* and 175*b*.

The profile of the spacers 174*a* and 174*b* depend on process conditions of the etching process P16 (e.g., etching time duration and/or the like). By way of example but not limiting the present disclosure, the anisotropic etching process P16 may implement an oxygen-containing gas, a fluorine-containing gas (e.g., $CF_4$, $SF_6$, $CH_2F_2$, $CHF_3$, and/or $C_4F_6$, $C_4F_8$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, a phosphoric-containing gas (e.g., $H_3PO_4$), other suitable gases and/or plasmas, and/or combinations thereof. In some embodiments, the non-zero bias plasma etching process uses a gas mixture of $C_4F_6$ and Ar with a bias in a range from about 50 W to about 1000 W. If the bias power is higher than about 1500 W, the plasma might result in unwanted damage to the dielectric layer 164 and the metal lines 167. If the bias power is lower than about 30 W, the spacers 174*a* and 174*b* may not be tapered enough to allow the isolation dielectric that will be formed later to flow into the upper portion of the air spacers 175*a* and 175*b*.

Returning to FIG. 1D, the method M then proceeds to block S148 where a fourth isolation dielectric is formed to overfill the fourth opening and to seal the fourth air spacer. With reference to FIGS. 45A to 45C, in some embodiments of block S148, an isolation dielectric 177 is formed to overfill the opening O4 and cover the dielectric layer 164 and the metal lines 167. As mentioned before, because the upper portions of the air spacers 175*a* and 175*b* has wider widths than the lower portions of the air spacers 175*a* and 175*b*, material of the isolation dielectric 177 may flow into the upper portions of the air spacers 175*a* and 175*b* and seal the air spacers 175*a* and 175*b*. Accordingly, the isolation dielectric 177 includes a seal portion 177*a* embedded between the spacer 174*a* and the metal line 167 and a seal portion 177*a* embedded between the spacer 174*b* and the dielectric layer 166. Therefore, the upper ends of the air spacers 175*a* and 175*b* are blocked by the seal portions 177*a* and 177*b* of the isolation dielectric 177, and thus the air spacers 175*a* and 175*b* can be protected during the subsequent process, such that other material would not fill into the air spacers 175*a* and 175*b*.

In some embodiments, the isolation dielectric 177 is made of silicon oxide, silicon nitride, silicon oxynitride, fluoride-doped silicate glass (FSG), or other low-K dielectric materials. In some embodiments, the isolation dielectric 177 may be formed using a high-density-plasma (HDP) chemical vapor deposition (CVD) process, using silane ($SiH_4$) and oxygen ($O_2$) as reacting precursors. In some other embodiments, the isolation dielectric 177 may be formed using a sub-atmospheric CVD (SACVD) process or high aspect-ratio process (HARP), in which process gases may include tetraethylorthosilicate (TEOS) and ozone ($O_3$). In yet other embodiments, the isolation dielectric 177 may be formed using a spin-on-dielectric (SOD) process, such as hydrogen silsesquioxane (HSQ) or methyl silsesquioxane (MSQ). Other processes and materials may be used. In some embodiments, the isolation dielectric 177 can have a multi-layer structure, for example, a thermal oxide liner layer with silicon nitride formed over the liner. Thereafter, a thermal annealing may be optionally performed to the isolation dielectric 177. In some embodiments, the isolation dielectric 177 may be made of a material the same as the spacers 174*a* and 174*b*. In some embodiments, the isolation dielectric 177 may be made of a material different than the spacers 174*a* and 174*b*.

Returning to FIG. 1D, the method M then proceeds to block S149 where a fifth planarization process is performed to the fourth isolation dielectric. With reference to FIGS. 46A to 46C, in some embodiments of block S149, a planarization process such as chemical mechanical polish (CMP) is performed to remove the excess isolation dielectric 177 over the semiconductor fin 177 such that top surfaces of the dielectric layer 164 and the metal lines 167 are exposed and the air spacers 175*a* and 175*b* remain covered by the seal portions 177*a* and 177*b* of the isolation dielectric 177.

Returning to FIG. 1D, the method M then proceeds to block S150 where at least one of metal via is formed over the dielectric layer and the metal line. With reference to FIGS. 47A and 47B, in some embodiments of block S150, the dielectric layer 184 is formed over the structure as shown in FIGS. 46B and 46C. Subsequently, a metal via 185 is formed to be embedded in the dielectric layer 184 and electrically connected to the metal line 167. In some embodiments, the dielectric layer 184 may include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), porous SiLK, or porous silicon oxide ($SiO_2$). In some embodiments, the dielectric layer 184 may include SiCN, SiCO, $SiO_2$, SiN, SiC and AlON, combinations thereof, or other suitable materials. In some embodiments, a dielectric constant (k) of the dielectric layer 184 is less than about 2.5. In some embodiments, the dielectric layer 184 has a material the same as the dielectric layer 166. In some embodiments, the dielectric layer 184 has a material different than the dielectric layer 166. In some embodiments, the metal via 185 may include copper, Pt, Ru, aluminum, tantalum, tungsten, tantalum nitride (TaN), titanium, titanium nitride (TiN), combinations thereof, or other suitable materials.

This is described in greater detail for an embodiment with reference to FIGS. 48A to 55B, an air spacer (e.g., an air spacer 275 as shown in FIGS. 55A and 55B) interposed between two metal lines of a multi-layer interconnect and surrounding the isolation dielectric (e.g., an isolation dielectric 277 as shown in FIGS. 55A and 55B) may be substantially the same as that shown in FIGS. 47A and 47B. The difference between the present embodiment and the embodiment in FIGS. 47A and 47B is that the air spacer is formed after the forming of the isolation dielectric.

Figure 48B:
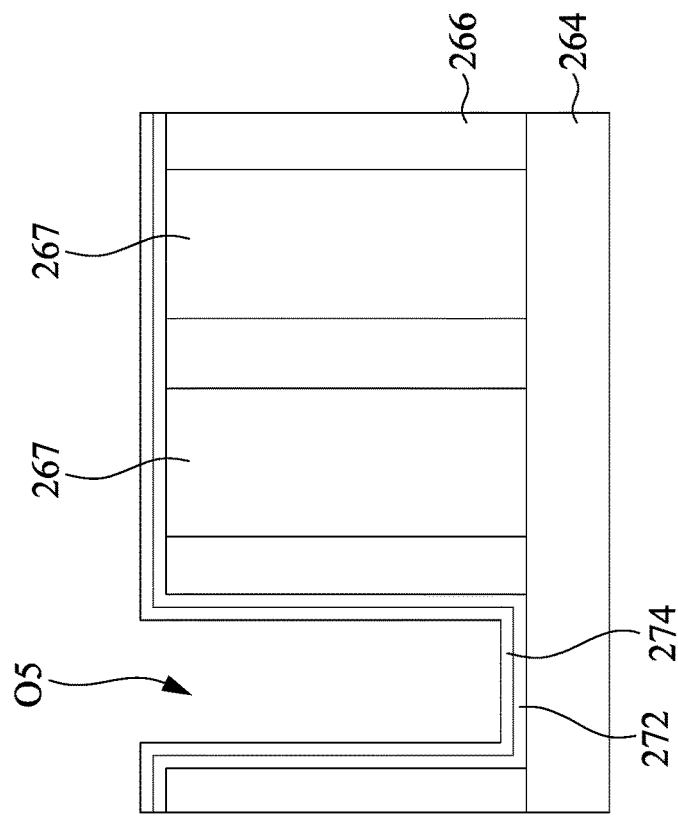
Figure 48A:
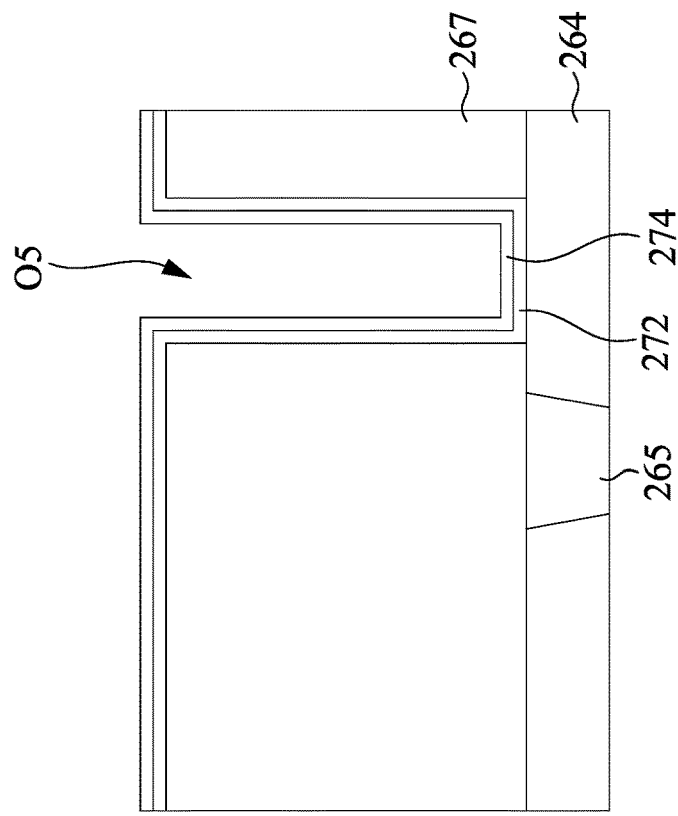

FIGS. 48A to 55B illustrate schematic views of intermediate stages in the formation of a semiconductor device 200 in accordance with some embodiments of the present disclosure. FIGS. 48A to 55A are cross-sectional views corresponding to line B4-B4' in FIGS. 37A to 46A. FIGS. 48B to 55B are cross-sectional corresponding to line C4-C4' in FIGS. 37A to 46A. Operations for forming a semiconductor device 200 prior to the structure shown in FIGS. 48A and 48B are substantially the same as the operations for forming the semiconductor device 100 shown in FIGS. 37A-39C at stages S140-S142 of the method M, and reference may be made to the foregoing paragraphs for the related detailed descriptions and such descriptions are not provided again herein. For example, material and manufacturing method of dielectric layers 264 and 266, a metal via 265, a metal line 267, and a sacrificial layer 272 may be substantially the same as that of the dielectric layers 164 and 166, the metal via 165, the metal line 167, and the sacrificial layer 172 as shown in FIGS. 37A to 39C, and the related detailed descriptions may refer to the foregoing paragraphs, and are not described again herein.

Reference is made to FIGS. 48A and 48B. The metal via 265 (see FIG. 48A) is embedded in the dielectric layer 264. The dielectric layer 266 is formed over the dielectric layer 264 and the metal via 265. A portion of the metal line 267 is removed to form an opening O5 that exposes the underlying dielectric layer 264, such that the opening O5 is formed between remainders of the metal line 267. Stated differently, the remainders of the metal line 267 are spaced apart from each other by the opening O5. The sacrificial layer 272 is blanket deposited over the dielectric layer 264 and lines sidewalls of the opening O5 and a top surface of the dielectric layer 264 in the opening O5. Subsequently, a spacer layer 274 is blanket deposited over the sacrificial layer 272. The spacer layer 274 includes a material different than the sacrificial layer 272. In some embodiments, the sacrificial layer 272 may have a thickness in a range from about 1 nm to about 5 nm, such as about 1, 2, 3, 4, or 5 nm, and other thickness ranges are within the scope of the disclosure. In some embodiments, the spacer layer 274 may have a thickness in a range from about 1 nm to about 5 nm, such as about 1, 2, 3, 4, or 5 nm, and other thickness ranges are within the scope of the disclosure. In some embodiments, the spacer layer 274 may include silicon oxide, silicon nitride, silicon oxynitride, SiCN, $SiC_xO_yN_z$, other suitable materials, or combinations thereof. For example, the spacer layer 274 may be a dielectric material such as silicon oxide. In some embodiments, the spacer layer 274 may have a multilayer structure. The spacer layer 274 can be formed using a deposition method, such as plasma enhanced chemical vapor deposition (PECVD), low-pressure chemical vapor deposition (LPCVD), sub-atmospheric chemical vapor deposition (SACVD), or the like.

Figure 49B:
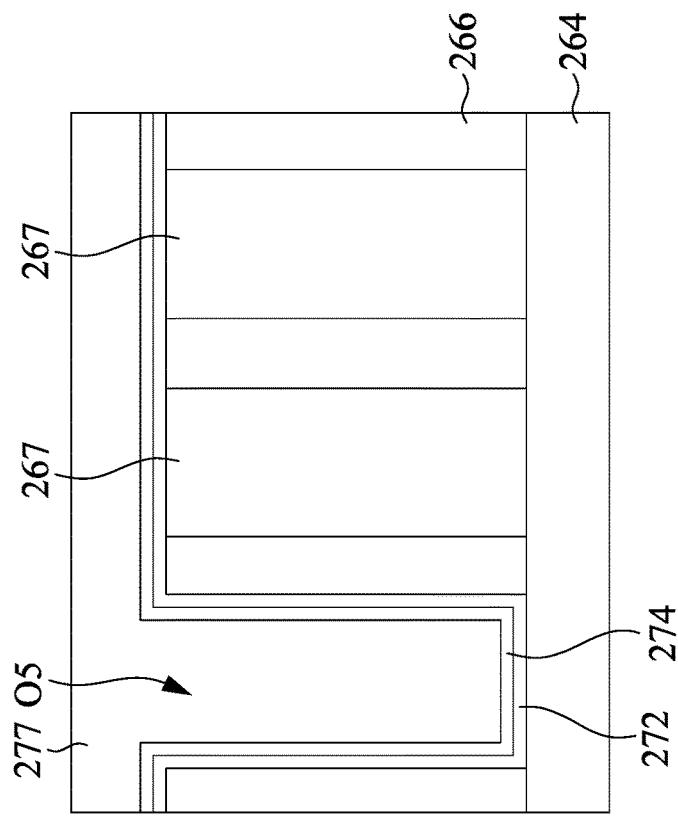
Figure 49A:
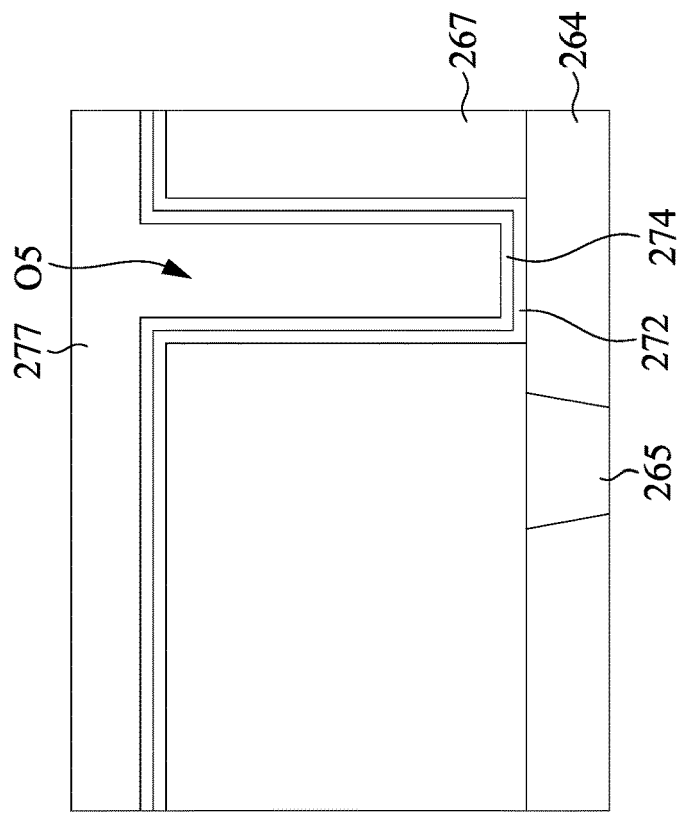

Reference is made to FIGS. 49A and 49B. An isolation dielectric 277 is formed over the spacer layer 274 to overfill the opening O5. In some embodiments, the isolation dielectric 277 is made of silicon oxide, silicon nitride, silicon oxynitride, fluoride-doped silicate glass (FSG), or other low-K dielectric materials. In some embodiments, the isolation dielectric 277 may be formed using a high-density-plasma (HDP) chemical vapor deposition (CVD) process, using silane ($SiH_4$) and oxygen ($O_2$) as reacting precursors. In some other embodiments, the isolation dielectric 277 may be formed using a sub-atmospheric CVD (SACVD) process or high aspect-ratio process (HARP), in which process gases may include tetraethylorthosilicate (TEOS) and ozone ($O_3$). In yet other embodiments, the isolation dielectric 277 may be formed using a spin-on-dielectric (SOD) process, such as hydrogen silsesquioxane (HSQ) or methyl silsesquioxane (MSQ). Other processes and materials may be used. In some embodiments, the isolation dielectric 277 can have a multi-layer structure, for example, a thermal oxide liner layer with silicon nitride formed over the liner. Thereafter, a thermal annealing may be optionally performed to the isolation dielectric 277. In some embodiments, the isolation dielectric 277 may be made of a material different than the spacer layer 274. In some embodiments, the isolation dielectric 277 may be made of a material the same as the spacer layer 274.

Figure 50B:
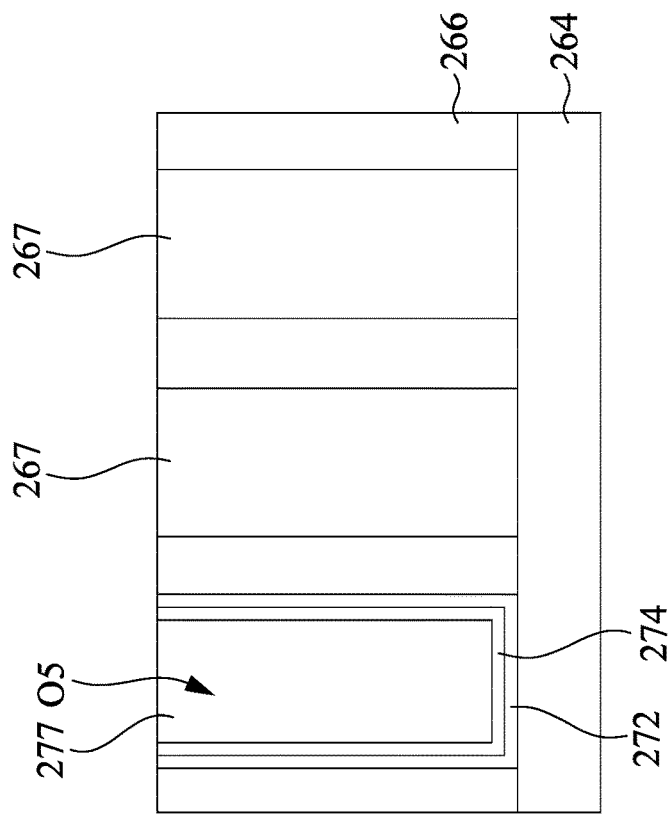
Figure 50A:
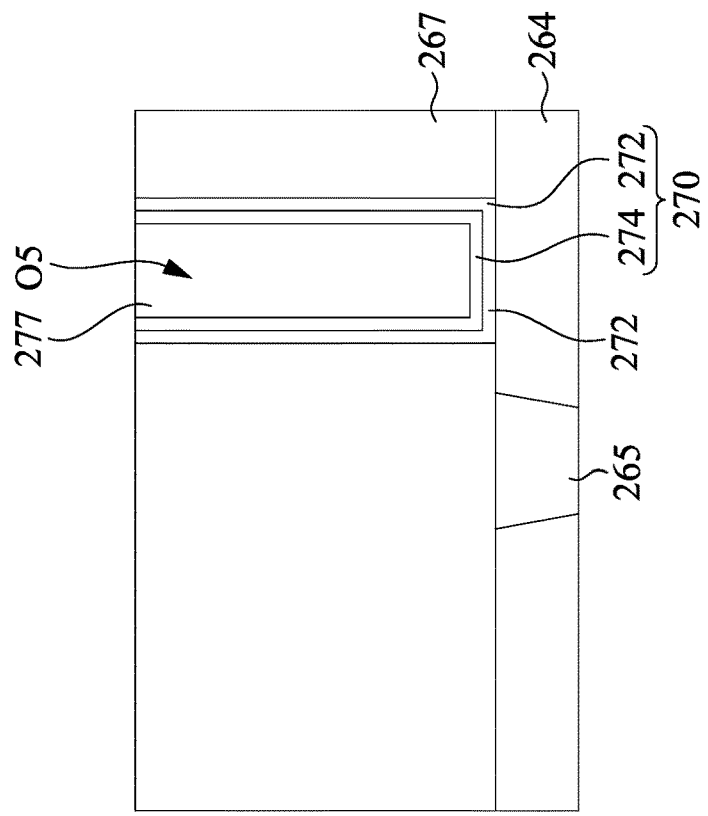

Reference is made to FIGS. 50A and 50B. A planarization process such as chemical mechanical polish (CMP) is performed to remove the excess isolation dielectric 277, the spacer layer 274, and the sacrificial layer 272 over the opening O5 until the dielectric layer 264 is exposed.

Figure 51B:
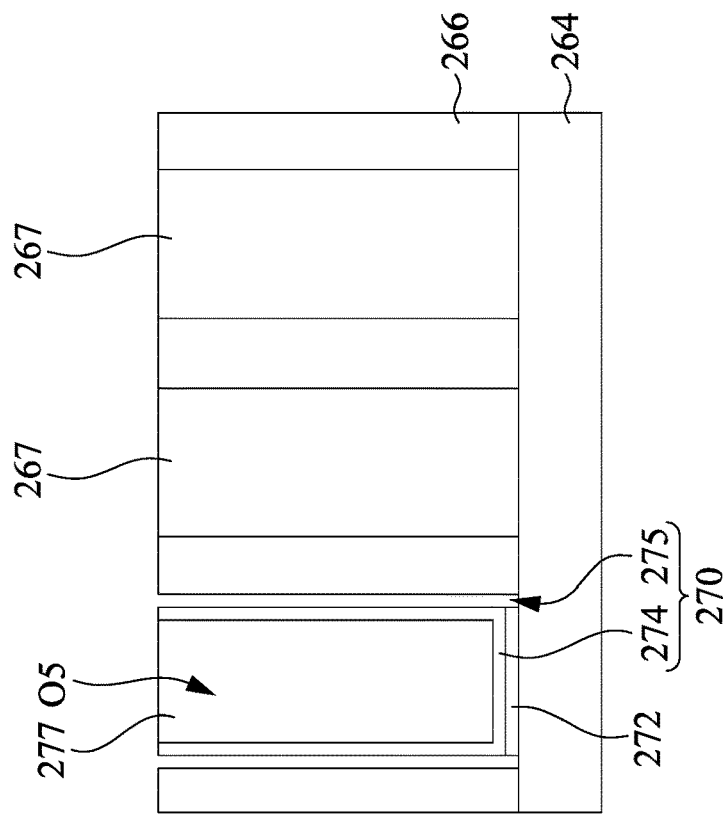
Figure 51A:
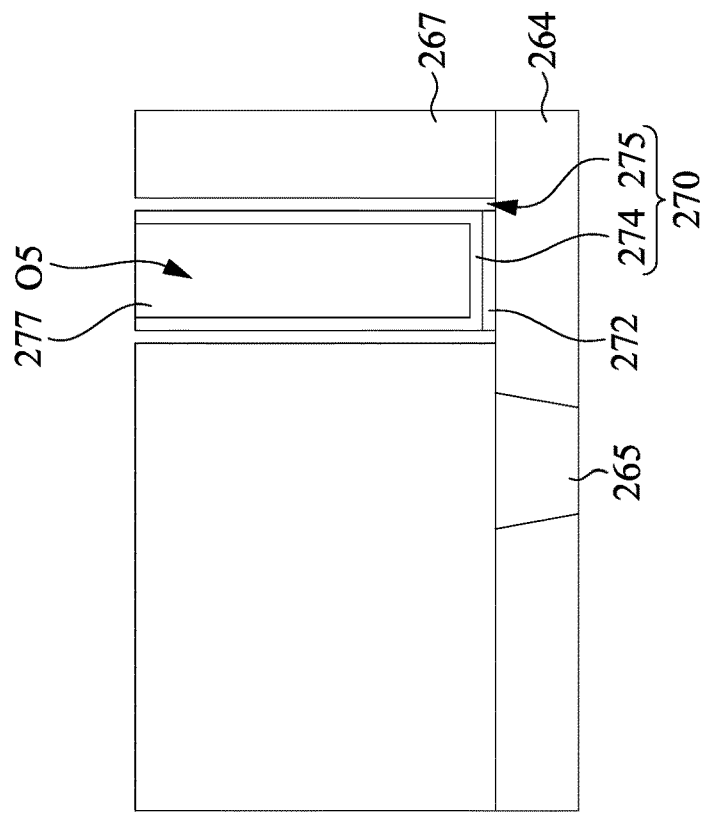

Reference is made to FIGS. 51A and 51B. An etching process is performed to selectively remove a vertical portion of the sacrificial spacer 272 such that an air spacer 275 is formed between the metal line 267 and the spacer layer 274 and between the dielectric layer 266 and the spacer layer 274. Stated differently, the metal line 267 and the spacer layer 274 are separated by the air spacer 275. After the air spacer 275 is formed, the spacer layer 274 and the air spacer 275 can be collectively referred to as an insulating structure 270. The insulating structure 270 is formed by removing the vertical portion of the sacrificial layer 272 (see FIGS. 50A and 50B), and thus the shape of the air spacer 275 substantially inherits the shape of the vertical portion of the sacrificial layer 272. In some embodiments, a portion of the dielectric layer 264 is exposed in the air spacer 275.

As mentioned before, the thickness of the sacrificial layer 272 (see FIGS. 39A and 39C) is in a range from about 1 nm to about 5 nm. As a result, the air spacer 275 may have a thickness also in a range from about 1 nm to about 5 nm, such as about 1, 2, 3, 4, or 5 nm. If the thickness of the sacrificial layer 272 is smaller than 1 nm, the sacrificial layer 272 is too thin such that the etchant is hard to flow into the space between the metal line 267, the dielectric layer 266, and the spacer layer 274, which in turn affects the formation of the air spacer 275. On the other hand, if the thickness of the sacrificial layer 272 is greater than 5 nm, the thickness of the air spacer 275 inheriting the thickness of the sacrificial layer 272 may be too thick, such that the material that will be formed above of the air spacer 275 may easily flow into the lower portion of the air spacer 275, which in turn affects the formation of the air spacer 275. Therefore, during the etching process, the vertical portion of the sacrificial layer 272 (see FIGS. 50A and 50B) may be etched away and expose the vertical sidewalls of the metal line 267 and the dielectric layer 266, which in turn affects the formation of the air spacer 275.

In the present disclosure, the sacrificial layer 272 has large dielectric constant, for example, greater than 1. On the other hand, the insulating structure 270 includes the air spacer 275 that has a dielectric constant equal to 1 ($k_{air}=1$), which is lower than the dielectric constant of the sacrificial layer 272. Thus, the equivalent dielectric constant of the insulating structure 270 may be reduced by forming the air spacer 275. As a result, the overall capacitance of the insulating structure 270 may be reduced, which in turn will reduce the RC delay and further improve the device performance.

In some embodiments, the etching process on the sacrificial spacer 272 may be an anisotropic etching process (e.g., a reactive-ion etching process, RIE or atomic layer etching (ALE)). By way of example but not limiting the present disclosure, the etching process on the sacrificial spacer 272 may implement an oxygen-containing gas, a fluorine-containing gas (e.g., $CF_4$, $SF_6$, $CH_2F_2$, $CHF_3$, and/or $C_4F_6$, $C_4F_8$), a chlorine-containing gas (e.g., $Cl_2$, $CHCl_3$, $CCl_4$, and/or $BCl_3$), a bromine-containing gas (e.g., HBr and/or CHBr$_3$), a phosphoric-containing gas (e.g., H$_3$PO$_4$), an iodine-containing gas, other suitable gases and/or plasmas, and/or combinations thereof. In some embodiments, the vertical portion of the sacrificial layer 272 (see FIGS. 50A and 50B) is etched using, by way of example but not limiting the present disclosure, phosphoric acid (H$_3$PO$_4$) when silicon nitride is used as the nitride sacrificial layer 272. This is described in greater detail with reference to FIGS. 51A and 51B, the etching process etches the sacrificial layer 272 (see FIGS. 50A and 50B) at a faster etch rate than it etches the dielectric layer 264, the metal lines 267, and/or the spacer layer 274. By way of example but not limiting the present disclosure, a ratio of the etch rate of the sacrificial layer 272 to the etch rate of the dielectric layer 264, the metal lines 267, and/or the spacer layer 274 may be greater than about 10. If the ratio of the etch rate of the sacrificial layer 272 to the etch rate of the dielectric layer 264, the metal lines 267, and/or the spacer layer 274 is less than about 10, the etching process would significantly consume the dielectric layer 264, the metal lines 267, and/or the spacer layer 274, which in turn adversely affects the semiconductor device. In some embodiments, the etching process on the sacrificial spacer 272 may be an isotropic etching process.

Reference is made to FIGS. 52A and 52B. An etching process is performed on the spacer layer 274, such that an upper portion of the spacer layer 274 is etched to form a tapered top end 276 thereon. In some embodiments, the etching process on the spacer layer 274 is a plasma etching process employing one or more etchants.

This is described in greater detail with reference to FIGS. 52A and 52B, the non-zero bias plasma etching process is performed to etch the upper portion of the spacer layer 274 such that the top end of the spacer layer 274 is tapered. The non-zero bias can drive more plasmas to scale down the spacer layer 274 compared to zero bias. For example, the non-zero bias plasma etching process begins with ion bombardment to remove compounds of the spacer layer 274. Hence, the upper portion of the spacer layer 274 has a narrower width than the lower portion of the spacer layer 274. Stated differently, the upper portion of the air spacer 275 has a wider width than the lower portion of the air spacer 275, such that an isolation dielectric that will be formed later may flow into the upper portion of the air spacer 275. Therefore, the upper end of the air spacer 275 is sealed by the isolation dielectric that will be formed later, and thus the air spacer 275 can be protected during the subsequent process, such that other material would not fill into the air spacer 275.

The profile of the spacer layer 274 depends on process conditions of the etching process (e.g., etching time duration and/or the like). By way of example but not limiting the present disclosure, the anisotropic etching process on the spacer layer 274 may implement an oxygen-containing gas, a fluorine-containing gas (e.g., CF$_4$, SF$_6$, CH$_2$F$_2$, CHF$_3$, and/or C$_4$F$_6$, C$_4$F$_8$), a chlorine-containing gas (e.g., Cl$_2$, CHCl$_3$, CCl$_4$, and/or BCl$_3$), a bromine-containing gas (e.g., HBr and/or CHBr$_3$), an iodine-containing gas, a phosphoric-containing gas (e.g., H$_3$PO$_4$), other suitable gases and/or plasmas, and/or combinations thereof. In some embodiments, the non-zero bias plasma etching process uses a gas mixture of C$_4$F$_6$ and Ar with a bias in a range from about 50 W to about 1000 W. If the bias power is higher than about 1500 W, the plasma might result in unwanted damage to the dielectric layer 264 and the metal lines 267. If the bias power is lower than about 30 W, the spacer may not be tapered enough to allow the isolation dielectric that will be formed later to flow into the upper portion of the air spacer 275.

Reference is made to FIGS. 53A and 53B. An isolation dielectric 278 is formed to overfill the opening O5 and to seal the air spacer 275. As mentioned before, because the upper portions of the air spacer 275 has wider widths than the lower portions of the air spacer 275, material of the isolation dielectric 278 may flow into the upper portions of the air spacer 275 and seal the air spacer 275. Accordingly, the isolation dielectric 278 includes a seal portion 278s embedded between the spacer layer 274, the dielectric layer 266, and the metal line 267. Therefore, the upper end of the air spacer 275 are blocked by the seal portion 278s of the isolation dielectric 278, and thus the air spacer 275 can be protected during the subsequent process, such that other material would not fill into the air spacer 275.

In some embodiments, the isolation dielectric 278 is made of silicon oxide, silicon nitride, silicon oxynitride, fluoride-doped silicate glass (FSG), or other low-K dielectric materials. In some embodiments, the isolation dielectric 278 may be formed using a high-density-plasma (HDP) chemical vapor deposition (CVD) process, using silane (SiH$_4$) and oxygen (O$_2$) as reacting precursors. In some other embodiments, the isolation dielectric 278 may be formed using a sub-atmospheric CVD (SACVD) process or high aspect-ratio process (HARP), in which process gases may include tetraethylorthosilicate (TEOS) and ozone (O$_3$). In yet other embodiments, the isolation dielectric 278 may be formed using a spin-on-dielectric (SOD) process, such as hydrogen silsesquioxane (HSQ) or methyl silsesquioxane (MSQ). Other processes and materials may be used. In some embodiments, the isolation dielectric 278 can have a multi-layer structure, for example, a thermal oxide liner layer with silicon nitride formed over the liner. Thereafter, a thermal annealing may be optionally performed to the isolation dielectric 278. In some embodiments, the isolation dielectric 278 may be made of a material the same as the spacer layer 274, the dielectric layer 266, and/or the isolation dielectric 278. In some embodiments, the isolation dielectric 278 may be made of a material different than the spacer layer 274, the dielectric layer 266, and/or the isolation dielectric 278.

Reference is made to FIGS. 54A and 54B. A planarization process such as chemical mechanical polish (CMP) is performed to remove the excess isolation dielectric 278 until the dielectric layer 266 and the metal lines 267 are exposed and the air spacer 275 remains covered by the seal portion 278s of the isolation dielectric 278.

Reference is made to FIGS. 55A and 55B. The dielectric layer 284 is formed over the structure as shown in FIGS. 54A and 54B. Subsequently, a metal via 285 is formed to be embedded in the dielectric layer 284 and electrically connected to the metal line 267. In some embodiments, the dielectric layer 284 may include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), porous SiLK, or porous silicon oxide (SiO$_2$). In some embodiments, the dielectric layer 284 may include SiCN, SiCO, SiO$_2$, SiN, SiC and AlON, combinations thereof, or other suitable materials. In some embodiments, a dielectric constant (k) of the dielectric layer 284 is less than about 2.5. In some embodiments, the dielectric layer 284 has a material the same as the dielectric layer 266. In some embodiments, the dielectric layer 284 has a material different than the dielectric layer 266. In some embodiments, the metal via 285 may include copper, Pt, Ru, aluminum, tantalum, tungsten, tantalum nitride (TaN), titanium, titanium nitride (TiN), combinations thereof, or other suitable materials.

This is described in greater detail for an embodiment with reference to FIGS. 56A to 61B, an air spacer (e.g., an air spacer 375 as shown in FIGS. 61A and 61B) interposed between two metal lines of a multi-layer interconnect and surrounding the isolation dielectric (e.g., an isolation dielectric 377 as shown in FIGS. 61A and 61B) may be substantially the same as that shown in FIGS. 55A and 55B. The difference between the present embodiment and the embodiment in FIGS. 55A and 55B is that the air spacer is formed between the physical spacer and the isolation dielectric to expose an outer sidewall of the isolation dielectric.

Figure 56B:
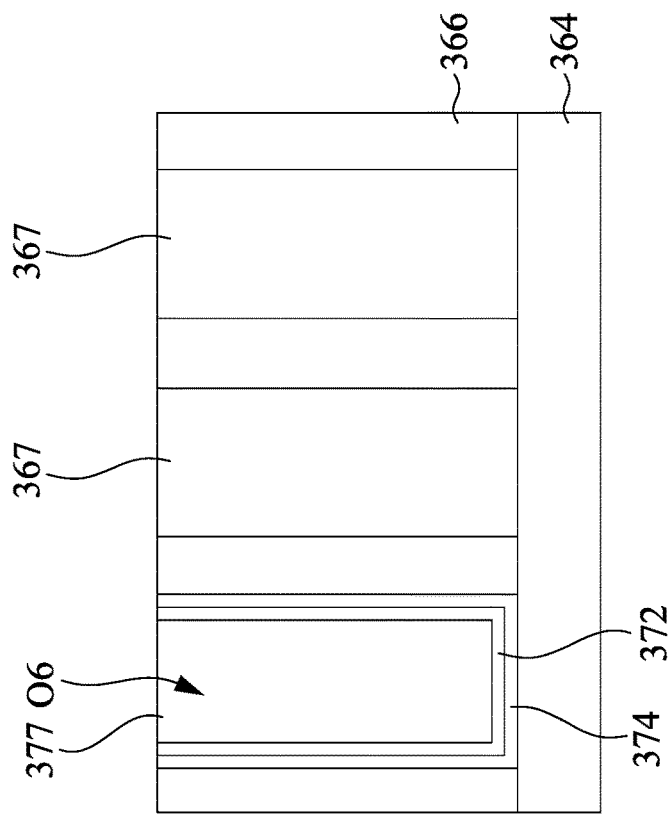
Figure 56A:
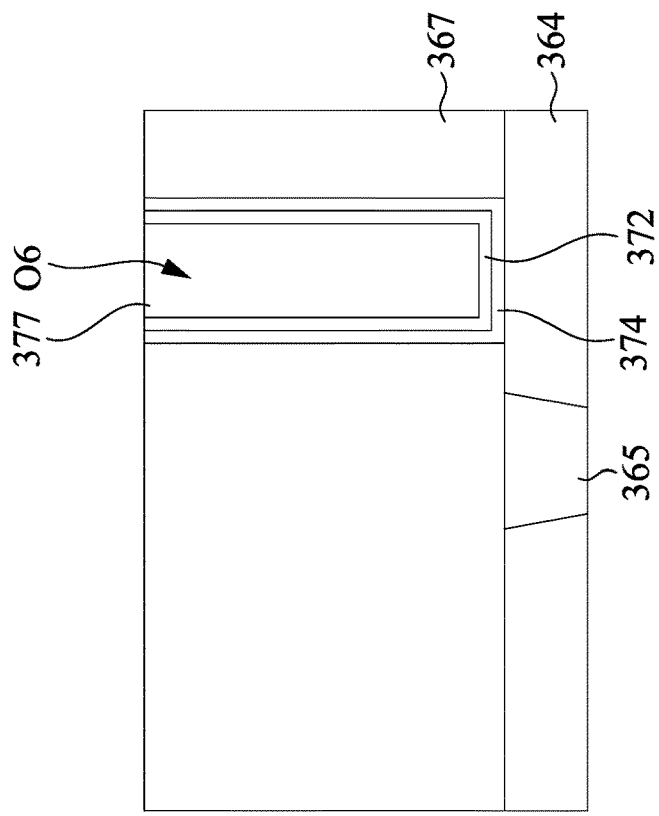

FIGS. 56A to 61B illustrate schematic views of intermediate stages in the formation of a semiconductor device 300 in accordance with some embodiments of the present disclosure. FIGS. 56A to 61A are cross-sectional views corresponding to line B4-B4' in FIGS. 37A to 46A. FIGS. 56B to 61B are cross-sectional corresponding to line C4-C4' in FIGS. 37A to 46A. Operations for forming a semiconductor device 300 prior to the structure shown in FIGS. 56A and 56B are substantially the same as the operations for forming the semiconductor device 200 shown in FIGS. 48A-50B, and reference may be made to the foregoing paragraphs for the related detailed descriptions and such descriptions are not provided again herein. For example, material and manufacturing method of dielectric layers 364 and 366, a metal via 365, a metal line 367, a sacrificial layer 372, a spacer layer 374, and an isolation dielectric 377 may be substantially the same as that of the dielectric layers 264 and 266, the metal via 265, the metal line 267, the sacrificial layer 272, the spacer layer 274, and the isolation dielectric 277 as shown in FIGS. 48A-50B, and the related detailed descriptions may refer to the foregoing paragraphs, and are not described again herein.

The difference between the present embodiment and the embodiment in FIGS. 48A-50B is that the sacrificial layer 372 is formed over the spacer layer 374. Reference is made to FIGS. 56A and 56B. The metal via 365 (see FIG. 56A) is embedded in the dielectric layer 364. The dielectric layer 366 is formed over the dielectric layer 364 and the metal via 365. A portion of the metal line 267 is removed to form an opening O6 that exposes the underlying dielectric layer 364, such that the opening O6 is formed between remainders of the metal line 367. Stated differently, the remainders of the metal line 367 are spaced apart from each other by the opening O6. The spacer layer 374 is blanket deposited over the dielectric layer 364 and lines sidewalls of the opening O6 and a top surface of the dielectric layer 364 in the opening O6. Subsequently, the sacrificial layer 372 is blanket deposited over the spacer layer 374. Subsequently, the isolation dielectric 377 is formed over the sacrificial layer 372 in the opening O6. The sacrificial layer 372 includes a material different than the spacer layer 374 and the isolation dielectric 377. In some embodiments, the sacrificial layer 372 may have a thickness in a range from about 1 nm to about 5 nm, such as about 1, 2, 3, 4, or 5 nm, and other thickness ranges are within the scope of the disclosure. In some embodiments, the spacer layer 374 may have a thickness in a range from about 1 nm to about 5 nm, such as about 1, 2, 3, 4, or 5 nm, and other thickness ranges are within the scope of the disclosure.

Reference is made to FIGS. 57A and 57B. An etching process is performed to selectively remove a vertical portion of the sacrificial spacer 372 such that an air spacer 375 is formed between the spacer layer 374 and the dielectric layer 377. Stated differently, the spacer layer 374 and the isolation dielectric 377 are separated by the air spacer 375. After the air spacer 375 is formed, the spacer layer 374 and the air spacer 375 can be collectively referred to as an insulating structure 370. The insulating structure 370 is formed by removing the vertical portion of the sacrificial layer 372 (see FIGS. 56A and 56B), and thus the shape of the air spacer 275 substantially inherits the shape of the vertical portion of the sacrificial layer 372. In some embodiments, a lateral portion of the spacer layer 374 is exposed in the air spacer 375.

The thickness of the sacrificial layer 372 may be in a range from about 1 nm to about 5 nm. As a result, the air spacer 375 may have a thickness also in a range from about 1 nm to about 5 nm, such as about 1, 2, 3, 4, or 5 nm. If the thickness of the sacrificial layer 372 is smaller than 1 nm, the sacrificial layer 372 is too thin such that the etchant is hard to flow into the space between the spacer layer 374 and the dielectric layer 377, which in turn affects the formation of the air spacer 375. On the other hand, if the thickness of the sacrificial layer 372 is greater than 5 nm, the thickness of the air spacer 375 inheriting the thickness of the sacrificial layer 372 may be too thick, such that the material that will be formed above of the air spacer 375 may easily flow into the lower portion of the air spacer 375, which in turn affects the formation of the air spacer 375. Therefore, during the etching process, the vertical portion of the sacrificial layer 372 (see FIGS. 56A and 56B) may be etched away and expose the vertical sidewalls of the spacer layer 374 and the dielectric layer 377, which in turn affects the formation of the air spacer 275.

In the present disclosure, the sacrificial layer 372 has large dielectric constant, for example, greater than 1. On the other hand, the insulating structure 370 includes the air spacer 375 that has a dielectric constant equal to 1 ($k_{air}=1$), which is lower than the dielectric constant of the sacrificial layer 372. Thus, the equivalent dielectric constant of the insulating structure 370 may be reduced by forming the air spacer 375. As a result, the overall capacitance of the insulating structure 370 may be reduced, which in turn will reduce the RC delay and further improve the device performance.

In some embodiments, the etching process on the sacrificial spacer 372 may be an anisotropic etching process (e.g., a reactive-ion etching process, RIE or atomic layer etching (ALE)). By way of example but not limiting the present disclosure, the etching process on the sacrificial spacer 372 may implement an oxygen-containing gas, a fluorine-containing gas (e.g., $CF_4$, $SF_6$, $CH_2F_2$, $CHF_3$, and/or $C_4F_6$, $C_4F_8$), a chlorine-containing gas (e.g., $Cl_2$, $CHCl_3$, $CCl_4$, and/or $BCl_3$), a bromine-containing gas (e.g., HBr and/or $CHBr_3$), a phosphoric-containing gas (e.g., $H_3PO_4$), an iodine-containing gas, other suitable gases and/or plasmas, and/or combinations thereof. In some embodiments, the vertical portion of the sacrificial layer 372 (see FIGS. 56A and 56B) is etched using, by way of example but not limiting the present disclosure, $NH_4OH$ when silicon is used in the nitride sacrificial layer 372. This is described in greater detail with reference to FIGS. 57A and 57B, the etching process etches the sacrificial layer 372 (see FIGS. 56A and 56B) at a faster etch rate than it etches the dielectric layer 364, the metal lines 367, and/or the spacer layer 374. By way of example but not limiting the present disclosure, a ratio of the etch rate of the sacrificial layer 372 to the etch rate of the dielectric layer 364, the metal lines 367, and/or the spacer layer 374 may be greater than about 10. If the ratio of the etch rate of the sacrificial layer 372 to the etch rate of the dielectric layer 364, the metal lines 367, and/or the spacer layer 374 is less than about 10, the etching process would significantly consume the dielectric layer 364, the metal lines 367, and/or the spacer layer 374, which in turn adversely affects the semiconductor device. In some embodiments, the etching process on the sacrificial spacer 372 may be an isotropic etching process.

Reference is made to FIGS. 58A and 58B. An etching process is performed on the spacer layer 374, such that an upper portion of the spacer layer 374 is etched to form a tapered top end 376 thereon. In some embodiments, the etching process on the spacer layer 374 is a plasma etching process employing one or more etchants.

This is described in greater detail with reference to FIGS. 58A and 58B, the non-zero bias plasma etching process is performed to etch the upper portion of the spacer layer 374 such that the top end of the spacer layer 374 is tapered. The non-zero bias can drive more plasmas to scale down the spacer layer 374 compared to zero bias. For example, the non-zero bias plasma etching process begins with ion bombardment to remove compounds of the spacer layer 374. Hence, the upper portion of the spacer layer 374 has a narrower width than the lower portion of the spacer layer 374. Stated differently, the upper portion of the air spacer 375 has a wider width than the lower portion of the air spacer 375, such that an isolation dielectric that will be formed later may flow into the upper portion of the air spacer 375. Therefore, the upper end of the air spacer 375 is sealed by the isolation dielectric that will be formed later, and thus the air spacer 375 can be protected during the subsequent process, such that other material would not fill into the air spacer 375.

The profile of the spacer layer 374 depends on process conditions of the etching process (e.g., etching time duration and/or the like). By way of example but not limiting the present disclosure, the anisotropic etching process on the spacer layer 374 may implement an oxygen-containing gas, a fluorine-containing gas (e.g., $CF_4$, $SF_6$, $CH_2F_2$, $CHF_3$, and/or $C_4F_6$, $C_4F_8$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, a phosphoric-containing gas (e.g., $H_3PO_4$), other suitable gases and/or plasmas, and/or combinations thereof. In some embodiments, the non-zero bias plasma etching process uses a gas mixture of $H_3PO_4$ and Ar with a bias in a range from about 50 W to about 1000 W. If the bias power is higher than about 1500 W, the plasma might result in unwanted damage to the dielectric layer 364 and the metal lines 367. If the bias power is lower than about 30 W, the spacer may not be tapered enough to allow the isolation dielectric that will be formed later to flow into the upper portion of the air spacer 375.

Reference is made to FIGS. 59A and 59B. An isolation dielectric 378 is formed to overfill the opening O6 and to seal the air spacer 375. As mentioned before, because the upper portions of the air spacer 375 has wider widths than the lower portions of the air spacer 375, material of the isolation dielectric 378 may flow into the upper portions of the air spacer 375 and seal the air spacer 375. Accordingly, the isolation dielectric 378 includes a seal portion 378s embedded between the spacer layer 374, the dielectric layer 366, and the metal line 367. Therefore, the upper end of the air spacer 375 are blocked by the seal portion 378s of the isolation dielectric 378, and thus the air spacer 375 can be protected during the subsequent process, such that other material would not fill into the air spacer 375.

In some embodiments, the isolation dielectric 378 is made of silicon oxide, silicon nitride, silicon oxynitride, fluoride-doped silicate glass (FSG), or other low-K dielectric materials. In some embodiments, the isolation dielectric 278 may be formed using a high-density-plasma (HDP) chemical vapor deposition (CVD) process, using silane ($SiH_4$) and oxygen ($O_2$) as reacting precursors. In some other embodiments, the isolation dielectric 378 may be formed using a sub-atmospheric CVD (SACVD) process or high aspect-ratio process (HARP), in which process gases may include tetraethylorthosilicate (TEOS) and ozone ($O_3$). In yet other embodiments, the isolation dielectric 378 may be formed using a spin-on-dielectric (SOD) process, such as hydrogen silsesquioxane (HSQ) or methyl silsesquioxane (MSQ). Other processes and materials may be used. In some embodiments, the isolation dielectric 378 can have a multi-layer structure, for example, a thermal oxide liner layer with silicon nitride formed over the liner. Thereafter, a thermal annealing may be optionally performed to the isolation dielectric 378. In some embodiments, the isolation dielectric 378 may be made of a material the same as the spacer layer 374, the dielectric layer 366, and/or the isolation dielectric 378. In some embodiments, the isolation dielectric 378 may be made of a material different than the spacer layer 374, the dielectric layer 366, and/or the isolation dielectric 378.

Reference is made to FIGS. 60A and 60B. A planarization process such as chemical mechanical polish (CMP) is performed to remove the excess isolation dielectric 378 until the dielectric layer 366 and the metal lines 367 are exposed and the air spacer 375 remains covered by the seal portion 378s of the isolation dielectric 378.

Reference is made to FIGS. 61A and 61B. The dielectric layer 384 is formed over the structure as shown in FIGS. 60A and 60B. Subsequently, a metal via 385 is formed to be embedded in the dielectric layer 384 and electrically connected to the metal line 367. In some embodiments, the dielectric layer 384 may include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), porous SiLK, or porous silicon oxide ($SiO_2$). In some embodiments, the dielectric layer 384 may include SiCN, SiCO, $SiO_2$, SiN, SiC and AlON, combinations thereof, or other suitable materials. In some embodiments, a dielectric constant (k) of the dielectric layer 384 is less than about 2.5. In some embodiments, the dielectric layer 384 has a material the same as the dielectric layer 366. In some embodiments, the dielectric layer 384 has a material different than the dielectric layer 366. In some embodiments, the metal via 385 may include copper, Pt, Ru, aluminum, tantalum, tungsten, tantalum nitride (TaN), titanium, titanium nitride (TiN), combinations thereof, or other suitable materials.

This is described in greater detail for an embodiment with reference to FIGS. 62A to 66B, an air spacer (e.g., an air spacer 475 as shown in FIGS. 66A and 66B) interposed between two metal lines of a multi-layer interconnect and surrounding the isolation dielectric (e.g., an isolation dielectric 477 as shown in FIGS. 66A and 66B) may be substantially the same as that shown in FIGS. 55A and 55B. The difference between the present embodiment and the embodiment in FIGS. 55A and 55B is that there is a single air spacer surrounding the isolation dielectric without forming an additional physical spacer as shown in FIGS. 55A and 55B surrounding the isolation dielectric.

Figure 62B:
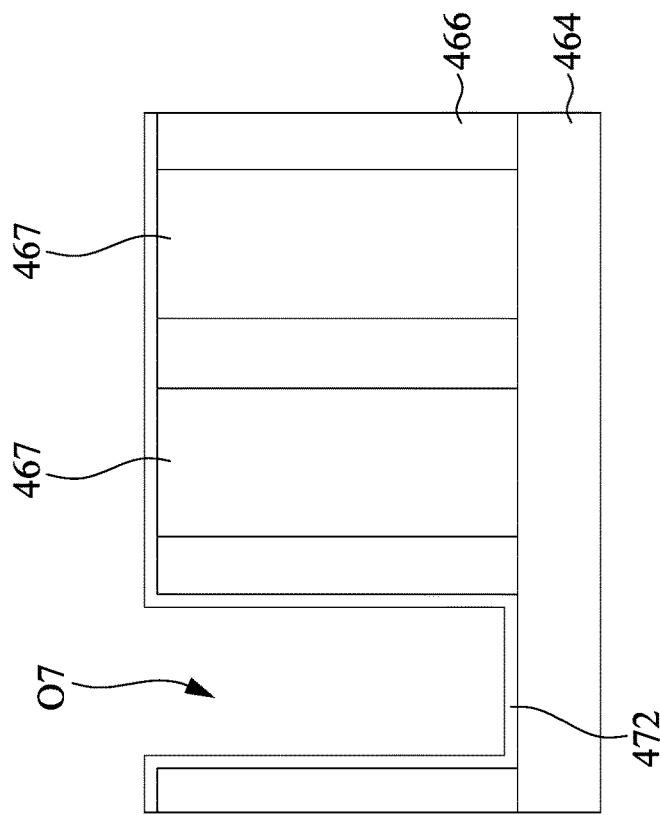
Figure 62A:
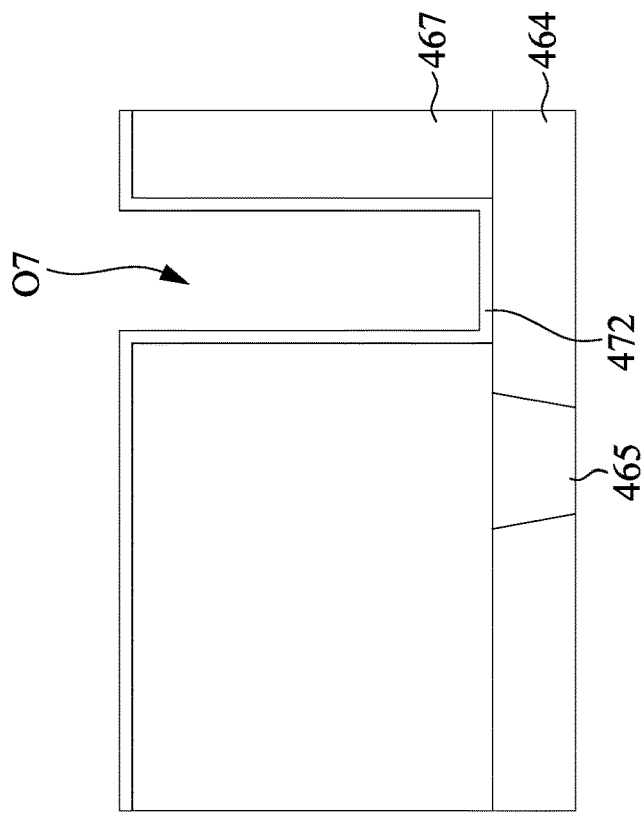

FIGS. 62A to 66B illustrate schematic views of intermediate stages in the formation of a semiconductor device 400 in accordance with some embodiments of the present disclosure. FIGS. 62A to 66A are cross-sectional views corresponding to line B4-B4' in FIGS. 37A to 46A. FIGS. 62B to 66B are cross-sectional corresponding to line C4-C4' in FIGS. 37A to 46A. Operations for forming a semiconductor device 400 prior to the structure shown in FIGS. 62A and 66B are substantially the same as the operations for forming the semiconductor device 100 shown in FIGS. 37A-39C at stages S140-S142 of the method M, and reference may be made to the foregoing paragraphs for the related detailed descriptions and such descriptions are not provided again herein. For example, material and manufacturing method of dielectric layers 464 and 466, a metal via 465, a metal line 467, and a sacrificial layer 472 may be substantially the same as that of the dielectric layers 164 and 166, the metal via 165, the metal line 167, and the sacrificial layer 172 as shown in FIGS. 37A to 39C, and the related detailed descriptions may refer to the foregoing paragraphs, and are not described again herein.

Reference is made to FIGS. 62A and 62B. Reference is made to FIGS. 48A and 48B. The metal via 465 (see FIG. 62A) is embedded in the dielectric layer 464. The dielectric layer 466 is formed over the dielectric layer 464 and the metal via 465. A portion of the metal line 467 is removed to form an opening O7 that exposes the underlying dielectric layer 464, such that the opening O7 is formed between remainders of the metal line 467. Stated differently, the remainders of the metal line 467 are spaced apart from each other by the opening O7. The sacrificial layer 472 is blanket deposited over the dielectric layer 464 and lines sidewalls of the opening O7 and a top surface of the dielectric layer 464 in the opening O7. In some embodiments, the sacrificial layer 472 may have a thickness in a range from about 1 nm to about 5 nm, such as about 1, 2, 3, 4, or 5 nm, and other thickness ranges are within the scope of the disclosure.

Figure 63B:
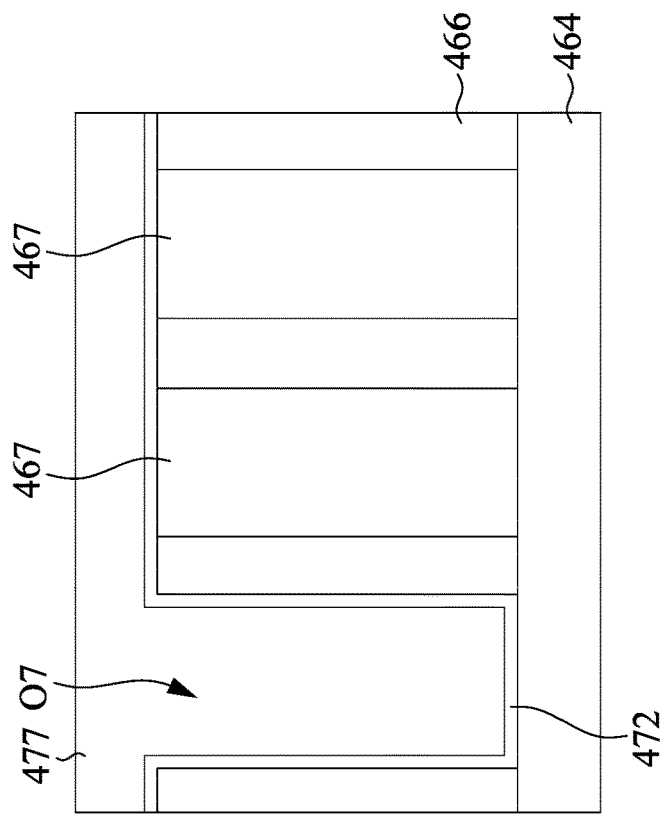
Figure 63A:
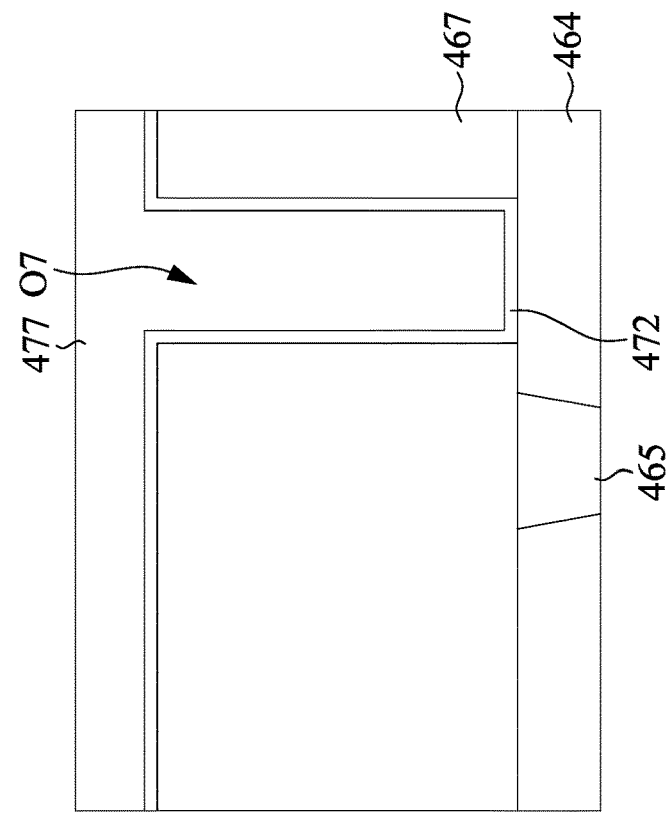

Reference is made to FIGS. 63A and 63B. An isolation dielectric 477 is formed over the sacrificial layer 472 to overfill the opening O7. In some embodiments, the isolation dielectric 477 is made of silicon oxide, silicon nitride, silicon oxynitride, fluoride-doped silicate glass (FSG), or other low-K dielectric materials. In some embodiments, the isolation dielectric 477 may be formed using a high-density-plasma (HDP) chemical vapor deposition (CVD) process, using silane ($SiH_4$) and oxygen ($O_2$) as reacting precursors. In some other embodiments, the isolation dielectric 477 may be formed using a sub-atmospheric CVD (SACVD) process or high aspect-ratio process (HARP), in which process gases may include tetraethylorthosilicate (TEOS) and ozone ($O_3$). In yet other embodiments, the isolation dielectric 477 may be formed using a spin-on-dielectric (SOD) process, such as hydrogen silsesquioxane (HSQ) or methyl silsesquioxane (MSQ). Other processes and materials may be used. In some embodiments, the isolation dielectric 477 can have a multi-layer structure, for example, a thermal oxide liner layer with silicon nitride formed over the liner. Thereafter, a thermal annealing may be optionally performed to the isolation dielectric 477. The isolation dielectric 477 is made of a material different than the sacrificial layer 472.

Figure 64B:
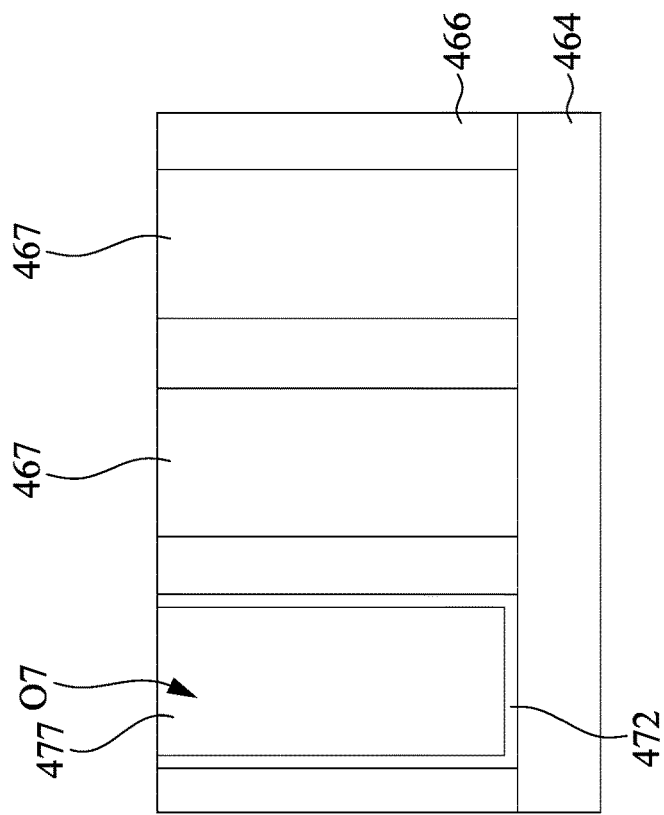
Figure 64A:
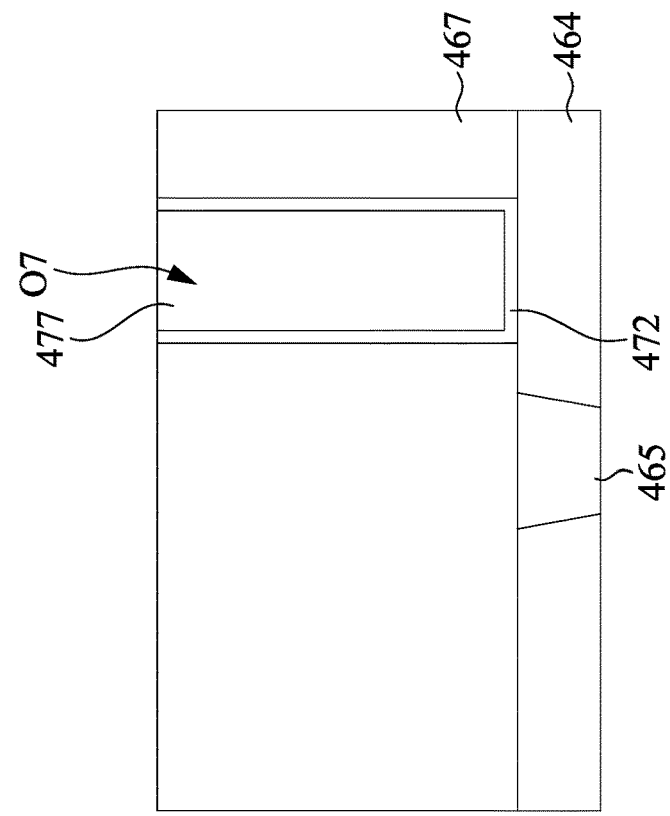

Reference is made to FIGS. 64A and 64B. A planarization process such as chemical mechanical polish (CMP) is performed to remove the excess isolation dielectric 477 and the sacrificial layer 472 over the opening O7 until the dielectric layer 464 is exposed.

Figure 65B:
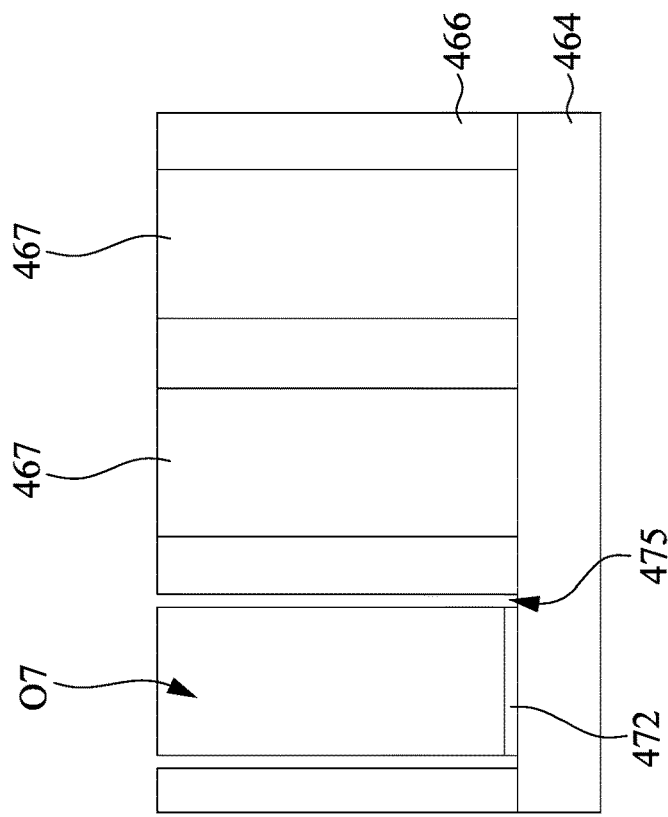
Figure 65A:
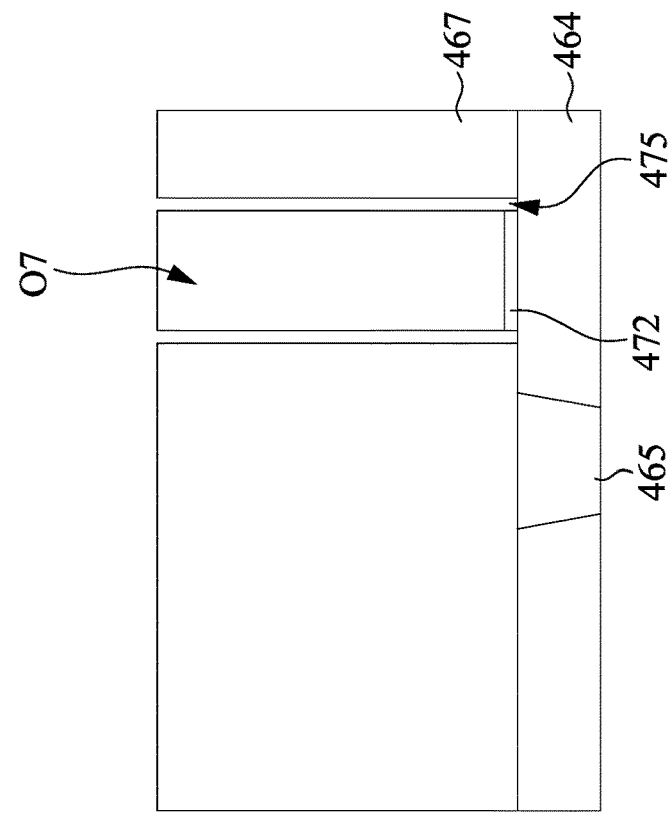

Reference is made to FIGS. 65A and 65B. An etching process is performed to selectively remove a vertical portion of the sacrificial spacer 472 such that an air spacer 475 is formed between the metal line 467 and the isolation dielectric 477 and between the dielectric layer 466 and the isolation dielectric 477. Stated differently, the metal line 467 and the isolation dielectric 477 are separated by the air spacer 475. The shape of the air spacer 475 substantially inherits the shape of the vertical portion of the sacrificial layer 472. In some embodiments, a portion of the dielectric layer 464 is exposed in the air spacer 475.

The thicknesses of the sacrificial layer 472 may be in a range from about 1 nm to about 5 nm. As a result, the air spacer 475 may have a thickness also in a range from about 1 nm to about 5 nm, such as about 1, 2, 3, 4, or 5 nm. If the thickness of the sacrificial layer 472 is smaller than 1 nm, the sacrificial layer 472 is too thin such that the etchant is hard to flow into the space between the dielectric layer 466, the metal line 467, and the isolation dielectric 477, which in turn affects the formation of the air spacer 475. On the other hand, if the thickness of the sacrificial layer 472 is greater than 5 nm, the thickness of the air spacer 475 inheriting the thickness of the sacrificial layer 472 may be too thick, such that the material that will be formed above of the air spacer 475 may easily flow into the lower portion of the air spacer 475, which in turn affects the formation of the air spacer 475. Therefore, during the etching process, the vertical portion of the sacrificial layer 472 (see FIGS. 64A and 64B) may be etched away and expose the vertical sidewalls of the metal line 467 and the dielectric layer 466, which in turn affects the formation of the air spacer 475.

In the present disclosure, the sacrificial layer 472 has large dielectric constant, for example, greater than 1. On the other hand, the air spacer 275 has a dielectric constant equal to 1 ($k_{air}=1$), which is lower than the dielectric constant of the sacrificial layer 472. Thus, the equivalent dielectric constant of the semiconductor device 400 may be reduced by forming the air spacer 475. As a result, the overall capacitance of the semiconductor device 400 may be reduced, which in turn will reduce the RC delay and further improve the device performance.

In some embodiments, the etching process on the sacrificial spacer 472 may be an anisotropic etching process (e.g., a reactive-ion etching process, RIE or atomic layer etching (ALE)). By way of example but not limiting the present disclosure, the etching process on the sacrificial spacer 472 may implement an oxygen-containing gas, a fluorine-containing gas (e.g., $CF_4$, $SF_6$, $CH_2F_2$, $CHF_3$, and/or $C_4F_6$, $C_4F_8$), a chlorine-containing gas (e.g., $Cl_2$, $CHCl_3$, $CCl_4$, and/or $BCl_3$), a bromine-containing gas (e.g., HBr and/or $CHBr_3$), a phosphoric-containing gas (e.g., $H_3PO_4$), an iodine-containing gas, other suitable gases and/or plasmas, and/or combinations thereof. In some embodiments, the vertical portion of the sacrificial layer 472 (see FIGS. 64A and 64B) is etched using, by way of example but not limiting the present disclosure, $NH_4OH$ when silicon is used in the nitride sacrificial layer 472. This is described in greater detail with reference to FIGS. 65A and 65B, the etching process etches the sacrificial layer 472 (see FIGS. 64A and 64B) at a faster etch rate than it etches the dielectric layer 464 and/or the metal lines 467. By way of example but not limiting the present disclosure, a ratio of the etch rate of the sacrificial layer 472 to the etch rate of the dielectric layer 464 and/or the metal lines 467 may be greater than about 10. If the ratio of the etch rate of the sacrificial layer 472 to the etch rate of the dielectric layer 464 and/or the metal lines 467 is less than about 10, the etching process would significantly consume the dielectric layer 464 and/or the metal lines 467, which in turn adversely affects the semiconductor device. In some embodiments, the etching process on the sacrificial spacer 472 may be an isotropic etching process.

Reference is made to FIGS. 66A and 66B. The dielectric layer 484 is formed over the structure as shown in FIGS. 65A and 65B. Subsequently, a metal via 485 is formed to be embedded in the dielectric layer 484 and electrically connected to the metal line 467. In some embodiments, the dielectric layer 484 may include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), porous SiLK, or porous silicon oxide (SiO$_2$). In some embodiments, the dielectric layer 484 may include SiCN, SiCO, SiO$_2$, SiN, SiC and AlON, combinations thereof, or other suitable materials. In some embodiments, a dielectric constant (k) of the dielectric layer 484 is less than about 2.5. In some embodiments, the dielectric layer 484 has a material the same as the dielectric layer 266. In some embodiments, the dielectric layer 484 has a material different than the dielectric layer 466. In some embodiments, the metal via 485 may include copper, Pt, Ru, aluminum, tantalum, tungsten, tantalum nitride (TaN), titanium, titanium nitride (TiN), combinations thereof, or other suitable materials.

Based on the above discussions, it can be seen that the present disclosure offers advantages. It is understood, however, that other embodiments may offer additional advantages, and not all advantages are necessarily disclosed herein, and that no particular advantage is required for all embodiments. An air spacer of the present disclosure is formed by removing a sacrificial layer between a semiconductor feature (e.g., OD, metal gate, source/drain contact, or metal line in a multi-layer interconnect) and a dielectric spacer. An advantage is that the overall capacitance of the IC structure may be reduced to improve the RC delay and further improve the device performance by forming the air spacer on the semiconductor feature. Moreover, since the air spacer is formed by removing the sacrificial layer between the semiconductor feature and a dielectric spacer, the air spacer may inherit the shape of the sacrificial layer, and thus it is easier to control the size of the air spacer. Further, because an upper end of the air spacer is sealed by a dielectric material, and thus the air spacer can be protected during subsequent filling or etching process.

In some embodiments, a semiconductor device includes a substrate, a semiconductor fin, a shallow trench isolation (STI) structure, an air spacer, and a gate structure. The semiconductor fin extends upwardly from the substrate. The STI structure laterally surrounds a lower portion of the semiconductor fin. The air spacer is interposed the STI structure and the semiconductor fin. The first gate structure extends across the semiconductor fin. In some embodiments, the lower portion of the semiconductor fin is exposed to the first air spacer. In some embodiments, the substrate is exposed to the first air spacer. In some embodiments, the first gate structure overlaps the first air spacer overlaps. In some embodiments, the semiconductor device further includes a dielectric structure sealing a top end of the first air spacer. In some embodiments, the dielectric structure is made of a material the same as the STI structure. In some embodiments, the semiconductor device further includes a dielectric spacer interposing the STI structure and the first air spacer. In some embodiments, an upper portion of the dielectric spacer has a narrower width than a lower portion of the dielectric spacer. In some embodiments, the dielectric spacer is made of a material the same as the STI structure. In some embodiments, the semiconductor device further includes a second gate structures, a source/drain structure, a dielectric structure, and a second air spacer. The second gate structures extends across the semiconductor fin. The source/drain structure is on the semiconductor fin and between the first and second gate structures. The dielectric structure is over the source/drain structure. The second air spacer interposes the first gate structure and the dielectric structure and also interposes the second gate structure and the dielectric structure.

In some embodiments, a semiconductor device includes a substrate, first and second semiconductor fins, a shallow trench isolation (STI) structure, a gate structure, a dielectric structure, and a first air spacer. The first and second semiconductor fins extend upwardly from the substrate. The STI structure laterally surrounds a lower portion of the first semiconductor fin and a lower portion of the second semiconductor fin. The first gate structure extends across the first semiconductor fin. The second gate structure extends across the second semiconductor fin. The dielectric structure is between a longitudinal end of the first gate structure and a longitudinal end of the second gate structure. The first air spacer laterally surrounds the dielectric structure. In some embodiments, the STI structure is exposed to the first air spacer. In some embodiments, the semiconductor device further includes a dielectric sealer sealing a top end of the first air spacer. In some embodiments, the dielectric sealer is made of a material the same as the dielectric structure. In some embodiments, the semiconductor device further includes a second air spacer laterally surrounding an upper portion of the second semiconductor fin. In some embodiments, the semiconductor device further includes a dielectric spacer interposing the first air spacer and the dielectric structure.

In some embodiments, a method includes: forming a metal via in a first dielectric layer; forming a second dielectric layer over the metal via; forming a metal line extending in the second dielectric layer and across the metal via; removing a portion of the metal line to form a trench that exposes the first dielectric layer; forming a sacrificial spacer lining the trench; forming a dielectric spacer lining sidewalls of the sacrificial spacer; after forming the dielectric spacer lining the sidewalls of the sacrificial spacer, removing the sacrificial spacer to form an air spacer; depositing a dielectric material in the trench and sealing the air spacer. In some embodiments, forming the sacrificial spacer lining the trench includes: conformally depositing a sacrificial layer over the metal line and the second dielectric layer; and removing a lateral portion of the sacrificial layer while leaving a vertical portion of the sacrificial layer on sidewalls of the trench. In some embodiments, the method further includes: after removing the sacrificial spacer and prior to depositing the dielectric material, selectively etching the dielectric spacer to form a tapered top end on the dielectric spacer. In some embodiments, the metal line has a longitudinal end exposed to the air spacer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device, comprising:
   forming a metal via in a first dielectric layer;
   forming a second dielectric layer over the metal via;
   forming a metal line extending in the second dielectric layer and across the metal via;
   removing a portion of the metal line to form a trench that exposes the first dielectric layer;
   forming a sacrificial spacer lining the trench;
   forming a dielectric spacer lining sidewalls of the sacrificial spacer;
   after forming the dielectric spacer, removing the sacrificial spacer to form an air spacer; and
   depositing a dielectric material in the trench and sealing the air spacer.

2. The method of claim 1, wherein forming the sacrificial spacer lining the trench comprises:
   conformally depositing a sacrificial layer over the metal line and the second dielectric layer; and
   removing a lateral portion of the sacrificial layer while leaving a vertical portion of the sacrificial layer on sidewalls of the trench.

3. The method of claim 1, furthering comprising:
   after removing the sacrificial spacer and prior to depositing the dielectric material, selectively etching the dielectric spacer to form a tapered top end on the dielectric spacer.

4. The method of claim 3, wherein the metal line has a longitudinal end exposed to the air spacer.

5. A method for forming a semiconductor device, comprising:
   forming a dielectric layer over a substrate;
   forming a metal line laterally extending in the dielectric layer;
   performing a first etching process on the metal line and the dielectric layer to form an opening that breaks the metal line into a first metal line pattern and a second metal line pattern;
   forming a sacrificial spacer on a sidewall of the opening;
   forming a dielectric spacer on the sacrificial spacer;
   after forming the dielectric spacer, removing the sacrificial spacer to form an air spacer; and
   depositing a dielectric material in the opening while leaving the air spacer unfilled.

6. The method of claim 5, wherein the sacrificial spacer comprises silicon.

7. The method of claim 5, wherein the dielectric spacer is made of a different material than the sacrificial spacer.

8. The method of claim 5, wherein removing the sacrificial spacer is performed by using an etchant comprising $NH_4OH$.

9. The method of claim 5, wherein the sacrificial spacer has a thickness in a range from about 1 nm to about 5 nm.

10. The method of claim 5, further comprising:
    after removing the sacrificial spacer and prior to depositing the dielectric material, performing a second etching process on the dielectric spacer.

11. The method of claim 10, wherein after performing the second etching process, the dielectric spacer has a top portion having a narrower width than a lower portion of the dielectric spacer.

12. The method of claim 5, further comprising:
    forming a dielectric sealer sealing a top end of the air spacer.

13. The method of claim 12, wherein the dielectric sealer is made of a same material as the dielectric spacer.

14. The method of claim 5, further comprising:
    performing a planarization process on the dielectric material until the dielectric layer is exposed.

15. A method for forming a semiconductor device, comprising:
    forming a dielectric layer over a substrate;
    forming a metal line in the dielectric layer;
    patterning the metal line to form a first metal line pattern and a second metal line pattern spaced apart from the first metal line pattern by an opening exposing the dielectric layer;
    forming a dielectric spacer extending upwardly from the dielectric layer in the opening and spaced apart from the dielectric layer by an air spacer in the opening, the dielectric spacer having a top view ring pattern;
    forming a dielectric material in the opening, wherein the dielectric spacer laterally surrounds the dielectric material; and
    forming a dielectric sealer sealing a top end of the air spacer.

16. The method of claim 15, wherein the dielectric sealer is made of a same material as the dielectric material.

17. The method of claim 15, wherein the dielectric sealer is made of nitride.

18. The method of claim 15, wherein the dielectric sealer has a top surface level with the dielectric layer.

19. The method of claim 15, further comprising:
    performing a plasma etching process on the dielectric spacer prior to forming the dielectric sealer.

20. The method of claim 19, wherein after the plasma etching process on the dielectric spacer, the dielectric spacer forms a tapered top end.

* * * * *